US010229906B2

(12) United States Patent
Yamazaki et al.

(10) Patent No.: US 10,229,906 B2
(45) Date of Patent: *Mar. 12, 2019

(54) SEMICONDUCTOR DEVICE INCLUDING INSULATING FILM HAVING OPENING PORTION AND CONDUCTIVE FILM IN THE OPENING PORTION

(71) Applicant: Semiconductor Energy Laboratory Co., Ltd., Atsugi-shi, Kanagawa-ken (JP)

(72) Inventors: Shunpei Yamazaki, Tokyo (JP); Hidekazu Miyairi, Kanagawa (JP); Shinya Sasagawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/814,569

(22) Filed: Nov. 16, 2017

(65) Prior Publication Data
US 2018/0076195 A1 Mar. 15, 2018

Related U.S. Application Data

(63) Continuation of application No. 14/657,347, filed on Mar. 13, 2015, now Pat. No. 9,831,238.

(30) Foreign Application Priority Data

May 30, 2014 (JP) .................. 2014-113576
May 30, 2014 (JP) .................. 2014-113585
May 30, 2014 (JP) .................. 2014-113587

(51) Int. Cl.
*H01L 21/76* (2006.01)
*H01L 27/11* (2006.01)
(Continued)

(52) U.S. Cl.
CPC .... *H01L 27/0688* (2013.01); *H01L 21/76805* (2013.01); *H01L 27/092* (2013.01); *H01L 27/1156* (2013.01); *H01L 2924/0002* (2013.01)

(58) Field of Classification Search
CPC .......... H01L 27/0688; H01L 21/76805; H01L 27/092; H01L 27/1156; H01L 2924/0002
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Didarul Mazumder
(74) *Attorney, Agent, or Firm* — Fish & Richardson P.C.

(57) ABSTRACT

Provided is a semiconductor device that occupies a small area, a highly integrated semiconductor device, or a semiconductor device with high productivity. To fabricate an integrated circuit, a first insulating film is formed over a p-channel transistor; a transistor including an oxide semiconductor is formed over the first insulating film; a second insulating film is formed over the transistor; an opening, that is, a contact hole part of a sidewall of which is formed of the oxide semiconductor of the transistor, is formed in the first
(Continued)

insulating film and the second insulating film; and an electrode connecting the p-channel transistor and the transistor including an oxide semiconductor to each other is formed.

11 Claims, 69 Drawing Sheets

(51) Int. Cl.
  *H01L 23/52* (2006.01)
  *H01L 21/31* (2006.01)
  *H01L 27/06* (2006.01)
  *H01L 27/092* (2006.01)
  *H01L 27/1156* (2017.01)
  *H01L 21/768* (2006.01)

(58) Field of Classification Search
  USPC .......................................... 257/775; 438/638
  See application file for complete search history.

(56) References Cited

U.S. PATENT DOCUMENTS

| | | |
|---|---|---|
| 6,087,730 A | 7/2000 | McGarvey et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,763,981 B2 | 7/2010 | Yamazaki et al. |
| 8,183,630 B2 | 5/2012 | Batude et al. |
| 8,207,756 B2 | 6/2012 | Shionoiri et al. |
| 8,461,586 B2 | 6/2013 | Yamazaki et al. |
| 8,547,771 B2 | 10/2013 | Koyama |
| 8,780,629 B2 | 7/2014 | Furutani et al. |
| 9,391,112 B2 | 7/2016 | Shimotsusa |
| 9,831,238 B2 * | 11/2017 | Yamazaki ........... H01L 27/0688 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0008497 A1 | 1/2003 | Lin et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118968 A1 | 6/2006 | Johnston et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0255465 A1 | 11/2006 | Kishiro |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0149021 A1 | 6/2008 | Seo et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0013107 A1 | 1/2010 | Sandhu et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089417 A1 | 4/2011 | Yamazaki et al. |
| 2011/0101351 A1 | 5/2011 | Yamazaki |
| 2011/0147737 A1 | 6/2011 | Yamazaki et al. |
| 2012/0003800 A1 | 1/2012 | Lee et al. |
| 2012/0142188 A1 | 6/2012 | Lu et al. |
| 2012/0241978 A1 | 9/2012 | Mino |
| 2012/0319101 A1 | 12/2012 | Sasagawa et al. |
| 2013/0069132 A1 | 3/2013 | Atsumi et al. |
| 2013/0140569 A1 | 6/2013 | Yoneda et al. |
| 2013/0161606 A1 | 6/2013 | Isobe et al. |
| 2013/0203214 A1 | 8/2013 | Isobe et al. |
| 2014/0312346 A1 | 10/2014 | Yamazaki et al. |
| 2014/0326992 A1 | 11/2014 | Hondo et al. |
| 2014/0332800 A1 | 11/2014 | Hanaoka |
| 2015/0187814 A1 | 7/2015 | Miyairi et al. |
| 2015/0187823 A1 | 7/2015 | Miyairi et al. |
| 2015/0214256 A1 | 7/2015 | Miyairi |
| 2015/0348997 A1 | 12/2015 | Sasagawa et al. |

(56) References Cited

U.S. PATENT DOCUMENTS

| 2015/0349127 A1 | 12/2015 | Kurata et al. |
| --- | --- | --- |
| 2016/0284755 A1 | 9/2016 | Shimotsusa |

FOREIGN PATENT DOCUMENTS

| JP | 60-198861 A | 10/1985 |
| --- | --- | --- |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-142161 A | 5/1990 |
| JP | 04-082222 A | 3/1992 |
| JP | 05-251705 A | 9/1993 |
| JP | 08-255764 A | 10/1996 |
| JP | 08-264794 A | 10/1996 |
| JP | 11-017009 A | 1/1999 |
| JP | 11-026575 A | 1/1999 |
| JP | 11-505377 A | 5/1999 |
| JP | 2000-044236 A | 2/2000 |
| JP | 2000-091423 A | 3/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-257187 A | 12/2012 |
| JP | 2014-072296 A | 4/2014 |
| WO | WO-2004/114391 | 12/2004 |

OTHER PUBLICATIONS

Asaoka.Y et al., "29.1:Polarizer-Free Reflective LCD Combined With Ultra Low-Power Driving Technolgy", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 33, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papaers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165262-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display On Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 As a Charge-Generation Layer", Adv. Mater. (Advanced Materials), 2006, vol. 13, No. 3, pp. 339-342.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, Or Al; B: Mg, Mn, Fe, Ni, Cu,Or Zn] At Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 8th International-Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B); 2008, vol. 77, pp. 245262-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure To Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 DIGEST, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (GaZO3—InZO3—ZnO) TFT", SID DIGEST '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

100a

100b

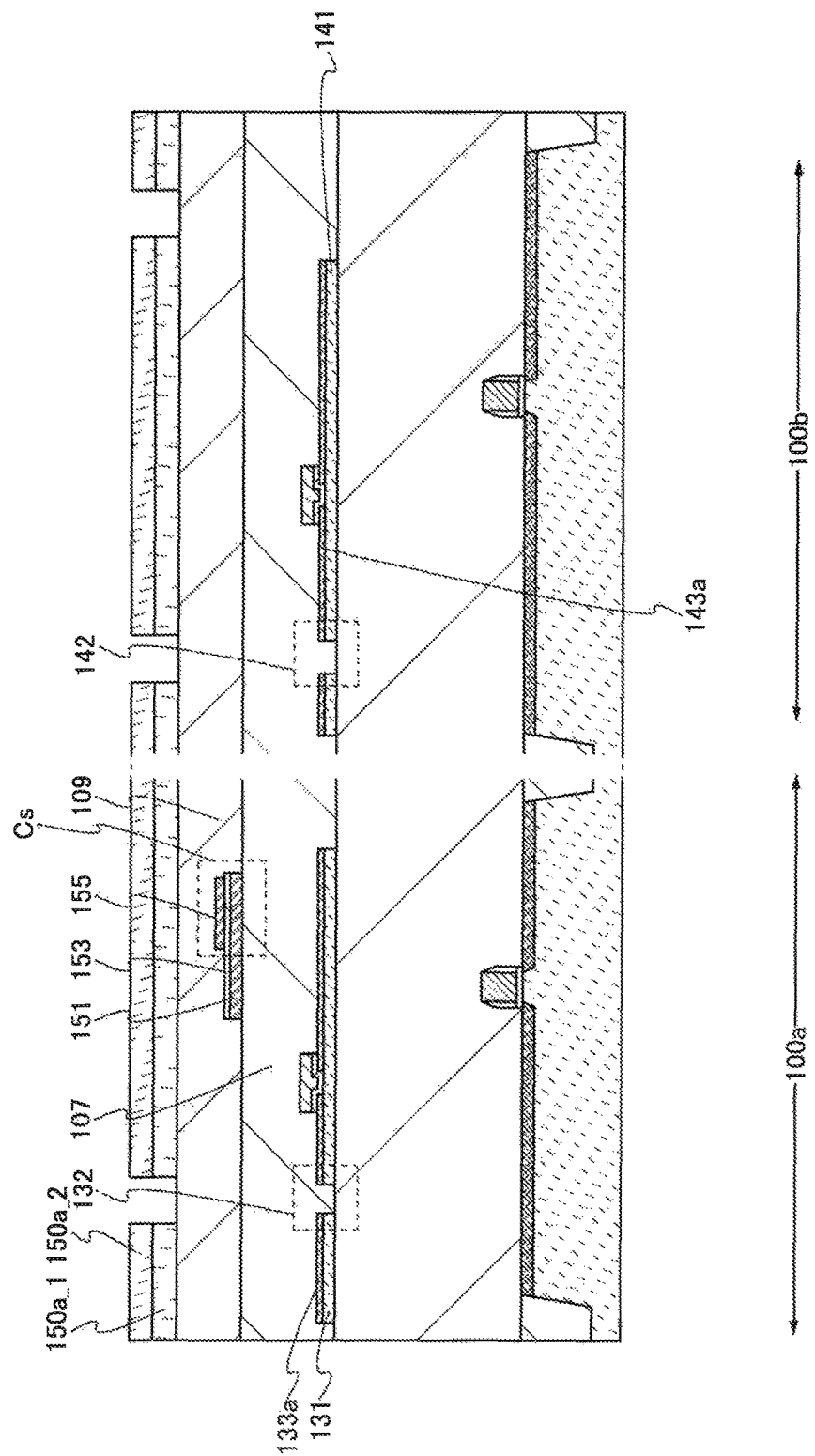

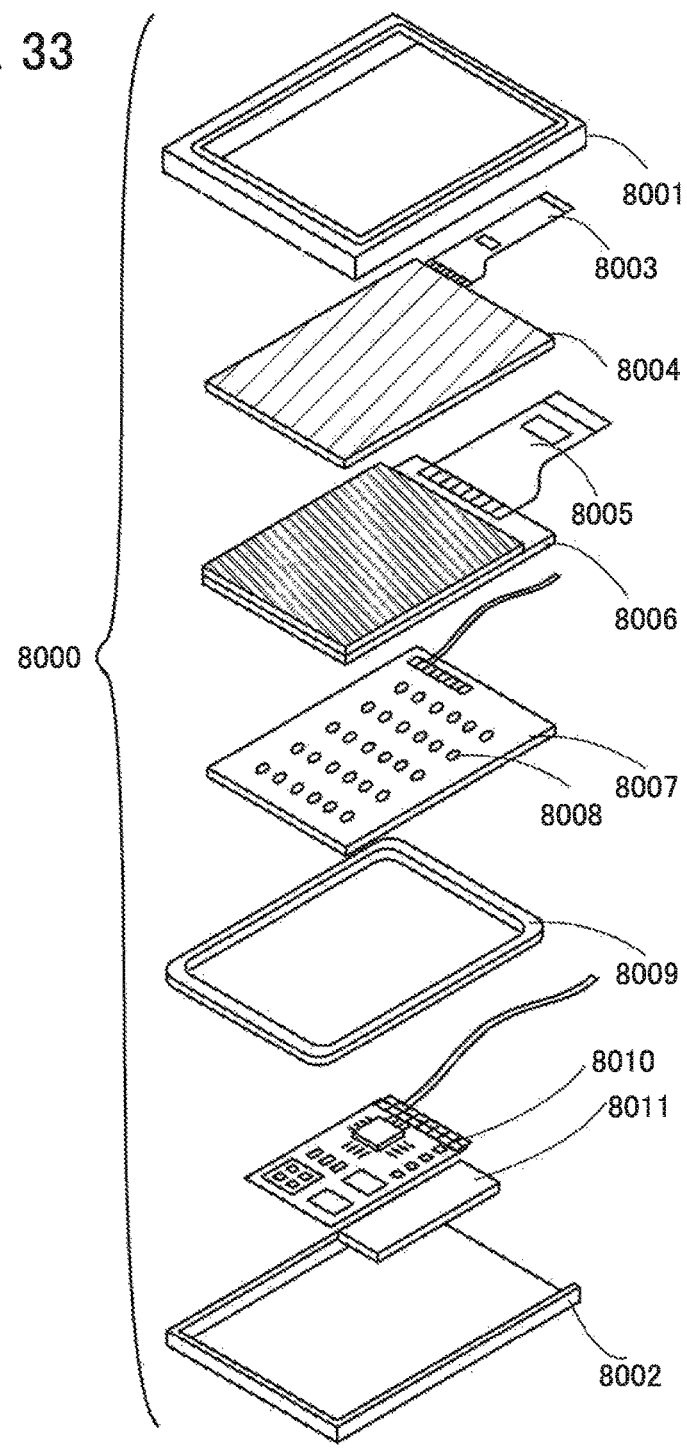

SEMICONDUCTOR DEVICE INCLUDING INSULATING FILM HAVING OPENING PORTION AND CONDUCTIVE FILM IN THE OPENING PORTION

CROSS-REFERENCE TO RELATED APPLICATIONS

This application is a continuation of U.S. application Ser. No. 14/657,347, filed Mar. 13, 2015, now allowed, which claims the benefit of foreign priority applications filed in Japan as Serial No. 2014-113576 on May 30, 2014, Serial No. 2014-113585 on May 30, 2014, and Serial No. 2014-113587 on May 30, 2014, all of which are incorporated by reference.

BACKGROUND OF THE INVENTION

1. Field of the Invention

The present invention relates to, for example, a transistor, a semiconductor device, and manufacturing methods thereof. The present invention relates to, for example, a display device, a light-emitting device, a lighting device, a power storage device, a memory device, a processor, and an electronic device. The present invention relates to a method for manufacturing a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. One embodiment of the present invention relates to a light-emitting device using an organic electroluminescence (hereinafter also referred to as EL) phenomenon, and a method for manufacturing the light-emitting device. One embodiment of the present invention relates to, for example, a power device mounted in a power supply circuit; an LSI; a CPU; a semiconductor integrated circuit including a memory, a thyristor, a converter, an image sensor, or the like; and an electronic device including any of the above as a component.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

In recent years, semiconductor devices have been developed to be used mainly for an LSI, a CPU, or a memory. A CPU is an aggregation of semiconductor elements each provided with an electrode that is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

Furthermore, a technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device).

In addition, a transistor including an oxide semiconductor has attracted attention. An oxide semiconductor can be formed by a sputtering method or the like, and thus can be used for a semiconductor of a transistor in a large display device. In addition, the transistor including an oxide semiconductor is advantageous in reducing capital investment because part of production equipment for a transistor including amorphous silicon can be retrofitted and utilized.

It is known that a transistor including an oxide semiconductor has an extremely low leakage current in an off state. For example, a low-power-consumption CPU utilizing a characteristic of low leakage current of the transistor including an oxide semiconductor is disclosed (see Patent Document 1).

REFERENCE

Patent Document

[Patent Document 1] Japanese Published Patent Application No. 2012-257187

SUMMARY OF THE INVENTION

One object is to provide a semiconductor device that occupies a small area. Another object is to provide a highly integrated semiconductor device. Another object is to provide a semiconductor device that operates at high speed. Another object is to provide a semiconductor device with low power consumption. Another object is to provide a semiconductor device with high productivity. Another object is to provide semiconductor devices with high yield. Another object is to provide a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects will be apparent from and can be derived from the descriptions of the specification, the drawings, the claims, and the like.

One embodiment of the present invention is a semiconductor device including a transistor, a first conductive film, and an insulating film. The insulating film has an opening portion. The first conductive film is provided in the opening portion and is electrically connected to the transistor. A side surface of the first conductive film has a plurality of projections in a cross section in a thickness direction.

One embodiment of the present invention is a semiconductor device including a first insulating film having a first opening portion, a second insulating film having a second opening portion, a third insulating film having a third opening portion, and a first conductive film provided in the first opening portion, the second opening portion, and the third opening portion. The first opening portion, the second opening portion, and the third opening portion are connected to each other. At least two of the width of the first conductive film in the first opening portion, the width of the first conductive film in the second opening portion, and the width of the first conductive film in the third opening portion are different from each other.

Note that the first opening portion, the second opening portion, and the third opening portion may be formed in this order. The width of the first conductive film in the second opening portion may be smaller than that in the first opening portion and that in the third opening portion. In such a case, the first insulating film and the third insulating film are formed using a silicon nitride film, a silicon nitride oxide film, or an aluminum oxide film, and the second insulating film is formed using a silicon oxide film or a silicon oxynitride film.

Alternatively, the first opening portion, the second opening portion, and the third opening portion may be formed in this order, and the width of the first conductive film in the second opening portion may be larger than that in the first opening portion and that in the third opening portion. In such a case, the first insulating film and the third insulating film are formed using a silicon oxide film or a silicon oxynitride film, and the second insulating film is formed using a silicon nitride film, a silicon nitride oxide film, or an aluminum oxide film.

The top surface of the first conductive film is in contact with a conductive film, and the bottom surface of the first conductive film is in contact with a conductive film or a semiconductor region.

One embodiment of the present invention is a method for manufacturing a semiconductor device. In the method, a first transistor is formed; a first insulating film is formed over the first transistor; a second transistor is formed over the first insulating film; a second insulating film is formed over the first insulating film and the second transistor; a capacitor is formed over the second insulating film; a third insulating film is formed over the capacitor; at least one of the first insulating film, the second insulating film, and the third insulating film is etched to form a first opening portion, a second opening portion, a third opening portion, a fourth opening portion, and a fifth opening portion in this order; and a first conductive film, a second conductive film, a third conductive film, a fourth conductive film, and a fifth conductive film are formed in the first opening portion, the second opening portion, the third opening portion, the fourth opening portion, and the fifth opening portion, respectively, in the same process. The first conductive film has regions in contact with a semiconductor film of the second transistor and one of a source region and a drain region of the first transistor. The second conductive film has a region in contact with the other of the source region and the drain region of the first transistor. The third conductive film has regions in contact with a gate electrode of the first transistor, the semiconductor film of the second transistor, and one electrode of the capacitor. The fourth conductive film has a region in contact with a gate electrode of the second transistor. The fifth conductive film has a region in contact with the other electrode of the capacitor.

One embodiment of the present invention is a method for manufacturing a semiconductor device. In the method, a third transistor is formed; a first insulating film is formed over the third transistor; a fourth transistor is formed over the first insulating film; a second insulating film is formed over the first insulating film and the fourth transistor; at least one of the first insulating film and the second insulating film is etched to form a sixth opening portion, a seventh opening portion, an eighth opening portion, a ninth opening portion, and a tenth opening portion in this order; and a sixth conductive film, a seventh conductive film, an eighth conductive film, a ninth conductive film, and a tenth conductive film are formed in the sixth opening portion, the seventh opening portion, the eighth opening portion, the ninth opening portion, and the tenth opening portion, respectively, in the same process. The sixth conductive film is in contact with a semiconductor film of the fourth transistor and one of a source region and a drain region of the third transistor. The seventh conductive film is in contact with the other of the source region and the drain region of the third transistor. The eighth conductive film is in contact with a gate electrode of the third transistor. The ninth conductive film is in contact with a gate electrode of the fourth transistor. The tenth conductive film is in contact with a semiconductor film of the fourth transistor.

Note that an eleventh conductive film that connects the eighth conductive film and the ninth conductive film may be included.

One embodiment of the present invention is a method for manufacturing a semiconductor device. In the method, a first transistor is formed; a first insulating film is formed over the first transistor; a capacitor is formed over the first insulating film; a second insulating film is formed over the capacitor; a second transistor is formed over the second insulating film; a third insulating film is formed over the second transistor; at least the third insulating film is etched to form a first opening portion, a second opening portion, a third opening portion, a fourth opening portion, and a fifth opening portion in this order; and a first conductive film, a second conductive film, a third conductive film, a fourth conductive film, and a fifth conductive film are formed in the first opening portion, the second opening portion, the third opening portion, the fourth opening portion, and the fifth opening portion, respectively, in the same process. The first conductive film has regions in contact with a semiconductor film of the second transistor and one of a source region and a drain region of the first transistor. The second conductive film has a region in contact with the other of the source region and the drain region of the first transistor. The third conductive film has regions in contact with a gate electrode of the first transistor, the semiconductor film of the second transistor, and one electrode of the capacitor. The fourth conductive film has a region in contact with a gate electrode of the second transistor. The fifth conductive film has a region in contact with the semiconductor film of the second transistor and the other electrode of the capacitor.

One embodiment of the present invention is a method for manufacturing a semiconductor device. In the method, a third transistor is formed; a first insulating film is formed over the third transistor, a second insulating film is formed over the first insulating film, a fourth transistor is formed over the second insulating film; a third insulating film is formed over the second insulating film and the fourth transistor; at least the third insulating film is etched to form a sixth opening portion, a seventh opening portion, an eighth opening portion, a ninth opening portion, and a tenth opening portion in this order; and a sixth conductive film, a seventh conductive film, an eighth conductive film, a ninth conductive film, and a tenth conductive film are formed in the sixth opening portion, the seventh opening portion, the eighth opening portion, the ninth opening portion, and the tenth opening portion, respectively, in the same process. The sixth conductive film is in contact with a semiconductor film of the fourth transistor and one of a source region and a drain region of the third transistor. The seventh conductive film is in contact with the other of the source region and the drain region of the third transistor. The eighth conductive film is in contact with a gate electrode of the third transistor. The ninth conductive film is in contact with a gate electrode of the fourth transistor. The tenth conductive film is in contact with a semiconductor film of the fourth transistor.

In the above structure, the first transistor and the third transistor each have a channel formation region formed of silicon.

In the above structure, the second transistor and the fourth transistor each have a channel formation region formed of a semiconductor, typified by an oxide semiconductor, having a wider band gap than silicon.

When the above structure is used to form an integrated circuit, the transistor whose channel formation region is formed of silicon and the transistor whose channel formation region is formed of an oxide semiconductor having a wider band gap than silicon are stacked, and an insulating film is formed thereover. An opening, that is, a contact hole part of the sidewall of which is the oxide semiconductor of the transistor, is formed in the insulating film, and electrodes that connect the transistors are formed. Some of the electrodes are connected to a side surface of the oxide semiconductor.

One embodiment of the present invention is a method for manufacturing a semiconductor device. In the method, a first transistor is formed: a first insulating film is formed over the first transistor; a second transistor is formed over the first insulating film; a capacitor in contact with the second transistor is formed; a second insulating film is formed over the capacitor; a third insulating film is formed over the second insulating film; at least the third insulating film is etched to form a first opening portion, a second opening portion, a third opening portion, a fourth opening portion, and a fifth opening portion in this order; and a first conductive film, a second conductive film, a third conductive film, a fourth conductive film, and a fifth conductive film are formed in the first opening portion, the second opening portion, the third opening portion, the fourth opening portion, and the fifth opening portion, respectively, in the same process. The first conductive film has regions in contact with a semiconductor film of the second transistor and one of a source region and a drain region of the first transistor. The second conductive film has a region in contact with the other of the source region and the drain region of the first transistor. The third conductive film has regions in contact with a gate electrode of the first transistor, the semiconductor film of the second transistor, and one electrode of the capacitor. The fourth conductive film has a region in contact with a gate electrode of the second transistor. The fifth conductive film has a region in contact with the other electrode of the capacitor.

One embodiment of the present invention is a semiconductor device including a through electrode. The through electrode includes an insulating film having an opening portion and a first conductive film in the opening portion of the insulating film. A side surface of the first conductive film has a plurality of projections in a cross section in a thickness direction.

One embodiment of the present invention is a semiconductor device including a first insulating film having a first opening portion, a second insulating film having a second opening portion, a third insulating film having a third opening portion, and a first conductive film provided in the first opening portion, the second opening portion, and the third opening portion. The first opening portion, the second opening portion, and the third opening portion are connected to each other. At least two of the width of the first conductive film in the first opening portion, the width of the first conductive film in the second opening portion, and the width of the first conductive film in the third opening portion are different from each other.

Note that the first opening portion, the second opening portion, and the third opening portion may be formed in this order. The width of the first conductive film in the second opening portion may be smaller than that in the first opening portion and that in the third opening portion. In such a case, the first insulating film and the third insulating film are formed using a silicon nitride film, a silicon nitride oxide film, or an aluminum oxide film, and the second insulating film is formed using a silicon oxide film or a silicon oxynitride film.

Alternatively, the first opening portion, the second opening portion, and the third opening portion may be formed in this order, and the width of the first conductive film in the second opening portion may be larger than that in the first opening portion and that in the third opening portion. In such a case, the first insulating film and the third insulating film are formed using a silicon oxide film or a silicon oxynitride film, and the second insulating film is formed using a silicon nitride film, a silicon nitride oxide film, or an aluminum oxide film.

The top surface of the first conductive film is in contact with a conductive film, and the bottom surface of the first conductive film is in contact with a conductive film or a semiconductor region.

To manufacture a highly integrated semiconductor device, a p-channel transistor and an n-channel transistor formed using a semiconductor having a wider band gap than silicon are stacked so as to partly overlap with each other, and electrodes or semiconductors of the transistors are connected to each other.

In the case of connecting the electrodes or the semiconductors to each other, the numbers of masks and steps are preferably small. With small numbers of masks and steps, the semiconductor devices can be provided with high yield. In the case of forming a capacitor, one electrode of the capacitor is made in contact with a semiconductor of the n-channel transistor and the other electrode of the capacitor is formed in the same step as a gate electrode of the re-channel transistor. Furthermore, a dielectric of the capacitor is formed in the same step as a gate insulating film of the n-channel transistor. When the capacitor is formed in the same steps as the n-channel transistor, the numbers of masks and steps can be small.

Moreover, the number of steps can be reduced in the following manner: a first insulating film between the transistors and a second insulating film that covers the transistors are formed and then, openings are formed in both of the first insulating film and the second insulating film to form contact holes with different depths which are appropriate for their respective connection structures.

In the above structure, the first transistor and the third transistor each have a channel formation region formed of silicon.

In the above structure, the second transistor and the fourth transistor each have a channel formation region formed of a semiconductor, typified by an oxide semiconductor, having a wider band gap than silicon.

When the above structure is used to form an integrated circuit, the transistor whose channel formation region is formed of silicon and the transistor whose channel formation region is formed of an oxide semiconductor having a wider band gap than silicon are stacked, and an insulating film is formed thereover. An opening, that is, a contact hole part of the sidewall of which is the oxide semiconductor of the transistor, is formed in the insulating film, and electrodes that connect the transistors are formed. Some of or all of the electrodes are through electrodes and are connected to a side surface of the oxide semiconductor.

A semiconductor device that occupies a small area can be provided. A highly integrated semiconductor device can be provided. A semiconductor device that operates at high speed can be provided. A semiconductor device with low power consumption can be provided. A semiconductor device with high productivity can be provided. Semiconductor devices can be provided with high yield. A novel semiconductor device can be provided. A module including any of the above semiconductor devices can be provided. An electronic device including any of the above semiconductor devices or the module can be provided.

Note that the descriptions of these effects do not disturb the existence of other effects. One embodiment of the present invention does not necessarily achieve all the above effects. Other effects will be apparent from and can be derived from the descriptions of the specification, the drawings, the claims, and the like.

BRIEF DESCRIPTION OF THE DRAWINGS

FIG. 20 is a cross-sectional view illustrating one embodiment of a method for manufacturing a semiconductor device.

FIGS. 22A to 22D are cross-sectional views each illustrating one embodiment of a semiconductor device.

FIG. 33 illustrates a display module.

DETAILED DESCRIPTION OF THE INVENTION

Figure 1:
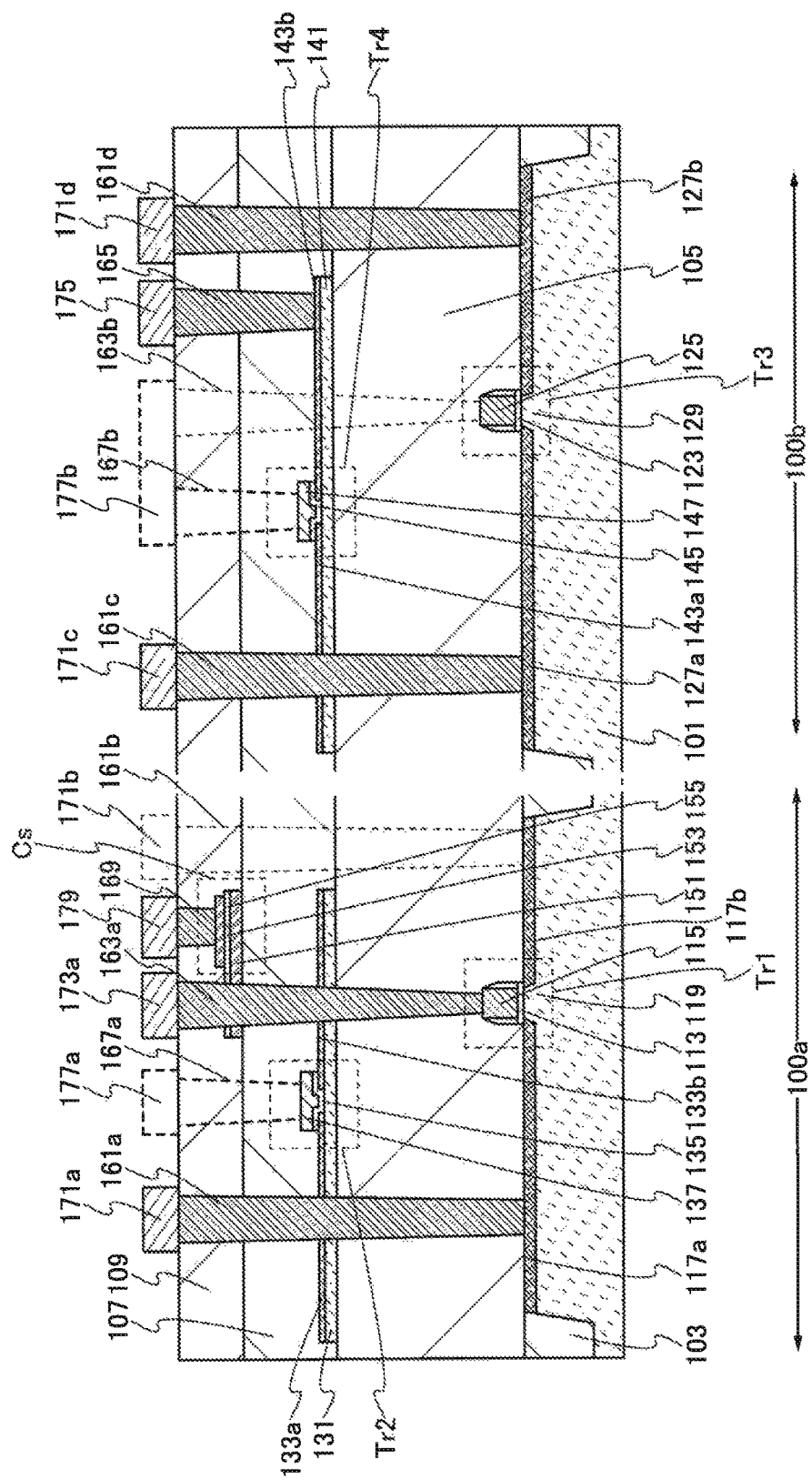
FIG. 1 is a cross-sectional view illustrating one embodiment of a semiconductor device.

Embodiments of the present invention will be described below in detail with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Note that, functions of "source" and "drain" may be switched in the case where the direction of a current flow is changed during circuit operation, for example. Therefore, the terms "source" and "drain" can be used to denote the drain and the source, respectively, in this specification.

The term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Note that a transistor including an oxide semiconductor film is an n-channel transistor; therefore, in this specification, a transistor that can be regarded as having no drain current flowing therein when a gate voltage is 0 V is defined as a transistor having normally-off characteristics. In contrast, a transistor that can be regarded as having a drain current flowing therein when the gate voltage is 0 V is defined as a transistor having normally-on characteristics.

Note that in this specification, the channel length refers to, for example, a distance between a source (a source region or a source electrode) and a drain (a drain region or a drain electrode) in a region where an oxide semiconductor film (or a portion where a current flows in an oxide semiconductor film when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where an oxide semiconductor film (or a portion where a current flows in an oxide semiconductor film when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of an oxide semiconductor film is higher than the proportion of a channel region formed in the top surface of an oxide semiconductor film in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of an oxide semiconductor film is known. Therefore, in the case where the shape of an oxide semiconductor film is not known accurately, it is difficult to measure an effective channel width accurately.

In view of the above, in a top view of a transistor, an apparent channel width that is a length of a portion where a source and a drain face each other in a region where an oxide semiconductor film and a gate electrode overlap with each other may be referred to as a "surrounded channel width (SCW)" in this specification. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

(Embodiment 1)

In this embodiment, a structure and a manufacturing method of a semiconductor device will be described.

<Structure of Semiconductor Device>

FIG. 1 is a schematic cross-sectional view of the semiconductor device. FIG. 1 illustrates circuits, which are a memory cell 100a and an inverter circuit 100b here, included in the semiconductor device.

The memory cell 100a includes a transistor Tr1, a transistor Tr2, and a capacitor Cs. An insulating film 105 is formed over the transistor Tr1. The transistor Tr2 is formed over the insulating film 105. An insulating film 107 is formed over the insulating film 105 and the transistor Tr2. The capacitor Cs is formed over the insulating film 107. An insulating film 109 is formed over the insulating film 107 and the capacitor Cs.

The transistor Tr1 includes a channel region 119 formed in a substrate 101, an insulating film 113 formed over the channel region 119, a conductive film 115 formed over the insulating film 113, and impurity regions 117a and 117b formed in the substrate 101 and outside the channel region 119. The insulating film 113 has a function of a gate insulating film. The conductive film 115 has a function of a gate electrode. The impurity regions 117a and 117b have functions of a source region and a drain region.

The transistor Tr2 includes a semiconductor film 131 formed over the insulating film 105, conductive films 133a and 133b formed over the semiconductor film 131, an insulating film 135 formed over the semiconductor film 131 and the conductive films 133a and 133b, and a conductive film 137 formed over the insulating film 135. The conductive films 133a and 133b have functions of a source electrode and a drain electrode. The insulating film 135 has a function of a gate insulating film. The conductive film 137 has a function of a gate electrode.

The capacitor Cs includes a conductive film 151 formed over the insulating film 107, an insulating film 153 formed over the conductive film 151, and a conductive film 155 formed over the insulating film 153. The conductive films 151 and 155 each have a function of a capacitor electrode. The insulating film 153 has a function of a dielectric.

The memory cell 100a also includes a conductive film 161a, a conductive film 161b, a conductive film 163a, a conductive film 167a, and a conductive film 169. The conductive film 161a is connected to the impurity region 117a of the transistor Tr1 and the semiconductor film 131 and the conductive film 133a of the transistor Tr2. The conductive film 161b is connected to the impurity region 117b of the transistor Tr1. The conductive film 163a is connected to the conductive film 115 of the transistor Tr1, the semiconductor film 131 and the conductive film 133b of the transistor Tr2, and the conductive film 151 of the capacitor Cs. The conductive film 167a is connected to the conductive film 137 of the transistor Tr2. The conductive film 169 is connected to the conductive film 155 of the capacitor Cs. The conductive films 161a, 161b, 163a, 167a, and 169 each have a function of a plug. Note that since not existing on a plane illustrated in FIG. 1, the conductive films 161b and 167a are shown by dashed lines. Note that here, the conductive film 163a is illustrated so as to overlap with the channel region 119 and the conductive film 115 so that the connection of the conductive film 163a and other conductive films is easily understood; however, in the actual structure, the conductive film 163a is connected to the conductive film 115 in a region not overlapping with the channel region.

The conductive film 161a is formed in an opening portion of the insulating film 105, the semiconductor film 131, the conductive film 133a, the insulating film 107, and the insulating film 109. The conductive film 161b is formed in an opening portion of the insulating films 105, 107, and 109. The conductive film 163a is formed in an opening portion of the insulating film 105, the semiconductor film 131, the conductive film 133b, the insulating film 107, the conductive film 151, the insulating film 153, and the insulating film 109. The conductive film 167a is formed in an opening portion of the insulating films 107 and 109. The conductive film 169 is formed in an opening portion of the insulating film 109.

A conductive film 171a, a conductive film 171b, a conductive film 173a, a conductive film 177a, and a conductive film 179 are formed over the insulating film 109. The conductive film 171a, the conductive film 171b, the conductive film 173a, the conductive film 177a, and the conductive film 179 are connected to the conductive film 161a, the conductive film 161b, the conductive film 163a, the conductive film 167a, and the conductive film 169, respectively. The conductive films 171a, 171b, 173a, 177a, and 179 each have a function of a wiring. Note that since not existing on a plane illustrated in FIG. 1, the conductive films 171b and 177a are shown by dashed lines.

In the memory cell 100a, some components of the transistor Tr1, the transistor Tr2, and the capacitor Cs are connected with the conductive films. The conductive films are formed through not only the insulating films but also the semiconductor films and the conductive films which are the components of the transistors. For this reason, the transistor Tr1, the transistor Tr2, and the capacitor Cs can partly or entirely overlap with each other. Accordingly, the semiconductor device can be highly integrated.

Next, the inverter circuit 100b will be described.

The inverter circuit 100b includes a transistor Tr3 and a transistor Tr4. The insulating film 105 is formed over the transistor Tr3. The transistor Tr4 is formed over the insulating film 105. The insulating film 107 is formed over the insulating film 105 and the transistor Tr4. The insulating film 109 is formed over the insulating film 107.

The transistor Tr3 includes a channel region 129 formed in the substrate 101, an insulating film 123 formed over the channel region 129, a conductive film 125 formed over the insulating film 123, and impurity regions 127a and 127b formed in the substrate 101 and outside the channel region 129. The insulating film 123 has a function of a gate insulating film. The conductive film 125 has a function of a gate electrode. The impurity regions 127a and 127b have functions of a source region and a drain region.

The transistor Tr4 includes a semiconductor film 141 formed over the insulating film 105, conductive films 143a and 143b formed over the semiconductor film 141, an insulating film 145 formed over the semiconductor film 141 and the conductive films 143a and 143b, and a conductive film 147 formed over the insulating film 145. The conductive films 143a and 143b have functions of a source electrode and a drain electrode. The insulating film 145 has a function of a gate insulating film. The conductive film 147 has a function of a gate electrode.

Figure 14:
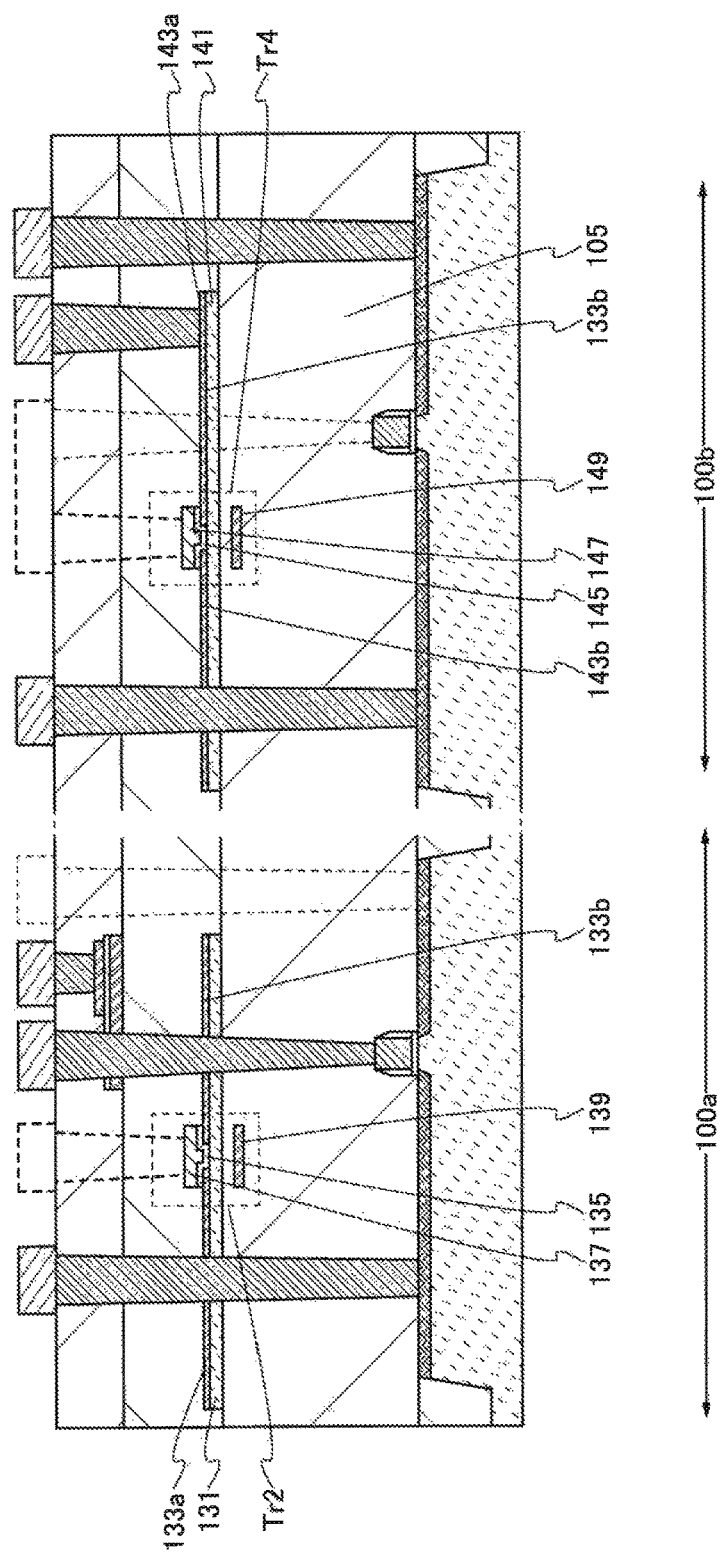
FIG. 14 is a cross-sectional view illustrating one embodiment of a semiconductor device.

Although the transistors Tr2 and Tr4 are described as single-gate transistors here, the transistors Tr2 and Tr4 can be dual-gate transistors as illustrated in FIG. 14. In that case, the transistor Tr2 includes a conductive film 139 having a function of a gate electrode in the insulating film 105 and in a position overlapping with the semiconductor film 131 and the conductive film 137. The transistor Tr4 includes a conductive film 149 having a function of a gate electrode in the insulating film 105 and in a position overlapping with the semiconductor film 141 and the conductive film 147.

By applying different voltages to the conductive films 137 and 139, the threshold voltage of the transistor Tr3 can be controlled. Furthermore, by applying different voltages to the conductive films 147 and 149, the threshold voltage of the transistor Tr4 can be controlled.

The inverter circuit 100b also includes a conductive film 161c, a conductive film 161d, a conductive film 163b, a conductive film 165, and a conductive film 167b. The conductive film 161c is connected to the impurity region 127a of the transistor Tr3 and the semiconductor film 141 and the conductive film 143a of the transistor Tr4. The conductive film 161d is connected to the impurity region 127b of the transistor Tr3. The conductive film 163b is connected to the conductive film 125 of the transistor Tr3 and the semiconductor film 141 and the conductive film 143b of the transistor Tr4. The conductive film 165 is connected to the conductive film 143b of the transistor Tr4. The conductive film 167b is connected to the conductive film 147 of the transistor Tr4. The conductive films 161c, 161d, 163b, 165, and 167b each have a function of a plug. Note that since not existing on a plane illustrated in FIG. 1, the conductive films 163b and 167b are shown by dashed lines.

The conductive film 161c is formed in an opening portion of the insulating film 105, the semiconductor film 141, the conductive film 143a, the insulating film 107, and the insulating film 109. The conductive film 161d is formed in an opening portion of the insulating films 105, 107, and 109. The conductive film 163b is formed in an opening portion of the insulating film 105, the semiconductor film 141, the conductive film 143b, the insulating film 107, and the insulating film 109. The conductive film 165 is formed in an opening portion of the insulating films 107 and 109. The conductive film 167b is formed in an opening portion of the insulating films 107 and 109.

A conductive film 171c, a conductive film 171d, a conductive film 175, and a conductive film 177b are formed over the insulating film 109. The conductive film 171c is connected to the conductive film 161c. The conductive film 171d is connected to the conductive film 161d. The conductive film 175 is connected to the conductive film 165. The conductive film 177b is connected to the conductive films 163b and 167b. The conductive films 171c, 171d, 175, and 177b each have a function of a wiring. Note that since not existing on a plane illustrated in FIG. 1, the conductive film 177b is shown by a dashed line.

In the inverter circuit 100b, some components of the transistors Tr3 and Tr4 are connected with the conductive films. The conductive films are formed through not only the insulating films but also the semiconductor films and the conductive films which are the components of the transistors. For this reason, the transistors Tr3 and Tr4 can partly or entirely overlap with each other. Accordingly, the semiconductor device can be highly integrated.

To manufacture the semiconductor device of this embodiment, after transistors are stacked, conductive films each having a function of a plug are selectively formed so that some components of the transistors are electrically connected to each other. In addition, wirings for connecting the plugs are formed. As a result, circuits each having a function can be formed. The plugs and the wirings can be formed as appropriate in accordance with a circuit design diagram to form an arbitrary circuit. Thus, masks designed for each semiconductor device are unnecessary, which increases the circuit design flexibility in the semiconductor device.

The transistors Tr1 and Tr3 have the same conductivity type and are p-channel transistors here. The transistors Tr2 and Tr4 have the same conductivity type and are n-channel transistors here. The transistor Tr2 is stacked over the transistor Tr1 and the transistor Tr4 is stacked over the transistor Tr3. In other words, the p-channel transistors and the n-channel transistors are formed in different tiers. Accordingly, in order that the electric characteristics of the transistor can be improved, the materials for the gate electrode and the gate insulating film can be appropriately selected depending on the conductivity type of the transistor. Moreover, since the transistors are stacked, the semiconductor device can be highly integrated.

The transistors Tr1 and Tr3 are formed using a semiconductor substrate, for example, and the channel regions 119 and 129 are formed in the semiconductor substrate. Alternatively, although not illustrated, the transistors Tr1 and Tr3 may each be a thin film transistor or a transistor in which a semiconductor film is provided over a substrate and a channel region is formed in the semiconductor film. As the semiconductor substrate, a single crystal semiconductor substrate or a polycrystalline semiconductor substrate of silicon, germanium, or the like; a compound semiconductor substrate of silicon germanium, silicon carbide, gallium arsenide, aluminum gallium arsenide, indium gallium arsenide, gallium nitride, indium phosphide, zinc oxide, gallium oxide, or the like; a silicon on insulator (SOI) substrate; or the like can be used. As the semiconductor film, a silicon film, an oxide semiconductor film, or the like can be used. The semiconductor film can have an amorphous structure, a polycrystalline structure, a single crystal structure, or any other crystal structures, as appropriate.

The impurity regions 117a, 117b, 127a, and 127b, the insulating films 113 and 123, and the conductive films 115 and 125 included in the transistors Tr1 and Tr3 can be formed using materials for an impurity region, an insulating film, and a conductive film included in any of a variety of metal-oxide-semiconductor field-effect transistors (MOSFETs), as appropriate.

To prevent leakage current in the transistors Tr1 and Tr3, the insulating films 113 and 123 are preferably formed using a high-k material. As the high-k material, hafnium oxide, yttrium oxide, hafnium silicate (HfSi$_x$O$_y$ (x>0, y>0)), hafnium silicate to which nitrogen is added (HfSi$_x$O$_x$N$_y$ (x>0, y>0)), hafnium aluminate (HfAl$_x$O$_y$ (x>0, y>0)), or the like can be given. Hafnium silicate to which nitrogen is added and hafnium aluminate are not crystallized even by heat treatment at a high temperature of 550° C. or higher. Thus, aggregation of carbon, which becomes a leakage path, can be prevented.

The conductive films 115 and 125 can be formed using any of conductive materials for a gate electrode, such as a metal material, an alloy material, and a metal oxide material. It is also possible to use a stack including a titanium nitride film and a polycrystalline silicon film to which impurities imparting a conductivity type are added, or a stack including a titanium nitride film, a tantalum film, a titanium nitride film, a titanium-aluminum alloy film, and a titanium nitride film.

The insulating film 105 can be formed using a silicon oxide film, a silicon oxynitride film, a silicon nitride film, a silicon nitride oxide film, an aluminum oxide film, an aluminum oxynitride film, a gallium oxide film, a gallium oxynitride film, a yttrium oxide film, a yttrium oxynitride film, a hafnium oxide film, or a hafnium oxynitride film. Alternatively, the insulating film 105 can be formed using a heat-resistant organic material such as polyimide, acrylic, a benzocyclobutene-based resin, polyamide, or epoxy. Other than the above organic materials, silicon oxide to which carbon is added (SiOC), silicon oxide to which fluorine is added (SiOF), tetraethylorthosilicate (TEOS) which is silicon oxide made from Si(OC$_2$H$_5$)$_4$, a low-dielectric constant material (low-k material), a siloxane-based resin, phosphorus glass (PSG), phosphorus boron glass (BPSG), and the like can also be used.

Note that in the insulating film 105, it is preferred to provide an insulating film that releases hydrogen by heat, as a typical example, a silicon nitride film containing hydrogen, so as to be in contact with the transistors Tr2 and Tr4. By heat treatment in the manufacturing process of the semiconductor device, the channel regions 119 and 129 can be hydrogenated. As a result, defects (dangling bonds) in the channel regions can be repaired (terminated with hydrogen).

In the insulating film 105, an insulating film that releases oxygen by heat may be provided so as to be in contact with the semiconductor films 131 and 141 of the transistors Tr2 and Tr4. The insulating film that releases oxygen by heat can be formed by adding one or more of an oxygen radical, an oxygen atom, an oxygen atomic ion, and an oxygen molecular ion to an oxide film. Examples of a method for adding one or more of an oxygen radical, an oxygen atom, an oxygen atomic ion, and an oxygen molecular ion to the oxide film include an ion doping method, an ion implantation method, and plasma treatment.

For the semiconductor films 131 and 141 included in the transistors Tr2 and Tr4, silicon or a wide-gap semiconductor can be used, for example. Examples of a wide-gap semiconductor include SiC, GaN, and an oxide semiconductor. The semiconductor films 131 and 141 of the transistors Tr2 and Tr4 are formed using a wide-gap semiconductor, whereby off-state leakage currents of the transistors Tr2 and Tr4 can be reduced.

Note that since SiC and GaN are single crystals, it is difficult to stack a plurality of transistors formed using SiC or GaN in some cases. Furthermore, in the case where a transistor is formed using SiC or GaN, heat treatment at a temperature of 1000° C. or higher is necessary in the fabrication process, and in addition, a large single crystal substrate might be difficult to fabricate. For these reasons, it might be difficult to form the semiconductor device including the transistors Tr2 and Tr4 using a large substrate of glass or the like.

In contrast, a transistor formed using an oxide semiconductor can be formed by heat treatment at a temperature lower than 600° C. In addition, an oxide semiconductor film can be formed by a gas phase method; thus, transistors including the oxide semiconductor films can be stacked. Accordingly, a highly integrated semiconductor device can be manufactured.

As the oxide semiconductor film, an oxide semiconductor film containing In or Ga can be used. As a typical example, an In—Ga oxide film, an In—Zn oxide film, an In—Mg oxide film, a Zn—Mg oxide film, or an In-M-Zn oxide film (M is Al, Ti, Ga, Y, Zr, Sn, La, Ce, Mg, or Nd) can be given.

Note that one embodiment of the present invention is not limited thereto. Depending on cases or conditions, transistors such as the transistors Tr2 and Tr4 may be formed using any of a variety of semiconductors; for example, amorphous silicon, microcrystalline silicon, polycrystalline silicon, and single crystal silicon. Depending on cases or conditions, part of or the whole of the semiconductor films can be formed of SiC, GaN, or the like.

The detailed structures of the transistors Tr2 and Tr4 will be described in Embodiment 2.

The insulating film 107 can be formed using any of the materials for the insulating film 105 as appropriate.

The conductive film 151, the insulating film 153, and the conductive film 155 included in the capacitor Cs can be formed using any of materials for a conductive film and an insulating film included in any of a variety of capacitors, as appropriate.

The insulating film 109 can be formed using any of the materials for the insulating film 105 as appropriate.

Each of the conductive films 161a, 161b, 161c, 161d, 163a, 163b, 165, 167a, 167b, and 169 can be formed using a conductive material such as a metal material, an alloy material, or a metal oxide material. For example, each of the conductive films is formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. It is preferred that each of the conductive films 161a, 161b, 161c, 161d, 163a, 163b, 165, 167a, 167b, and 169 be formed using a high-melting-point material that has both heat resistance and conductivity, such as tungsten or molybdenum, and it is particularly preferred to use tungsten.

Figure 18:
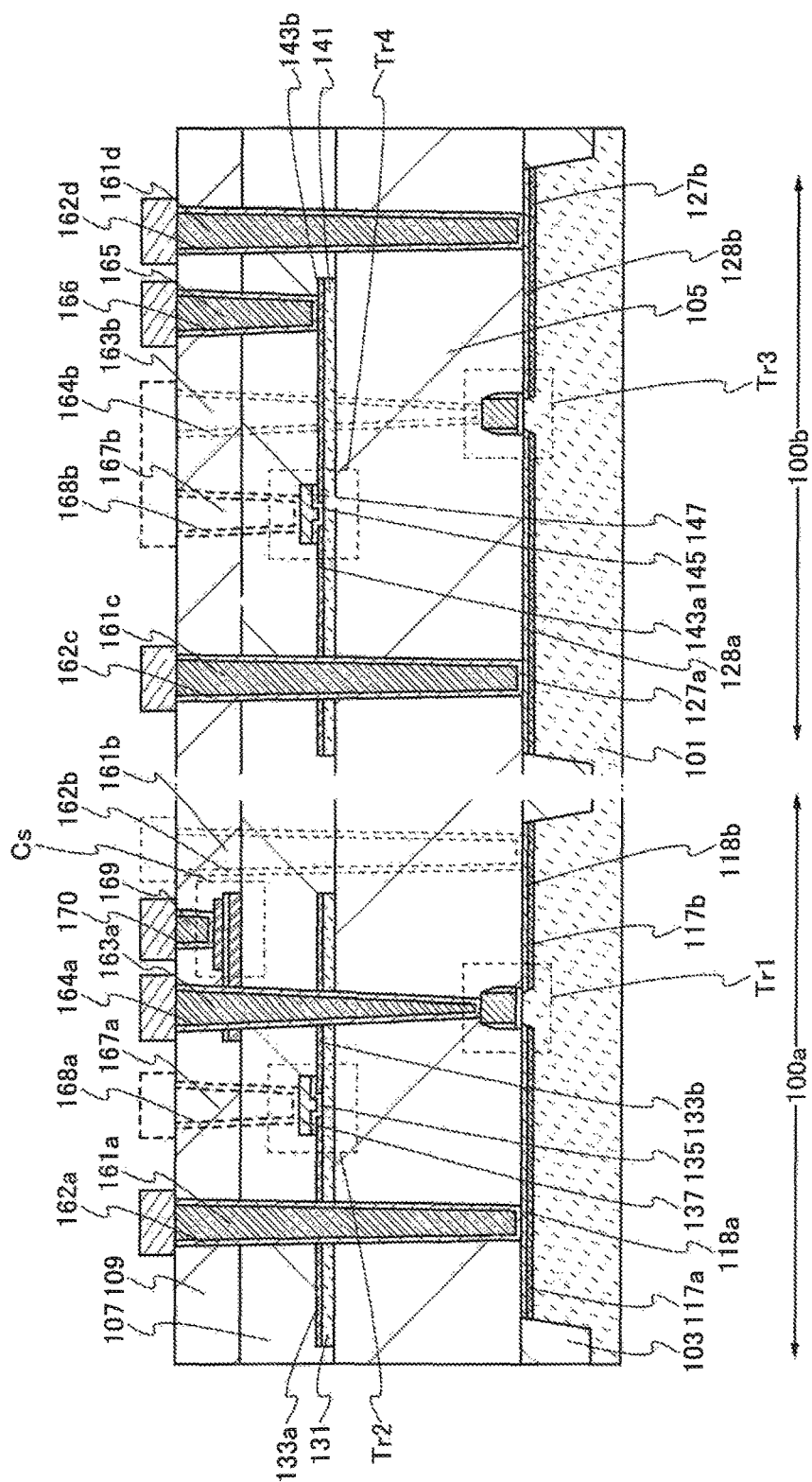
FIG. 18 is a cross-sectional view illustrating one embodiment of a semiconductor device.

As illustrated in FIG. 18, in the opening portions, barrier films 162a, 162b, 162c, 162d, 164a, 164b, 166, 168a, 168b, and 170 may be provided between the conductive films 161a, 161b, 161c, 161d, 163a, 163b, 165, 167a, 167b, and 169 and the insulating films 105, 107, and 109. Each of the barrier films 162a, 162b, 162c, 162d, 164a, 164b, 166, 168a, 168b, and 170 can be formed using a titanium film, a titanium nitride film, a tantalum nitride film, a molybdenum film, a molybdenum nitride film, or the like as appropriate. The barrier films 162a, 162b, 162c, 162d, 164a, 164b, 166, 168a, 168b, and 170 can prevent metal elements contained in the conductive films 161a, 161b, 161c, 161d, 163a, 163b, 165, 167a, 167b, and 169 from being diffused into the transistors Tr1, Tr2, Tr3, and Tr4 through the insulating films 105, 107, and 109. In addition, the adhesion of the conductive films 161a, 161b, 161c, 161d, 163a, 163b, 165, 167a, 167b, and 169 can be increased.

Furthermore, as illustrated in FIG. 18, silicide films 118a, 118b, 128a, and 128b may be provided over the impurity regions 117a, 117b, 127a, and 127b. Each of the silicide films can be formed using a nickel silicide film, a cobalt silicide film, a molybdenum silicide film, a tungsten silicide film, a titanium silicide film, or the like. The silicide films 118a, 118b, 128a, and 128b can reduce contact resistance; thus, a semiconductor device capable of high-speed operation can be manufactured.

Note that although not illustrated, silicide films can be provided over the conductive films 137 and 147 to reduce contact resistance.

In the case where the semiconductor films 131 and 141 are formed using oxide semiconductor films, low-resistance regions (n-type regions) might be formed in regions of the semiconductor films 131 and 141 which are in contact with the conductive films 133a, 133b, 143a, 143b, 161a, 161c, 163a, and 163b. Here, such cases are described with reference to FIGS. 22A to 22D, which are enlarged views of the transistor Tr2. Note that, in FIGS. 22A to 22D, the conductive films 167a and 177a are shown by solid lines for easy understanding.

Figures 22A, 22B, 22C, 22D:
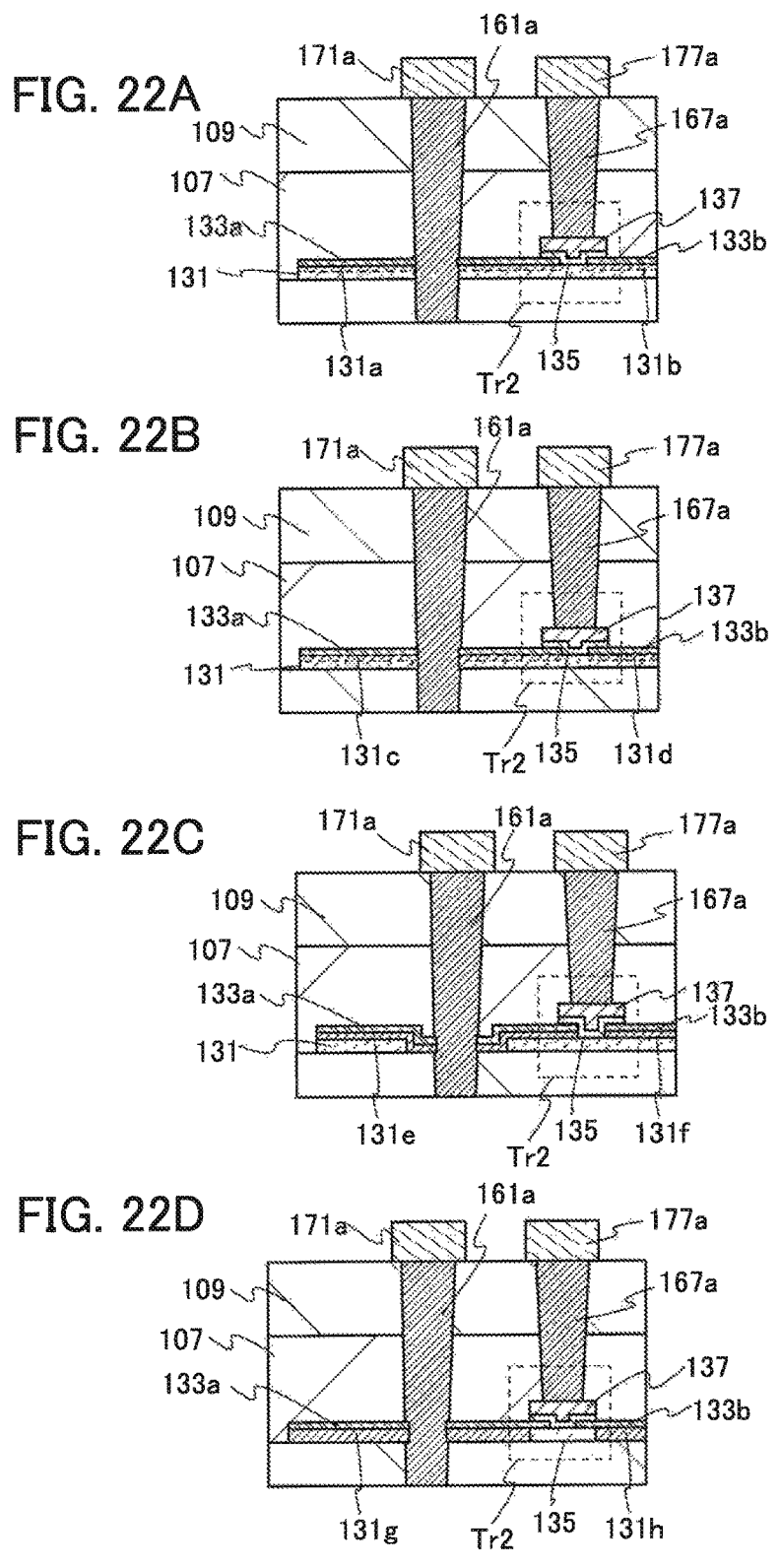

In the case where the conductive films 133a and 133b are formed using a conductive material that is easily bonded to oxygen, such as tungsten, titanium, aluminum, copper, molybdenum, chromium, tantalum, an alloy of any of these, or the like, oxygen contained in the semiconductor film 131 is bonded to the conductive material contained in the conductive films, and an oxygen vacancy region is formed in the semiconductor film 131 as illustrated in FIG. 22A. Note that the conductive material that is easily bonded to oxygen includes, in its category, a material to which oxygen is easily diffused. For these reasons, in some cases, some of constituent elements of the conductive material that is included in the conductive films 133a and 133b are mixed into the semiconductor film 131. Consequently, low-resistance regions (n-type regions) 131a and 131b are formed regions of the semiconductor film 131 which are in contact with the conductive films 133a and 133b. The low-resistance regions (n-type regions) serve as a source region and a drain region.

In the case where the conductive films 133a and 133b and the conductive film 161a are formed using a conductive material that is easily bonded to oxygen, low-resistance regions (n-type regions) 131c and 131d are formed in regions of the semiconductor film 131 which are in contact with the conductive films 133a and 133b and the conductive film 161a, as illustrated in FIG. 22B.

Alternatively, low-resistance regions (n-type regions) 131e and 131f may be provided between the semiconductor film 131 and the conductive films 133a and 133b as illustrated in FIG. 22C. The low-resistance regions 131e and 131f can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Note that an opening portion is formed in the semiconductor film 131 and the low-resistance region 131e and the conductive film 133a are stacked in the opening portion. The conductive film 161a is connected to the low-resistance region 131e and the conductive film 133a.

Alternatively, an impurity element may be added to the semiconductor film 131 using the conductive film 137 as a mask, so that low-resistance regions (n-type regions) 131g and 131h are formed as illustrated in FIG. 22D. As the impurity element, hydrogen, nitrogen, phosphorus, boron, a rare gas, or the like can be used.

Since the low-resistance regions (n-type regions) have high conductivity, contact resistance between the semiconductor film 131 and each of the conductive films 133a, 133b, and 161a can be reduced, and thus, the on-state current of the transistor can be increased.

The conductive films 171a, 171b, 171c, 171d, 173a, 175, 177a, 177b, and 179 can be formed using any of the materials and structures for the conductive films 161a, 161b, 161c, 161d, 163a, 163b, 165, 167a, 167b, and 169, as appropriate.

Figure 36:
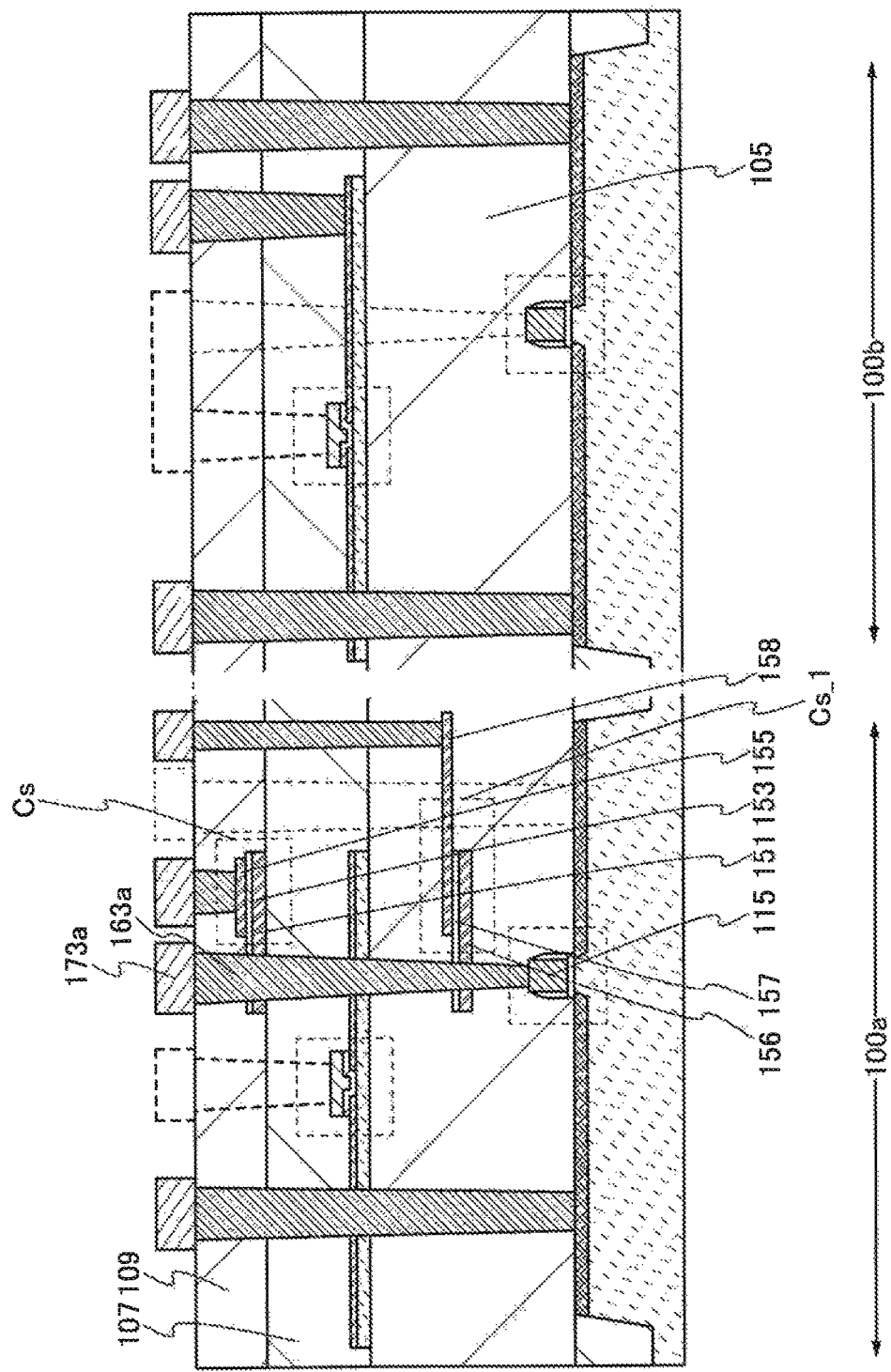
FIG. 36 is a cross-sectional view illustrating one embodiment of a semiconductor device.

As illustrated in FIG. 36, the capacitor Cs and a capacitor Cs_1 may be electrically connected to each other through the conductive film 163a. The capacitor Cs_1 includes a conductive film 156, an insulating film 157, and a conductive film 158. The conductive film 156 is connected to the conductive film 163*a*.

<Method for Manufacturing Semiconductor Device>

Next, methods for manufacturing the semiconductor device will be described with reference to FIG. 3 to FIG. 13, FIG. 15, and FIG. 16. Though not existing on a plane illustrated in these figures, some components may be shown by solid lines for easy understanding. Note that components of the transistors Tr1, Tr2, Tr3, and Tr4, the insulating films over the transistors Tr1, Tr2, Tr3, and Tr4, and the conductive films connected to the transistors Tr1, Tr2, Tr3, and Tr4 can be formed by any of a variety of methods as appropriate if not particularly described.

First, an example of a method for forming the transistors Tr1 and Tr3 that include part of the substrate 101 will be described.

Figure 3:
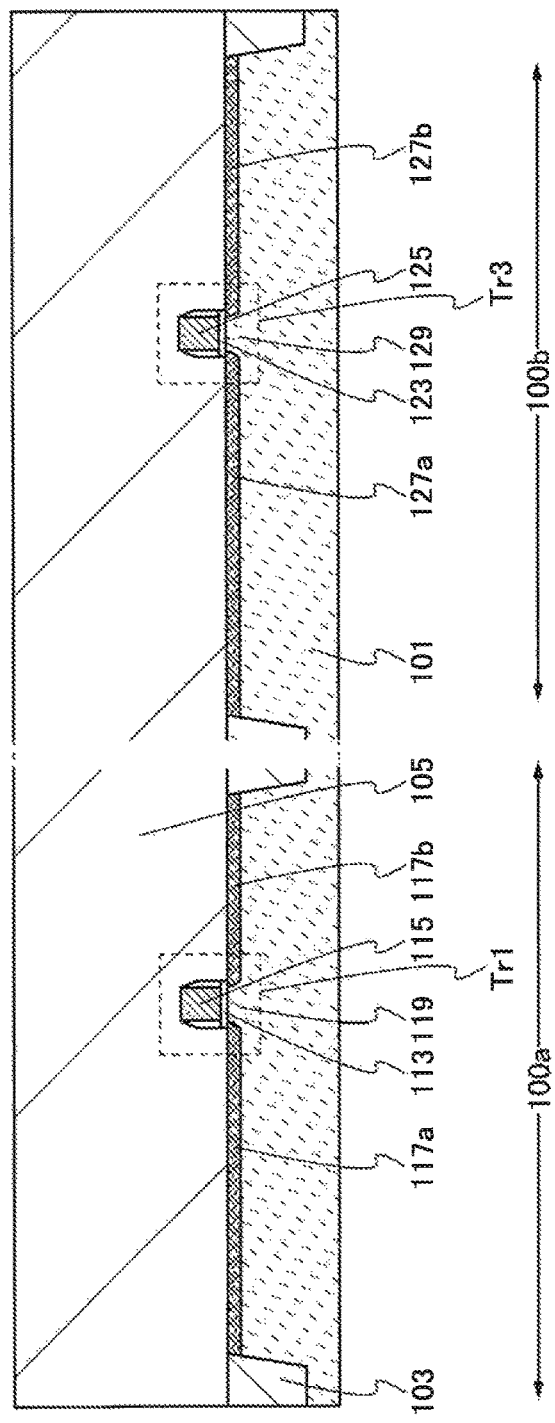
FIG. 3 is a cross-sectional view illustrating one embodiment of a method for manufacturing a semiconductor device.

A single crystal silicon substrate is used as the substrate 101, and an element formation region isolated with an insulating film 103 (also referred to as a field oxide film) is formed in the surface as illustrated in FIG. 3. The insulating film 103 having a function of an element separation region can be formed by local oxidation of silicon (LOCOS), shallow trench isolation (STI), or the like.

Next, an insulating film is formed on the substrate 101. For example, a surface of the substrate 101 is oxidized by heat treatment to form a silicon oxide film as the insulating film. After the silicon oxide film is formed, a surface of the silicon oxide film may be nitrided by nitriding treatment.

After that, a conductive film is formed so as to cover the insulating film.

Subsequently, a mask is formed over the conductive film. Then, the conductive film is selectively etched using the mask to form the conductive films 115 and 125 each having a function of a gate electrode over the insulating film.

Here, a method for processing a film is described. In the case of finely processing a film, a variety of fine processing techniques can be used. For example, a method may be used in which a resist mask formed by a lithography process or the like is subjected to slimming treatment. Alternatively, a method may be used in which a dummy pattern is formed by a lithography process or the like, the dummy pattern is provided with a sidewall and is then removed, and a film is etched using the remaining sidewall as a mask. In order to achieve a high aspect ratio, anisotropic dry etching is preferably used for etching of a film. Alternatively, a hard mask formed of an inorganic insulating film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use EUV light, X-rays, or an electron beam because extremely fine processing can be performed. Note that in the case of performing exposure by scanning of a beam such as an electron beam, a photomask is not needed.

An organic resin film having a function of improving adhesion between a film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In the case of fine processing, in particular, a material serving as a film having a function of preventing reflection of light for the exposure is preferably used for the organic resin film. Examples of the organic resin film having such a function include a bottom anti-reflection coating (BARC) film. The organic resin film may be removed when or after the removal of the resist mask.

Next, although not illustrated, an insulating film such as a silicon oxide film or a silicon nitride film covering the conductive films 115 and 125 may be formed and etched back so that sidewall insulating films are formed on side surfaces of the conductive films 115 and 125. After that, the insulating film over the substrate 101 is etched using the conductive films 115 and 125 as masks to form the insulating films 113 and 123 each having a function of a gate insulating film.

Then, an impurity element is added to the substrate 101, whereby the p-type impurity regions 117*a*, 117*b*, 127*a*, and 127*b* are formed. Here, in order to form p-channel transistors, an impurity element imparting p-type conductivity such as boron or gallium can be used as the impurity element.

In the above manner, the p-channel transistor Tr1 having the channel region 119 in the substrate 101 and the p-channel transistor Tr3 having the channel region 129 in the substrate 101 can be fabricated.

Figure 2A:
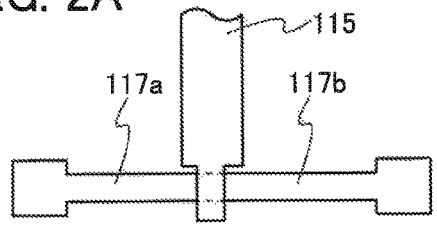
FIGS. 2A to 2J are each a top view illustrating one embodiment of a semiconductor device.
Figure 2B:
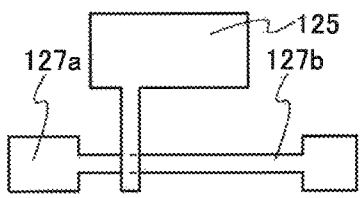

Note that FIGS. 2A and 2B are top views of the memory cell 100*a* and the inverter circuit 100*b*, respectively, at this stage.

Next, the insulating film 105 is formed over the transistors Tr1 and Tr3.

The insulating film 105 can be formed by a sputtering method, a chemical vapor deposition (CVD) method, a vacuum evaporation method, or a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used as well. As the thermal CVD method, a metal organic chemical vapor deposition (MOCVD) method or an atomic layer deposition (ALD) method may be used, for example. With the use of an ALD method, a film can have high coverage even with a small thickness.

In the case of using an oxide film as the insulating film 105, the oxide film can be formed in the following manner: a conductive film is formed and at least one of an oxygen radical, an oxygen atom, an oxygen atomic ion, and an oxygen molecular ion is added to the conductive film. The thickness of the conductive film can be greater than or equal to 5 nm and less than or equal to 50 nm, preferably greater than or equal to 10 nm and less than or equal to 20 nm. The conductive film with a thickness greater than or equal to 5 nm or preferably greater than or equal to 10 nm can reduce variation in a large substrate. Meanwhile, the conductive film with a thickness less than or equal to 50 nm or preferably less than or equal to 20 nm can increase the productivity. Examples of a method for adding one or more of an oxygen radical, an oxygen atom, an oxygen atomic ion, and an oxygen molecular ion include an ion doping method, an ion implantation method, and plasma treatment. In the case where an oxygen radical, an oxygen atom, an oxygen atomic ion, or an oxygen molecular ion is added to the conductive film, the amount of oxygen to be added can be increased by application of bias to a substrate side.

Note that the channel regions 119 and 129 may be hydrogenated in the following manner: an insulating film serving as part of the insulating film 105 is formed over the transistors Tr1 and Tr3, and heat treatment is performed at a temperature of 350° C. or higher and 650° C. or lower.

Figure 4:
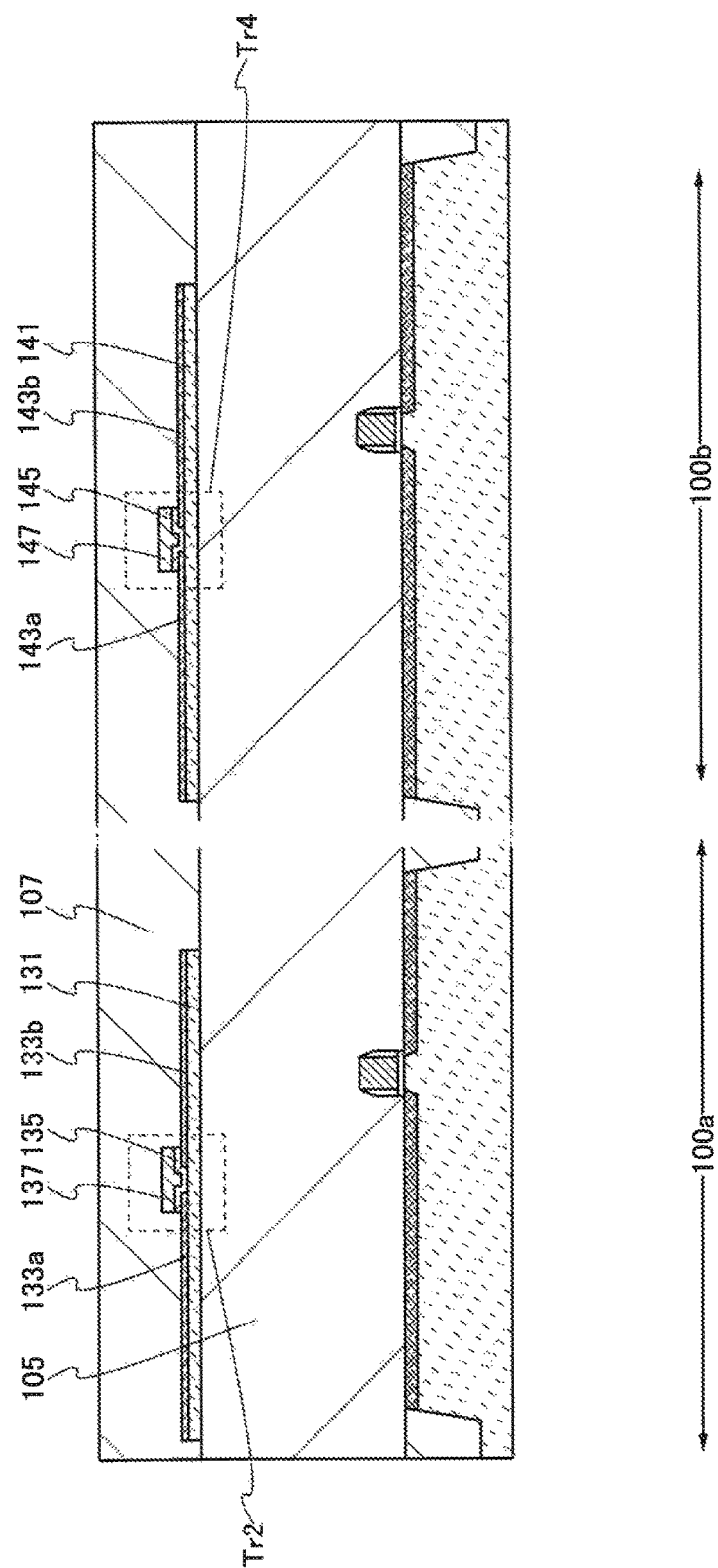
FIG. 4 is a cross-sectional view illustrating one embodiment of a method for manufacturing a semiconductor device.

As illustrated in FIG. 4, over the insulating film 105, the transistor Tr2 including the semiconductor film 131, the conductive films 133a and 133b, the insulating film 135, and the conductive film 137 is formed. Furthermore, the transistor Tr4 including the semiconductor film 141, the conductive films 143a and 143b, the insulating film 145, and the conductive film 147 is formed. Then, the insulating film 107 is formed over the transistors Tr2 and Tr4.

Methods for forming the transistors Tr2 and Tr4 will be described in Embodiment 2.

Figure 2C:
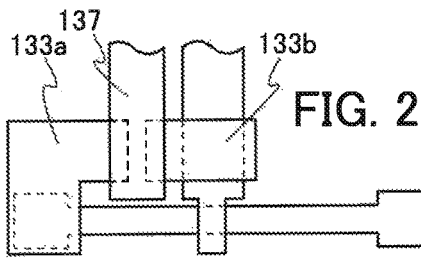
Figure 2D:
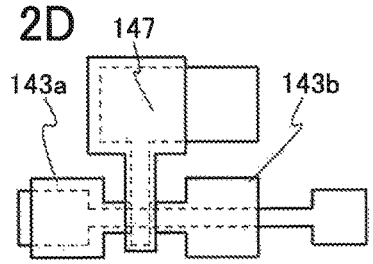

Note that FIGS. 2C and 2D are top views of the memory cell 100a and the inverter circuit 100b, respectively, at this stage.

The insulating film 107 can be formed by the method for forming the insulating film 105 as appropriate.

Figure 5:
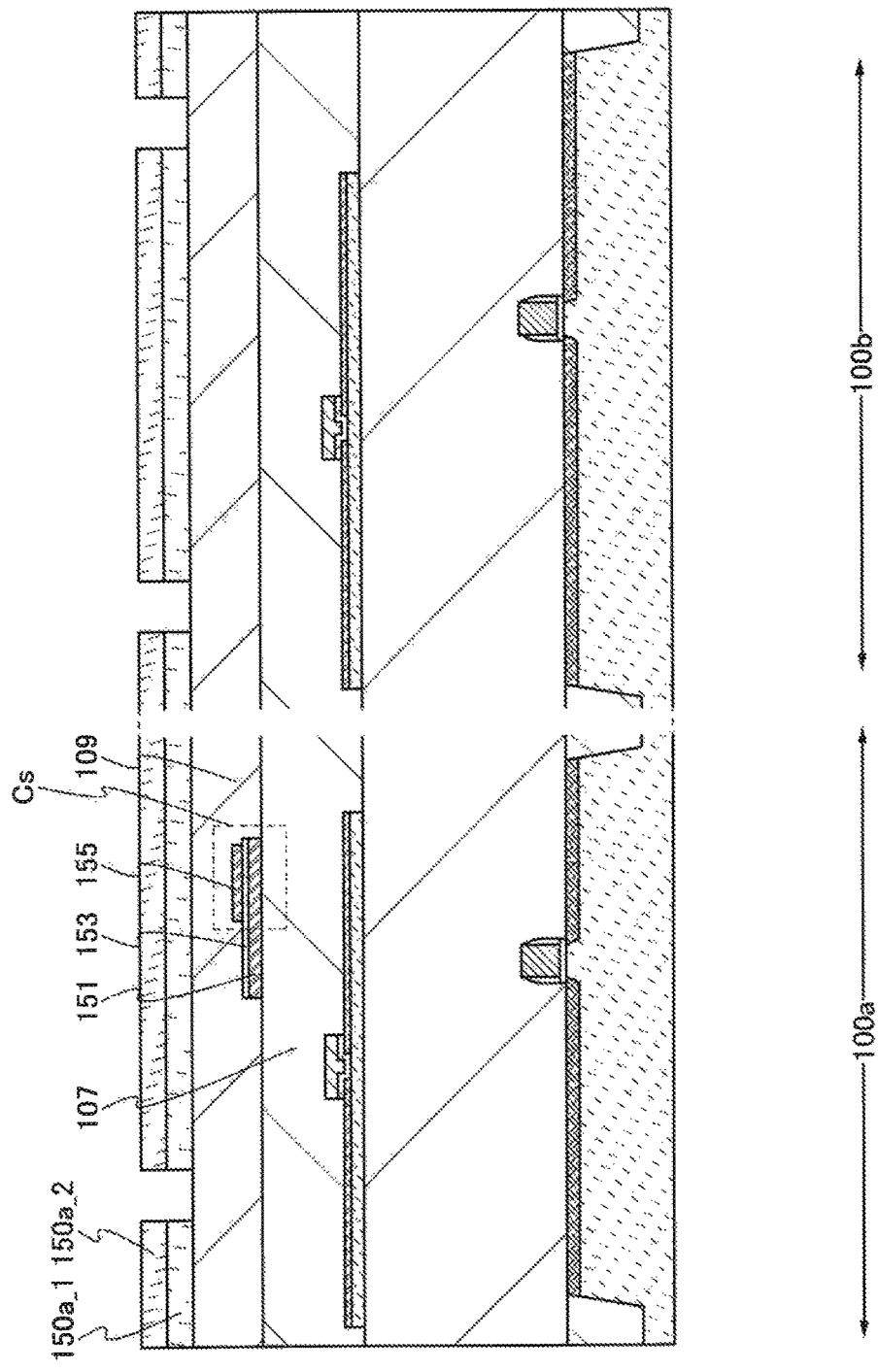
FIG. 5 is a cross-sectional view illustrating one embodiment of a method for manufacturing a semiconductor device.

Next, as illustrated in FIG. 5, the capacitor Cs is formed over the insulating film 107.

A conductive film is formed so as to cover the insulating film 107. Subsequently, a mask is formed over the conductive film. Then, the conductive film is selectively etched using the mask to form the conductive film 151 having a function of an electrode of the capacitor Cs over the insulating film 107.

Then, an insulating film is formed over the insulating film 107 and the conductive film 151. Subsequently, a mask is formed over the insulating film. After that, the insulating film is selectively etched to form the insulating film 153 having a function of a dielectric of the capacitor Cs over the conductive film 151.

After that, the conductive film 155 is formed over the insulating film 153 by a formation method similar to that of the conductive film 151.

Figure 2E:
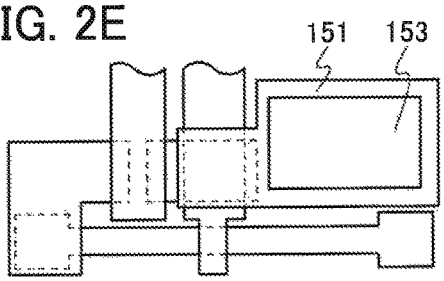
Figure 2F:
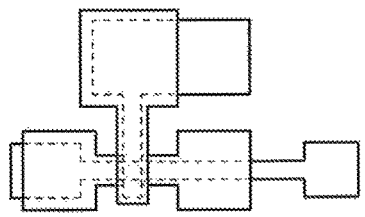

Note that FIGS. 2E and 2F are top views of the memory cell 100a and the inverter circuit 100b, respectively, at this stage.

Next, the insulating film 109 is formed over the insulating film 107 and the capacitor Cs.

The insulating film 109 can be formed by the method for forming the insulating film 105 as appropriate.

Then, a mask is formed over the insulating film 109.

In this embodiment, opening portions, which are formed later, each have a high aspect ratio. For this reason, the mask is preferably a stack including a hard mask 150a_1 and a resist mask 150a_2.

The hard mask 150a_1 can have a single-layer structure or a stacked-layer structure of any of insulating films such as a silicon nitride film, a silicon oxide film, and a silicon nitride oxide film, and conductive films such as a tungsten film. The resist mask 150a_2 can be formed by a lithography process.

Figure 6:
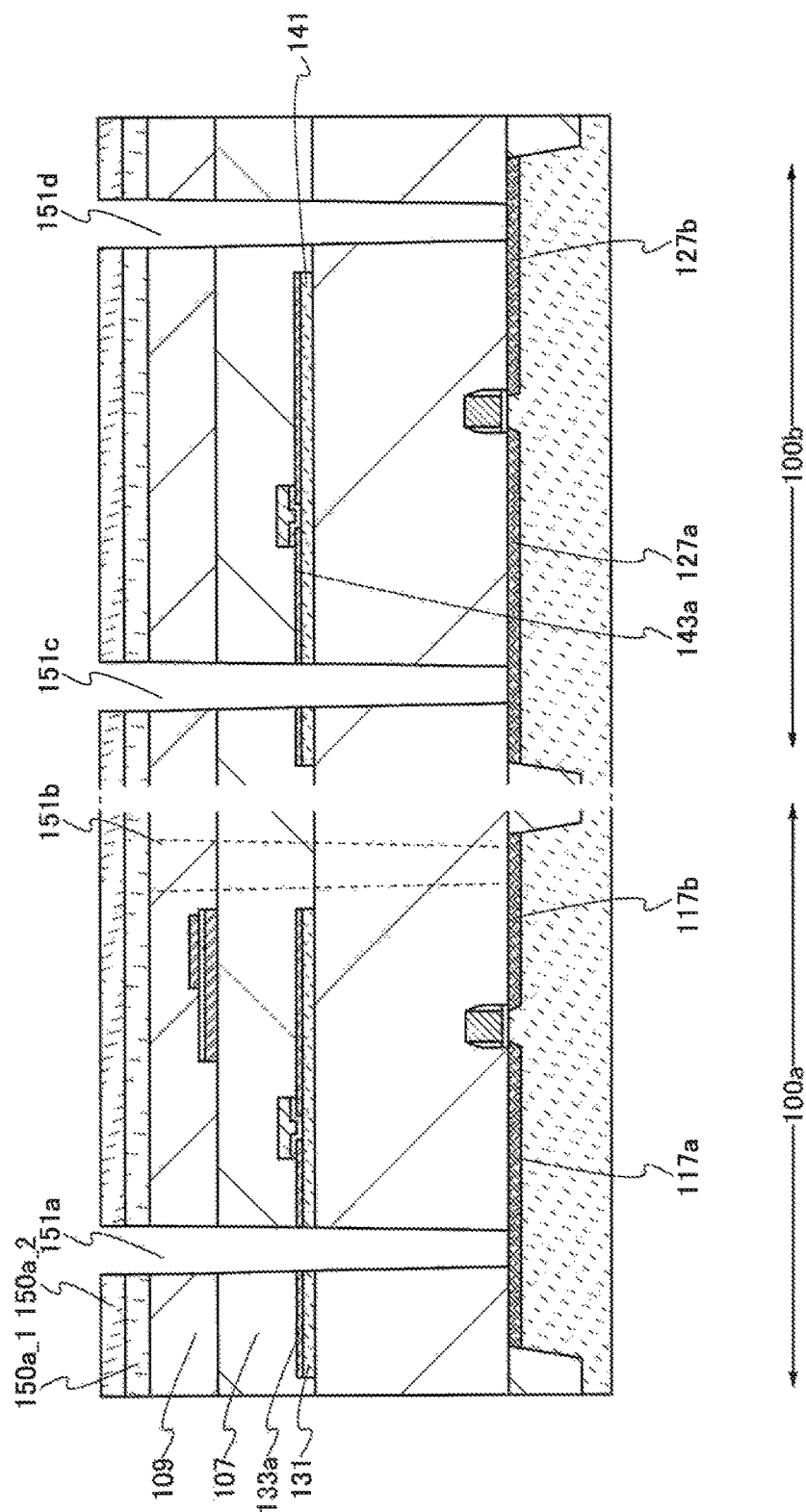
FIG. 6 is a cross-sectional view illustrating one embodiment of a method for manufacturing a semiconductor device.

Next, as illustrated in FIG. 6, the insulating films 105, 107, and 109, the semiconductor films 131 and 141, and the conductive films 133a and 143a are etched to form opening portions 151a, 151b, 151c, and 151d that expose the impurity regions 117a, 117b, 127a, and 127b. At this time, the etching rate of the resist mask 150a_2 is preferably lower than the etching rates of the insulating films 105, 107, and 109, the semiconductor films 131 and 141, and the conductive films 133a and 143a. When the etching rate of the resist mask 150a_2 is low, the opening portions can be prevented from extending in the lateral direction. Note that as etching gases for the silicon nitride film, a trifluoromethane ($CHF_3$) gas and a helium (He) gas can be used. As etching gases for the tungsten film, a chlorine ($Cl_2$) gas, a carbon tetrafluoride ($CF_4$) gas, and an oxygen ($O_2$) gas can be used. In the case of using an In—Ga—Zn oxide film as the semiconductor films 131 and 141, a trifluoromethane ($CHF_3$) gas and a helium (He) gas can be used as etching gases. Alternatively, a hexafluoro-1,3-butadiene ($C_4F_6$) gas and an argon (Ar) gas can be used. As etching gases for the silicon oxide film, a hexafluoro-1,3-butadiene ($C_4F_6$) gas and an argon (Ar) gas can be used. As an etching gas for the aluminum oxide film, a boron chloride ($BCl_3$) gas can be used.

Instead of the semiconductor films 131 and 141 and the conductive films 133a and 143a, the semiconductor films 131 and 141 and the conductive films 133a and 143a having opening portions 132 and 142 can be formed in advance in regions where the opening portions 151a, 151b, 151c, and 151d are to be formed, as illustrated in FIG. 20. In such a case, the number of kinds of etching gases that are used for forming the opening portions 151a, 151b, 151c, and 151d can be reduced, and throughput can be improved.

After that, the hard mask 150a_1 and the resist mask 150a_2 are removed.

Here, a method for forming a minute opening portion in a multilayer film including films formed of different materials will be described.

To form a minute opening portion, a parallel-plate etching apparatus is preferably used. Note that the etching apparatus may be provided with a high-density plasma generation source. The etching apparatus preferably includes a gas supply system 190 that allows an optimal etching gas for each film to be selected as appropriate. The etching apparatus may have a plurality of etching chambers.

To form a minute opening portion in the multilayer film including the films formed of different materials, one etching chamber may be used for etching. In this method, a gas to be introduced into the etching chamber is optimized for each film.

In the case where the multilayer film is etched in one etching chamber, etching products might be deposited on an etching chamber wall. When a plurality of kinds of etching products are deposited on the etching chamber wall, some of the products become particles and are scattered in the etching chamber. As a result, the particles are deposited on a substrate, which causes a decrease in yield.

When an etching apparatus having a plurality of etching chambers is used, films can be etched using their respective etching chambers; as a result, deposition of a plurality of kinds of particles can be prevented.

Figure 23:
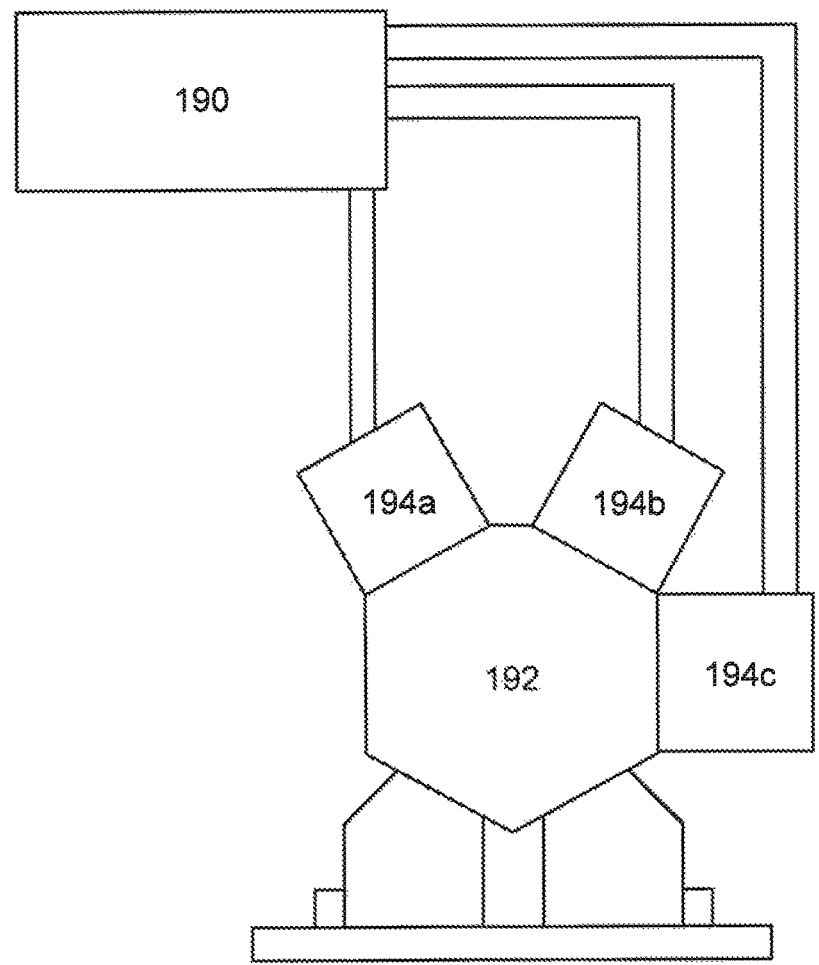
FIG. 23 is a schematic view illustrating one embodiment of an etching apparatus.

FIG. 23 illustrates an example of an etching apparatus with three etching chambers 194a, 194b, and 194c. The etching apparatus in FIG. 23 includes three etching chambers, a transfer chamber 192 intended for temporary standby of a substrate at the time of transferring the substrate to each etching chamber, the gas supply system 190 that supplies an etching gas or the like to each etching chamber, and a power supply system, a pump system, a gas removal system, and the like which are not illustrated.

Here, a method for etching the multilayer film with an etching apparatus illustrated in FIG. 23 will be described.

First, a substrate is inserted into the etching chamber 194a and the insulating films 109 and 107 are etched. Next, the substrate is inserted into the etching chamber 194b from the etching chamber 194a through the transfer chamber 192, and the conductive film 133a is etched. After that, the substrate is inserted into the etching chamber 194a from the etching chamber 194b in a manner similar to that described above, and the semiconductor film 131 and the insulating film 105 are etched. Subsequently, the substrate is transferred to the etching chamber 194c from the etching chamber 194a, and the resist mask 150a_2 is subjected to ashing. Note that in the case where the resist mask 150a_2 is removed in the etching step, ashing is not needed. Then, the substrate is transferred to the etching chamber 194a from the etching chamber 194c in a manner similar to that described above, so that the silicon nitride film of the hard mask 150a_1 is etched. Subsequently, the substrate is transferred to the etching chamber 194b from the etching chamber 194a in a manner similar to that described above, so that the tungsten film of the hard mask 150a_1 is etched.

In the etching apparatus having a plurality of etching chambers, the etching chambers and the transfer chamber 192 are in vacuum. This means that the substrate is not exposed to the air atmosphere even when being transferred to a different etching chamber, which allows etching with high repeatability. Furthermore, an etching chamber is selected depending on the material of the film, whereby time for etching treatment can be shortened and production efficiency can be improved.

In addition, with the use of the etching apparatus having a plurality of chambers, a plurality of substrates can be etched at the same time in different chambers; thus, production efficiency can be improved.

Figure 7:
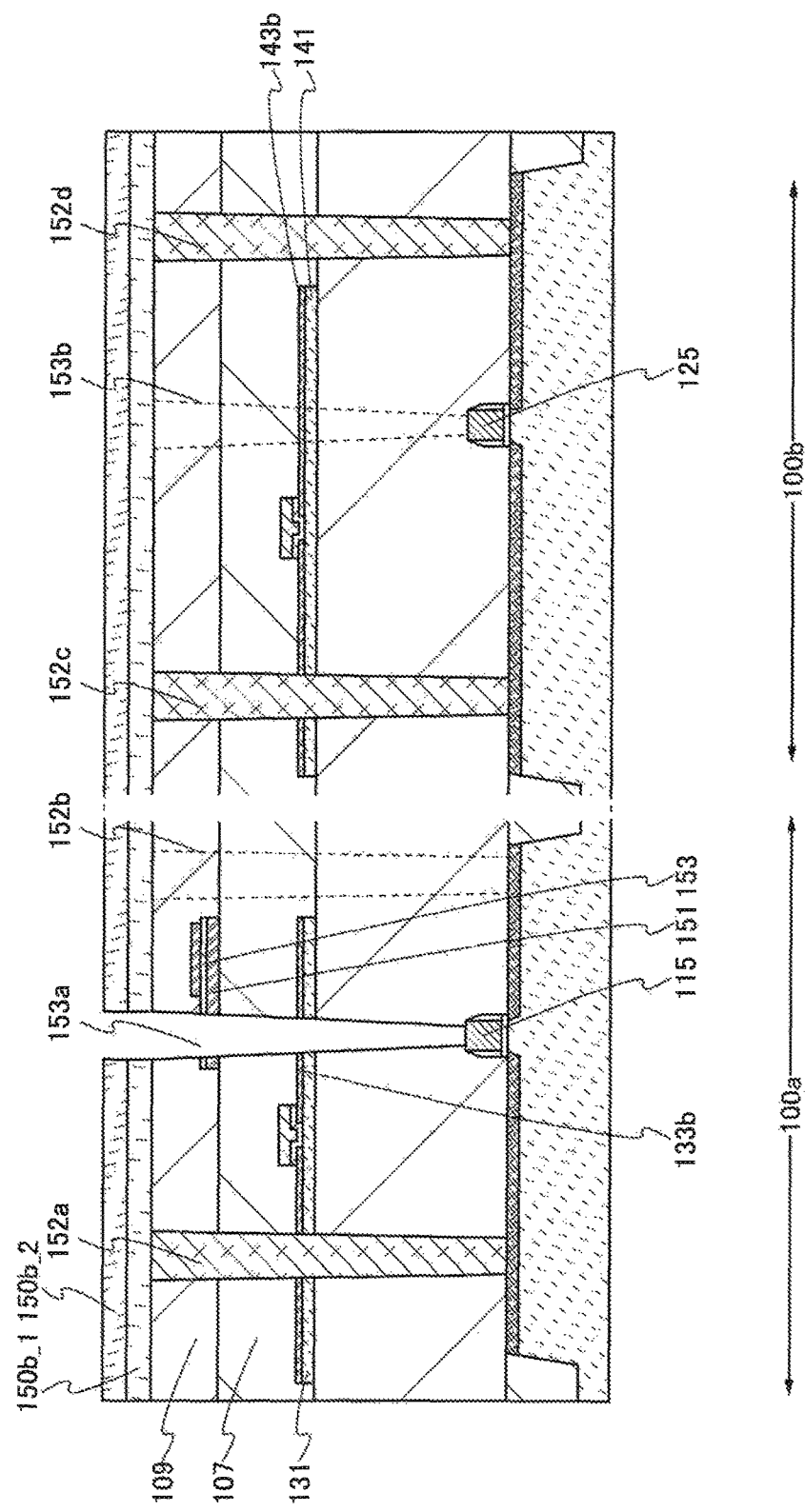
FIG. 7 is a cross-sectional view illustrating one embodiment of a method for manufacturing a semiconductor device.

Next, masks 152a, 152b, 152c, and 152d are preferably formed in the opening portions 151a, 151b, 151c, and 151d as illustrated in FIG. 7. The masks 152a, 152b, 152c, and 152d can prevent a hard mask and a resist mask from being formed in the opening portions in a later step. The masks 152a, 152b, 152c, and 152d can be formed using an organic resin film such as a BARC film.

Then, a mask is formed over the insulating film 109. Here, the mask is preferably a stack including a hard mask 150b_1 and a resist mask 150b_2.

The hard mask 150b_1 can be formed in a manner similar to that of the hard mask 150a_1. The resist mask 150b_2 can be formed in a manner similar to that of the resist mask 150a_2.

Next, the insulating films 105, 107, 109, and 153, the semiconductor films 131 and 141, and the conductive films 133b, 143b, and 151 are etched to form opening portions 153a and 153b that expose the conductive films 115 and 125. At this time, as in the formation step of the opening portions 151a, 151b, 151c, and 151d, the etching rate is preferably controlled so that the opening portions are prevented from extending in the lateral direction.

After that, the hard mask 150b_1 and the resist mask 1501:02 are removed.

Note that although the opening portions 151a, 151b, 151c, and 151d illustrated in FIG. 6 and the opening portions 153a and 153b illustrated in FIG. 7 are formed in different etching steps here, the opening portions 151a, 151b, 151c, 151d, 153a, and 153b can be formed in the same etching step.

Figure 8:
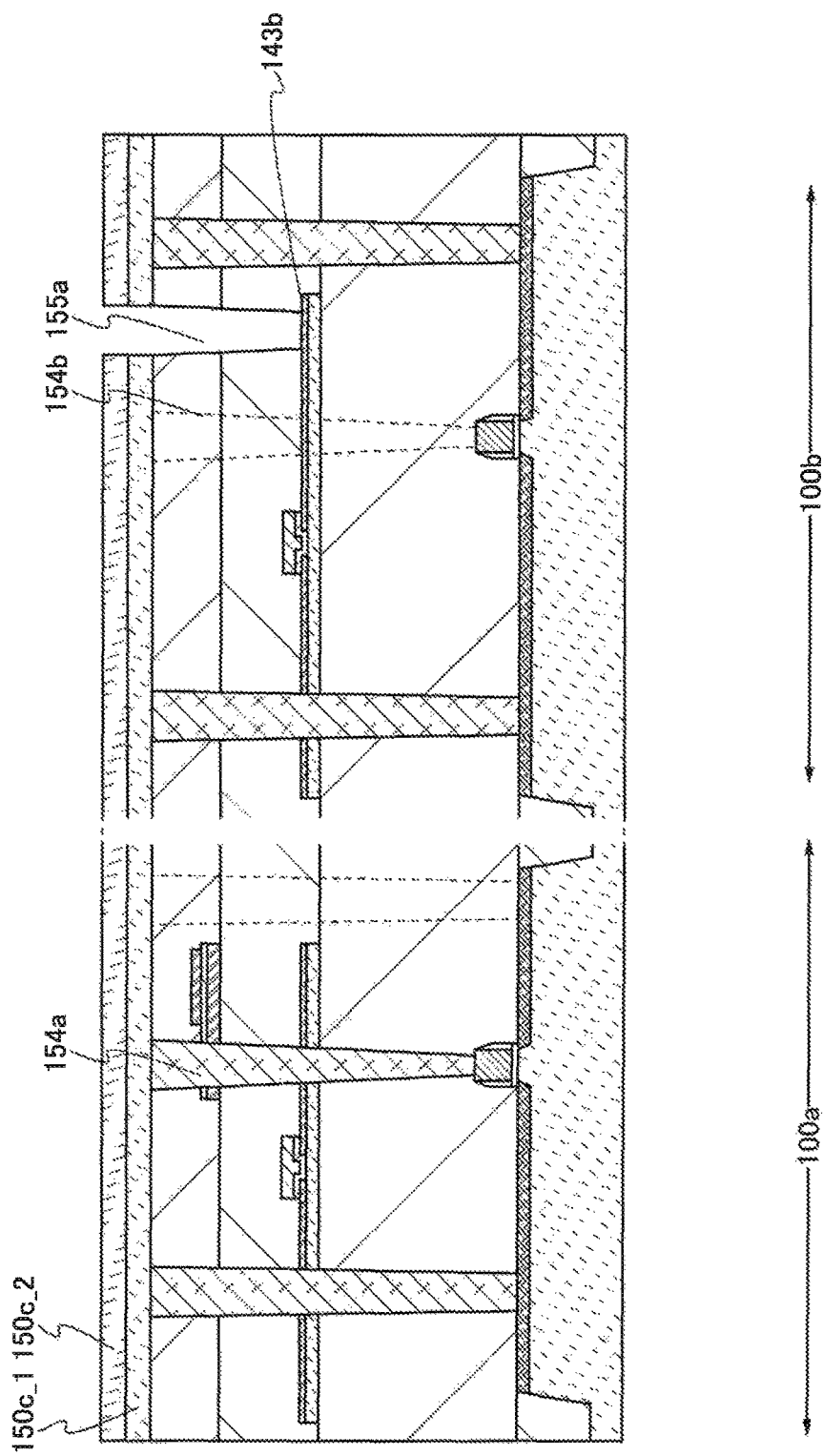
FIG. 8 is a cross-sectional view illustrating one embodiment of a method for manufacturing a semiconductor device.

Next, masks 154a and 154b are preferably formed in the opening portions 153a and 153b as illustrated in FIG. 8.

Subsequently, a mask is formed over the insulating film 109. Here, the mask is preferably a stack including a hard mask 150c_1 and a resist mask 150c_2.

The hard mask 150c_1 can be formed in a manner similar to that of the hard mask 150a_1. The resist mask 150c_2 can be formed in a manner similar to that of the resist mask 150a_2.

Next, the insulating films 107 and 109 are etched to form an opening portion 155a that exposes the conductive film 143b. At this time, as in the formation step of the opening portions 151a, 151b, 151c, and 151d, the etching rate is preferably controlled so that the opening portions are prevented from extending in the lateral direction.

After that, the hard mask 150c_1 and the resist mask 150c_2 are removed.

Figure 9:
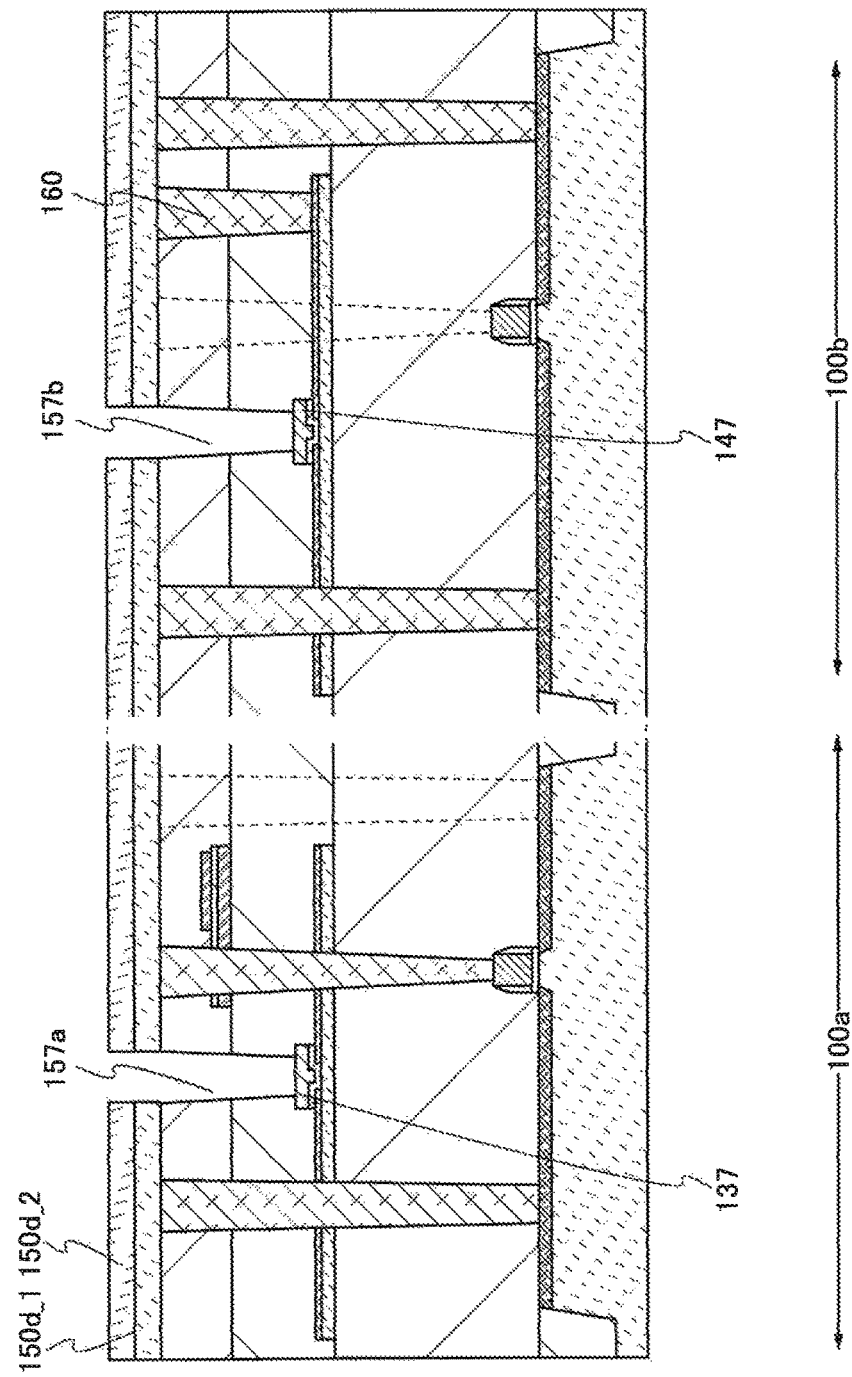
FIG. 9 is a cross-sectional view illustrating one embodiment of a method for manufacturing a semiconductor device.

Next, as illustrated in FIG. 9, a mask 160 is preferably formed in the opening portion 155a.

Subsequently, a mask is formed over the insulating film 109. Here, the mask is preferably a stack including a hard mask 150d_1 and a resist mask 150d_2.

The hard mask 150d_1 can be formed in a manner similar to that of the hard mask 150a_1. The resist mask 150d_2 can be formed in a manner similar to that of the resist mask 150a_2.

Next, the insulating films 107 and 109 are etched to form opening portions 157a and 157b that expose the conductive films 137 and 147. At this time, as in the formation step of the opening portions 151a, 151b, 151c, and 151d, the etching rate is preferably controlled so that the opening portions are prevented from extending in the lateral direction.

After that, the hard mask 150d_1 and the resist mask 150d_2 are removed.

Note that although the opening portion 155a illustrated in FIG. 8 and the opening portions 157a and 157b illustrated in FIG. 9 are formed in different etching steps here, the opening portions 155a, 157a, and 157b can be formed in the same etching step.

Figure 10:
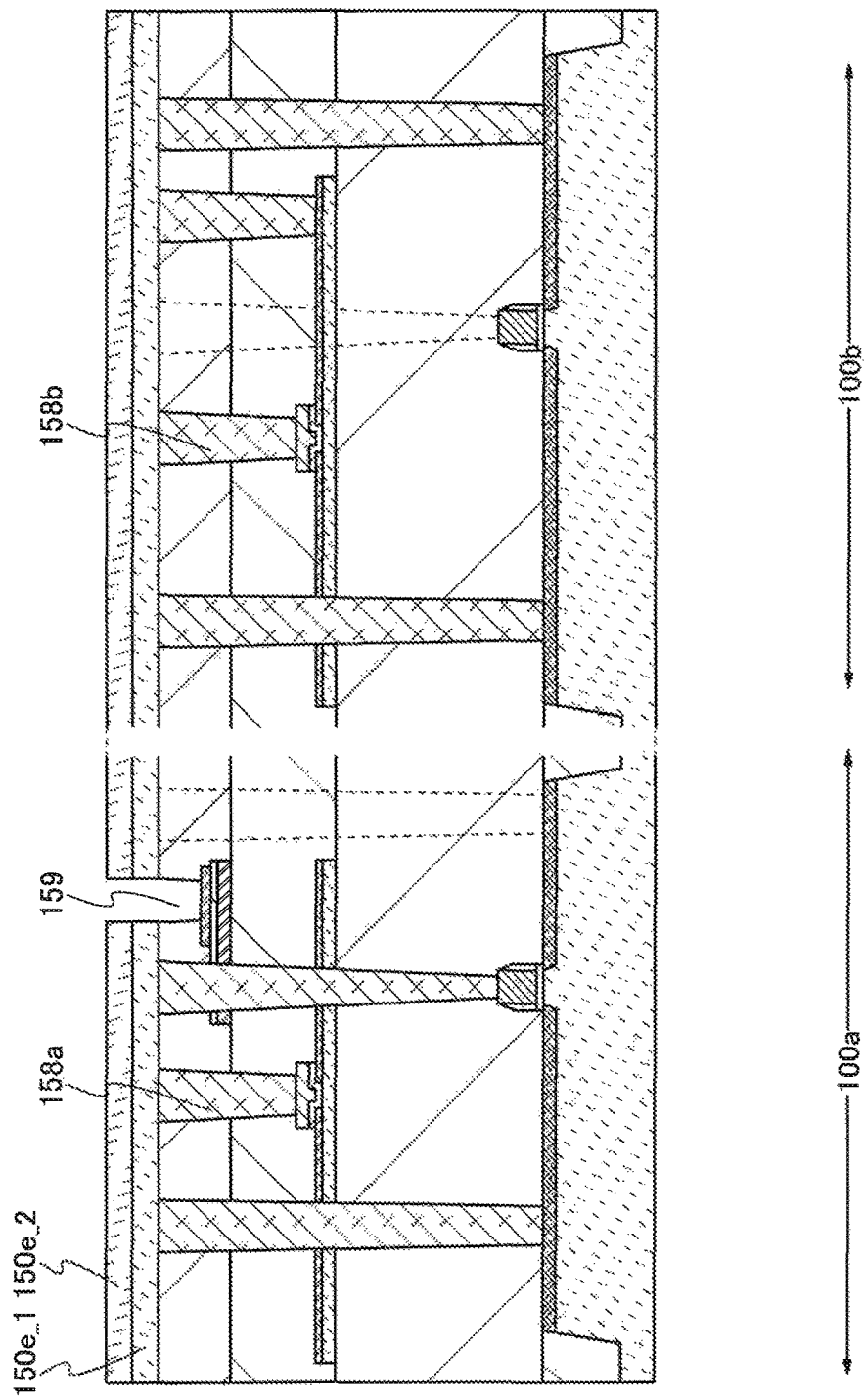
FIG. 10 is a cross-sectional view illustrating one embodiment of a method for manufacturing a semiconductor device.

Then, masks 158a and 158b are preferably formed in the opening portions 157a and 157b as illustrated in FIG. 10.

Subsequently, a mask is formed over the insulating film 109. Here, the mask is preferably a stack including a hard mask 150e_1 and a resist mask 150e_2.

The hard mask 150e_1 can be formed in a manner similar to that of the hard mask 150a_1. The resist mask 150e_2 can be formed in a manner similar to that of the resist mask 150a_2.

Next, the insulating film 109 is etched to form an opening portion 159 that exposes the conductive film 155. At this time, as in the formation step of the opening portions 151a, 151b, 151c, and 151d, the etching rate is preferably controlled so that the opening portions are prevented from extending in the lateral direction.

After that, the hard mask 150e_1 and the resist mask 150e_2 are removed.

Figure 11:
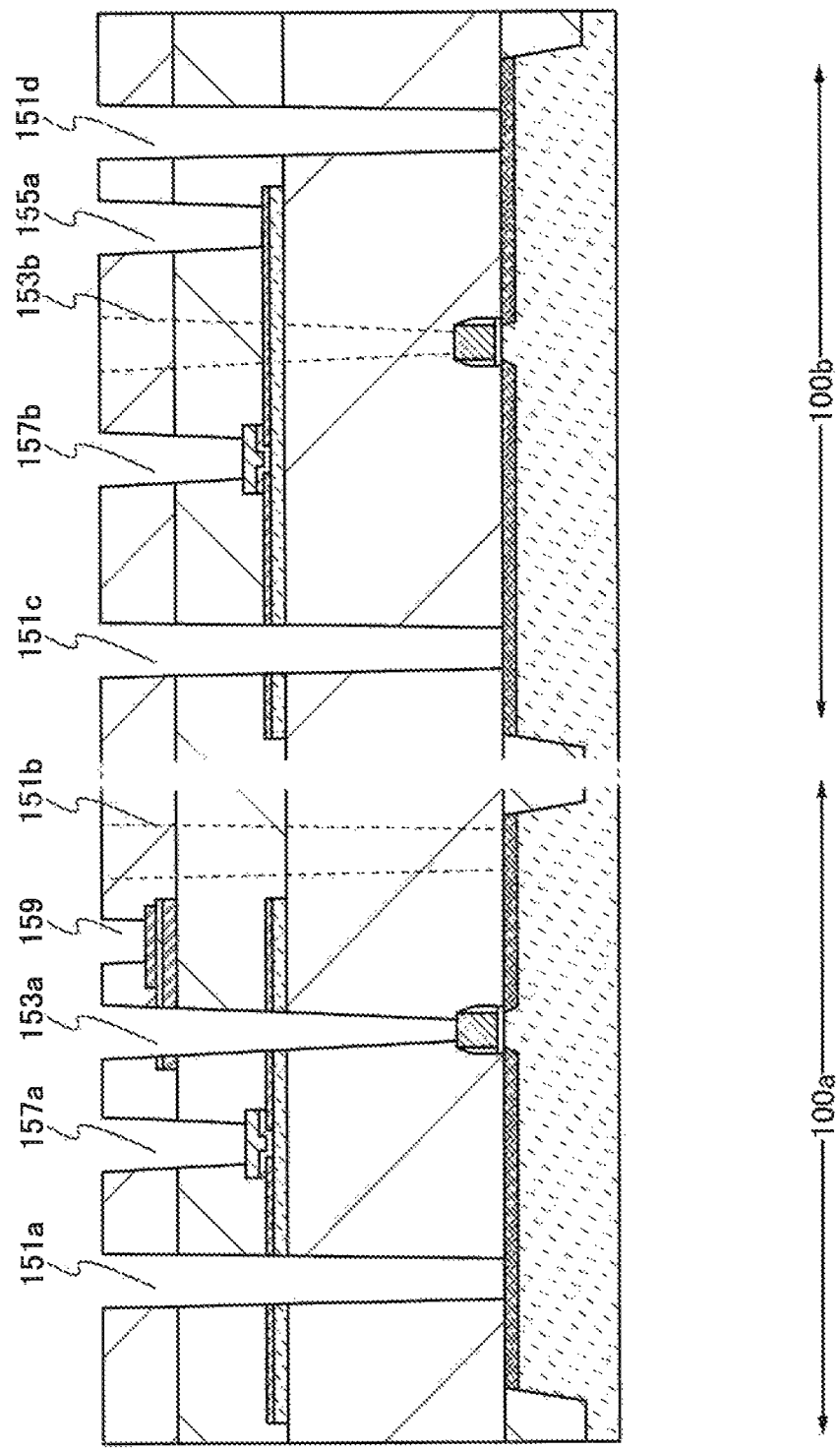
FIG. 11 is a cross-sectional view illustrating one embodiment of a method for manufacturing a semiconductor device.

Next, as illustrated in FIG. 11, the masks 152a, 152b, 152c, 152d, 154a, 154b, 160, 158a, and 158b formed in the opening portions 151a, 151b, 151c, 151d, 153a, 153b, 155a, 157a, and 157b are removed.

Figure 12:
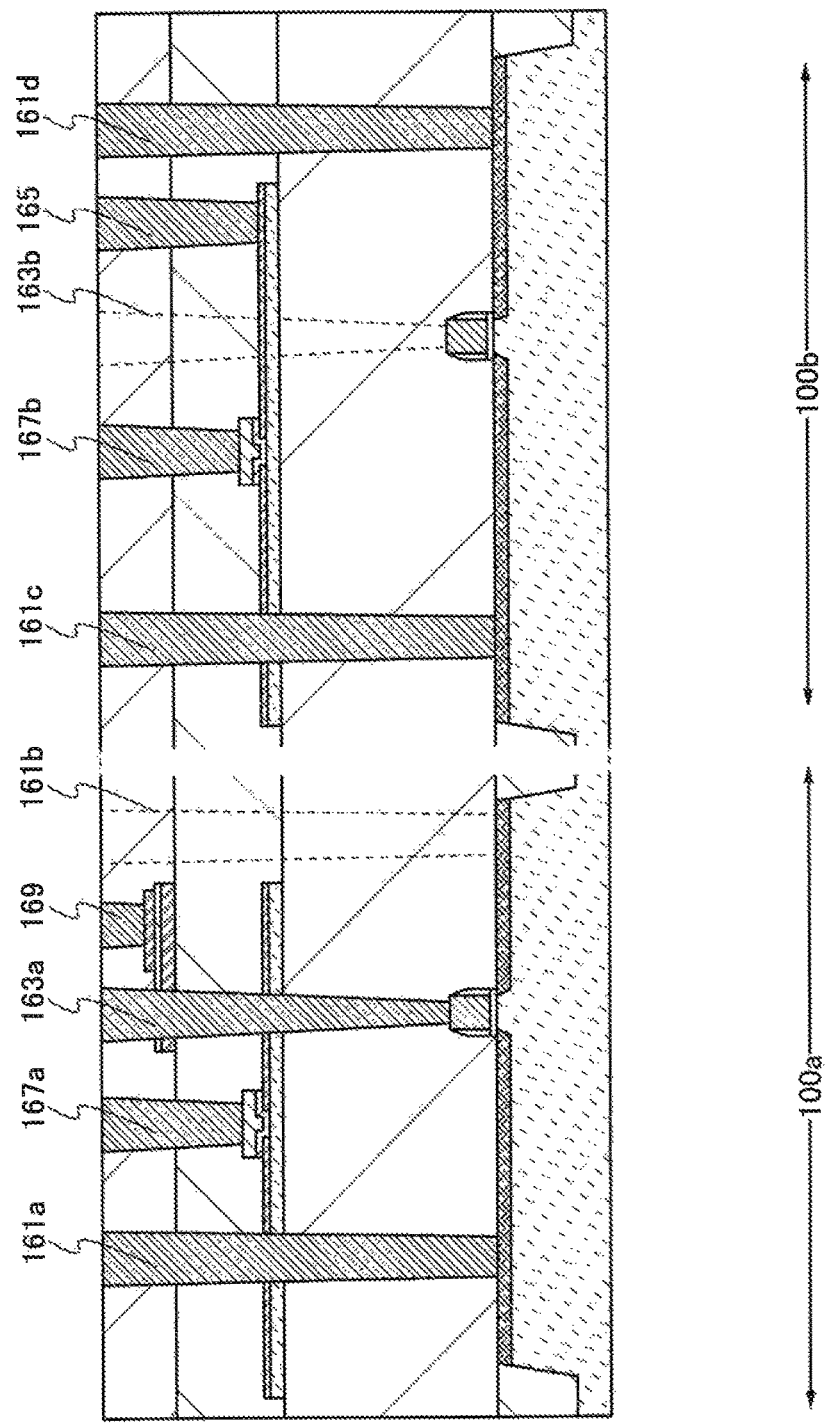
FIG. 12 is a cross-sectional view illustrating one embodiment of a method for manufacturing a semiconductor device.

Then, as illustrated in FIG. 12, the conductive films 161a, 161b, 161c, 161d, 163a, 163b, 165, 167a, 167b, and 169 each having a function of a plug are formed in the opening portions 151a, 151b, 151c, 151d, 153a, 153b, 155a, 157a, 157b, and 159.

The conductive films 161a, 161b, 161c, 161d, 163a, 163b, 165, 167a, 167b, and 169 can be formed in the following manner: a conductive film is formed by a sputtering method, a CVD method, an evaporation method, or the like so as to fill the opening portions, and part of the conductive film over the insulating film 109 is removed by a chemical mechanical polishing (CMP) method or an etching method. The conductive films 161a, 161b, 161c, 161d, 163a, 163b, 165, 167a, 167b, and 169 may be formed by a damascene method.

Figure 2G:
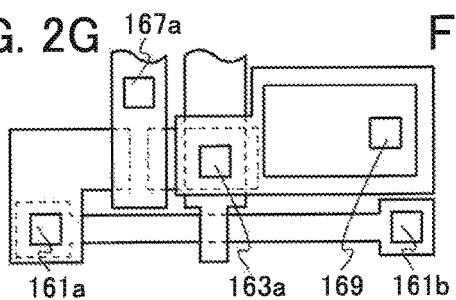
Figure 2H:
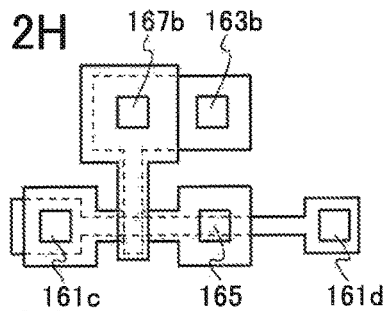

Note that FIGS. 2G and 2H are top views of the memory cell 100a and the inverter circuit 100b, respectively, at this stage.

Figure 13:
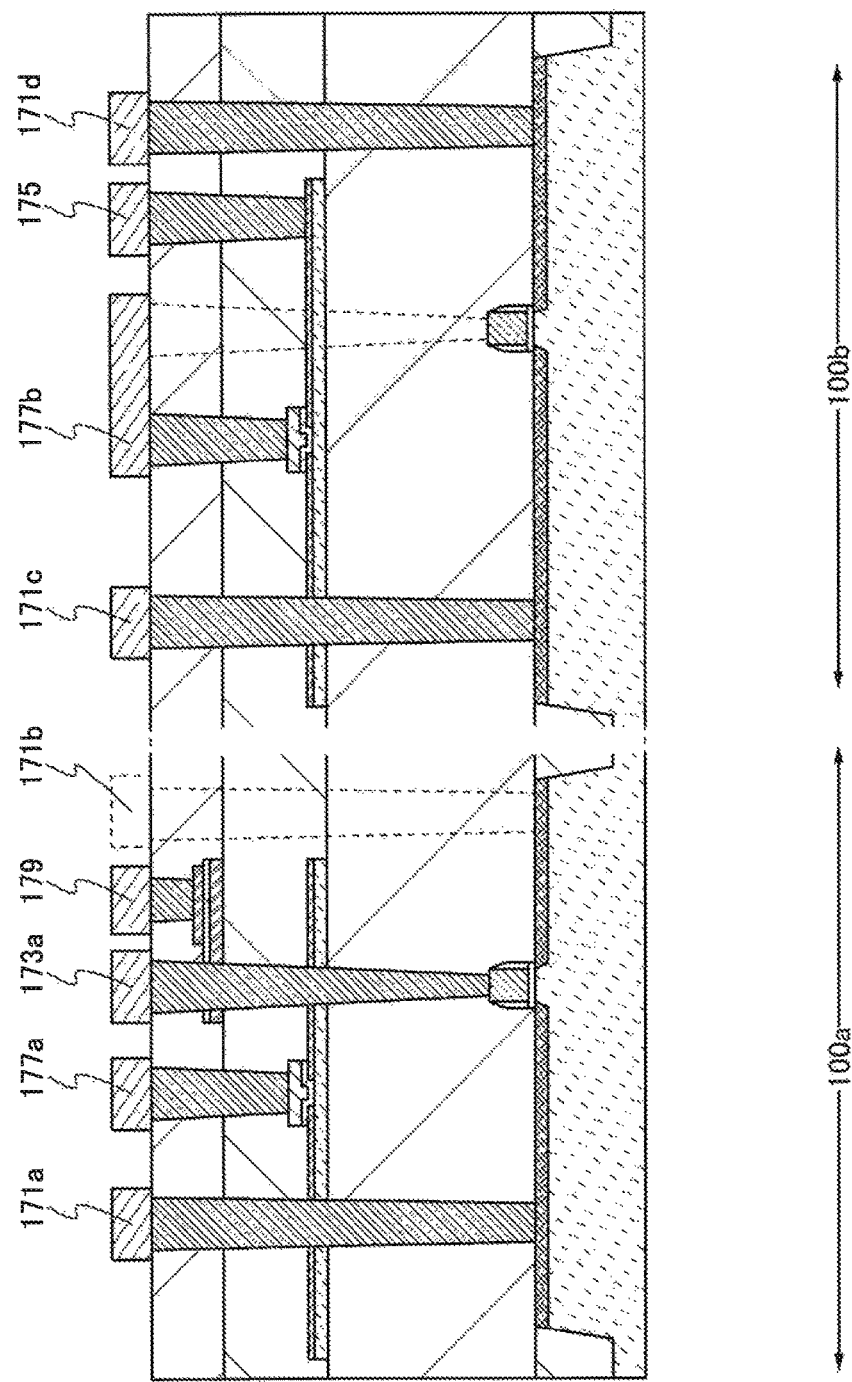
FIG. 13 is a cross-sectional view illustrating one embodiment of a method for manufacturing a semiconductor device.

Then, as illustrated in FIG. 13, the conductive films 171a, 171b, 171c, 171d, 173a, 175, 177a, 177b, and 179 each having a function of a wiring are formed over the insulating film 109 and the conductive films 161a, 161b, 161c, 161d, 163a, 163b, 165, 167a, 167b, and 169.

A conductive film is formed so as to cover the insulating film 109. After that, a mask is formed over the conductive film and then, the conductive film is selectively etched. In this manner, the conductive films 171a, 171b, 171c, 171d, 173a, 175, 177a, 177b, and 179 can be formed over the insulating film 109.

Figure 2I:
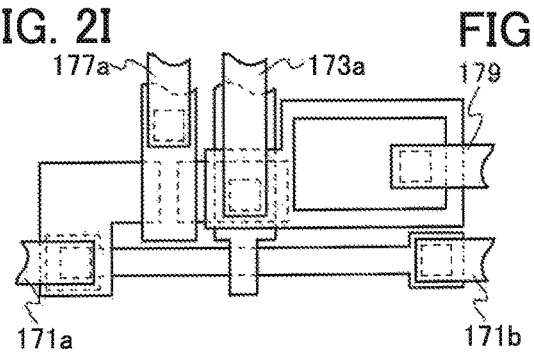
Figure 2J:
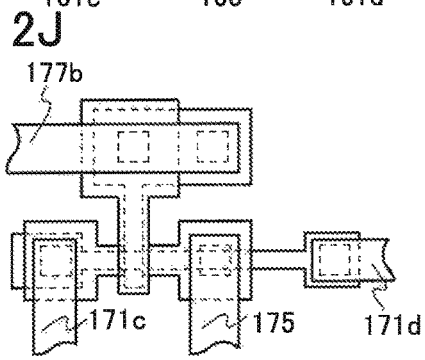

Note that FIGS. 2I and 2J are top views of the memory cell 100a and the inverter circuit 100b, respectively, at this stage.

Through the above steps, a semiconductor device can be manufactured.

Note that here, an example where hard masks are used is described. However, one embodiment of the present invention is not limited thereto. Depending on cases or conditions, the semiconductor device can be manufactured using any of a variety of methods; for example, the semiconductor device may be manufactured without using a hard mask.

Figure 21A:
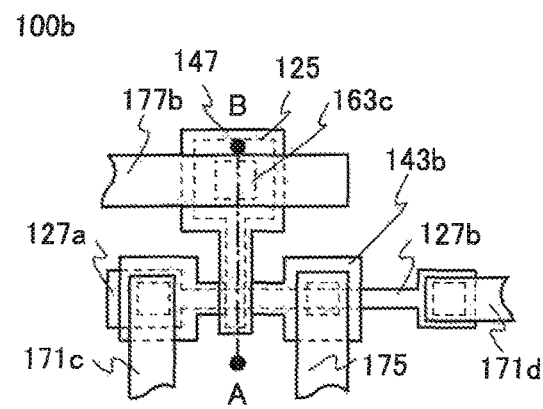
FIGS. 21A and 21B are a top view and a cross-sectional view illustrating one embodiment of a semiconductor device.

Note that the conductive films 125 and 147 are electrically connected to each other through the conductive films 163b, 167b, and 177b in FIG. 2J; however, a conductive film 163c that is directly connected to the conductive films 125 and 147 may be provided as illustrated in FIG. 21A. In that case, the connection area of the conductive films 125 and 147 can be reduced. Note that FIG. 21A is a top view of the inverter circuit 100b and FIG. 21B is a cross-sectional view taken along dashed-dotted line A-B in FIG. 21A.

Figure 21B:
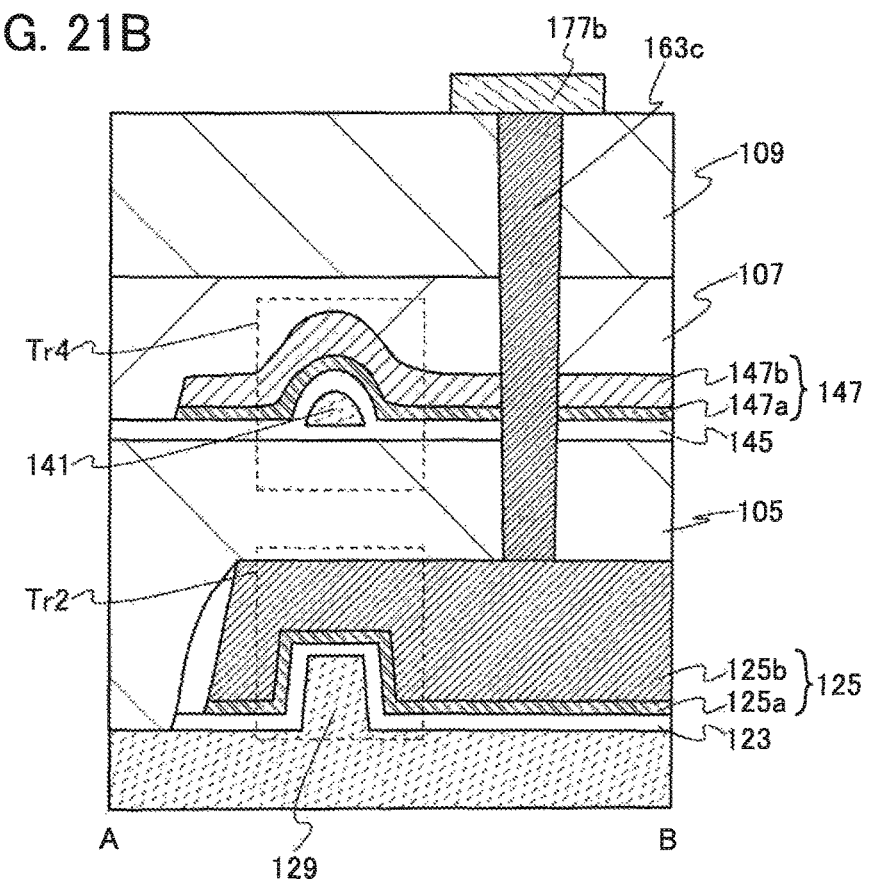

FIG. 21B is the cross-sectional view of the transistors Tr2 and Tr4 in the channel width direction. In the conductive film 125 having a function of the gate electrode of the transistor Tr2, conductive films 125a and 125b are stacked. In the conductive film 147 having a function of the gate electrode of the transistor Tr4, conductive films 147a and 147b are stacked.

Although the transistor Tr2 is a FIN-type transistor here, a planar type transistor, a Tri-Gate type transistor, or the like can be used as appropriate. Furthermore, a transistor with any of a variety of structures such as a top-gate type, a bottom-gate type, a double-gate type (with gates above and below a channel), and the like can be used as the transistor Tr4.

The transistors other than the transistor Tr2, for example, the transistors Tr1, Tr3, and Tr4 can also be FIN-type transistors. Alternatively, a planar type, Tri-gate type, top-gate type, bottom-gate type, or double-gate type (with gates above and below a channel) transistor can be used, for example.

<Modification Example of Method for Manufacturing Semiconductor Device>

Here, an example of a method for manufacturing the transistors Tr1, Tr2, Tr3, and Tr4 having excellent electric characteristics will be described.

Figure 15:
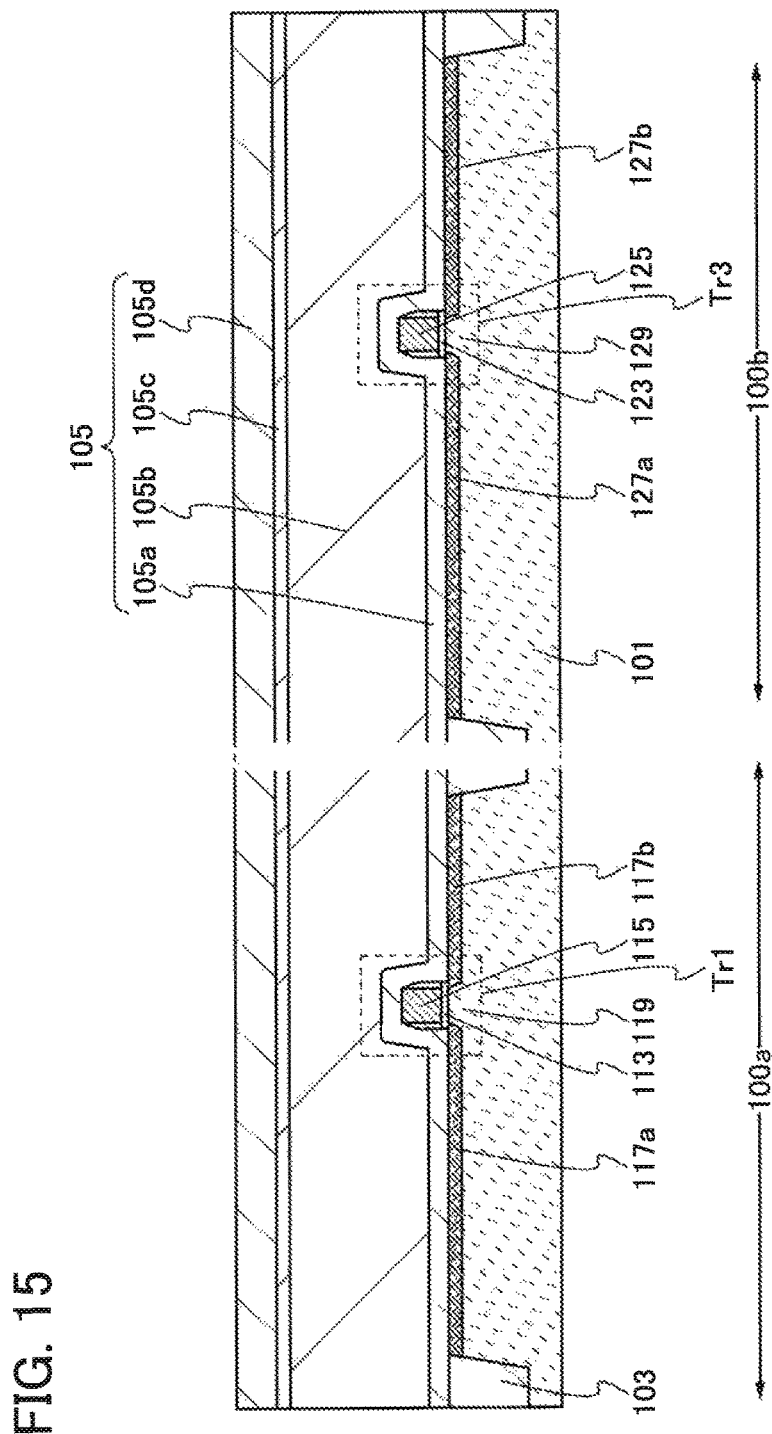
FIG. 15 is a cross-sectional view illustrating one embodiment of a method for manufacturing a semiconductor device.

In a manner similar to that described with reference to FIG. 3, the transistors Tr1 and Tr3 are formed over the substrate 101. Then, an insulating film 105a is formed over the impurity regions 117a, 117b, 127a, and 127b, the insulating films 113 and 123, and the conductive films 115 and 125 as illustrated in FIG. 15. The insulating film 105a is preferably formed using an insulating film that releases hydrogen by heating, typified by a silicon nitride film containing hydrogen, a silicon nitride oxide film containing hydrogen, or the like, so that the channel regions 119 and 129 can be hydrogenated by heat treatment in the manufacturing process of the semiconductor device. The insulating film that releases hydrogen by heating can be formed by a method for forming the insulating film 105 as appropriate.

Next, an insulating film 105b is formed over the insulating film 105a. The insulating film 105b is formed using any of the materials for the insulating film 105 as appropriate. Note that the insulating film 105b is preferably formed flat by a coating method. Alternatively, the insulating film 105b is preferably formed by performing planarization treatment such as a CMP method on an insulating film. This can increase coverage with an insulating film to be formed later.

Then, an insulating film 105c is formed over the insulating film 105b. The insulating film 105c is preferably formed using a film having barrier properties against hydrogen, water, and the like, and further preferably formed using a film having barrier properties against hydrogen, water, oxygen, and the like. Typical examples of the film having barrier properties against hydrogen, water, oxygen, and the like include a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film.

The insulating film 105c preferably has a sufficient thickness to be capable of preventing hydrogen diffusion, typified by a thickness greater than or equal to 20 nm and less than or equal to 250 nm.

High flatness of the insulating film 105b can increase the coverage with the insulating film 105c even with a small thickness. Such a case is preferable because the barrier properties of the insulating film 105c against hydrogen, water, and the like can be increased.

The insulating film 105c can be formed by the method for forming the insulating film 105 as appropriate. The insulating film 105c formed using an oxide film can be formed in the following manner: a conductive film is formed over the insulating film 105b and at least one of an oxygen radical, an oxygen atom, an oxygen atomic ion, and an oxygen molecular ion is added to the conductive film.

Next, an insulating film 105d is formed over the insulating film 105c. The insulating film 105d is preferably formed using an insulating film that releases oxygen by heating, in which case oxygen contained in the insulating film 105d can be supplied to the semiconductor films of the transistors Tr2 and Tr4, which are to be formed later, by heat treatment in the manufacturing process of the semiconductor device. In addition, in the case where the semiconductor films are each formed using an oxide semiconductor film, oxygen vacancies contained in the oxide semiconductor film can be reduced.

In the oxide semiconductor film, oxygen vacancies sometimes serve as carrier traps, or serve as carrier generation sources when capturing hydrogen. Thus, in the case of using an oxide semiconductor film as each of the semiconductor films of the transistors Tr2 and Tr4, supplying oxygen contained in the insulating film 105d to the oxide semiconductor films reduces oxygen vacancies in the oxide semiconductor films, in which case the transistors Tr2 and Tr4 having excellent electric characteristics can be fabricated.

Through the above steps, the insulating film 105 including the insulating films 105a, 105b, 105c, and 105d is formed.

Figure 16:
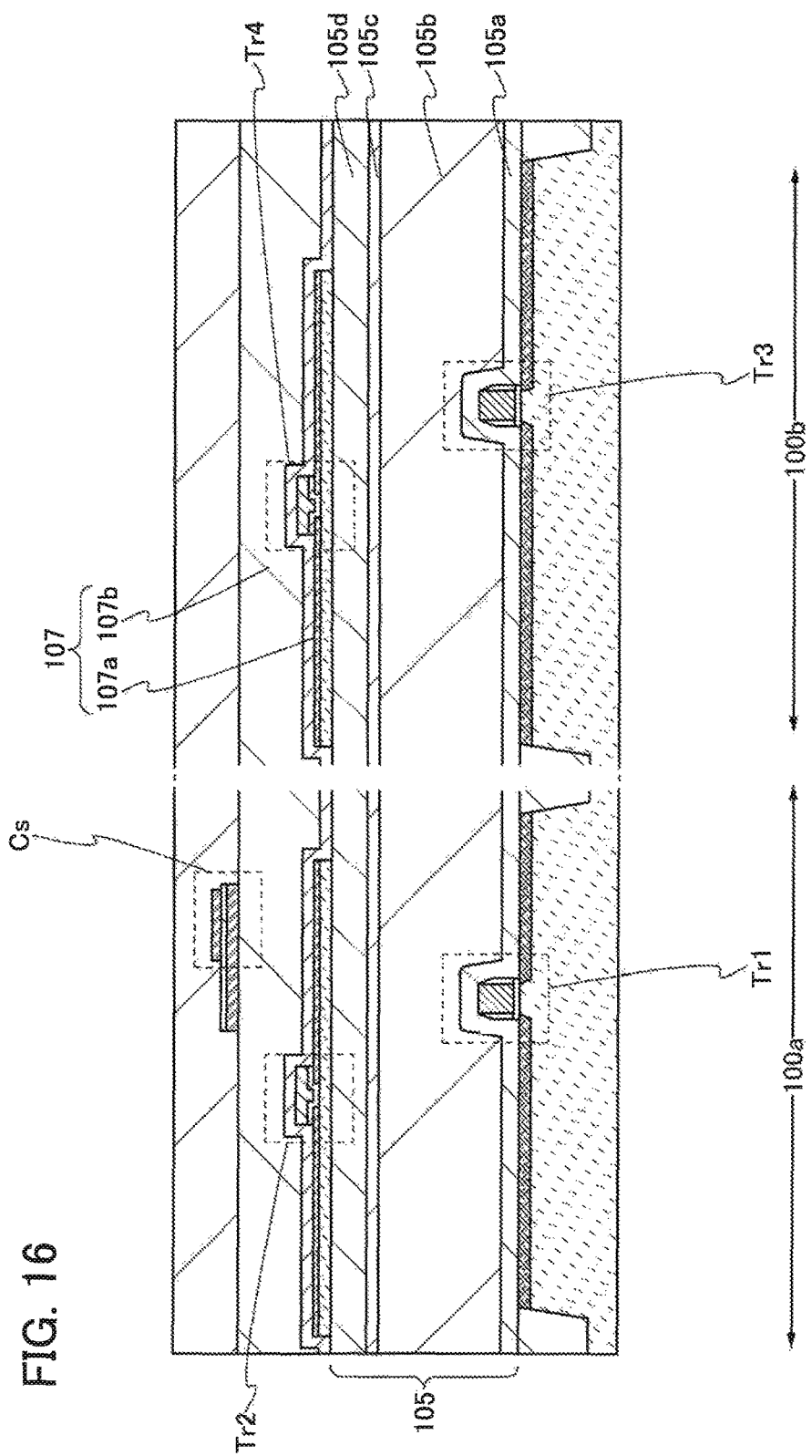
FIG. 16 is a cross-sectional view illustrating one embodiment of a method for manufacturing a semiconductor device.

After that, the transistors Tr2 and Tr4 are formed over the insulating film 105 as illustrated in FIG. 16. Subsequently, the insulating film 107 is formed over the transistors Tr2 and Tr4. In the insulating film 107, insulating films 107a and 107b are stacked in this order.

It is preferred that, like the insulating film 105c, one of the insulating films 107a and 107b be formed using a film having barrier properties against hydrogen, water, and the like, and further preferably formed using a film having barrier properties against hydrogen, water, oxygen, and the like. Here, the insulating film 107a is formed using a film having barrier properties against hydrogen, water, oxygen, and the like.

Next, the capacitor Cs is formed over the insulating film 107. Subsequently, the insulating film 109 is formed over the insulating film 107 and the capacitor Cs.

Note that by heat treatment in the formation steps of the insulating films 107 and 109, the transistors Tr2 and Tr4, and the capacitor Cs, hydrogen contained in the insulating film 105a is diffused into the channel regions of the transistors Tr1 and Tr3, so that defects in the channel regions can be repaired (dangling bonds in the channel regions can be terminated with hydrogen).

Hydrogen contained in the insulating film 105a might also be diffused into the insulating film 105b by heat treatment; however, since the insulating film 105c has a function of a barrier film against hydrogen, water, and the like, hydrogen diffusion into the semiconductor films of the transistors Tr2 and Tr4 can be prevented.

Hydrogen diffused to the oxide semiconductor film reacts with oxygen bonded to a metal atom to be water, and also causes oxygen vacancies in a lattice from which oxygen is released (or a portion from which oxygen is released). Due to entry of hydrogen into the oxygen vacancies, an electron serving as a carrier is generated. Furthermore, bonding of part of hydrogen to oxygen bonded to a metal atom causes generation of an electron serving as a carrier. Thus, a transistor including an oxide semiconductor into which hydrogen is diffused is likely to be normally on. In view of the above, prevention of diffusion of hydrogen, water, and the like into the semiconductor films of the transistors Tr2 and Tr4 makes it possible for the transistors Tr2 and Tr4 to have excellent electric characteristics.

The insulating film 105d is formed using an insulating film that releases oxygen by heat treatment; thus, oxygen contained in the insulating film 105d can be supplied to the semiconductor films of the transistors Tr2 and Tr4 by the heat treatment. This is another factor for the fabrication of the transistors Tr2 and Tr4 having excellent electric characteristics.

Since the transistors Tr2 and Tr4 and the insulating film 105d are sandwiched between the insulating films 105c and 107a having functions of barrier films against hydrogen, water, oxygen, and the like, oxygen contained in the insulating film 105d can be efficiently supplied to the semiconductor films of the transistors Tr2 and Tr4 while hydrogen, water, and the like can be prevented from entering the semiconductor films of the transistors Tr2 and Tr4 from the outside. This is another factor for the fabrication of the transistors Tr2 and Tr4 having excellent electric characteristics.

Owing to the insulating films 105c and 107a, the hydrogen concentration of the semiconductor films of the transistors Tr2 and Tr4 can be less than 1/10 and preferably less than 1/100 that of the channel regions of the transistors Tr1 and Tr3.

When the insulating film 105c is formed using a film having barrier properties against hydrogen, water, and oxygen, the insulating film 105c prevents diffusion of oxygen contained in the insulating film 105d. In that case, oxygen contained in the insulating film 105d can be efficiently supplied to the semiconductor films of the transistors Tr2 and Tr4 by heat treatment.

Note that opening portions in the insulating films 105, 107, and 109 and conductive films that fill the opening portions are not formed at this stage. Thus, hydrogen contained in the insulating film 105a can be prevented from being diffused to the semiconductor films of the transistors Tr2 and Tr4 by heat treatment via the opening portions and the conductive films that fill the opening portion. In addition, oxygen contained in the insulating film 105d can be efficiently supplied to the semiconductor films of the transistors Tr2 and Tr4.

Figure 19:
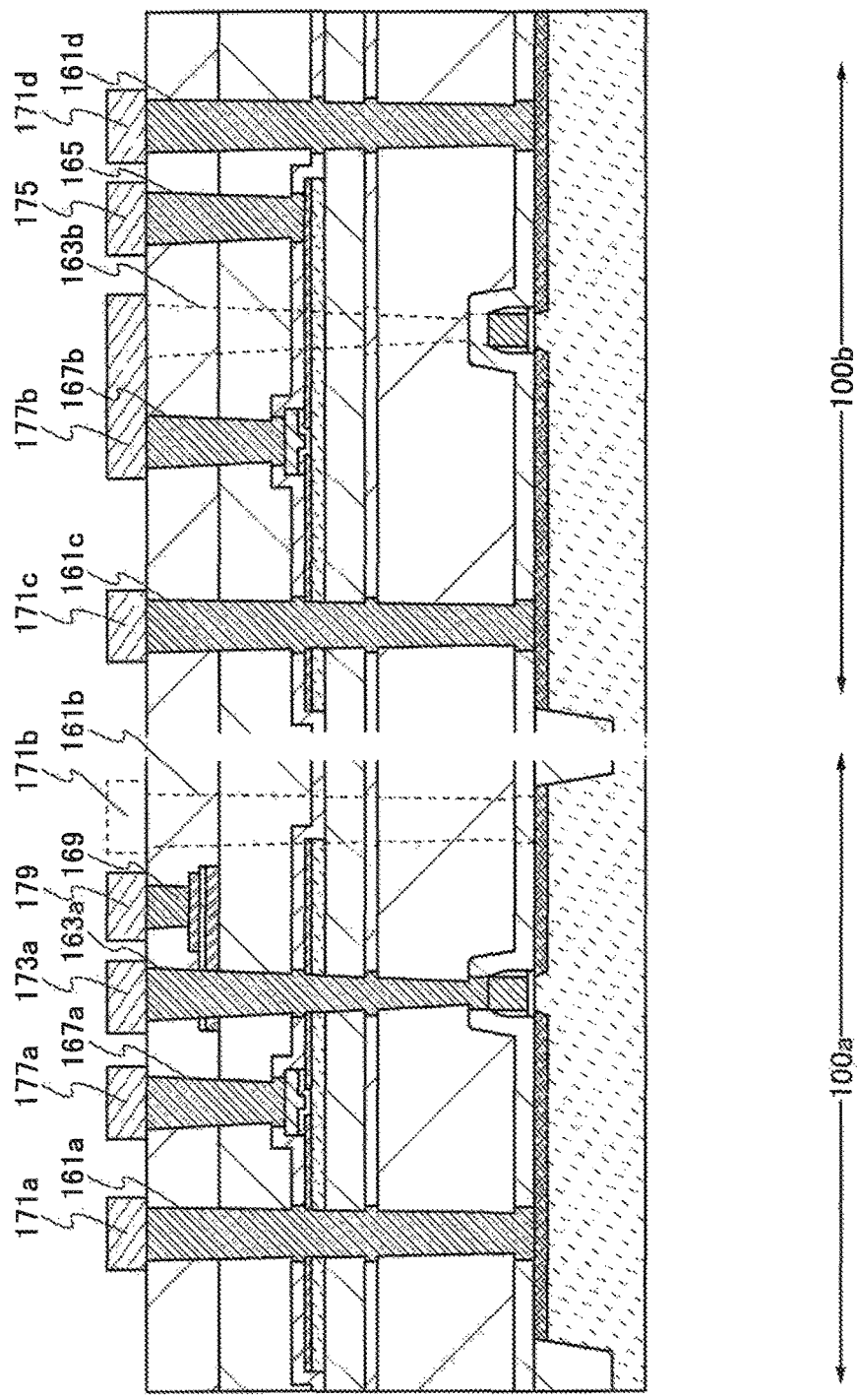
FIG. 19 is a cross-sectional view illustrating one embodiment of a method for manufacturing a semiconductor device.

Then, opening portions are formed in the insulating films 105, 107, and 109, the semiconductor films 131 and 141, the conductive films 133a, 133b, 143a, 143b, and 151, and the insulating film 153 by the steps illustrated in FIG. 6 to FIG. 11. Subsequently, by the steps illustrated in FIG. 12 and FIG. 13, the conductive films 161a, 161b, 161c, 161d, 163a, 163b, 165, 167a, 167b, and 169 each having a function of a plug and the conductive films 171a, 171b, 171c, 171d, 173a, 175, 177a, 177b, and 179 each having a function of a wiring are formed as illustrated in FIG. 19.

In the case where the insulating films are formed using different materials, the opening portion may have a plurality of widths because of the different etching rates of the insulating films. For example, the width of the opening portion might be large in an insulating film that is easily etched, whereas the width might be small in an insulating film that is not easily etched. As a result, the conductive films 161a, 161b, 161c, 161d, 163a, 163b, 165, 167a, and 167b whose side surfaces have a plurality of projections are formed as illustrated in FIG. 19 in one step. Note that each of the conductive films 161a, 161b, 161c, 161d, 163a, 163b, 165, 167a, and 167b has one or more projections in a cross section in a thickness direction. Furthermore, the width of each of the conductive films 161a, 161b, 161c, 161d, 163a, 163b, 165, 167a, and 167b is not gradually reduced from the insulating film 109 toward the insulating film 107; each of the conductive films is formed to have regions with narrow widths and regions with wide widths randomly.

Each of the conductive films 161a, 161b, 161c, 161d, 163a, 163b, 165, 167a, and 167b has at least a region with a first width, a region with a second width, and a region with a third width. At least two of the first width, the second width, and the third width have different values.

For example, in a conductive film in which a region with the first width, a region with the second width, and a region with the third width are formed in this order, the first width and the third width are larger than the second width in some cases. In such a case, the region with the first width and the region with the third width are in opening portions formed in a silicon nitride film, a silicon nitride oxide film, an aluminum oxide film, or the like, whereas the region with the second width is in an opening portion formed in a silicon oxide film, a silicon oxynitride film, or the like.

In the conductive film in which the region with the first width, the region with the second width, and the region with the third width are formed in this order, the first width and the third width are smaller than the second width in some cases. In such a case, the region with the first width and the region with the third width are in opening portions formed in a silicon oxide film, a silicon oxynitride film, or the like whereas the region with the second width is in an opening portion formed in a silicon nitride film, a silicon nitride oxide film, an aluminum oxide film, or the like.

The conductive films 161*a*, 161*b*, 161*c*, 161*d*, 163*a*, 163*b*, 165, 167*a*, 167*b*, and 169 having the shapes illustrated in FIG. 19 have high adhesion with the insulating films 105, 107, and 109. Thus, the conductive films 161*a*, 161*b*, 161*c*, 161*d*, 163*a*, 163*b*, 165, 167*a*, 167*b*, and 169 can be prevented from being separated by a mechanical load due to a polishing step in a step using a CMP method, which is one of formation steps of the conductive films. As a result, the yield of the semiconductor device can be improved.

In a manner described in this embodiment, an n-channel transistor can be stacked over a p-channel transistor without attaching a substrate over which the p-channel transistor is formed to a substrate over which the n-channel transistor is formed.

Next, examples of circuit diagrams of the memory cell 100*a* and the inverter circuit 100*b* in the semiconductor device will be described with reference to FIGS. 17A and 17B.

<Circuit Diagram of Memory Cell>

Figure 17A:
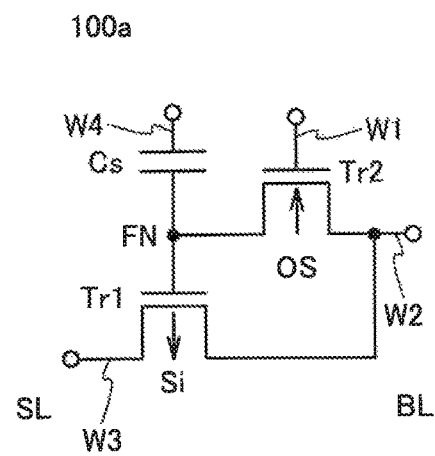
FIGS. 17A and 17B are circuit diagrams illustrating one embodiment of a semiconductor device.

FIG. 17A is a circuit diagram of the memory cell 100*a*. The memory cell 100*a* includes the transistor Tr1, the transistor Tr2, and the capacitor Cs. In the memory cell 100*a*, a node FN is a data retention portion. A gate of the transistor Tr1 is connected to the node FN, one of a source and a drain of the transistor Tr1 is connected to a wiring W3, and the other of the source and the drain of the transistor Tr1 is connected to a wiring W2. The transistor Tr2 serves as a switch connecting the node FN and the wiring W2. The capacitor Cs is between a wiring W4 and the node FN.

Various materials such as an oxide semiconductor and silicon can be used for a channel formation region of the transistor Tr1. Here, the transistor Tr1 is a p-channel transistor. The wiring W2 is connected to one of a source and a drain of the transistor Tr2.

The wiring W3 has a function of a source line or a power line. Although the wiring W3 is preferably retained at a constant potential, the potential may be changed when power is supplied or stopped.

The transistor Tr2 includes an oxide semiconductor film, and a channel region is formed in the oxide semiconductor film. Thus, the transistor Tr2 has an extremely low off-state current (extremely high off-state resistance). The transistor Tr2 is turned on when data is written, and accordingly is also referred to as a writing transistor. Here, the transistor Tr2 is an n-channel transistor.

A gate of the transistor Tr2 is electrically connected to a wiring W1. The wiring W1 has a function of a write word line. Although the transistor Tr2 is a single-gate transistor here, the transistor Tr2 can be a dual-gate transistor as appropriate.

One of the source and the drain of the transistor Tr2 is electrically connected to the wiring W2. The wiring W2 has a function of a bit line.

The other of the source and the drain of the transistor Tr2 is electrically connected to one electrode of the capacitor Cs and the gate of the transistor Tr1. The other electrode of the capacitor Cs is electrically connected to the wiring W4.

By changing the potential of the wiring W4, the potential of the gate of the transistor Tr1 (the node FN) is changed. The wiring W4 has a function of a capacitor line.

Here, data writing is described. Data is written to the memory cell 100*a* in the following manner: the transistor Tr2 is turned on while a constant voltage is applied to the wirings W1 and W2, so that the node FN is connected to the wiring W2.

Next, data reading is described. A constant voltage is applied to the wirings W2, W3, and W4. The value of a current flowing between the source and the drain of the transistor Tr1 changes depending on the voltage of the node FN. The wiring W2 is charged or discharged depending on the source—drain current of the transistor Tr1. In this manner, data retained in the memory cell 100*a* can be read by sensing the voltage of the wiring W2.

Note that the transistors Tr1 and Tr2 can each be a p-channel transistor or an n-channel transistor. Voltage applied to the wirings (wirings W2, W3, and W4) depends on the conductivity types of the transistors Tr1 and Tr2.

In the memory cell 100*a* illustrated in FIG. 17A, data is retained as the potential of the node FN. If the transistor Tr2 has sufficiently high off-state resistance, data can be retained for a long period.

Note that a transistor including an oxide semiconductor film has frequency characteristics equivalent to those of an n-channel transistor having a channel region in a semiconductor substrate. A transistor having a channel length of less than 100 nm, a cutoff frequency (fT) higher than 1 GHz when source-drain voltage is 1 V or higher and 2 V or lower, and excellent frequency characteristics achieve high-speed operation when used in a memory circuit, a logic circuit, an analog circuit, or the like. Accordingly, the memory cell 100*a* formed using the transistor Tr2 including the oxide semiconductor film and the p-channel transistor Tr1 whose channel region is in a semiconductor substrate can operate at high speed. In addition, since the transistor Tr2 including the oxide semiconductor film can be stacked over the transistor Tr1, transistors can be three-dimensionally positioned, leading to the fabrication of a highly integrated or small semiconductor device.

<Circuit Diagram of Inverter>

Figure 17B:
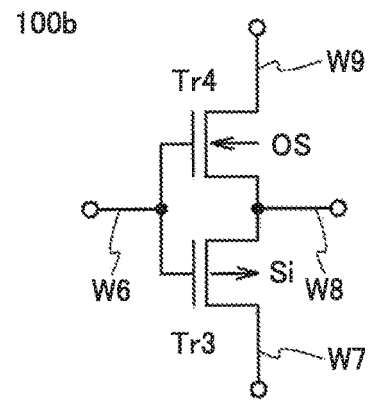

FIG. 17B is a circuit diagram of the inverter circuit 100*b* included in the semiconductor device. The inverter circuit 100*b* shown in FIG. 17B includes the transistors Tr3 and Tr4. A gate of the transistor Tr3 is electrically connected to a wiring W6, one of a source and a drain of the transistor Tr3 is electrically connected to a wiring W7, and the other of the source and the drain of the transistor Tr3 is electrically connected to a wiring W8.

A gate of the transistor Tr4 is electrically connected to the wiring W6, one of a source and a drain of the transistor Tr4 is electrically connected to the wiring W8, and the other of the source and the drain of the transistor Tr4 is electrically connected to a wiring W9.

The transistor Tr3 is a p-channel transistor. Various materials such as an oxide semiconductor and silicon can be used for a channel formation region of the transistor Tr3.

A region where a channel region of the transistor Tr4 is formed is included in an oxide semiconductor film. Thus, the transistor Tr4 has an extremely low off-state current (extremely high off-state resistance). Here, the transistor Tr4 is an n-channel transistor.

Although the transistor Tr4 is a single-gate transistor, the transistor Tr4 can be a dual-gate transistor as appropriate.

Note that the transistors Tr3 and Tr4 can each be a p-channel transistor or an n-channel transistor as appropriate.

Similarly in the memory cell 100*a*, the inverter circuit formed using the p-channel transistor Tr3 whose channel region is in a semiconductor substrate and the transistor Tr4 including the oxide semiconductor film can operate at high speed. In addition, since the transistor Tr4 including the oxide semiconductor film can be stacked over the transistor Tr3, transistors can be three-dimensionally positioned, leading to the fabrication of a highly integrated or small semiconductor device.

Note that although the semiconductor device described in this embodiment includes a memory cell and an inverter circuit, the semiconductor device can be provided with an analog switch circuit, a NOR circuit, an OR circuit, a NAND circuit, an AND circuit, or the like, as appropriate.

This embodiment can be combined with any of the other embodiments in this specification as appropriate.

(Embodiment 2)

The threshold voltage of a transistor using an oxide semiconductor film with oxygen vacancies easily shifts in the negative direction, and such a transistor tends to be normally on. This is because electric charges are generated owing to oxygen vacancies in the oxide semiconductor, and the resistance is reduced. In addition, a transistor using an oxide semiconductor film with oxygen vacancies has such a problem that the electrical characteristics, typically, the threshold voltage, are changed with time or changed by a stress test (typically, a gate bias-temperature (BT) stress test under light irradiation). In this embodiment, a highly reliable semiconductor device in which a change in threshold voltage is small and a manufacturing method thereof will be described. Furthermore, a transistor with excellent electrical characteristics and a manufacturing method thereof will be described.

<Structural Example of Transistor>

In this embodiment, a structure and a fabrication method of a transistor that can be used as the transistors Tr2 and Tr4 in Embodiment 1 will be described. Note that the transistor described in this embodiment includes an oxide semiconductor film as a semiconductor film. Furthermore, the transistor described in this embodiment is a top-gate transistor.

Figure 24A:
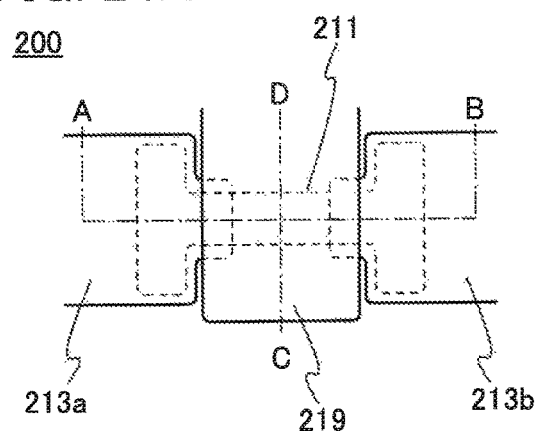
FIGS. 24A to 24C are a top view and cross-sectional views illustrating one embodiment of a semiconductor device.
Figure 24C:
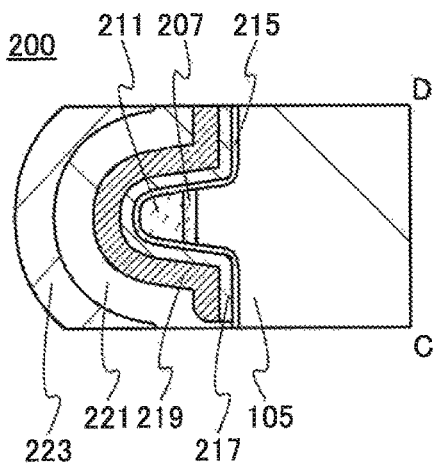
Figure 24B:
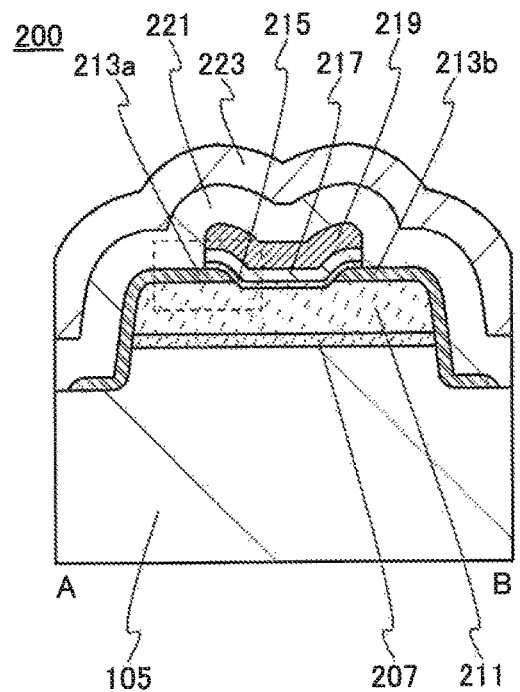

FIGS. 24A to 24C are a top view and cross-sectional views of a transistor 200. FIG. 24A is a top view of the transistor 200, FIG. 24B is a cross-sectional view taken along dashed-dotted line A-B in FIG. 24A, and FIG. 24C is a cross-sectional view taken along dashed-dotted line C-D in FIG. 24A. Note that in FIG. 24A, the insulating film 105, an oxide semiconductor film 207, an oxide semiconductor film 215, a gate insulating film 217, an insulating film 221, an insulating film 223, and the like are not illustrated for simplicity.

FIG. 24B is a cross-sectional view in the channel length direction of the transistor 200 and FIG. 24C is a cross-sectional view in the channel width direction of the transistor 200.

The transistor 200 illustrated in FIGS. 24A to 24C is provided over the insulating film 105. The transistor 200 includes the oxide semiconductor film 207 over the insulating film 105, an oxide semiconductor film 211 in contact with the top surface of the oxide semiconductor film 207, a pair of electrodes 213a and 213b in contact with at least the top surface and a side surface of the oxide semiconductor film 211 and a side surface of the oxide semiconductor film 207, the oxide semiconductor film 215 in contact with the oxide semiconductor film 211 and the pair of electrodes 213a and 213b, the gate insulating film 217 overlapping with the oxide semiconductor film 211 with the oxide semiconductor film 215 sandwiched therebetween, and a gate electrode 219 being in contact with the gate insulating film 217 and overlapping with the oxide semiconductor film 211 with the oxide semiconductor film 215 and the gate insulating film 217 sandwiched therebetween. Furthermore, the insulating film 221 that covers the pair of electrodes 213a and 213b, the oxide semiconductor film 215, the gate insulating film 217, and the gate electrode 219 and the insulating film 223 that covers the insulating film 221 may be included.

The insulating film 105 included in the transistor 200 has a projection. The oxide semiconductor films 207 and 211 are formed over the projection. In the channel width direction as illustrated in FIG. 24C, the gate electrode 219 faces side surfaces of the oxide semiconductor films 207 and 211 with the gate insulating film 217 positioned therebetween. In other words, when a voltage is applied to the gate electrode 219, the oxide semiconductor films 207 and 211 are surrounded by electric field of the gate electrode 219 in the channel width direction. The transistor structure in which an oxide semiconductor film is surrounded by electric field of the gate electrode 219 is referred to as a surrounded channel (s-channel) structure. In the transistor with the s-channel structure, a channel is formed in the whole oxide semiconductor film 211 (bulk) in the on state; as a result, an on-state current is increased. In the off state, the entire region of the channel region formed in the oxide semiconductor film 211 is depleted; as a result, an off-state current can be further reduced.

Components of the transistor 200 are described below.

The insulating film 105 has a function of a base film of the oxide semiconductor film 207. The insulating film 105 is preferably a film with a small number of defects or a small number of impurities in order to reduce a shift in the electrical characteristics of the transistor such as the threshold voltage.

By using an oxide insulating film with a low content of nitrogen oxide and a low density of defect states for the insulating film 105, a shift in the threshold voltage of the transistor can be reduced, which leads to a smaller change in the electrical characteristics of the transistor.

After heat treatment in the manufacturing process of the transistor, typically heat treatment at a temperature higher than or equal to 300° C. and lower than the strain point of the substrate, the oxide insulating film with a low content of nitrogen oxide and a low density of defect states has a nitrogen concentration measured by secondary ion mass spectrometry (SIMS) of less than $2 \times 10^{20}$ atoms/cm$^3$, less than $7 \times 10^{19}$ atoms/cm$^3$, or less than $2 \times 10^{19}$ atoms/cm$^3$. The higher the deposition temperature of the insulating film 105 is, the more the content of nitrogen oxide in the insulating film 105 can be reduced. The deposition temperature of the insulating film 105 is preferably higher than or equal to 450° C. and lower than the strain point of the substrate, higher than or equal to 500° C. and lower than strain point of the substrate, or higher than or equal to 500° C. and lower than or equal to 550° C.

The oxide semiconductor film 211 is an oxide semiconductor film containing In or Ga and typically contains an In—Ga oxide, an In—Zn oxide, an In—Mg oxide, an Zn—Mg oxide, or an In-M-Zn oxide (M is Al, Ti, Ga, Y, Zr, Sn, La, Ce, Mg, or Nd).

Note that in the case where the oxide semiconductor film 211 contains an In-M-Zn oxide, the proportion of In and the proportion of M, not taking Zn and O into consideration, are preferably greater than or equal to 25 atomic % and less than 75 atomic %, respectively, further preferably greater than or equal to 34 atomic % and less than 66 atomic %, respectively.

The indium and gallium contents in the oxide semiconductor film 211 can be compared with each other by time-of-flight secondary ion mass spectrometry (TOF-SIMS), X-ray photoelectron spectrometry (XPS), or inductively coupled plasma mass spectrometry (ICP-MS).

Since the oxide semiconductor film 211 has an energy gap of 2 eV or more, preferably 2.5 eV or more, further preferably 3 eV or more, the off-state current of the transistor 200 can be low.

The thickness of the oxide semiconductor film 211 is greater than or equal to 3 nm and less than or equal to 200 nm, preferably greater than or equal to 3 nm and less than or equal to 100 nm, further preferably greater than or equal to 3 nm and less than or equal to 50 nm.

The oxide semiconductor films 207 and 215 contain at least one element that is contained in the oxide semiconductor film 211. Thus, interface scattering is unlikely to occur at the interfaces between the oxide semiconductor film 211 and each of the oxide semiconductor films 207 and 215. Thus, the transistor 200 can have a high field-effect mobility because the movement of carriers is not hindered at the interfaces.

The oxide semiconductor films 207 and 215 each contain, as a typical example, a Ga oxide, an In—Ga oxide, an In—Zn oxide, an In—Mg oxide, a Zn—Mg oxide, or an In-M-Zn oxide (M is Al, Ti, Ga, Y, Zr, Sn, La, Ce, Mg, or Nd), and have the energy level at the conduction band minimum that is closer to a vacuum level than that of the oxide semiconductor film 211 is. Typically, a difference between the conduction band minimum of the oxide semiconductor film 211 and the conduction band minimum of each of the oxide semiconductor films 207 and 215 is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. That is, the difference between the electron affinity of the oxide semiconductor film 211 and the electron affinity of each of the oxide semiconductor films 207 and 215 is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the electron affinity refers to an energy gap between the vacuum level and the conduction band minimum.

When the oxide semiconductor films 207 and 215 contain a larger amount of Al, Ti, Ga, Y, Zr, Sn, La, Ce, Mg, or Nd in an atomic ratio than the amount of In in an atomic ratio, any of the following effects may be obtained.
(1) The energy gap of each of the oxide semiconductor films 207 and 215 is widened.
(2) The electron affinity of each of the oxide semiconductor films 207 and 215 is reduced.
(3) Impurities from the outside are blocked.
(4) An insulating property of each of the oxide semiconductor films 207 and 215 is higher than that of the oxide semiconductor film 211.
(5) Oxygen vacancies are less likely to be generated in the oxide semiconductor films 207 and 215 because Al, Ti, Ga, Y, Zr, Sn, La, Ce, Mg, and Nd are metal elements that can be strongly bonded to oxygen.

In the case where the oxide semiconductor films 207 and 215 each contain an In-M-Zn oxide, the proportion of In and the proportion of M, not taking Zn and O into consideration, are preferably less than 50 atomic % and greater than or equal to 50 atomic %, respectively, and further preferably less than 25 atomic % and greater than or equal to 75 atomic %, respectively.

Furthermore, in the case where the oxide semiconductor films 207, 211, and 215 each contain an In-M-Zn oxide (M is Al, Ti, Ga, Y, Zr, Sn, La, Ce, Mg, or Nd), the proportion of M atoms (M is Al, Ti, Ga, Y, Zr, Sn, La, Ce, Mg, or Nd) in each of the oxide semiconductor films 207 and 215 is higher than that in the oxide semiconductor film 211. Typically, the proportion of M in each of the oxide semiconductor films 207 and 215 is higher than or equal to 1.5 times, preferably higher than or equal to twice, further preferably higher than or equal to three times as high as that in the oxide semiconductor film 211. Any of the above-described elements represented by M is more strongly bonded to oxygen than indium is, and thus has a function of suppressing generation of oxygen vacancies in the oxide semiconductor films 207 and 215. That is, oxygen vacancies are less likely to be generated in the oxide semiconductor films 207 and 215 than in the oxide semiconductor film 211.

In the case where the oxide semiconductor film 211 contains an In-M-Zn oxide (M is Al, Ti, Ga, Y, Zr, Sn, La, Ce, Mg, or Nd) and a target having the atomic ratio of metal elements of In:M:Zn=$x_1$:$y_1$:$z_1$ is used for forming the oxide semiconductor film 211, $x_1/y_1$ is preferably greater than or equal to 1/3 and less than or equal to 6, further preferably greater than or equal to 1 and less than or equal to 6, and $z_1/y_1$ is preferably greater than or equal to 1/3 and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 211 can be easily formed. Typical examples of the atomic ratio of In to M and Zn of the target are 1:1:1, 1:1:1.2, 2:1:1.5, 2:1:2.3, 2:1:3, 3:1:2, and 4:2:4.1.

In the case where the oxide semiconductor films 207 and 215 each contain an In-M-Zn oxide (M is Al, Ti, Ga, Y, Zr, Sn, La, Ce, Mg, or Nd) and a target having the atomic ratio of metal elements of In:M:Zn=$x_2$:$y_2$:$z_2$ is used for forming the oxide semiconductor films 207 and 215, $x_2/y_2$ is preferably less than $x_1/y_1$, and $z_2/y_2$ is preferably greater than or equal to 1/3 and less than or equal to 6, further preferably greater than or equal to 1 and less than or equal to 6. Note that when $z_2/y_2$ is greater than or equal to 1 and less than or equal to 6, a CAAC-OS films as the oxide semiconductor films 207 and 215 can be easily formed. Typical examples of the atomic ratio of In to M and Zn of the target are 1:2:4, 1.1:2.9:7.5, 1:3:2, 1:3:4, 1:3:6, 1:3:8, 1:4:4, 1:4:5, 1:4:6, 1:4:7, 1:4:8, 1:5:5, 1:5:6, 1:5:7, 1:5:8, and 1:6:8.

In each of the oxide semiconductor films 207, 211, and 215, the proportion of each atom in the above-described atomic ratio varies within a range of ±40% as an error.

The atomic ratio is not limited to those described above, and may be appropriately set in accordance with needed semiconductor characteristics.

The oxide semiconductor film 207 and the oxide semiconductor film 215 may have the same composition. For example, each of the oxide semiconductor film 207 and the oxide semiconductor film 215 may be an In—Ga—Zn oxide with an atomic ratio of In:Ga:Zn=1:3:2, 1:3:4, or 1:4:5.

Alternatively, the oxide semiconductor film 207 and the oxide semiconductor film 215 may have different compositions. For example, the oxide semiconductor film 207 may be an In—Ga—Zn oxide with an atomic ratio of In:Ga:Zn=1:3:2, and the oxide semiconductor film 215 may be an In—Ga—Zn oxide with an atomic ratio of In:Ga:Zn=1:3:4 or 1:4:5.

The oxide semiconductor film 207 and the oxide semiconductor film 215 may each have a thickness of more than or equal to 3 nm and less than or equal to 100 nm, or more than or equal to 3 nm and less than or equal to 50 nm.

Here, it is preferable that the thickness of the oxide semiconductor film 211 be at least larger than that of the oxide semiconductor film 207. The thicker the oxide semiconductor film 211 is, the higher the on-state current of the transistor can be. The thickness of the oxide semiconductor film 207 may be set as appropriate as long as formation of interface states at the interface with the oxide semiconductor film 211 can be inhibited. For example, the thickness of the oxide semiconductor film 211 is larger than that of the oxide semiconductor film 207, preferably 2 or more times, further preferably 4 or more times, still further preferably 6 or more times as large as that of the oxide semiconductor film 207. Note that the above description does not apply in the case where the on-state current of the transistor need not be increased, in which case the thickness of the oxide semiconductor film 207 may be larger than or equal to than that of the oxide semiconductor film 211. In this case, more oxygen can be added to the oxide semiconductor film 207, and oxygen vacancies in the oxide semiconductor film 211 can be reduced by heat treatment.

The thickness of the oxide semiconductor film 215 may be set as appropriate, in a manner similar to that of the oxide semiconductor film 207, as long as formation of interface states at the interface with the oxide semiconductor film 211 can be inhibited. For example, the thickness of the oxide semiconductor film 215 may be set smaller than or equal to that of the oxide semiconductor film 207. If the oxide semiconductor film 215 is thick, it may become difficult for the electric field from the gate electrode 219 to reach the oxide semiconductor film 211; thus, it is preferable that the oxide semiconductor film 215 be thin. In addition, to prevent oxygen contained in the oxide semiconductor film 215 from diffusing to the pair of electrodes 213a and 213b and thus oxidizing the pair of electrodes 213a and 213b, it is preferable that the oxide semiconductor film 215 be thin. For example, the oxide semiconductor film 215 is preferably thinner than the oxide semiconductor film 211. Note that the thickness of the oxide semiconductor film 215 is not limited to the above, and may be set as appropriate in accordance with the driving voltage of the transistor in consideration of the withstand voltage of the gate insulating film 217.

In the case where the oxide semiconductor film 207, the oxide semiconductor film 211, and the oxide semiconductor film 215 have different compositions from one another, the interfaces thereof can be observed by scanning transmission electron microscopy (STEM).

Hydrogen contained in the oxide semiconductor films 207, 211, and 215 reacts with oxygen bonded to a metal atom to produce water, which causes oxygen vacancies in a lattice from which oxygen is released (or a portion from which oxygen is released). Electrons serving as carriers might be generated when hydrogen enters the oxygen vacancies. Further, electrons serving as carriers might be generated when part of hydrogen is bonded to oxygen bonded to a metal atom. Thus, a transistor including an oxide semiconductor which contains hydrogen is likely to be normally on.

Accordingly, it is preferable that hydrogen be reduced as much as possible as well as the oxygen vacancies in the oxide semiconductor films 207, 211, and 215. Specifically, the hydrogen concentration of the oxide semiconductor film 211 measured by SIMS is lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$. As a result, the transistor 200 has positive threshold voltage (normally-off characteristics).

Note that the impurity concentration of the oxide semiconductor films 207, 211, and 215 can be measured by SIMS.

When the oxide semiconductor films 207, 211, and 215 contain silicon or carbon that is a Group 14 element, oxygen vacancies in the films increase to form n-type regions. Thus, the concentration of silicon or carbon (the concentration is measured by SIMS) of the oxide semiconductor film 211 is set lower than or equal to $2\times10^{18}$ atoms/cm$^3$, preferably lower than or equal to $2\times10^{17}$ atoms/cm$^3$. As a result, the transistor 200 has positive threshold voltage (normally-off characteristics).

Furthermore, the concentration of alkali metal or alkaline earth metal of the oxide semiconductor films 207, 211, and 215, which is measured by SIMS, is set lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, which may increase the off-state current of the transistor. Thus, it is preferable to reduce the concentration of alkali metal or alkaline earth metal of the oxide semiconductor film 211. As a result, the transistor 200 has positive threshold voltage (normally-off characteristics).

In addition, when containing nitrogen, the oxide semiconductor films 207, 211, and 215 easily become n-type by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set, for example, lower than or equal to $5\times10^{18}$ atoms/cm$^3$.

When impurities in the oxide semiconductor films 207, 211, and 215 are reduced, the carrier density of the oxide semiconductor films can be lowered. The oxide semiconductor film 211 preferably has a carrier density of $1\times10^{17}$/cm$^3$ or less, further preferably $1\times10^{15}$/cm$^3$ or less, still further preferably $1\times10^{13}$/cm$^3$ or less, yet still further preferably $1\times10^{11}$/cm$^3$ or less.

Note that an oxide semiconductor film with a low impurity concentration and a low density of defect states can be used for the oxide semiconductor films 207, 211, and 215, in which case the transistor can have more excellent electrical characteristics. Here, the state in which the impurity concentration is low and the density of defect states is low (the number of oxygen vacancies is small) is described as "highly purified intrinsic" or "substantially highly purified intrinsic." A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has few carrier traps in some cases. Furthermore, a highly purified intrinsic or substantially highly purified intrinsic oxide semiconductor film has an extremely low off-state current; the off-state current can be lower than or equal to the measurement limit of a semiconductor parameter analyzer, i.e., lower than or equal to $1\times10^{-13}$ A, at a voltage between a source electrode and a drain electrode (drain voltage) of from 1 V to 10 V. Thus, the transistor whose channel region is formed in the oxide semiconductor film has a small variation in electrical characteristics and high reliability in some cases.

The oxide semiconductor films 207, 211, and 215 may have a non-single crystal structure, for example. The non-single crystal structure includes a CAAC-OS which is described later, a polycrystalline structure, a microcrystalline structure, or an amorphous structure, for example. Among the non-single crystal structure, the amorphous structure has the highest density of defect states, whereas the CAAC-OS has the lowest density of defect states.

The oxide semiconductor films 207, 211, and 215 may have a microcrystalline structure, for example. The oxide semiconductor films 207, 211, and 215 that have the microcrystalline structure each include a microcrystal with a size greater than or equal to 1 nm and less than 10 nm, for example. Alternatively, oxide films or the oxide semiconductor films that have the microcrystalline structure have a mixed phase structure where crystal parts (each of which is greater than or equal to 1 nm and less than 10 nm) are distributed in an amorphous phase.

The oxide semiconductor films 207, 211, and 215 may have an amorphous structure, for example. The oxide semiconductor films 207, 211, and 215 that have the amorphous structure each have disordered atomic arrangement and no crystalline component, for example. Alternatively, oxide films that have an amorphous structure have, for example, an absolutely amorphous structure and no crystal part.

Note that the oxide semiconductor films 207, 211, and 215 may each be a mixed film including regions having two or more of the following structures: a CAAC-OS, a microcrystalline structure, and an amorphous structure. The mixed film, for example, has a single-layer structure including a region having an amorphous structure, a region having a microcrystalline structure, and a region of a CAAC-OS. Alternatively, the mixed film may have a stacked-layer structure including a region having an amorphous structure, a region having a microcrystalline structure, and a region of a CAAC-OS, for example.

Note that the oxide semiconductor films 207, 211, and 215 may have a single-crystal structure, for example.

By providing oxide semiconductor films in which oxygen vacancies are less likely to be generated than in the oxide semiconductor film 211, so as to be in contact with the oxide semiconductor film 211, oxygen vacancies in the oxide semiconductor film 211 can be reduced. Furthermore, since the oxide semiconductor film 211 is in contact with the oxide semiconductor films 207 and 215 containing one or more metal elements forming the oxide semiconductor film 211, the density of interface states at the interface between the oxide semiconductor film 207 and the oxide semiconductor film 211 and at the interface between the oxide semiconductor film 211 and the oxide semiconductor film 215 is extremely low. Thus, after oxygen is added to the oxide semiconductor film 207 or 215, the oxygen is transferred from the oxide semiconductor film 207 or 215 to the oxide semiconductor film 211 by heat treatment; however, the oxygen is hardly trapped by the interface states at this time, and the oxygen in the oxide semiconductor film 207 or 215 can be efficiently transferred to the oxide semiconductor film 211. Accordingly, oxygen vacancies in the oxide semiconductor film 211 can be reduced. Since oxygen is added to the oxide semiconductor films 207 and 215, oxygen vacancies in the oxide semiconductor films 207 and 215 can be reduced. In other words, the density of localized states of the oxide semiconductor films 207, 211, and 215 can be reduced.

In addition, when the oxide semiconductor film 211 is in contact with an insulating film including a different constituent element (e.g., a gate insulating film including a silicon oxide film), an interface state is sometimes formed and the interface state forms a channel. At this time, a second transistor having a different threshold voltage appears, so that an apparent threshold voltage of the transistor is varied. However, since the oxide semiconductor films 207 and 215 containing one or more kinds of metal elements forming the oxide semiconductor film 211 are in contact with the oxide semiconductor film 211, an interface state is not easily formed at the interfaces between the oxide semiconductor film 207 and the oxide semiconductor film 211 and between the oxide semiconductor film 215 and the oxide semiconductor film 211.

The oxide semiconductor films 207 and 215 serve as barrier films that prevent constituent elements of the insulating film 105 and the gate insulating film 217 from entering the oxide semiconductor film 211 and forming an impurity state.

For example, in the case of using silicon-containing insulating films as the insulating film 105 and the gate insulating film 217, silicon in the insulating film 105 and the gate insulating film 217 or carbon which might be contained in the insulating film 105 and the gate insulating film 217 enters the oxide semiconductor film 207 or the oxide semiconductor film 215 to a depth of several nanometers from the interface in some cases. An impurity such as silicon or carbon entering the oxide semiconductor film 211 forms an impurity state. The impurity state serves as a donor to generate an electron; thus, an n-type semiconductor might be formed.

However, when the thicknesses of the oxide semiconductor film 207 and the oxide semiconductor film 215 are each larger than several nanometers, the impurity such as silicon or carbon does not reach the oxide semiconductor film 211, so that the influence of impurity state is suppressed.

Thus, providing the oxide semiconductor films 207 and 215 makes it possible to reduce variations in electrical characteristics of the transistor, such as threshold voltage.

In the case where a channel is formed at interfaces between the insulating film 105 and the oxide semiconductor film 211 and between the gate insulating film 217 and the oxide semiconductor film 211, interface scattering occurs at the interfaces and the field-effect mobility of the transistor is decreased. However, since the oxide semiconductor films 207 and 215 containing one or more kinds of metal elements forming the oxide semiconductor film 211 are provided in contact with the oxide semiconductor film 211, scattering of carriers does not easily occur at the interfaces between the oxide semiconductor film 211 and each of the oxide semiconductor films 207 and 215, and thus the field-effect mobility of the transistor can be increased.

In this embodiment, the number of oxygen vacancies in the oxide semiconductor film 211, and further the number of oxygen vacancies in the oxide semiconductor films 207 and 215 in contact with the oxide semiconductor film 211 can be reduced; thus, the density of localized states of the oxide semiconductor film 211 can be reduced. As a result, the transistor 200 in this embodiment has small variations in threshold voltage and high reliability. Further, the transistor 200 of this embodiment has excellent electric characteristics.

The pair of electrodes 213a and 213b is formed to have a single-layer structure or a stacked-layer structure including, as a conductive material, any of metals such as aluminum, titanium, chromium, nickel, copper, yttrium, zirconium, molybdenum, silver, tantalum, manganese, and tungsten or an alloy containing any of these metals as a main component. For example, a single-layer structure of an aluminum film containing silicon, a single-layer structure of a copper film containing manganese, a two-layer structure in which a titanium film is stacked over an aluminum film, a two-layer structure in which a titanium film is stacked over a tungsten film, a two-layer structure in which a copper film is stacked over a copper-magnesium alloy film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, a three-layer structure in which a copper-magnesium alloy film, a copper film, and a copper-magnesium alloy film are stacked in this order, and the like can be given. Note that a transparent conductive material containing indium oxide, tin oxide, or zinc oxide may be used.

Note that in the oxide semiconductor film 211, a channel formation region refers to a region which overlaps with the gate electrode 219 and is positioned between the pair of electrodes 213a and 213b. Furthermore, a channel region refers to a region through which carriers mainly flow in the channel formation region. Here, a channel region is part of the oxide semiconductor film 211, which is positioned between the pair of electrodes 213a and 213b. A channel length refers to the distance between the pair of electrodes 213a and 213b.

The gate insulating film 217 can be formed using any of the materials that can be used as the material for the insulating film 105 as appropriate.

The gate electrode 219 can be formed using a metal element selected from aluminum, chromium, copper, tantalum, titanium, molybdenum, manganese, and tungsten; an alloy containing any of these metal elements as a component; an alloy containing any of these metal elements in combination; or the like. Furthermore, one or more metal elements selected from manganese and zirconium may be used. Moreover, the gate electrode 219 may have a single-layer structure or a stacked structure of two or more layers. For example, the gate electrode 219 can have a single-layer structure of an aluminum film containing silicon, a single-layer structure of a copper film containing manganese, a two-layer structure in which a titanium film is stacked over an aluminum film, a two-layer structure in which a copper film is stacked over a copper-magnesium alloy film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are formed in this order, a three-layer structure in which a copper-magnesium alloy film, a copper film, and a copper-magnesium alloy film are stacked in this order, or the like. Alternatively, an alloy film or a nitride film which contains aluminum and one or more elements selected from titanium, tantalum, tungsten, molybdenum, chromium, neodymium, and scandium may be used.

The gate electrode 219 can also be formed using a light-transmitting conductive material. The gate electrode 219 can have a stacked structure formed using the above-described light-transmitting conductive material and the above-described metal element.

The insulating films 221 and 223 can be formed using any of the materials and formation methods which can be used as those of the insulating film 105, as appropriate. Although a stacked-layer structure of the insulating films 221 and 223 is used here, a single-layer structure may be used as well.

As the insulating film 221 or 223, an aluminum oxide film is preferably used. Since aluminum oxide functions as a barrier film against hydrogen, water, and oxygen, when using an aluminum oxide film as the insulating film 221 or 223, release of oxygen contained in the oxide semiconductor film 211 and diffusion of water, hydrogen, and the like from the outside to the oxide semiconductor film 211 can be prevented.

In the case where the insulating film 221 and the insulating film 223 are oxide insulating films, an oxide insulating film containing oxygen in excess of the stoichiometric composition may be used as one or both of the insulating film 221 and the insulating film 223. In this way, the oxygen in the insulating film is transferred to the oxide semiconductor film, and oxygen vacancies are filled with the oxygen, so that oxygen vacancies can be further reduced.

As the oxide insulating film containing oxygen in excess of the stoichiometric composition, it is preferable to use an oxide insulating film from which oxygen molecules at more than or equal to $1.0 \times 10^{18}$ molecules/cm$^3$ are released in thermal desorption spectroscopy (hereinafter referred to as TDS) at a surface temperature of higher than or equal to 100° C. and lower than or equal to 700° C., or higher than or equal to 100° C. and lower than or equal to 500° C.

The oxide insulating film containing oxygen in excess of the stoichiometric composition has such a thickness as to allow oxygen to be supplied to the oxide semiconductor film 211. For example, the thickness can be more than or equal to 50 nm and less than or equal to 500 nm, or more than or equal to 50 nm and less than or equal to 400 nm.

As one or both of the insulating films 221 and 223, a nitride insulating film where the hydrogen content is low may be provided. The nitride insulating film is preferably as follows, for example: the number of hydrogen molecules released from the nitride insulating film is less than $5.0 \times 10^{21}$ molecules/cm$^3$, preferably less than $3.0 \times 10^{21}$ molecules/cm$^3$, and further preferably less than $1.0 \times 10^{21}$ molecules/cm$^3$ when measured by TDS in which heat treatment is performed at a surface temperature of higher than or equal to 100° C. and lower than or equal to 700° C., preferably higher than or equal to 100° C. and lower than or equal to 500° C.

The nitride insulating film has such a thickness as to allow prevention of impurities such as hydrogen and water from the outside. For example, the thickness can be more than or equal to 50 nm and less than or equal to 200 nm, preferably more than or equal to 50 nm and less than or equal to 150 nm, and further preferably more than or equal to 50 nm and less than or equal to 100 nm.

A silicon oxynitride film having a function of a base film of the oxide semiconductor film is formed at a temperature higher than the temperature of heat treatment performed on the oxide semiconductor film, whereby the nitrogen concentration of the silicon oxynitride film can be reduced. In that case, production of nitrogen oxide and an increase in defects in the silicon oxynitride film by heat treatment can be prevented.

When the oxide semiconductor film 211 is formed after addition of oxygen to the oxide semiconductor film 207, and then heat treatment is performed on the oxide semiconductor film 211, oxygen contained in the oxide semiconductor film 207 is diffused to the oxide semiconductor film 211. As a result, oxygen vacancies in the oxide semiconductor film 211 can be reduced.

<Method for Forming Transistor>

A method for forming a transistor will be described with reference to FIGS. 25A to 25D and FIGS. 26A to 26C.

Figure 25A:
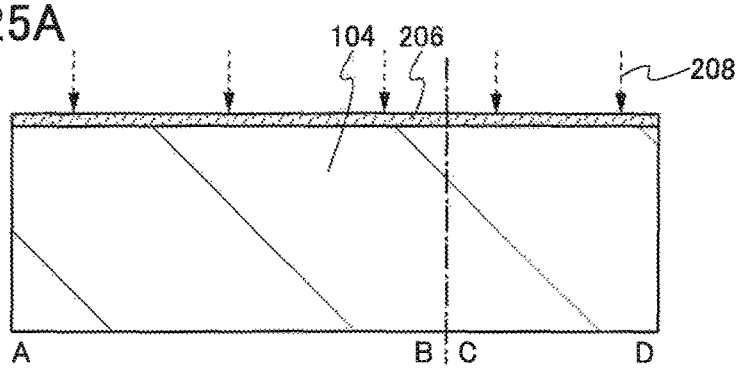
FIGS. 25A to 25D are cross-sectional views illustrating one embodiment of a method for manufacturing a semiconductor device.

As illustrated in FIG. 25A, an oxide semiconductor film 206 is formed over an insulating film 104. Next, oxygen 208 is added to the oxide semiconductor film 206.

Note that the insulating film 104 is processed into the insulating film 105 later. The oxide semiconductor film 206 is processed into the oxide semiconductor film 207 later.

A method for forming the gate electrode 219 will be described below. First, a conductive film is formed by a sputtering method, a chemical vapor deposition (CVD) method such as a metal organic chemical vapor deposition (MOCVD) method, a metal chemical vapor deposition method, an atomic layer deposition (ALD) method, or a plasma-enhanced chemical vapor deposition (PECVD) method, an evaporation method, a pulsed laser deposition (PLD) method, or the like. Then, a mask is formed over the conductive film by a lithography process. Then, part of the conductive film is etched using the mask to form the gate electrode 219. Then, the mask is removed.

Here, a 20-nm-thick tungsten film is formed as the conductive film by a sputtering method. Then, a mask is formed over the conductive film by a lithography step, and the conductive film is wet-etched using the mask, so that the gate electrode 219 is formed.

Note that heat treatment may be performed to release water, hydrogen, or the like contained in the insulating film 104. As a result, the concentration of water, hydrogen, or the like contained in the insulating film 105 that is to be formed later can be reduced. The heat treatment can reduce the amount of water, hydrogen, or the like diffused into the oxide semiconductor film 211.

The oxide semiconductor film 206 can be formed by a sputtering method, a coating method, a pulsed laser deposition method, a laser ablation method, a metal organic chemical vapor deposition (MOCVD) method, an atomic layer deposition (ALD) method, or the like.

In the case where the oxide semiconductor film 206 is formed by a sputtering method, a power supply device for generating plasma can be an RF power supply device, an AC power supply device, a DC power supply device, or the like as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased.

Furthermore, a target may be appropriately selected in accordance with the composition of the oxide semiconductor film 206 to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., further preferably higher than or equal to 200° C. and lower than or equal to 350° C., the oxide semiconductor film can be a CAAC-OS film.

For the deposition of the CAAC-OS film, the following conditions are preferably used.

By inhibiting entry of impurities during the deposition, the crystal state can be prevented from being broken by the impurities. For example, the concentration of impurities (e.g., hydrogen, water, carbon dioxide, or nitrogen) that exist in a deposition chamber may be reduced. Furthermore, the concentration of impurities in a deposition gas may be reduced. Specifically, a deposition gas whose dew point is −80° C. or lower, preferably −100° C. or lower is used.

Here, as the oxide semiconductor film 206, a 20-nm-thick In—Ga—Zn oxide film (In:Ga:Zn=1:3:4) is formed by a sputtering method.

The oxygen 208 added to the oxide semiconductor film 206 is at least one kind selected from oxygen radicals, oxygen atoms, oxygen atomic ions, oxygen molecular ions, and the like. As a method for adding the oxygen 208 to the oxide semiconductor film 206, an ion doping method, an ion implantation method, and the like can be given.

In the case of using an ion implantation method as the method for adding the oxygen 208, damage to the oxide semiconductor film 206 can be reduced by using oxygen molecular ions as the oxygen 208 added to the oxide semiconductor film 206. Oxygen molecular ions are broken down into oxygen atomic ions at the surface of the oxide semiconductor film 206, and the oxygen atomic ions are added to the oxide semiconductor film 206. Since energy for breaking oxygen molecules down into oxygen atoms is used, the energy per oxygen atomic ion in the case of adding oxygen molecular ions to the oxide semiconductor film 206 is lower than that in the case of adding oxygen atomic ions to the oxide semiconductor film 206. Therefore, in the case of adding oxygen molecular ions to the oxide semiconductor film 206, damage to the oxide semiconductor film 206 can be reduced.

By using oxygen molecular ions, the energy of each oxygen atomic ion injected to the insulating film 104 is lowered, which makes the injected oxygen atomic ion be positioned in a shallow region. Accordingly, oxygen atoms easily move by later heat treatment, so that more oxygen can be supplied to an oxide semiconductor film 209 that is to be formed later.

In the case of injecting oxygen molecular ions, the energy per oxygen atomic ion is low as compared with the case of injecting oxygen atomic ions. Thus, by using oxygen molecular ions for injection, the acceleration voltage can be increased and throughput can be increased. Moreover, by using oxygen molecular ions for injection, the dose can be half of the amount that is necessary in the case of using oxygen atomic ions. As a result, throughput can be increased.

In the case of adding oxygen to the oxide semiconductor film 206, it is preferable that oxygen be added to the oxide semiconductor film 206 so that a peak of the concentration profile of oxygen atomic ions can be positioned in the oxide semiconductor film 206. As a result, damage to the insulating film 105 that is to be formed later can be reduced. In other words, defects in the insulating film 105 can be reduced, so that variations in electrical characteristics of the transistor can be reduced. Furthermore, in the case where oxygen is added to the oxide semiconductor film 206 so that the number of added oxygen atoms at the interface between the insulating film 104 and the oxide semiconductor film 206 is less than $1 \times 10^{21}$ atoms/cm$^3$, less than $1 \times 10^{20}$ atoms/cm$^3$, or less than $1 \times 10^{19}$ atoms/cm$^3$, the amount of oxygen added to the insulating film 105 that is to be formed later can be reduced. As a result, damage to the insulating film 105 that is to be formed later can be reduced, whereby variations in electrical characteristics of the transistor can be prevented.

Even if oxygen is also added to the insulating film 104 in this step for adding oxygen, since the nitrogen concentration of the insulating film 104 is still low, the amount of nitrogen oxide produced by heat treatment performed later can be small and defects in a back channel of the transistor can be reduced. Thus, there are a small number of carrier traps in the back channel of the transistor, leading to a reduction in the amount of change in the threshold voltage of the transistor in a GBT stress test.

Plasma treatment in which the oxide semiconductor film 206 is exposed to plasma generated in an atmosphere containing oxygen may be performed, to add oxygen to the oxide semiconductor film 206. As the atmosphere containing oxygen, an atmosphere containing an oxidation gas such as oxygen, ozone, dinitrogen monoxide, or nitrogen dioxide can be given. Note that it is preferable that the oxide semiconductor film 206 be exposed to plasma generated in a state where bias is applied on the insulating film 105 side, because the amount of oxygen added to the oxide semiconductor film 206 can be increased. As an example of an apparatus used in such plasma treatment, an ashing apparatus is given.

Here, oxygen atomic ions are added to the oxide semiconductor film 206 by an ion implantation method with a dose of $1 \times 10^{16}/cm^2$ at an acceleration voltage of 5 kV.

In the case where the oxide semiconductor film 206 contains a small number of oxygen vacancies, oxygen does not need to be added to the oxide semiconductor film 206. Oxygen may be added to the oxide semiconductor film 209 or 215, which is to be formed later, instead of the oxide semiconductor film 206.

Figure 25B:
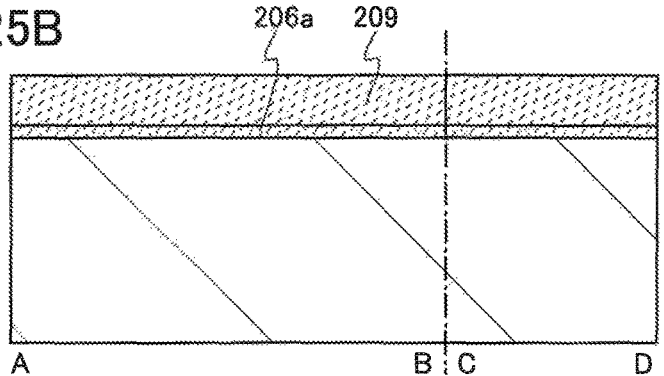
Figure 25C:
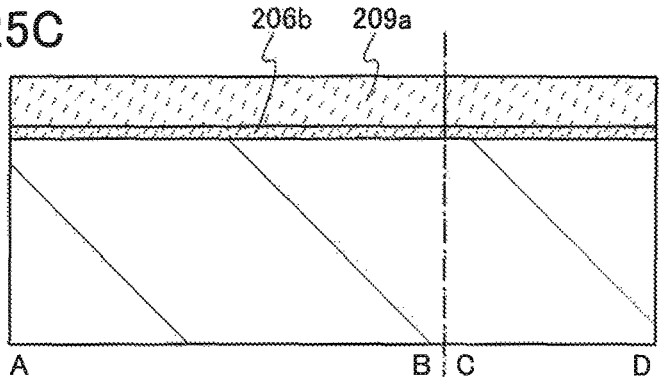

Through the above-described steps, an oxide semiconductor film 206a to which oxygen is added as illustrated in FIG. 25B can be formed. As a result, the number of oxygen vacancies in the oxide semiconductor film 209 can be reduced by heat treatment in a later step. Note that the oxide semiconductor film 206a to which oxygen is added has a low film density compared with the oxide semiconductor film 206 to which oxygen is not added.

Next, as illustrated in FIG. 25B, the oxide semiconductor film 209 is formed over the oxide semiconductor film 206a to which oxygen is added.

The oxide semiconductor film 209 can be formed by a sputtering method, a coating method, a pulsed laser deposition method, a laser ablation method, a metal organic chemical vapor deposition (MOCVD) method, an atomic layer deposition (ALD) method, or the like.

As a power supply device for generating plasma in the case of forming the oxide semiconductor film 209, an RF power supply device, an AC power supply device, a DC power supply device, or the like can be used as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased.

Furthermore, a target may be appropriately selected in accordance with the composition of the oxide semiconductor film 209.

Note that in the case where the oxide semiconductor film 209 is formed by, for example, a sputtering method, the substrate temperature may be set to higher than or equal to 100° C. and lower than or equal to 450° C., preferably higher than or equal to 170° C. and lower than or equal to 350° C., and the oxide semiconductor film 209 may be formed while being heated.

Here, as the oxide semiconductor film 209, a 20-nm-thick In—Ga—Zn oxide film (In:Ga:Zn=1:1:1) is formed by a sputtering method.

Next, heat treatment is performed so that part of oxygen contained in the oxide semiconductor film 206a to which oxygen is added can be transferred to the oxide semiconductor film 209; consequently, oxygen vacancies in the oxide semiconductor film 209 can be reduced. This oxide semiconductor film with reduced oxygen vacancies is represented as the oxide semiconductor film 209a in FIG. 25C. Oxygen vacancies in the oxide semiconductor film 206a to which oxygen is added can be reduced. This oxide semiconductor film is represented as the oxide semiconductor film 206b in FIG. 25C. Hydrogen, water, and the like contained in the oxide semiconductor film 206a to which oxygen is added and the oxide semiconductor film 209 can be released. As a result, the amount of impurities contained in the oxide semiconductor film 206a to which oxygen is added and the oxide semiconductor film 209 can be reduced.

The temperature of the heat treatment is preferably within the range of temperatures at which oxygen moves from the oxide semiconductor film 206a to the oxide semiconductor film 209. In addition, the temperature of the heat treatment is preferably lower than the deposition temperature of the insulating film 104. In that case, nitrogen oxide is unlikely to be produced in the insulating film 104 by the heat treatment, so that the number of electron traps can be reduced. The temperature of the heat treatment typically higher than or equal to 250° C. and lower than the strain point of the substrate, preferably higher than or equal to 300° C. and lower than or equal to 550° C., further preferably higher than or equal to 350° C. and lower than or equal to 510° C., still further preferably higher than or equal to 350° C. and lower than or equal to 450° C.

The heat treatment is performed in an inert gas atmosphere containing nitrogen or a rare gas such as helium, neon, argon, xenon, or krypton. Further, after heat treatment performed in an inert gas atmosphere, heat treatment may be additionally performed in an oxygen atmosphere or a dry air atmosphere (air whose dew point is lower than or equal to −80° C., preferably lower than or equal to −100° C., further preferably lower than or equal to −120° C.). Note that it is preferable that hydrogen, water, and the like be not contained in an inert gas and oxygen, like the dry air, and the dew point is preferably lower than or equal to −80° C., further preferably lower than or equal to −100° C. The treatment time is 3 minutes to 24 hours.

In the heat treatment, instead of an electric furnace, any device for heating an object by heat conduction or heat radiation from a heating element such as a resistance heating element may be used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas such as nitrogen or a rare gas like argon is used.

Here, after heat treatment is performed at 450° C. for 1 hour in a nitrogen atmosphere, heat treatment is performed at 450° C. for 1 hour in an oxygen atmosphere.

Through the above-described steps, oxygen vacancies in the oxide semiconductor films can be reduced. The oxide semiconductor films can have low density of localized states.

Note that the heat treatment may be performed in a later step, not this step. In other words, in another heating step performed later, part of oxygen contained in the oxide semiconductor film 206a to which oxygen is added may be transferred to the oxide semiconductor film 209. As a result, the number of heating steps can be reduced.

Figure 25D:
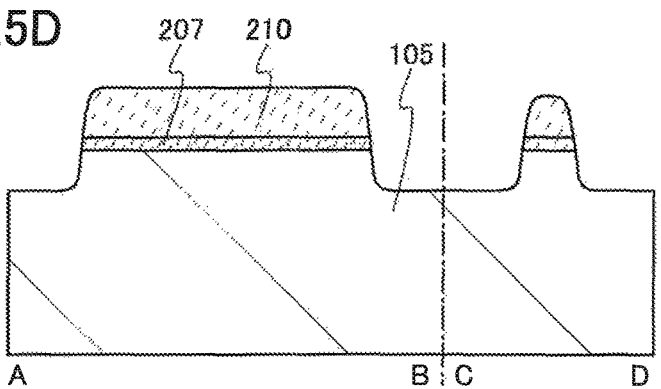

Then, after a mask is formed over the oxide semiconductor film 209a by a lithography process, part of the oxide semiconductor film 206b and part of the oxide semiconductor film 209a are each etched using the mask. Accordingly, the oxide semiconductor film 207 and an oxide semiconductor film 210 are formed as illustrated in FIG. 25D. Then, the mask is removed. Note that in the etching step, it is preferable that part of the insulating film 104 be etched. As a result, a transistor with the s-channel structure where, in the channel width direction, the side surfaces of the oxide semiconductor film 207 and the oxide semiconductor film 211 face the gate electrode 219 with the gate insulating film interposed therebetween can be formed. Here, the insulating film 104 which is partly etched is referred to as the insulating film 105.

Here, a mask is formed over the oxide semiconductor film 209a by a lithography process, and the oxide semiconductor film 206b and the oxide semiconductor film 209a are wet-etched using the mask, so that the oxide semiconductor film 207 and the oxide semiconductor film 210 are formed.

Figure 26A:
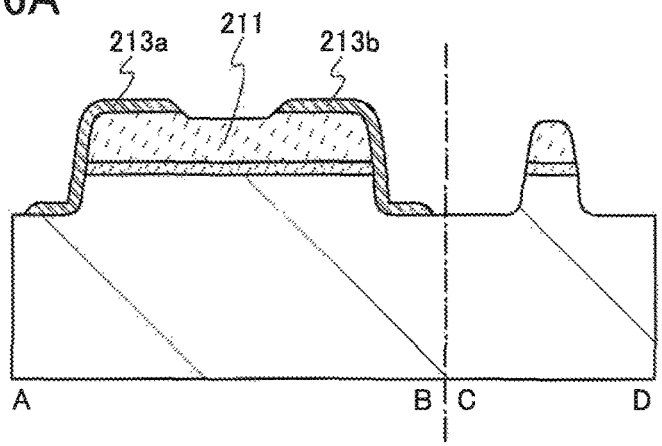
FIGS. 26A to 26C are cross-sectional views illustrating one embodiment of a method for manufacturing a semiconductor device.

Next, as illustrated in FIG. 26A, the pair of electrodes 213a and 213b is formed over the oxide semiconductor film 210.

A method for forming the pair of electrodes 213a and 213b is described below. A conductive film is formed by a sputtering method, a chemical vapor deposition (CVD) method such as a metal organic chemical vapor deposition (MOCVD) method, a metal chemical vapor deposition method, an atomic layer deposition (ALD) method, or a plasma-enhanced chemical vapor deposition (PECVD) method, an evaporation method, a pulsed laser deposition (PLD) method, or the like. Then, a mask is formed over the conductive film by a lithography process. Then, part of the conductive film is etched using the mask to form the pair of electrodes 213a and 213b. Then, the mask is removed.

Note that in the case where a transistor having an extremely short channel length is formed, at least the conductive film in a region to divide the pair of electrodes 213a and 213b is etched using a resist mask that is processed by a method suitable for micropatterning, such as electron beam exposure, liquid immersion exposure, or EUV exposure.

Here, a 10-nm-thick tungsten film is formed as the conductive film by a sputtering method. Then, a mask is formed over the conductive film by a lithography process and the conductive film is dry-etched with use of the mask to form the pair of electrodes 213a and 213b.

After the pair of electrodes 213a and 213b is formed, cleaning treatment is preferably performed to remove an etching residue. A short circuit of the pair of electrodes 213a and 213b can be suppressed by this cleaning treatment. The cleaning treatment can be performed using an alkaline solution such as a tetramethylammonium hydroxide (TMAH) solution, an acidic solution such as diluted hydrofluoric acid, an oxalic acid solution, or a phosphoric acid solution. By the cleaning treatment, part of the oxide semiconductor film 210 is etched, so that the oxide semiconductor film 211 having a concave portion is formed.

Figure 26B:
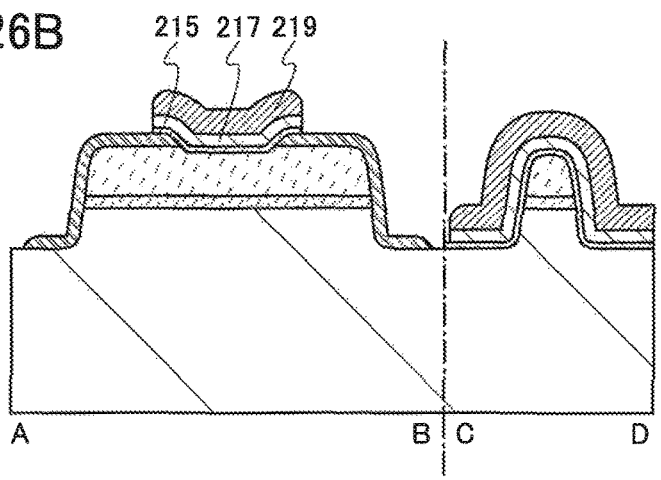

Next, as illustrated in FIG. 26B, the oxide semiconductor film 215 is formed over the oxide semiconductor film 211 and the pair of electrodes 213a and 213b, the gate insulating film 217 is formed over the oxide semiconductor film 215, and the gate electrode 219 is formed over the gate insulating film 217.

A method for forming the oxide semiconductor film 215, the gate insulating film 217, and the gate electrode 219 is described below. First, an oxide semiconductor film is formed using any of the methods that can be used for forming the oxide semiconductor film 206 as appropriate. Next, an insulating film is formed using any of the methods that can be used for forming an insulating film 116. Then, a conductive film is formed. Then, a mask is formed over the conductive film by a lithography process. Next, the oxide semiconductor film, the insulating film, and the conductive film are etched using the mask to form the oxide semiconductor film 215, the gate insulating film 217, and the gate electrode 219. After that, the mask is removed.

Here, as the oxide semiconductor film, a 5-nm-thick In—Ga—Zn oxide film (In:Ga:Zn=1:3:2) is formed by a sputtering method. Next, as the insulating film, a 10-nm-thick silicon oxynitride film is formed by a CVD method. Then, as the conductive film, a 20-nm-thick tungsten film is formed by a sputtering method. Then, a mask is formed over the conductive film by a lithography process. Next, the oxide semiconductor film, the insulating film, and the conductive film are etched using the mask to form the oxide semiconductor film 215, the gate insulating film 217, and the gate electrode 219. After that, the mask is removed.

In the transistor 200, by providing the oxide semiconductor film 215 in which oxygen vacancies are unlikely to occur, release of oxygen from side surfaces of the oxide semiconductor film 211 in the channel width direction is suppressed, so that generation of oxygen vacancies can be suppressed. As a result, a transistor which has improved electrical characteristics and high reliability can be provided.

Figure 26C:
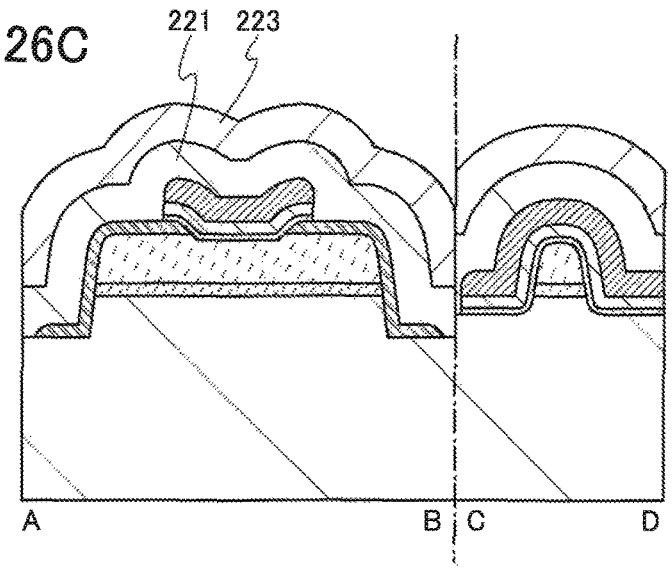

As illustrated in FIG. 26C, the insulating film 221 and the insulating film 223 are formed sequentially over the insulating film 105, the pair of electrodes 213a and 213b, the oxide semiconductor film 215, the gate insulating film 217, and the gate electrode 219. After that, heat treatment is preferably performed.

The insulating films 221 and 223 can be formed by a sputtering method, a CVD method, or the like as appropriate.

In the case where the insulating films 221 and 223 are oxide insulating films containing oxygen in excess of the stoichiometric composition, the oxide insulating films containing oxygen in excess of the stoichiometric composition can be formed by a CVD method, a sputtering method, or the like. After the oxide insulating films are formed by a CVD method, a sputtering method, or the like, oxygen may be added to the oxide insulating films by an ion implantation method, an ion doping method, plasma treatment, or the like.

The heat treatment is preferably performed at a temperature lower than the deposition temperature of the insulating film 104. In that case, nitrogen oxide is unlikely to be produced in the insulating film 104 by the heat treatment. In addition, the number of carrier traps in the back channel of the transistor can be reduced. The temperature of the heat treatment typically higher than or equal to 150° C. and lower than the strain point of the substrate, preferably higher than or equal to 250° C. and lower than or equal to 500° C., further preferably higher than or equal to 350° C. and lower than or equal to 450° C.

Here, a 40-nm-thick aluminum oxide film is formed as the insulating film 221 by a sputtering method, and a 150-nm-thick silicon oxynitride film is formed as the insulating film 223 by a CVD method. Further, heat treatment is performed at 350° C. in an oxygen atmosphere for 1 hour.

Through the above-described steps, the density of localized states of the oxide semiconductor films is lowered, and thus a transistor with excellent electrical characteristics can be manufactured. In addition, a highly reliable transistor with few variations with time in electrical characteristics or few variations in electrical characteristics due to a stress test can be manufactured.

<Band Diagram>

Here, a band diagram is described. For easy understanding, the band diagram is illustrated with the conduction band minimums (Ec) of the insulating film 105, the oxide semiconductor film 207, the oxide semiconductor film 211, the oxide semiconductor film 215, and the gate insulating film 217.

Figure 27A:
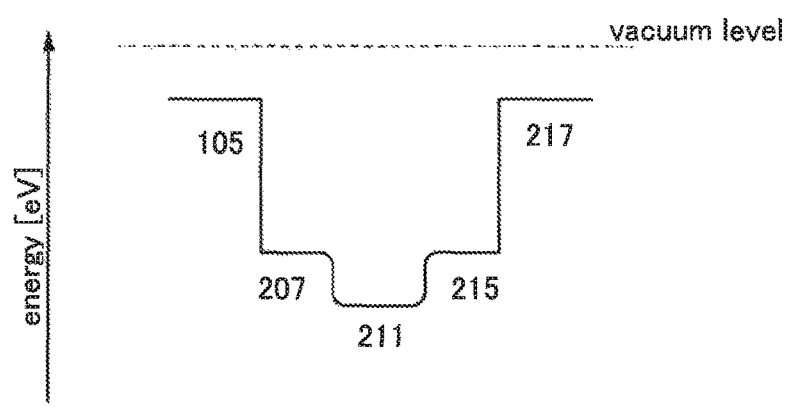
FIGS. 27A and 27B each show a band diagram of a transistor.
Figure 27B:
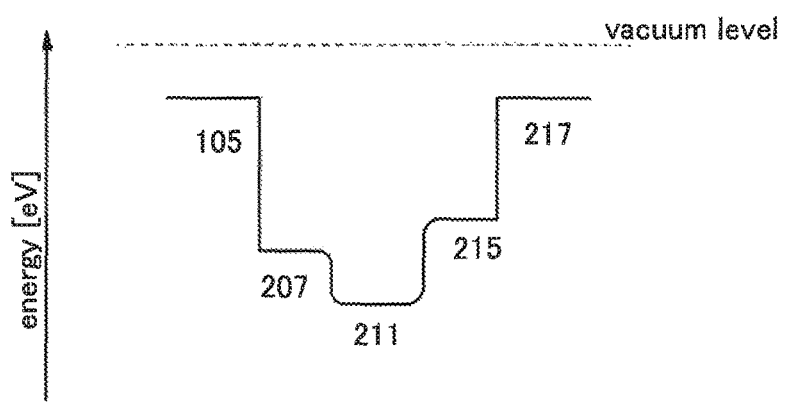

As illustrated in FIGS. 27A and 27B, the conduction band minimum changes continuously within the oxide semiconductor films 207, 211, and 215. This can be understood also from the fact that the constituent elements are common among the oxide semiconductor films 207, 211, and 215 and oxygen is easily diffused among the oxide semiconductor films 207, 211, and 215. Thus, the oxide semiconductor films 207, 211, and 215 have a continuous physical property although they are a stack of films having different compositions.

The oxide semiconductor films, which contain the same main components and are stacked, are not simply stacked but formed to have continuous junction (here, particularly a U-shaped (U shape) well structure where the conduction band minimum is continuously changed between the films). In other words, a stacked-layer structure is formed such that there exist no impurities which form a defect level such as a trap center or a recombination center at each interface. If impurities are mixed between the films in the stacked multilayer film, the continuity of the energy band is lost and carriers disappear by a trap or recombination at the interface.

Note that FIG. 27A illustrates Ec of the oxide semiconductor film 207 and that of the oxide semiconductor film 215 are equal to each other; however, they may be different from each other. For example, FIG. 27B illustrates part of the band diagram in the case where the conduction band minimum (Ec) of the oxide semiconductor film 215 is closer to the vacuum level than that of the oxide semiconductor film 207 is.

As illustrated in FIGS. 27A and 27B, the oxide semiconductor film 211 serves as a well and a channel of the transistor 200 is formed in the oxide semiconductor film 211. Note that a channel having a U-shaped well structure in which the conduction band minimum continuously changes like the one formed in the oxide semiconductor films 207, 211, and 215, can also be referred to as a buried channel.

Note that trap levels due to impurities or defects might be formed in the vicinity of the interface between an insulating film such as a silicon oxide film and each of the oxide semiconductor films 207 and 215. The oxide semiconductor film 211 can be distanced away from the trap levels owing to the existence of the oxide semiconductor films 207 and 215. However, when the energy difference between the Ec of the oxide semiconductor film 207 or 215 and the Ec of the oxide semiconductor film 211 is small, electrons in the oxide semiconductor film 211 might reach the trap levels across the energy difference. When the electrons are trapped in the trap levels, negative charges are generated at the interface with the insulating film, whereby the threshold voltage of the transistor is shifted in the positive direction.

Thus, to reduce a change in the threshold voltage of the transistor, an energy difference between the Ec of the oxide semiconductor film 211 and the Ec of each of the oxide semiconductor films 207 and 215 is necessary. The energy difference is preferably greater than or equal to 0.1 eV, further preferably greater than or equal to 0.2 eV.

The oxide semiconductor films 207, 211, and 215 preferably include a crystal portion. In particular, when a crystal in which c-axes are aligned is used, the transistor can have stable electrical characteristics.

In the band diagram in FIG. 27B, instead of the oxide semiconductor film 215, an In—Ga oxide (e.g., an In—Ga oxide with an atomic ratio of In:Ga=7:93) may be provided between the oxide semiconductor film 211 and the gate insulating film 217.

For the oxide semiconductor film 211, an oxide having an electron affinity higher than that of each of the oxide semiconductor films 207 and 215 is used. For example, for the oxide semiconductor film 211, an oxide having an electron affinity higher than that of each of the oxide semiconductor films 207 and 215 by 0.07 eV or higher and 1.3 eV or lower, preferably 0.1 eV or higher and 0.7 eV or lower, and more preferably 0.2 eV or higher and 0.4 eV or lower is used.

Since the transistor described in this embodiment includes the oxide semiconductor films 207 and 215 that each include one or more kinds of metal elements included in the oxide semiconductor film 211, interface states are unlikely to occur at the interface between the oxide semiconductor film 207 and the oxide semiconductor film 211 and the interface between the oxide semiconductor film 215 and the oxide semiconductor film 211. Thus, providing the oxide semiconductor films 207 and 215 makes it possible to reduce variation or change in the electrical characteristics of the transistor, such as threshold voltage.

When a channel is formed at the interface between the gate insulating film 217 and the oxide semiconductor film 211, interface scattering occurs at the interface and the field-effect mobility of the transistor may decrease in some cases. In the transistor of this structure, however, the oxide semiconductor film 215 includes one or more kinds of metal elements included in the oxide semiconductor film 211. Therefore, scattering of carriers is unlikely to occur at the interface between the oxide semiconductor film 211 and the oxide semiconductor film 215, and thus the field-effect mobility of the transistor can be increased.

<Modification Example 1>

Transistors having different shapes of the oxide semiconductor film 215 and the gate insulating film 217 from those of the transistor 200 illustrated in FIGS. 24A to 24C will be described with reference to FIGS. 28A to 28C.

Figure 28A:
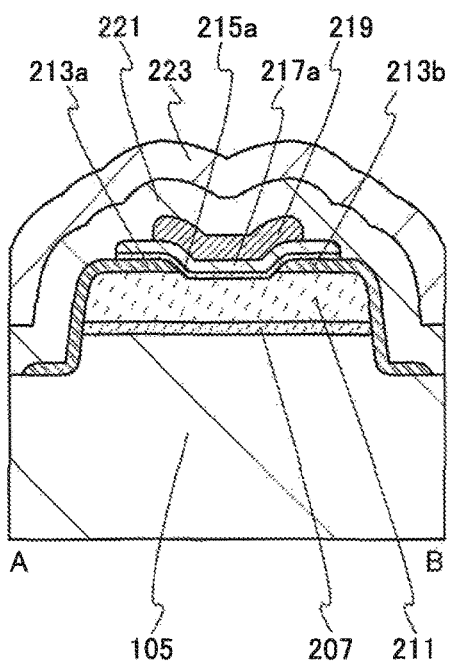
FIGS. 28A to 28C are each a cross-sectional view illustrating one embodiment of a semiconductor device.

A transistor 200a illustrated in FIG. 28A includes an oxide semiconductor film 215a that is in contact with the oxide semiconductor film 211 and the pair of electrodes 213a and 213b, and a gate insulating film 217a that is in contact with the oxide semiconductor film 215a. The gate insulating film 217a is in contact with the gate electrode 219.

In the transistor 200a, edges of the oxide semiconductor film 215a and the gate insulating film 217a are located on the outer side of an edge of the gate electrode 219.

Figure 28B:
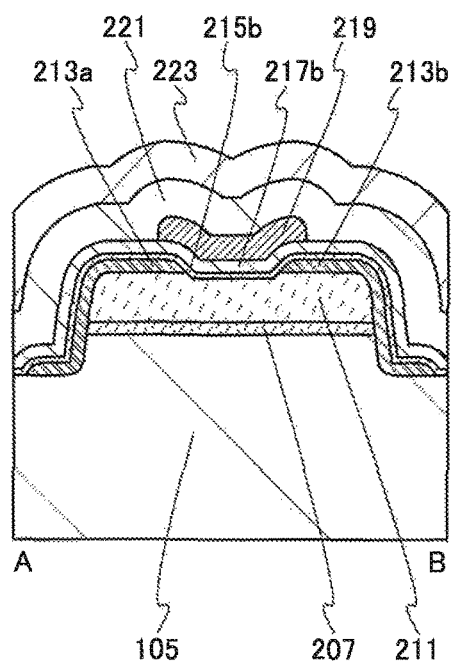

A transistor 200b illustrated in FIG. 28B includes an oxide semiconductor film 215b that is in contact with the oxide semiconductor film 211 and the pair of electrodes 213a and 213b, and a gate insulating film 217b that is in contact with the oxide semiconductor film 215b. The gate insulating film 217b is in contact with the gate electrode 219.

In the transistor 200b, the oxide semiconductor film 215b and the gate insulating film 217b are each not disconnected and cover the pair of electrodes 213a and 213b and the insulating film 105.

Figure 28C:
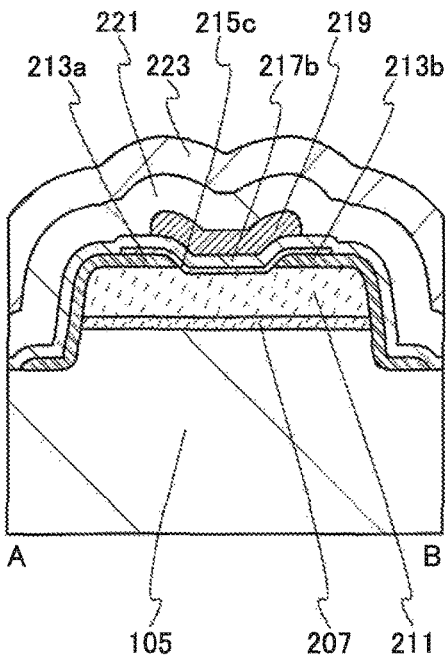

A transistor 200c illustrated in FIG. 28C includes an oxide semiconductor film 215c that is in contact with the oxide semiconductor film 211 and the pair of electrodes 213a and 213b, and a gate insulating film 217b that is in contact with the oxide semiconductor film 215c. The gate insulating film 217b is in contact with the gate electrode 219.

Edges of the oxide semiconductor film 215c included in the transistor 200c are located on the outer side of an edge of the gate electrode 219. The gate insulating film 217b covers the pair of electrodes 213a and 213b and the insulating film 105 without being disconnected.

The oxide semiconductor films 215a, 215b, and 215c can be formed using the same material as that of the oxide semiconductor film 215, as appropriate. The gate insulating films 217a and 217b can be formed using the same material as that of the gate insulating film 217, as appropriate.

<Modification Example 2>

A transistor having different shapes of the pair of electrodes 213a and 213b from those of the transistor 200 illustrated in FIGS. 24A to 24C will be described with reference to FIGS. 29A to 29D.

Figure 29A:
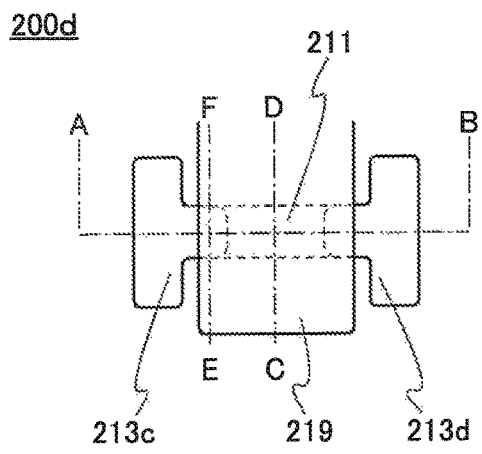
FIGS. 29A to 29D are a top view and cross-sectional views each illustrating one embodiment of a semiconductor device.
Figure 29C:
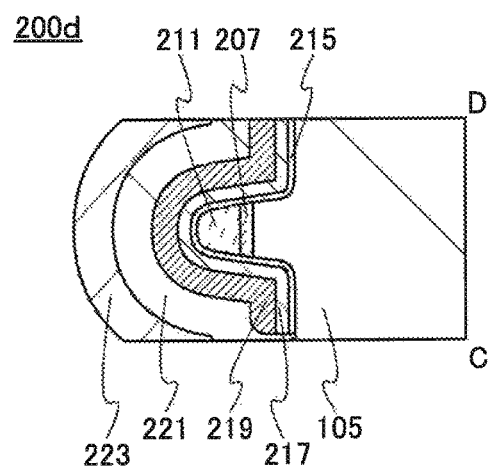
Figure 29B:
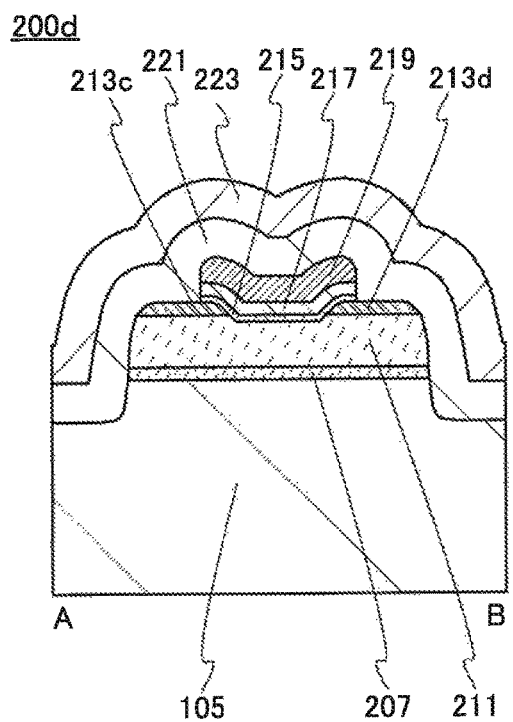
Figure 29D:
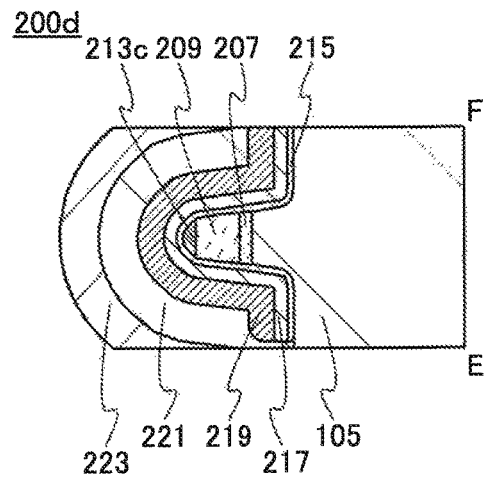

FIGS. 29A to 29D are a top view and cross-sectional views of a transistor 200d. FIG. 29A is a top view of the transistor 200d, FIG. 29B is a cross-sectional view taken along dashed-dotted line A-B in FIG. 29A, FIG. 29C is a cross-sectional view taken along dashed-dotted line C-D in FIG. 29A, and FIG. 29D is a cross-sectional view taken along dashed-dotted line E-F in FIG. 29A.

FIG. 29B is a cross-sectional view in the channel length direction of the transistor 200d, FIG. 29C is a cross-sectional view in the channel width direction of the transistor 200d, and FIG. 29D is a cross-sectional view in the channel width direction of the transistor 200d showing the region where the pair of electrodes and the oxide semiconductor films are stacked.

Note that in FIG. 29A, the insulating film 105, the oxide semiconductor film 207, the gate insulating film 217, the insulating film 221, the insulating film 223, and the like are not illustrated for simplicity.

The transistor 200d illustrated in FIG. 29C includes a pair of electrodes 213c and 213d that is not in contact with the side surfaces of the oxide semiconductor film 207 and the oxide semiconductor film 211 and are in contact with the top surface of the oxide semiconductor film 211.

As illustrated in FIG. 29D, since the side surfaces of the oxide semiconductor films 207, 209, and 213c are not in contact with the pair of electrodes 213c and 213d in the channel width direction, electric field of the gate electrode 219 is not blocked by the pair of electrodes 213c and 213d. As a result, the effect of the electric field of the gate electrode 219 on the side surfaces of the oxide semiconductor films 207, 209, and 213c can be increased, and this transistor can therefore have an excellent subthreshold swing (hereinafter referred to as S value) and a high field-effect mobility. Note that the S value is the value of a gate voltage necessary to change the on-state current by one digit; a smaller S value means better transistor characteristics.

<Modification Example 3>

A transistor including an oxide semiconductor film having a shape different from that of the oxide semiconductor film 211 included in the transistor 200 illustrated in FIGS. 24A to 24C will be described with reference to FIGS. 30A to 30C.

Figure 30A:
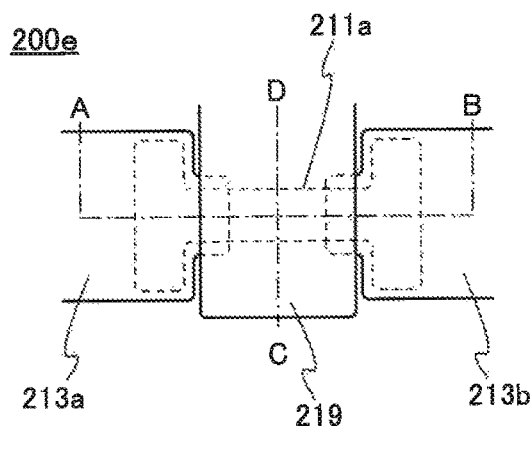
FIGS. 30A to 30C are a top view and cross-sectional views illustrating one embodiment of a semiconductor device.
Figure 30C:
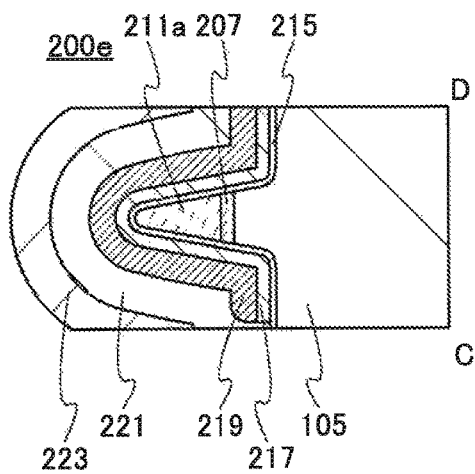
Figure 30B:
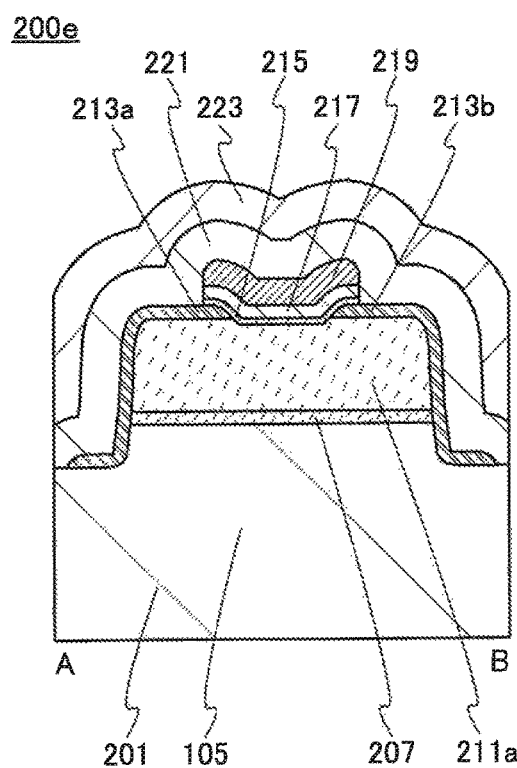

FIGS. 30A to 30C are a top view and cross-sectional views of a transistor 200e. FIG. 30A is a top view of the transistor 200e, FIG. 30B is a cross-sectional view taken along dashed-dotted line A-B in FIG. 30A, and FIG. 30C is a cross-sectional view taken along dashed-dotted line C-D in FIG. 30A.

FIG. 30B is a cross-sectional view in the channel length direction of the transistor 200e and FIG. 30C is a cross-sectional view in the channel width direction of the transistor 200e.

Note that in FIG. 30A, the insulating film 105, the oxide semiconductor film 207, the gate insulating film 217, the insulating film 221, the insulating film 223, and the like are not illustrated for simplicity.

As illustrated in FIG. 30C, the transistor 200e includes an oxide semiconductor film 211a whose cross section in the channel width direction is substantially triangular or substantially trapezoidal. Here, the substantial triangle and the substantial trapezoid refer to the shapes in which the angle between the bottom surface in contact with the oxide semiconductor film 207 and the side surface in contact with the oxide semiconductor film 215 in the oxide semiconductor film 211a is greater than 0° and less than or equal to 85° or greater than or equal to 30° and less than or equal to 80°. In addition, the surface on the opposite side to the bottom surface may have a sharp corner or a rounded corner. The shape may have a vertex on the opposite side to the bottom surface.

As compared with an upper region in an oxide semiconductor film whose cross section in the channel width direction is substantially rectangular, a region in the oxide semiconductor film 211a whose cross section is substantially triangular or trapezoidal has a small cross-sectional area on the gate insulating film 217 side. This decreases a region having high current density on the gate insulating film 217 side. As a result, excellent S value and increased on-state current can be achieved.

<Modification Example 4>

Figure 35A:
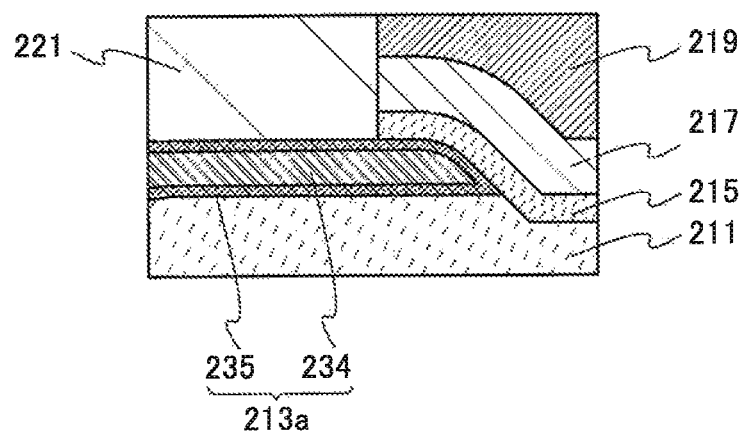
FIGS. 35A and 35B are each a cross-sectional view illustrating one embodiment of a semiconductor device.
Figure 35B:
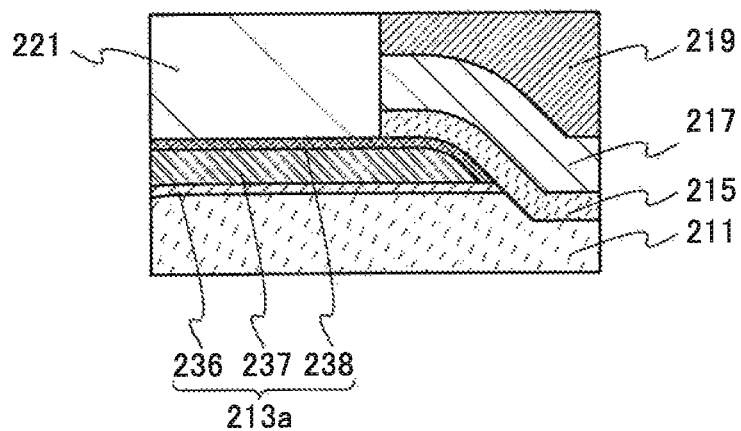

A modification example of the pair of electrodes included in the transistor will be described with reference to FIGS. 35A and 35B. FIGS. 35A and 35B are each an enlarged view of a region surrounded by a dashed line in FIG. 24B.

The pair of electrodes preferably includes at least a Cu—X alloy film (hereinafter, simply referred to as a Cu—X alloy film, where X is Mn, Ni, Cr, Fe, Co, Mo, Ta, or Ti). When the pair of electrodes is formed using a single structure of a Cu—X alloy film or a stacked-layer structure including a Cu—X alloy film, for example, the resistance of the pair of electrodes can be reduced. Here, the electrode 213a is described as an example of the electrode.

In the electrode 213a illustrated in FIG. 35A, a Cu—X alloy film 234 and a covering film 235 formed on a surface of the Cu—X alloy film 234 are stacked. The covering film 235 contains X in the Cu—X alloy film and a compound formed by reaction between X and an element contained in the oxide semiconductor film 211 or 215 or the insulating film 221. Examples of the compound containing X include an oxide containing X, a nitride containing X, silicide containing X, and carbide containing X Examples of the oxide containing X include an X oxide, an In—X oxide, a Ga—X oxide, an In—Ga—X oxide, and an In—Ga—Zn—X oxide. Since the covering film 235 serves as a blocking film, entry of Cu in the Cu—X alloy film into the oxide semiconductor film 211 or 215 or the insulating film 221 can be prevented.

Note that when a Cu—Mn alloy film is used as the Cu—X alloy film 234, for example, the adhesion between the electrode 213a and the oxide semiconductor film 211 or 215 or the insulating film 221 can be increased. With the Cu—Mn alloy film, a favorable ohmic contact between the electrode 213a and each of the oxide semiconductor films 211 and 215 can be made.

Specifically, the covering film 235 might be formed in the following manner: a Cu—Mn alloy film is formed as the Cu—X alloy film 234 and then is subjected to heat treatment at higher than or equal to 150° C. and lower than or equal to 450° C., preferably higher than or equal to 250° C. and lower than or equal to 350° C., for example; and Mn in the Cu—Mn alloy film is segregated at the interfaces between the Cu—X alloy film 234 and each of the oxide semiconductor films 211 and 215 and the insulating film 221. The covering film 235 can contain a Mn oxide formed by oxidation of the segregated Mn, or an In—Mn oxide, a Ga—Mn oxide, an In—Ga—Mn oxide, an In—Ga—Zn—Mn oxide, or the like, which is formed by reaction between the segregated Mn and a constituent element in the oxide semiconductor films 211 and 215. The covering film 235 increases the adhesion between the electrode 213a and each of the oxide semiconductor films 211 and 215. Furthermore, with the segregation of Mn in the Cu—Mn alloy film, part of the Cu—Mn alloy film becomes a pure Cu film, so that the electrode 213a can obtain high conductivity.

In the electrode 213a illustrated in FIG. 35B, a conductive film 236, a Cu—X alloy film 237, and a covering film 238 are stacked in this order. The conductive film 236 can be formed using a metal such as tungsten or titanium or an alloy containing the metal. The materials for the Cu—X alloy film 237 and the covering film 238 can be the same as those of the Cu—X alloy film 234 and the covering film 235 illustrated in FIG. 35A. The conductive film 236 can prevent diffusion of Cu contained in the Cu—X alloy film to the oxide semiconductor films 211 and 215.

This embodiment can be combined with any of the other embodiments in this specification as appropriate.

(Embodiment 3)

Transistors each having a stacked structure of oxide semiconductor films different from that of the transistor 200 illustrated in FIGS. 24A to 24C will be described with reference to FIGS. 31A to 31C.

Figure 31A:
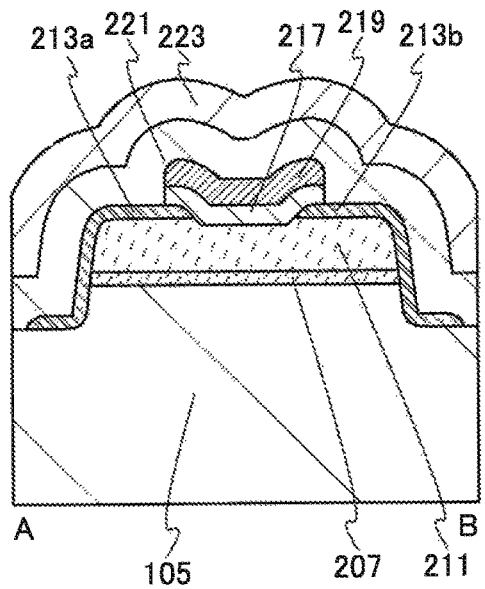
FIGS. 31A to 31C are each a cross-sectional view illustrating one embodiment of a semiconductor device.

A transistor 200f illustrated in FIG. 31A is different from the transistor 200 illustrated in FIG. 24B in not including the oxide semiconductor film 215. In other words, the transistor 200f includes the oxide semiconductor film 211, the pair of electrodes 213a and 213b, and the gate insulating film 217 in contact with the gate electrode 219.

Figure 31B:
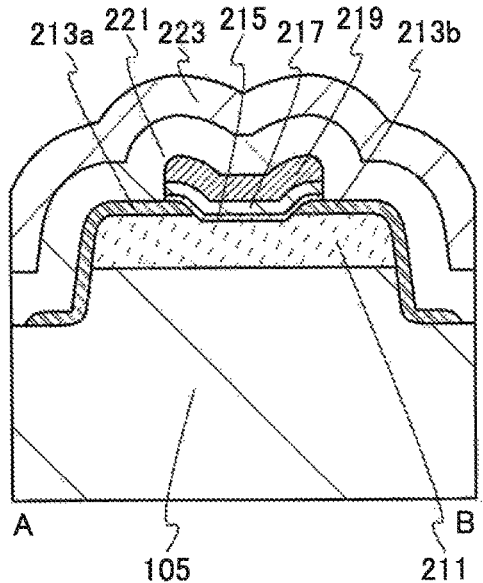

A transistor 200g illustrated in FIG. 31B is different from the transistor 200 illustrated in FIG. 24B in not including the oxide semiconductor film 207. In other words, the transistor 200g is characterized by including the insulating film 105 that is in contact with the gate electrode 219 and the oxide semiconductor film 211.

Figure 31C:
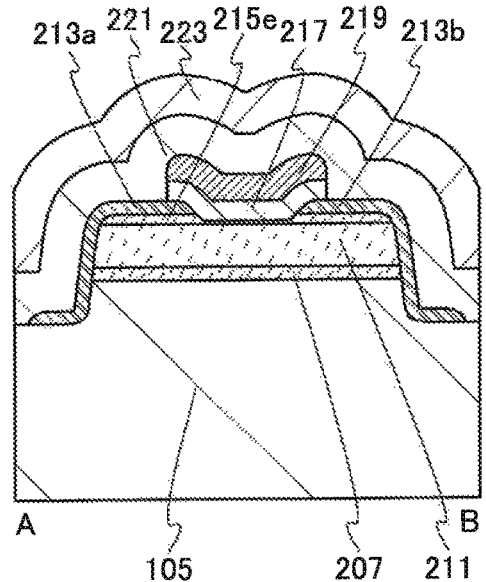

A transistor 200h illustrated in FIG. 31C is different from the transistor 200 illustrated in FIG. 24B in including an oxide semiconductor film 215e between the oxide semiconductor film 211 and the pair of electrodes 213a and 213b. In other words, the transistor 200h is characterized by including the oxide semiconductor film 215e that is in contact with the oxide semiconductor film 211, the pair of electrodes 213a and 213b, and the gate insulating film 217. The oxide semiconductor film 215e is provided between the oxide semiconductor film 211 and the pair of electrodes 213a and 213b.

This embodiment can be combined with any of the other embodiments in this specification as appropriate.

(Embodiment 4)

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a form reflecting unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is assigned to the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when 2θ is around 36°, in addition to the peak at 2θ of around 31°. The peak at 28 of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electric characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electric characteristics in some cases.

With the use of the CAAC-OS film in a transistor, variation in the electric characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the diameter of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots is shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film is an oxide semiconductor film having disordered atomic arrangement and no crystal part and exemplified by an oxide semiconductor film which exists in an amorphous state as quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and only a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is hardly observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are layered in the c-axis direction. Accordingly, the spacing between these adjacent layers is substantially equivalent to the lattice spacing (also referred to as d value) on the (009) plane, and is 0.29 nm according to crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

Furthermore, the density of an oxide semiconductor varies depending on the structure in some cases. For example, when the composition of an oxide semiconductor film is determined, the structure of the oxide semiconductor can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor having a density of lower than 78% of the density of the single crystal oxide semiconductor film.

Specific examples of the above description are given. For example, in the case of an oxide semiconductor film having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

This embodiment can be combined with any of the other embodiments in this specification as appropriate.

(Embodiment 5)

In this embodiment, a structure example of a display device of one embodiment of the present invention is described.

<Structure Example>

Figure 32A:
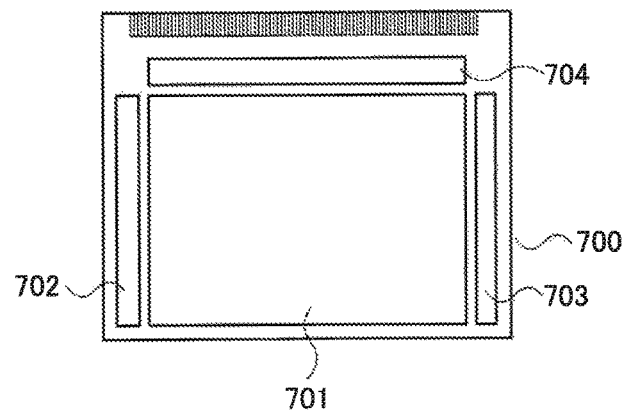
FIGS. 32A to 32C each illustrate a display device.
Figure 32B:
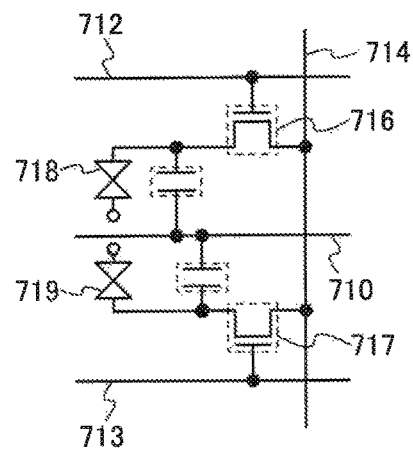
Figure 32C:
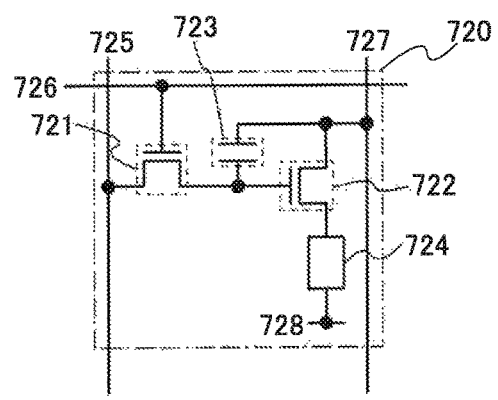

FIG. 32A is a top view of the display device of one embodiment of the present invention. FIG. 32B is a circuit diagram illustrating a pixel circuit that can be used in the case where a liquid crystal element is used in a pixel in the display device of one embodiment of the present invention. FIG. 32C is a circuit diagram illustrating a pixel circuit that can be used in the case where an organic EL element is used in a pixel in the display device of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 32A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 32A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

<Liquid Crystal Display Device>

FIG. 32B illustrates an example of a circuit configuration of the pixel. Here, a pixel circuit that can be used in a pixel of a VA liquid crystal display device is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 712 of a transistor 716 and a gate wiring 713 of a transistor 717 are separated so that different gate signals can be supplied thereto. In contrast, a source or drain electrode 714 that functions as a data line is shared by the transistors 716 and 717. The transistor described in any of the above embodiments can be used as appropriate as each of the transistors 716 and 717. Thus, a highly reliable liquid crystal display device can be provided.

A first pixel electrode is electrically connected to the transistor 716 and a second pixel electrode is electrically connected to the transistor 717. The first pixel electrode and the second pixel electrode are separated. There is no particular limitation on the shapes of the first pixel electrode and the second pixel electrode. The first pixel electrode may have, for example, a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, a storage capacitor may be formed using a capacitor wiring 710, a gate insulating film functioning as a dielectric, and a capacitor electrode electrically connected to the first pixel electrode or the second pixel electrode.

The multi-domain pixel includes a first liquid crystal element 718 and a second liquid crystal element 719 in one pixel. The first liquid crystal element 718 includes the first pixel electrode, a counter electrode, and a liquid crystal layer therebetween. The second liquid crystal element 719 includes the second pixel electrode, a counter electrode, and a liquid crystal layer therebetween.

Note that a pixel circuit of the present invention is not limited to that shown in FIG. 32B. For example, a switch, a resistor, a capacitor, a transistor, a sensor, a logic circuit, or the like may be added to the pixel illustrated in FIG. 32B.

<Organic EL Display Device>

FIG. 32C illustrates another example of a circuit configuration of the pixel. Here, a pixel structure of a display device including an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 32C illustrates an applicable example of a pixel circuit. Here, one pixel includes two n-channel transistors. Note that an oxide semiconductor film can be used for channel formation regions of the n-channel transistors. Furthermore, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode of the switching transistor 721 is connected to a scan line 726, a first electrode (one of a source electrode and a drain electrode) of the switching transistor 721 is connected to a signal line 725, and a second electrode (the other of the source electrode and the drain electrode) of the switching transistor 721 is connected to a gate electrode of the driver transistor 722. The gate electrode of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage higher than or equal to a voltage which is the sum of the forward voltage of the light-emitting element 724 and the threshold voltage $V_{th}$ of the driver transistor 722 is applied to the gate electrode of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 32C. For example, a switch, a resistor, a capacitor, a sensor, a transistor, a logic circuit, or the like may be added to the pixel circuit illustrated in FIG. 32C.

In the case where the transistor shown in any of the above embodiments is used for any of the circuits shown in FIGS. 32A to 32C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device includes, for example, at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Examples of the display device including an EL element include an EL display. Examples of the display device including an electron emitter include a field emission display (FED) and an SED-type flat panel display (SED: surface-conduction electron-emitter display). Examples of the display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of the display device including electronic ink, Electronic Liquid Powder (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Accordingly, power consumption can be further reduced.

This embodiment can be combined with any of the other embodiments in this specification as appropriate.

(Embodiment 6)

In this embodiment, a display module including a semiconductor device of one embodiment of the present invention will be described with reference to FIG. 33.

In a display module 8000 illustrated in FIG. 33, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

This embodiment can be combined with any of the other embodiments in this specification as appropriate.

(Embodiment 7)

In this embodiment, examples of an electronic device that uses a semiconductor device of one embodiment of the present invention will be described.

Specific examples of the electronic device that uses the semiconductor device of one embodiment of the present invention are as follows: display devices of televisions, monitors, and the like, lighting devices, desktop and notebook personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by fuel engines or electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 34A:
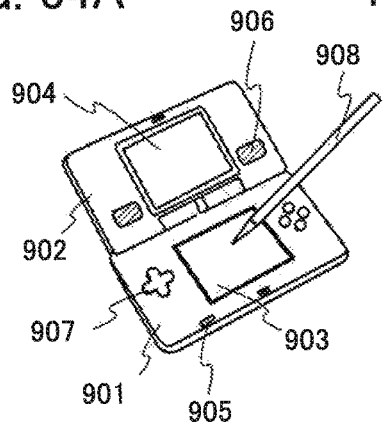
FIGS. 34A to 34F each illustrate an electronic device of one embodiment of the present invention.

FIG. 34A illustrates an example of a portable game console including a housing 901, a housing 902, a display portion 903, a display portion 904, a microphone 905, a speaker 906, an operation key 907, a stylus 908, and the like. Although the portable game machine in FIG. 34A has the two display portions 903 and 904, the number of display portions included in a portable game machine is not limited to this number. Any of the transistors described in Embodiment 2 can be used as transistors included in the display portions 903 and 904 and the like. Furthermore, any of the transistors described in Embodiment 2 can be used in a CPU, a memory device, or the like which is not illustrated in FIG. 34A.

Figure 34B:
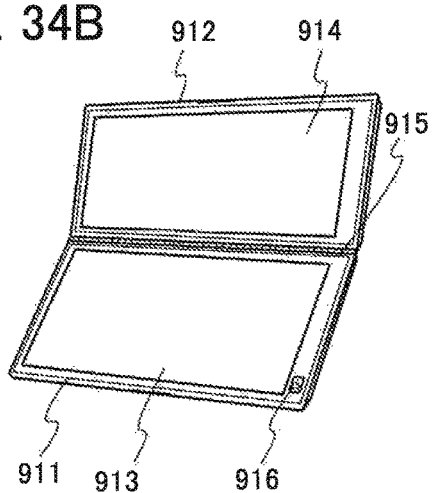

FIG. 34B illustrates an example of a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device. Any of the transistors described in Embodiment 2 can be used as transistors included in the first display portion 913, the second display portion 914, and the like. Furthermore, any of the transistors described in Embodiment 2 can be used in a CPU, a memory device, or the like which is not illustrated in FIG. 34B.

Figure 34C:
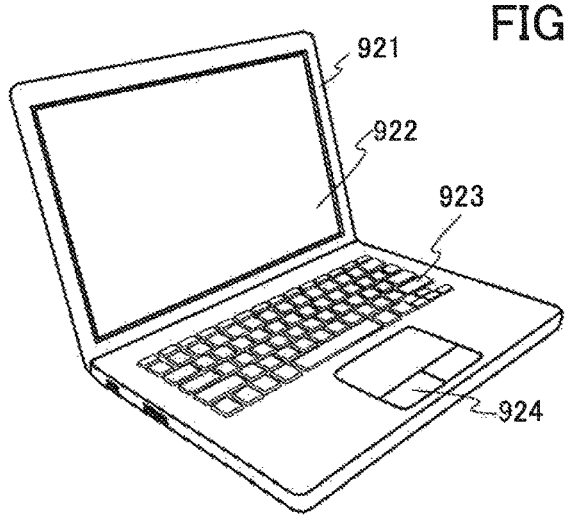

FIG. 34C illustrates an example of a notebook personal computer, which includes a housing 921, a display portion 922, a keyboard 923, a pointing device 924, and the like. Any of the transistors described in Embodiment 2 can be used as transistors included in the display portion 922 and the like. Furthermore, any of the transistors described in Embodiment 2 can be used in a CPU, a memory device, or the like which is not illustrated in FIG. 34C.

Figure 34D:
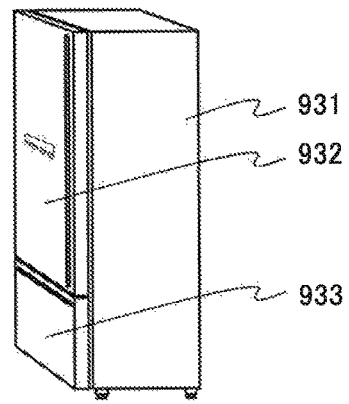

FIG. 34D illustrates an example of an electric refrigerator-freezer including a housing 931, a door for a refrigerator 932, a door for a freezer 933, and the like. Any of the transistors described in Embodiment 2 can be used in a CPU, a memory device, or the like which is not illustrated in FIG. 34D.

Figure 34E:
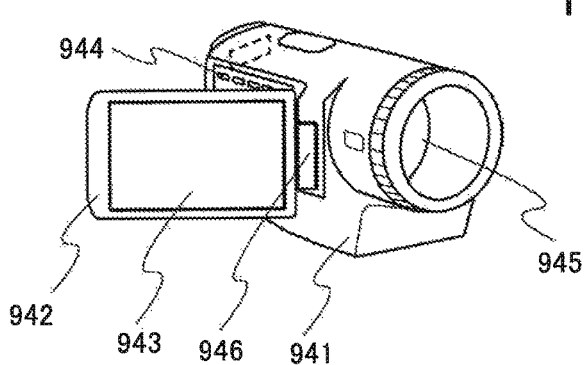

FIG. 34E illustrates an example of a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942. Any of the transistors described in Embodiment 2 can be used as transistors included in the display portion 943 and the like. Furthermore, any of the transistors described in Embodiment 2 can be used in a CPU, a memory device, or the like which is not illustrated in FIG. 34E.

Figure 34F:
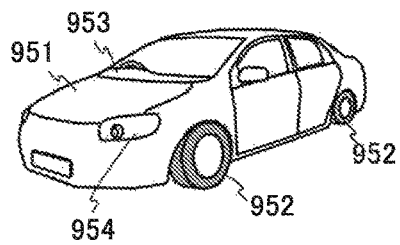

FIG. 34F illustrates an example of an automobile including a car body 951, wheels 952, a dashboard 953, lights 954, and the like. Any of the transistors described in Embodiment 2 can be used in a CPU, a memory device, or the like which is not illustrated in FIG. 34F.

This embodiment can be combined with any of the other embodiments in this specification as appropriate.

(Embodiment 8)

An example in which the capacitor Cs is provided over the insulating film 107 is described in Embodiment 1. In contrast, in this embodiment, described is an example in which an insulating film 106 is provided over the capacitor Cs, the transistor Tr2 is provided over the insulating film 106, and the insulating film 107 is provided thereover. In this embodiment, portions common to those in Embodiment 1 will be described using the same reference numerals, and the descriptions overlapping with those in Embodiment 1 will be omitted.

Figure 37:
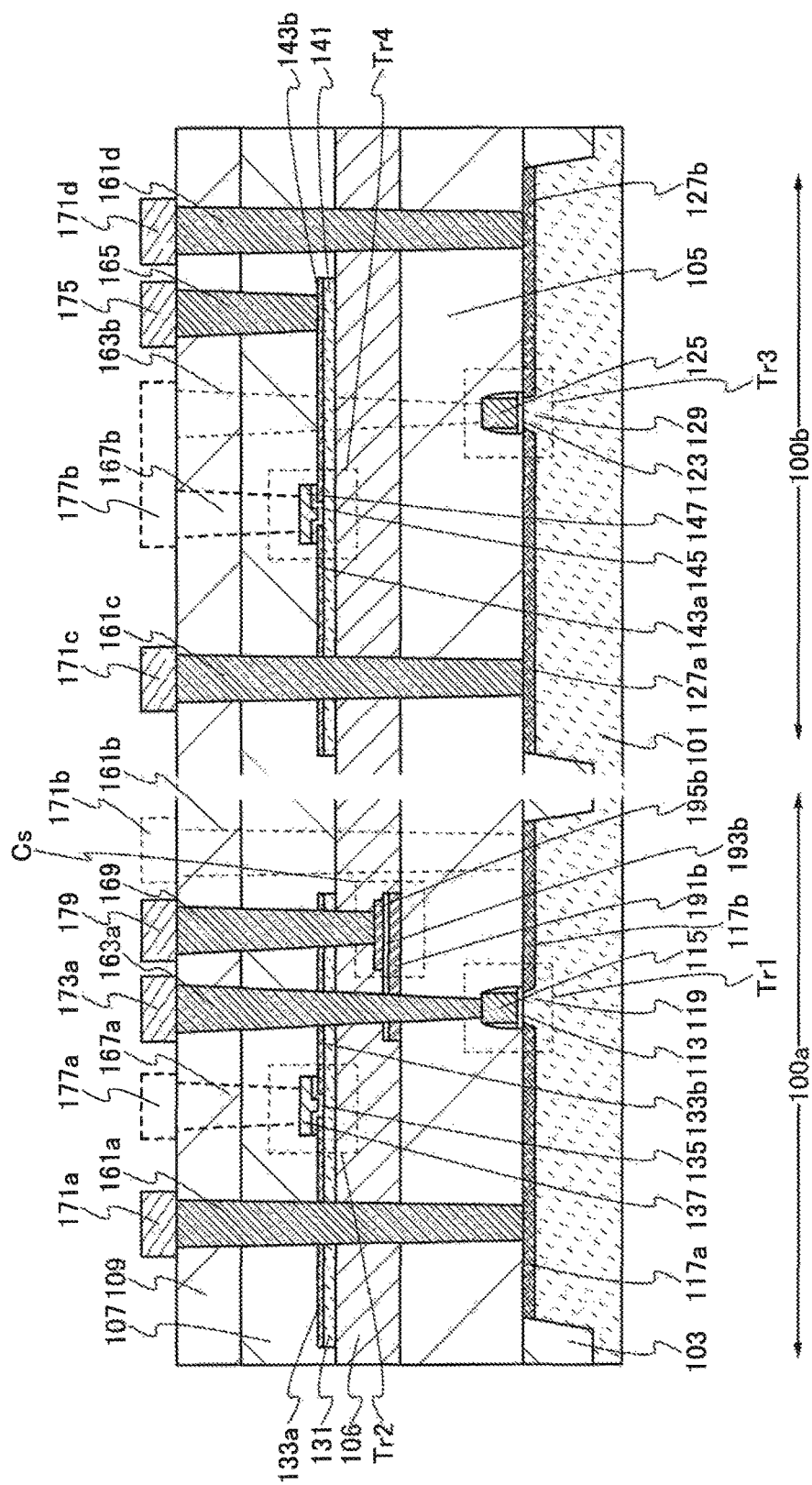
FIG. 37 is a cross-sectional view illustrating one embodiment of a semiconductor device.

FIG. 37 is a schematic cross-sectional view of the semiconductor device. FIG. 37 illustrates circuits, which are the memory cell 100*a* and the inverter circuit 100*b* here, included in the semiconductor device.

The memory cell 100*a* includes the transistor Tr1, the transistor Tr2, and the capacitor Cs. The insulating film 105 is formed over the transistor Tr1. The capacitor Cs is formed over the insulating film 105. The insulating film 106 is formed over the capacitor Cs. The transistor Tr2 is formed over the insulating film 106. The insulating film 107 is formed over the transistor Tr2. The insulating film 109 is formed over the insulating film 107.

The capacitor Cs includes a conductive film 191*b* formed over the insulating film 105, an insulating film 193*b* formed over the conductive film 191*b*, and a conductive film 195*b* formed over the insulating film 193*b*. The conductive films 191*b* and 195*b* each have a function of a capacitor electrode. The insulating film 193*b* has a function of a dielectric.

The memory cell 100*a* also includes the conductive films 161*a*, 161*b*, 163*a*, 167*a*, and 169. The conductive film 161*a* is connected to the impurity region 117*a* of the transistor Tr1 and the semiconductor film 131 and the conductive film 133*a* of the transistor Tr2. The conductive film 161*b* is connected to the impurity region 117*b* of the transistor Tr1. The conductive film 163*a* is connected to the conductive film 115 of the transistor Tr1, the semiconductor film 131 and the conductive film 133*b* of the transistor Tr2, and the conductive film 191*b* of the capacitor Cs. The conductive film 167*a* is connected to the conductive film 137 of the transistor Tr2. The conductive film 169 is connected to the conductive film 195*b* of the capacitor Cs. The conductive films 161*a*, 161*b*, 163*a*, 167*a*, and 169 each have a function of a plug. Note that since not existing on a plane illustrated in FIG. 37, the conductive film 161*b* is shown by a dashed line. Note that here, the conductive film 163*a* is illustrated so as to overlap with the channel region 119 and the conductive film 115 so that the connection of the conductive film 163*a* and other conductive films is easily understood; however, in the actual structure, the conductive film 163*a* is connected to the conductive film 115 in a region not overlapping with the channel region.

The conductive films are formed through not only the insulating films but also the semiconductor films and the conductive films which are the components of the transistors. For this reason, the transistor Tr1, the transistor Tr2, and the capacitor Cs can partly or entirely overlap with each other. Accordingly, the semiconductor device can be highly integrated.

The structure of the inverter circuit 100*b* is the same as that described in Embodiment 1 and thus is not described here.

The conductive films 191*b* and 195*b* included in the capacitor Cs can be formed using any of known materials for a conductive film included in a capacitor as appropriate. The insulating film 193*b* can be formed using any of the materials for the insulating film 105.

Figure 49:
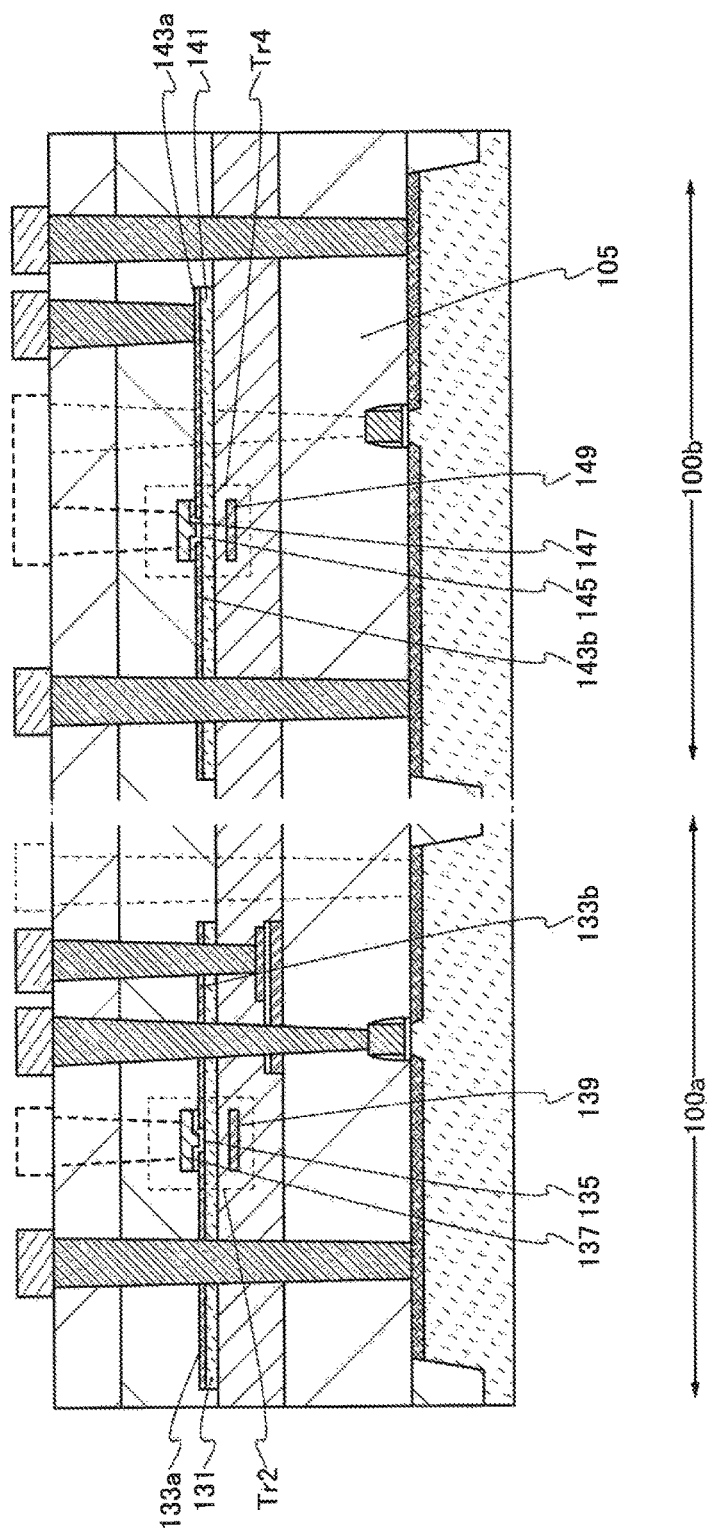
FIG. 49 is a cross-sectional view illustrating one embodiment of a semiconductor device.

Although the transistors Tr2 and Tr4 are described as single-gate transistors here, the transistors Tr2 and Tr4 can be dual-gate transistors as illustrated in FIG. 49. In that case, the transistor Tr2 includes a conductive film 139 having a function of a gate electrode in the insulating film 106 and in a position overlapping with the semiconductor film 131 and the conductive film 137. The transistor Tr4 includes a conductive film 149 having a function of a gate electrode in the insulating film 106 and in a position overlapping with the semiconductor film 141 and the conductive film 147.

<Method for Manufacturing Semiconductor Device>

Next, methods for manufacturing the semiconductor device will be described with reference to FIG. 38 to FIG. 48, FIG. 50, and FIG. 51. Though not existing on a plane illustrated in these figures, some components may be shown by solid lines for easy understanding.

In a manner similar to that described in Embodiment 1, the p-channel transistor Tr1 having the channel region 119 in the substrate 101 and the p-channel transistor Tr3 having the channel region 129 in the substrate 101 are formed.

Next, the insulating film 105 is formed over the transistors Tr1 and Tr3.

Figure 38:
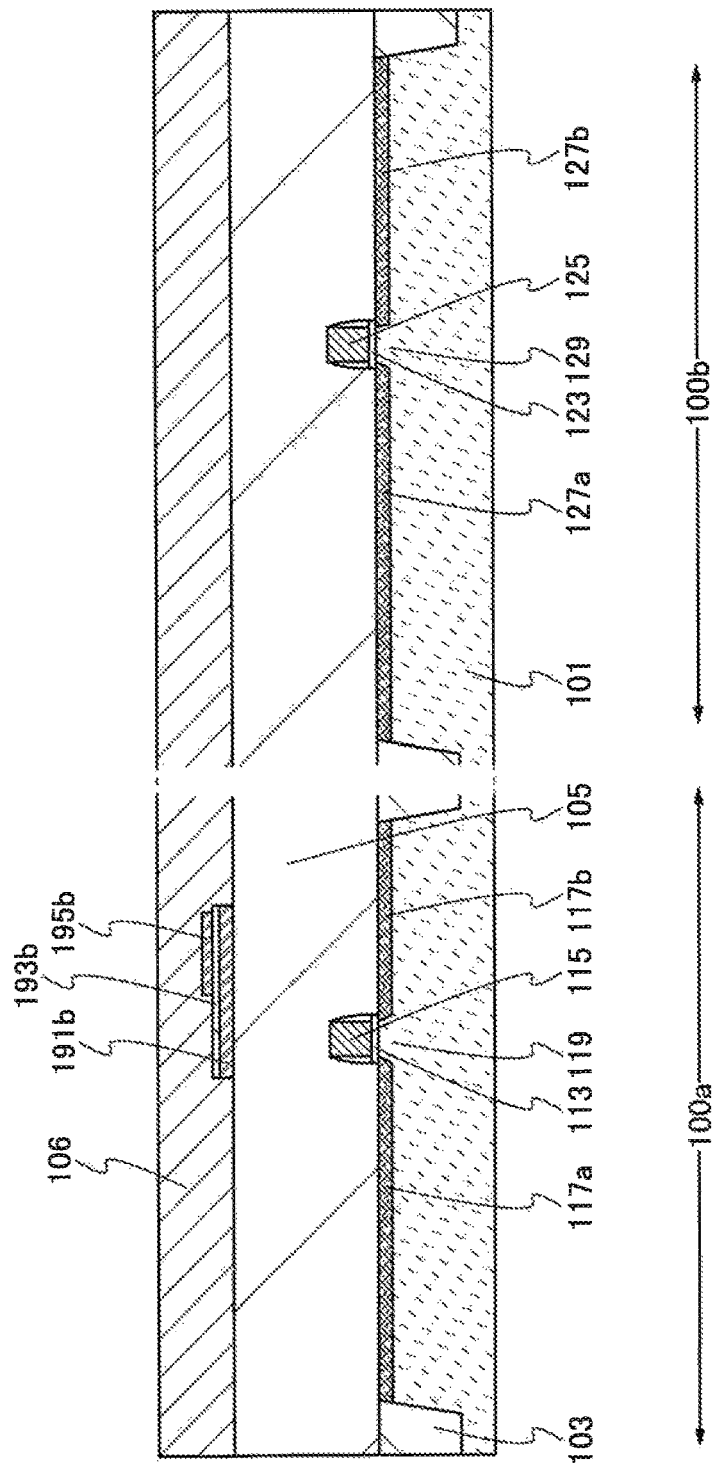
FIG. 38 is a cross-sectional view illustrating one embodiment of a method for manufacturing a semiconductor device.

Subsequently, as illustrated in FIG. 38, the capacitor Cs is formed over the insulating film 105.

A conductive film is formed so as to cover the insulating film 105. Next, a mask is formed over the conductive film. After that, the conductive film is selectively etched using the mask to form the conductive film 191b having a function of an electrode of the capacitor Cs over the insulating film 105.

Then, an insulating film is formed over the insulating film 105 and the conductive film 191b. Subsequently, a mask is formed over the insulating film. After that, the insulating film is selectively etched to form the insulating film 193b having a function of a dielectric of the capacitor Cs over the conductive film 191b.

Next, the conductive film 195b is formed over the insulating film 193b by a formation method similar to that of the conductive film 191b.

Subsequently, the insulating film 106 is formed so as to cover the capacitor Cs.

Figure 39:
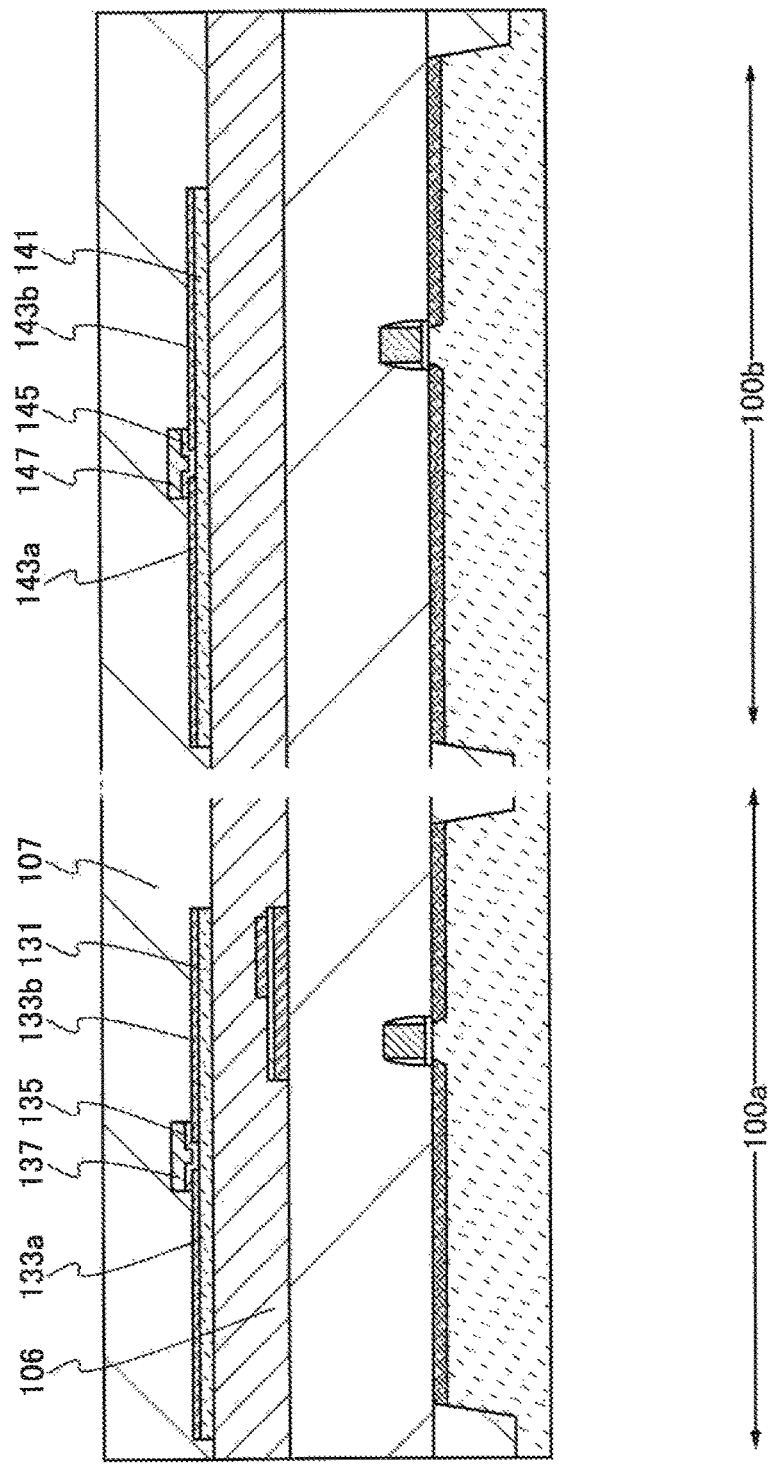
FIG. 39 is a cross-sectional view illustrating one embodiment of a method for manufacturing a semiconductor device.

As illustrated in FIG. 39, over the insulating film 106, the transistor Tr2 including the semiconductor film 131, the conductive films 133a and 133b, the insulating film 135, and the conductive film 137 is formed. Furthermore, the transistor Tr4 including the semiconductor film 141, the conductive films 143a and 143b, the insulating film 145, and the conductive film 147 is formed. Then, the insulating film 107 is formed over the transistors Tr2 and Tr4.

Figure 40:
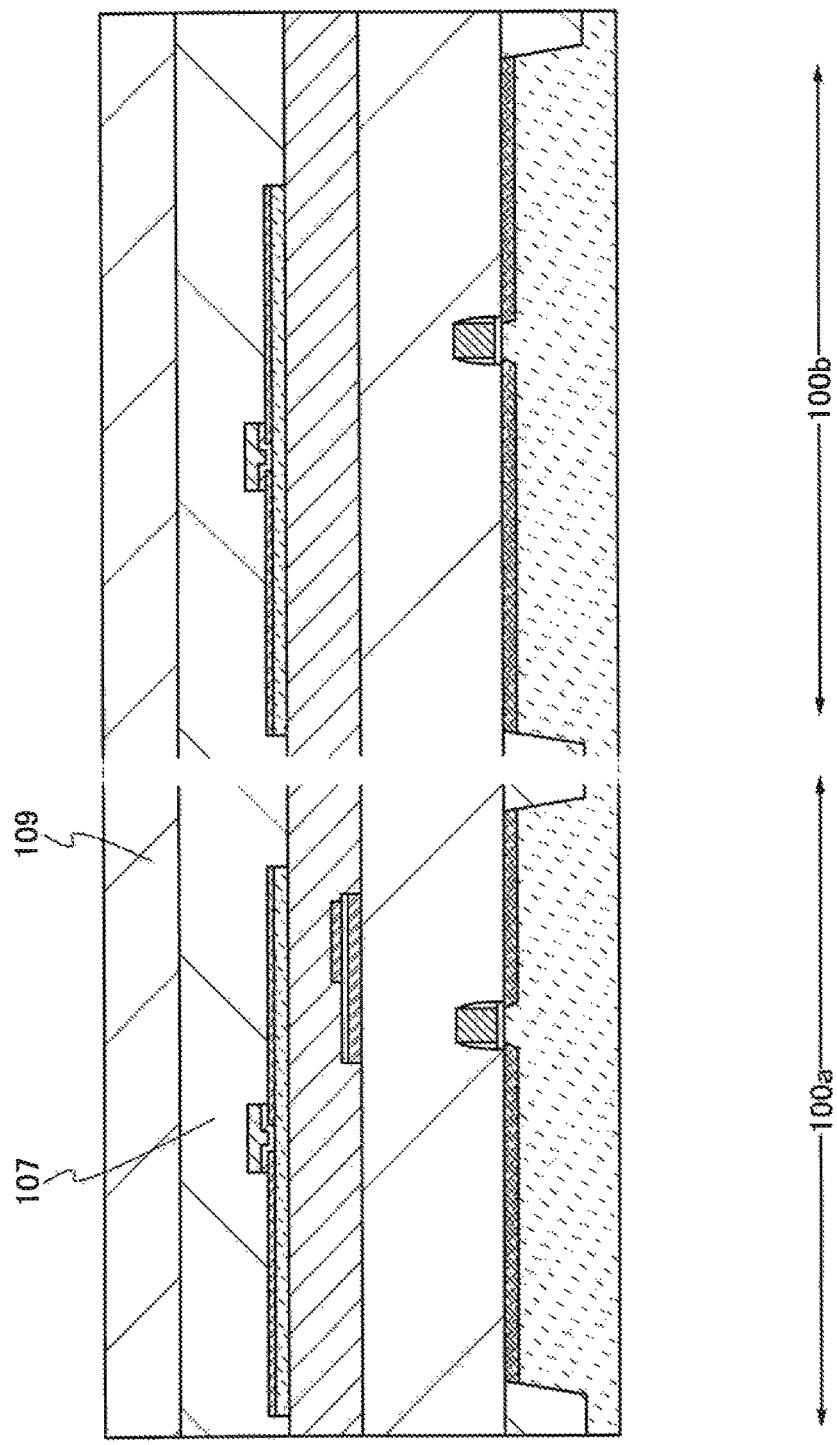
FIG. 40 is a cross-sectional view illustrating one embodiment of a method for manufacturing a semiconductor device.

Next, as illustrated in FIG. 40, the insulating film 109 is formed over the insulating film 107.

The insulating film 109 can be formed using any of the materials and the method for forming the insulating film 105 as appropriate.

Then, a mask is formed over the insulating film 109.

In this embodiment, opening portions, which are formed later, each have a high aspect ratio. For this reason, the mask is preferably a stack including the hard mask 150a_1 and the resist mask 150a_2.

The hard mask 150a_1 can have a single-layer structure or a stacked-layer structure of any of insulating films such as a silicon nitride film, a silicon oxide film, and a silicon nitride oxide film, and conductive films such as a tungsten film. The resist mask 150a_2 can be formed by a lithography process.

Figure 41:
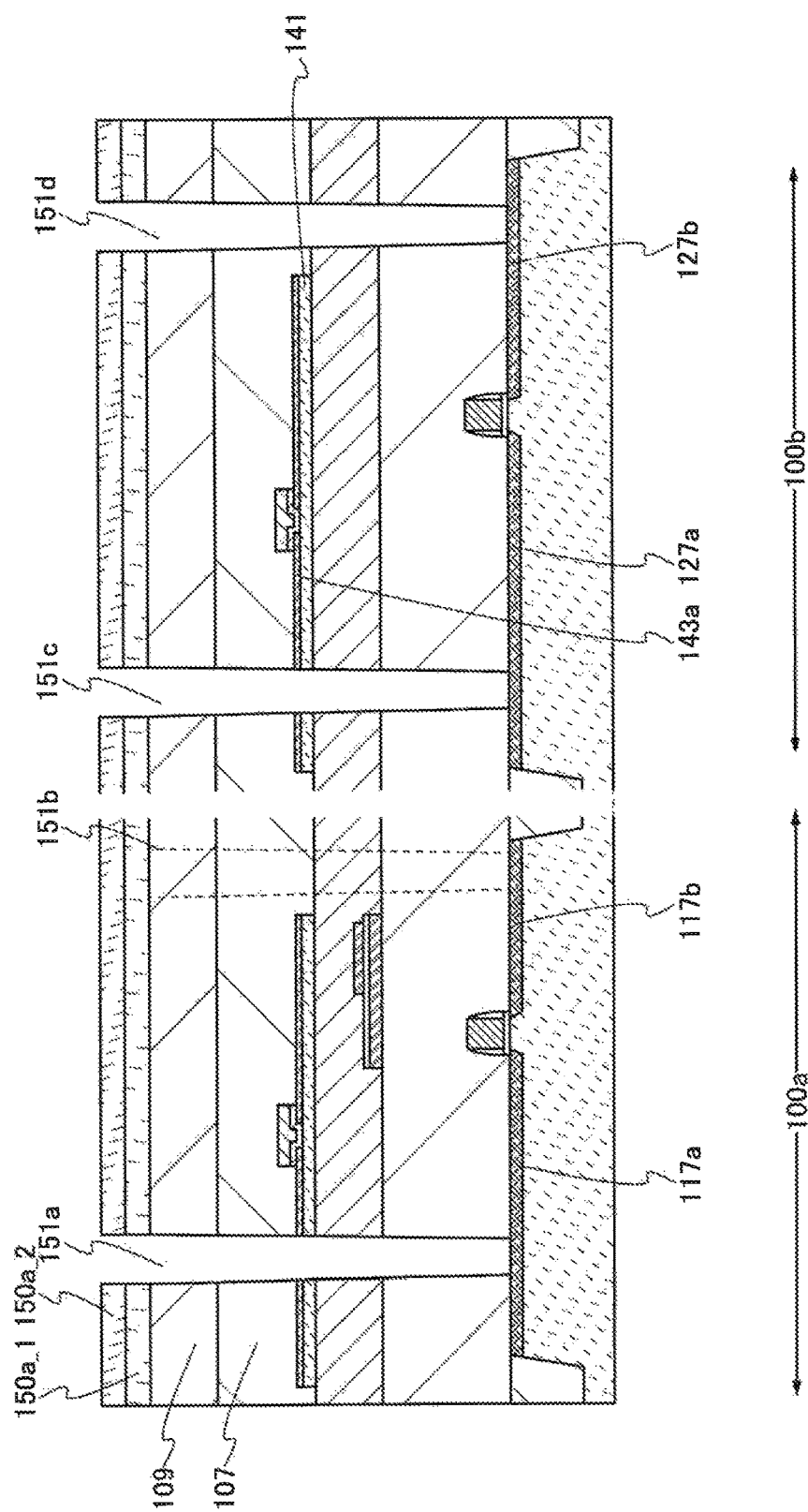
FIG. 41 is a cross-sectional view illustrating one embodiment of a method for manufacturing a semiconductor device.

Next, as illustrated in FIG. 41, the insulating films 105, 106, 107, and 109, the semiconductor films 131 and 141, and the conductive films 133a and 143a are etched to form opening portions 151a, 151b, 151c, and 151d that expose the impurity regions 117a, 117b, 127a, and 127b. At this time, the etching rate of the resist mask 150a_2 is preferably lower than the etching rates of the insulating films 105, 106, 107, and 109, the semiconductor films 131 and 141, and the conductive films 133a and 143a. When the etching rate of the resist mask 150a_2 is low, the opening portions can be prevented from extending in the lateral direction.

Figure 54:
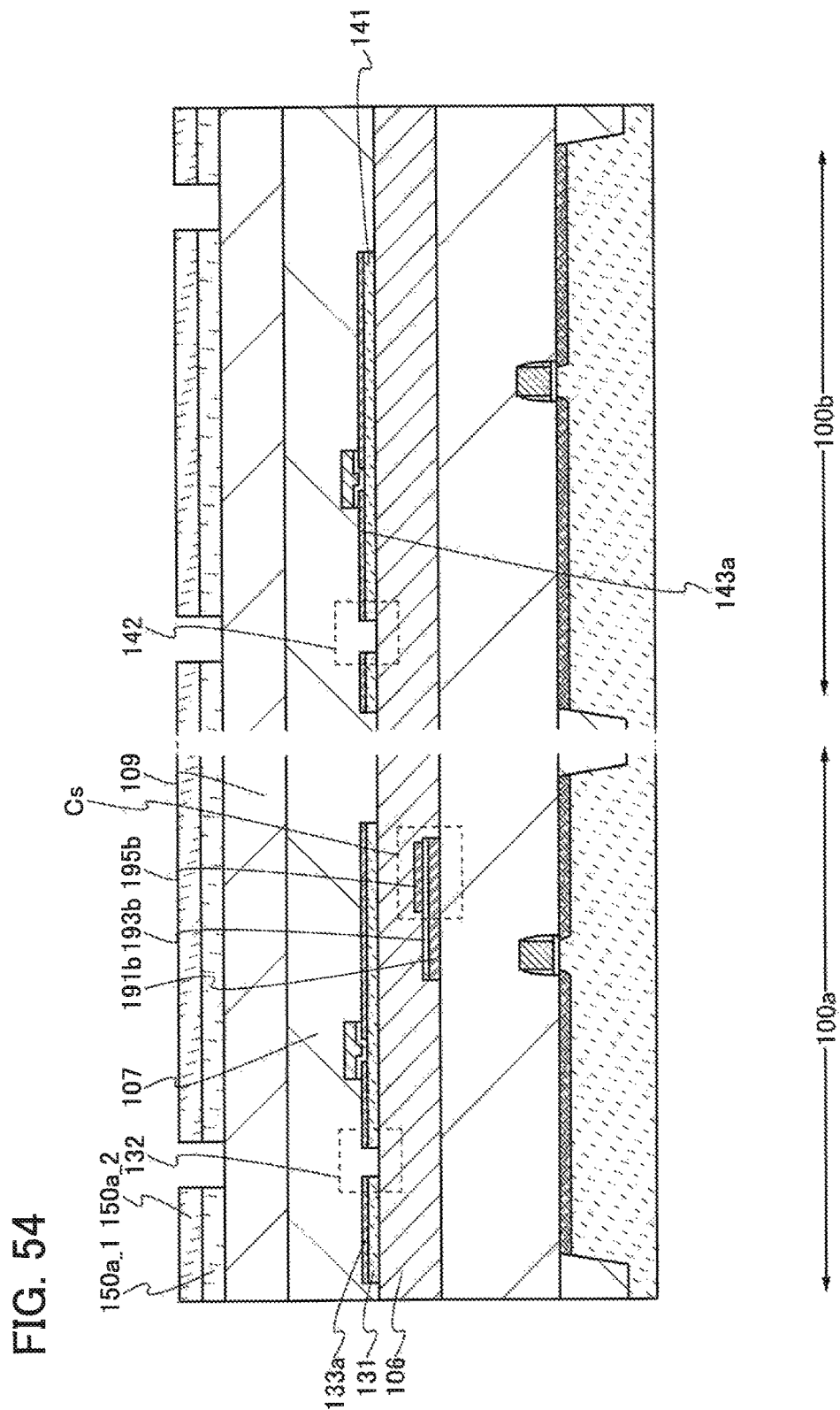
FIG. 54 is a cross-sectional view illustrating one embodiment of a method for manufacturing a semiconductor device.

Instead of the semiconductor films 131 and 141 and the conductive films 133a and 143a, the semiconductor films 131 and 141 and the conductive films 133a and 143a having the opening portions 132 and 142 can be formed in advance in regions where the opening portions 151a, 151b, 151c, and 151d are to be formed, as illustrated in FIG. 54. In such a case, the number of kinds of etching gases that are used for forming the opening portions 151a, 151b, 151c, and 151d can be reduced, and throughput can be improved.

After that, the hard mask 150a_1 and the resist mask 150a_2 are removed.

Figure 42:
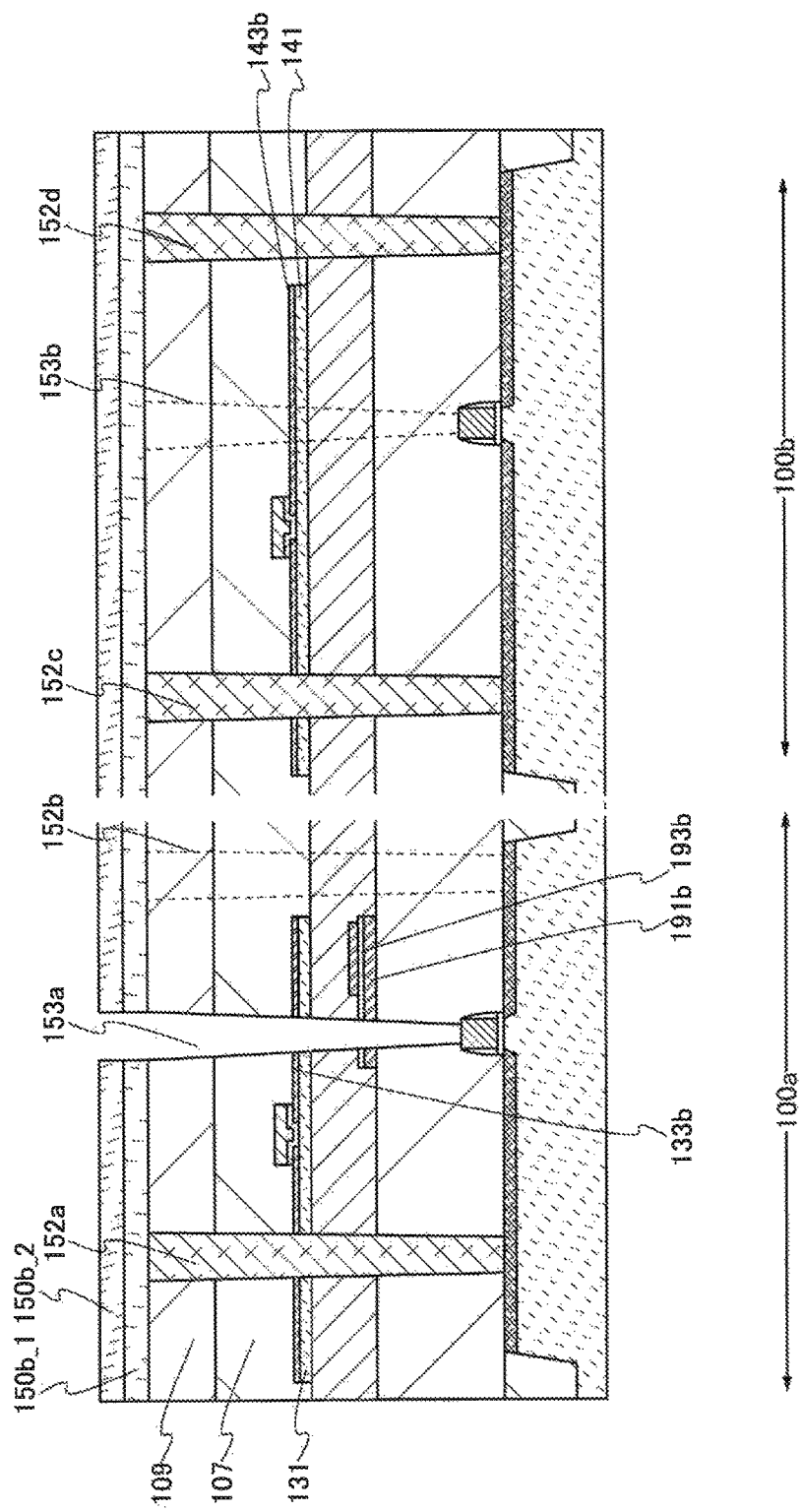
FIG. 42 is a cross-sectional view illustrating one embodiment of a method for manufacturing a semiconductor device.

Next, the masks 152a, 152b, 152c, and 152d are preferably formed in the opening portions 151a, 151b, 151c, and 151d as illustrated in FIG. 42. The masks 152a, 152b, 152c, and 152d can prevent a hard mask and a resist mask from being formed in the opening portions in a later step. The masks 152a, 152b, 152c, and 152d can be formed using an organic resin film such as a BARC film.

Then, a mask is formed over the insulating film 109. Here, the mask is preferably a stack including the hard mask 150b_1 and the resist mask 150b_2.

The hard mask 150b_1 can be formed in a manner similar to that of the hard mask 150a_1. The resist mask 150b_2 can be formed in a manner similar to that of the resist mask 150a_2.

Next, the insulating films 105, 106, 107, 109, and 193b, the semiconductor films 131 and 141, and the conductive films 133b, 143b, and 191b are etched to form opening portions 153a and 153b that expose the conductive films 115 and 125. At this time, as in the formation step of the opening portions 151a, 151b, 151c, and 151d, the etching rate is preferably controlled so that the opening portions are prevented from extending in the lateral direction.

After that, the hard mask 150b_1 and the resist mask 150b_2 are removed.

Note that although the opening portions 151a, 151b, 151c, and 151d illustrated in FIG. 41 and the opening portions 153a and 153b illustrated in FIG. 42 are formed in different etching steps here, the opening portions 151a, 151b, 151c, 151d, 153a, and 153b can be formed in the same etching step.

Figure 43:
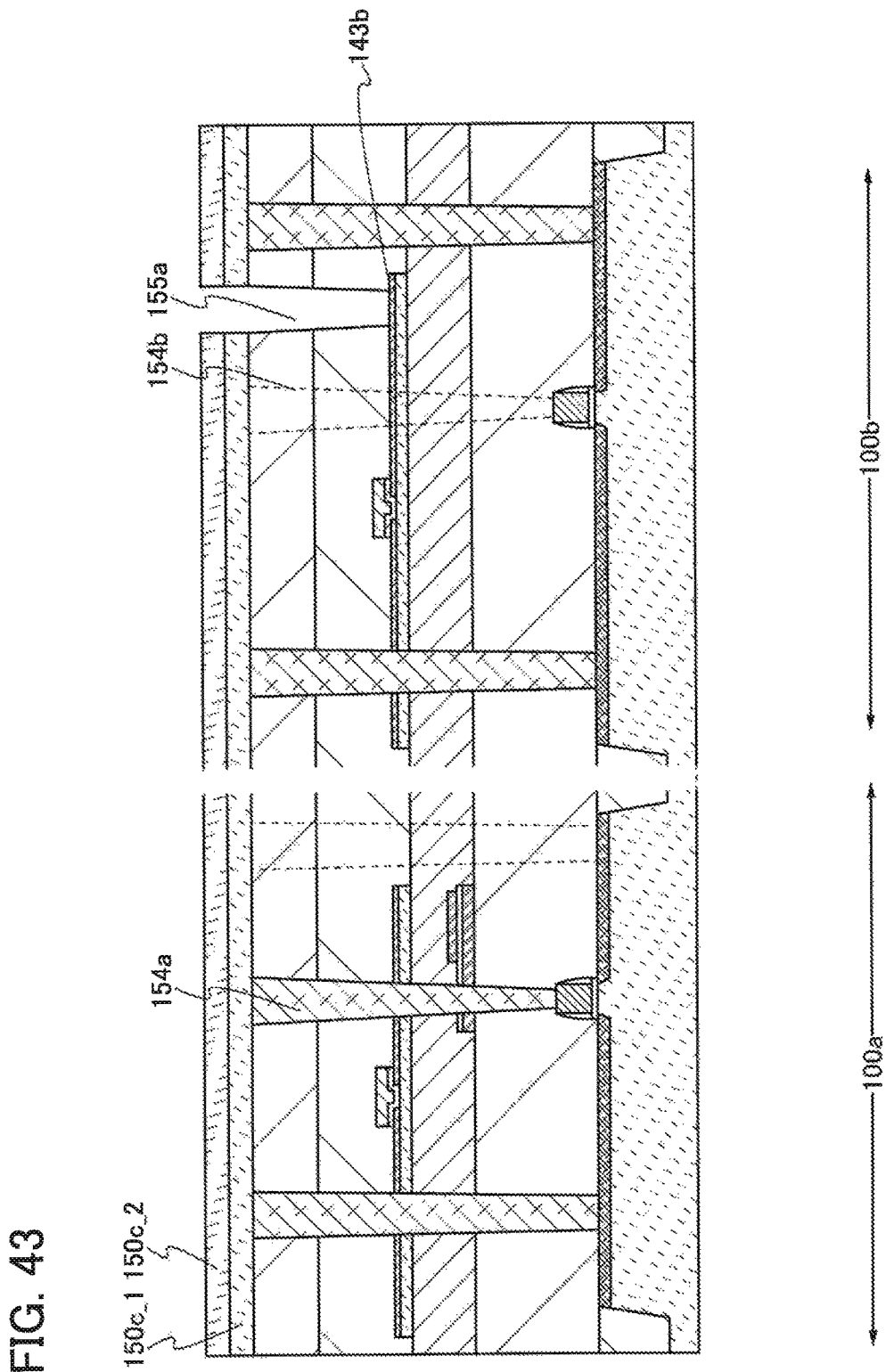
FIG. 43 is a cross-sectional view illustrating one embodiment of a method for manufacturing a semiconductor device.

Next, the masks 154a and 154b are preferably formed in the opening portions 153a and 153b as illustrated in FIG. 43.

Subsequently, a mask is formed over the insulating film 109. Here, the mask is preferably a stack including the hard mask 150c_1 and the resist mask 150c_2.

The hard mask 150c_1 can be formed in a manner similar to that of the hard mask 150a_1. The resist mask 150c_2 can be formed in a manner similar to that of the resist mask 150a_2.

Next, the insulating films 107 and 109 are etched to form the opening portion 155a that exposes the conductive film 143b. At this time, as in the formation step of the opening portions 151a, 151b, 151c, and 151d, the etching rate is preferably controlled so that the opening portions are prevented from extending in the lateral direction.

After that, the hard mask 150c_1 and the resist mask 150c_2 are removed.

Figure 44:
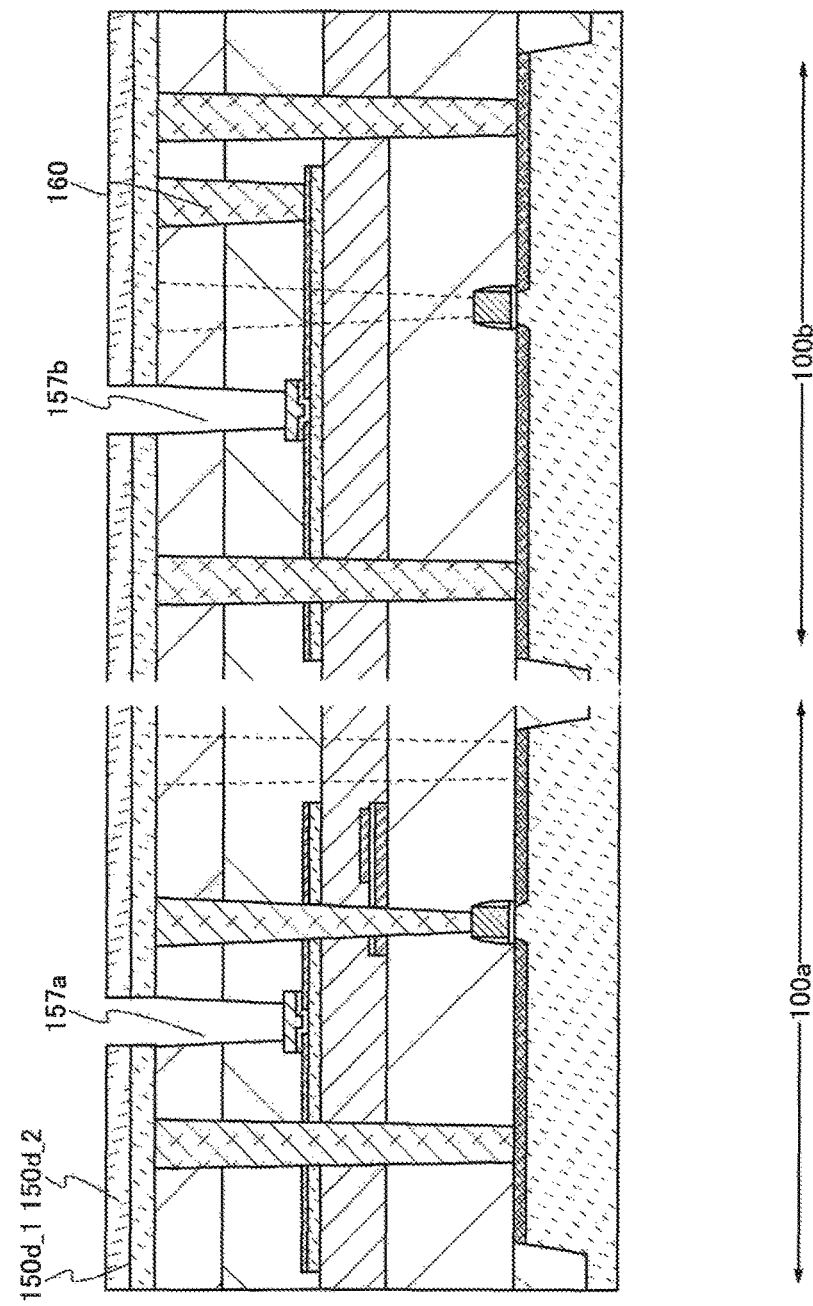
FIG. 44 is a cross-sectional view illustrating one embodiment of a method for manufacturing a semiconductor device.

Next, as illustrated in FIG. 44, the mask 160 is preferably formed in the opening portion 155a.

Subsequently, a mask is formed over the insulating film 109. Here, the mask is preferably a stack including the hard mask 150d_1 and the resist mask 150d_2.

The hard mask 150d_1 can be formed in a manner similar to that of the hard mask 150a_1. The resist mask 150d_2 can be formed in a manner similar to that of the resist mask 150a_2.

Next, the insulating films 107 and 109 are etched to form the opening portions 157a and 157b that expose the conductive films 137 and 147. At this time, as in the formation step of the opening portions 151a, 151b, 151c, and 151d, the etching rate is preferably controlled so that the opening portions are prevented from extending in the lateral direction.

After that, the hard mask 150d_1 and the resist mask 150d_2 are removed.

Note that although the opening portion 155a illustrated in FIG. 43 and the opening portions 157a and 157b illustrated in FIG. 44 are formed in different etching steps here, the opening portions 155a, 157a, and 157b can be formed in the same etching step.

Figure 45:
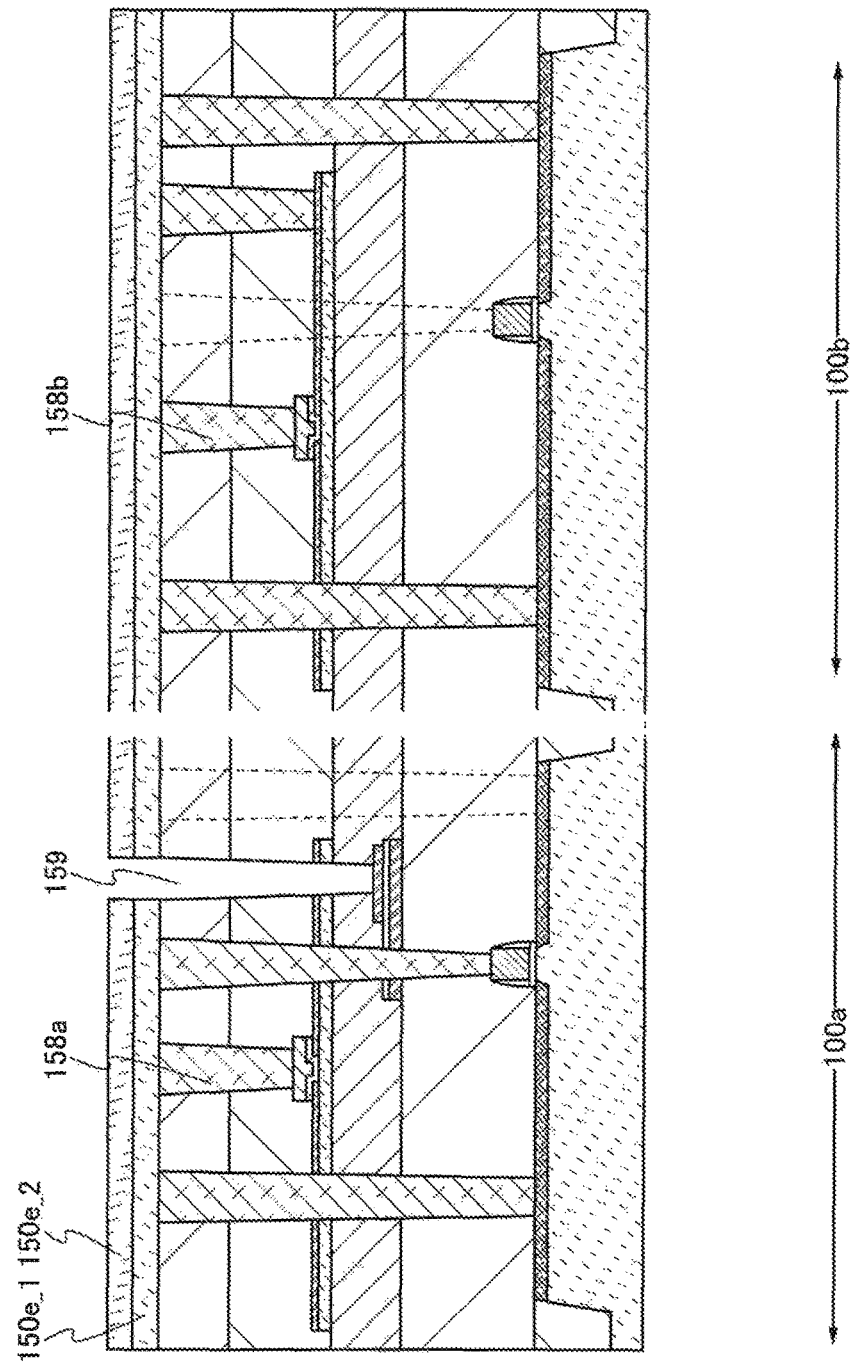
FIG. 45 is a cross-sectional view illustrating one embodiment of a method for manufacturing a semiconductor device.

Then, the masks 158a and 158b are preferably formed in the opening portions 157a and 157b as illustrated in FIG. 45.

Subsequently, a mask is formed over the insulating film 109. Here, the mask is preferably a stack including the hard mask 150e_1 and the resist mask 150e_2.

The hard mask 150e_1 can be formed in a manner similar to that of the hard mask 150a_1. The resist mask 150e_2 can be formed in a manner similar to that of the resist mask 150a_2.

Next, the insulating films 106, 107, and 109, the semiconductor film 131, and the conductive film 133b are etched to form the opening portion 159 that exposes the conductive film 195b. At this time, as in the formation step of the opening portions 151a, 151b, 151c, and 151d, the etching rate is preferably controlled so that the opening portions are prevented from extending in the lateral direction.

After that, the hard mask 150e_1 and the resist mask 150e_2 are removed.

Figure 46:
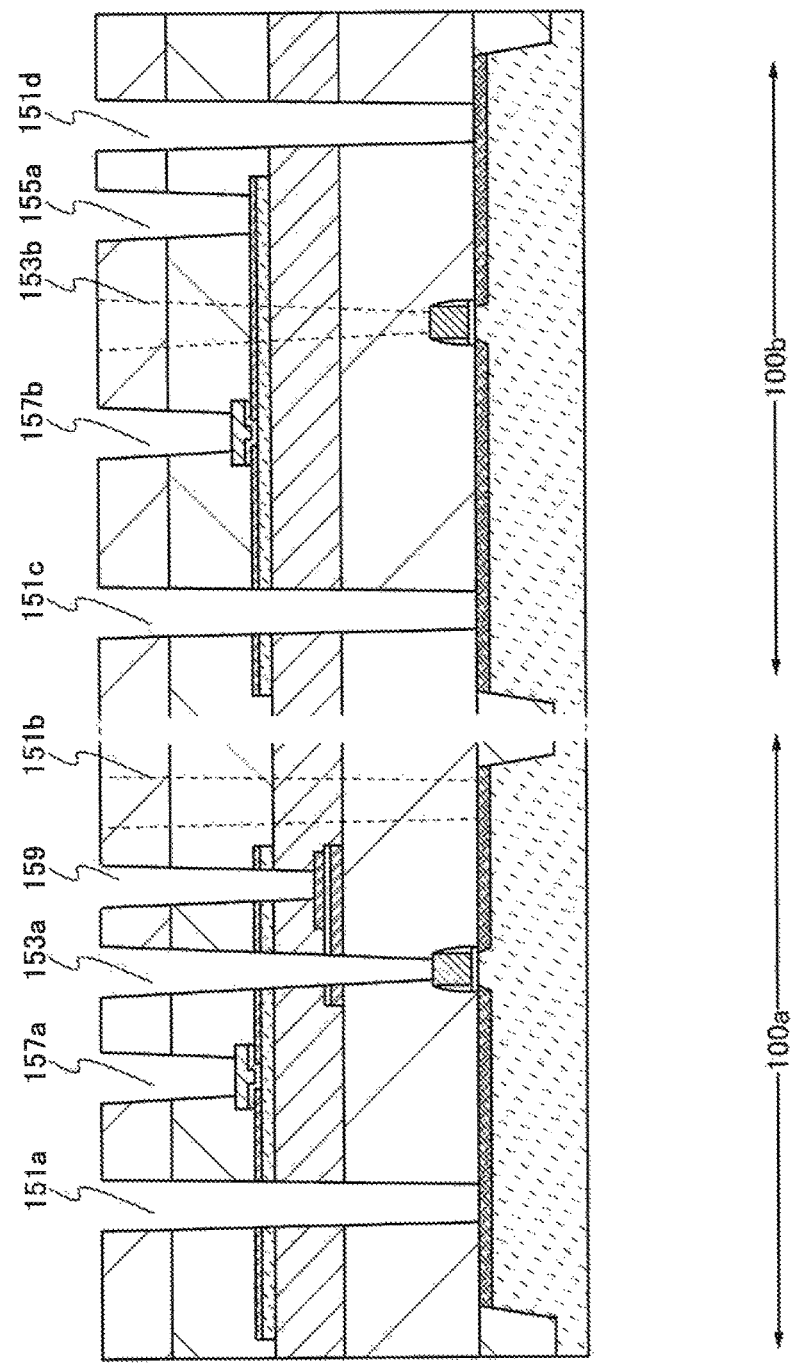
FIG. 46 is a cross-sectional view illustrating one embodiment of a method for manufacturing a semiconductor device.

Next, as illustrated in FIG. 46, the masks 152a, 152b, 152c, 152d, 154a, 160, 154b, 158a, and 158b formed in the opening portions 151a, 151b, 151c, 151d, 153a, 153b, 155a, 157a, and 157b are removed.

Figure 47:
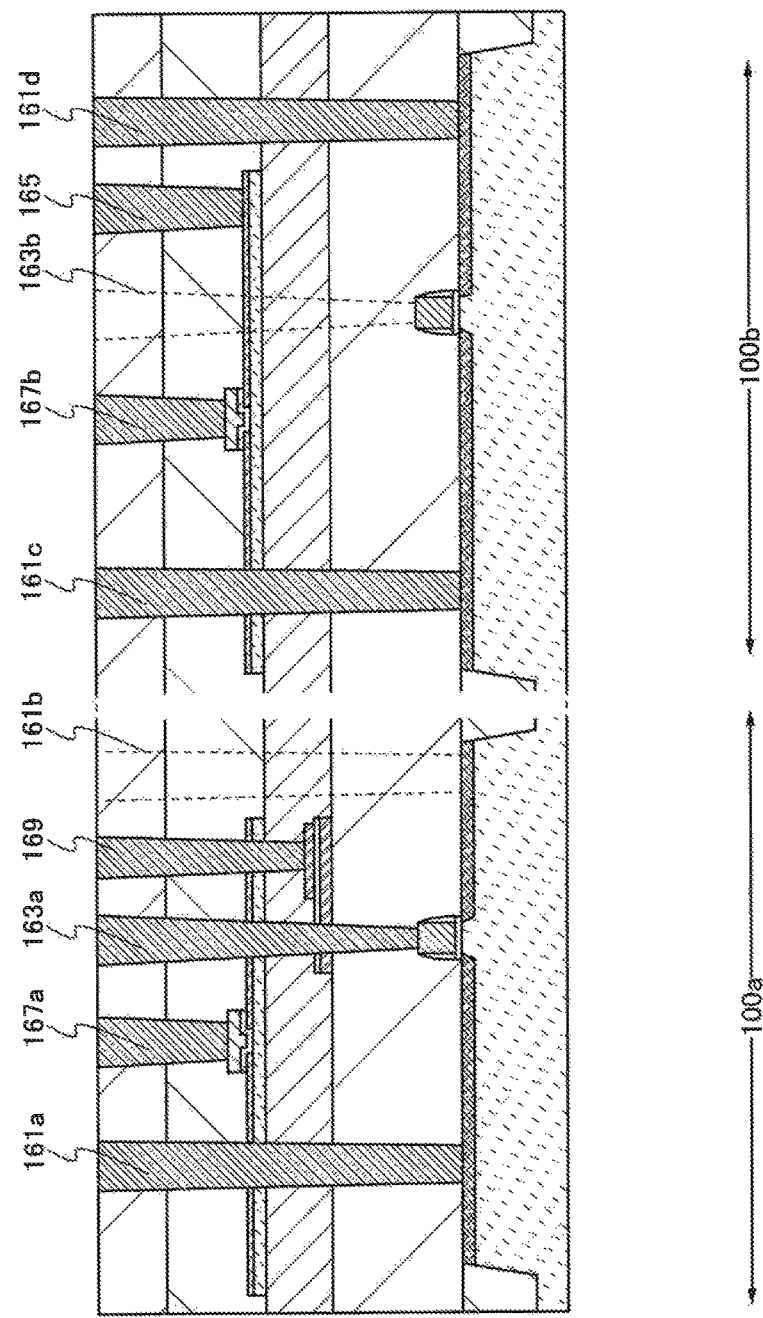
FIG. 47 is a cross-sectional view illustrating one embodiment of a method for manufacturing a semiconductor device.

Then, as illustrated in FIG. 47, the conductive films 161a, 161b, 161c, 161d, 163a, 163b, 165, 167a, 167b, and 169 each having a function of a plug are formed in the opening portions 151a, 151b, 151c, 151d, 153a, 153b, 155a, 157a, 157b, and 159.

The conductive films 161a, 161b, 161c, 161d, 163a, 163b, 165, 167a, 167b, and 169 can be formed in the following manner: a conductive film is formed by a sputtering method, a CVD method, an evaporation method, or the like so as to fill the opening portions, and part of the conductive film over the insulating film 109 is removed by a CMP method or an etching method. The conductive films 161a, 161b, 161c, 161d, 163a, 163b, 165, 167a, 167b, and 169 may be formed by a damascene method.

Figure 48:
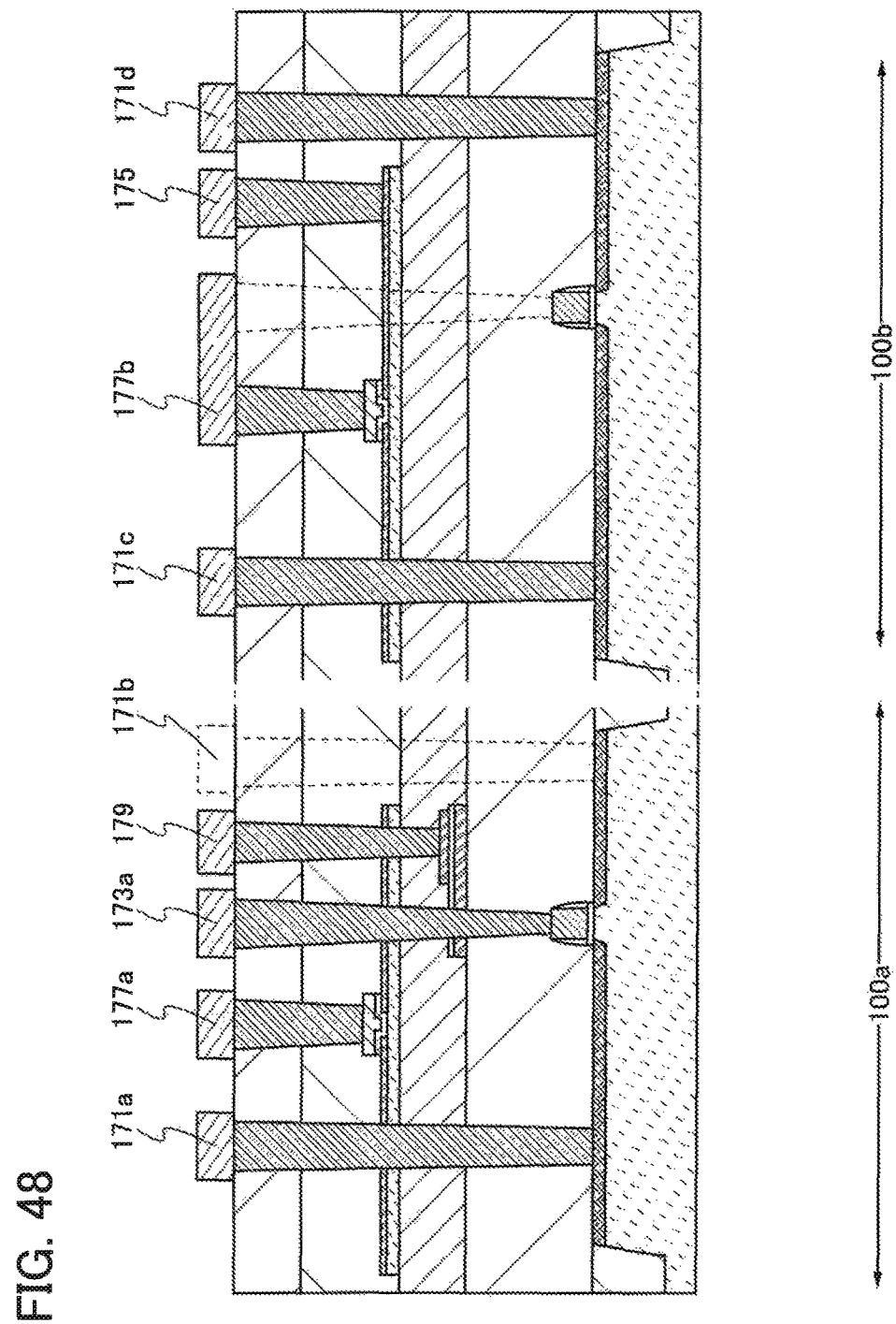
FIG. 48 is a cross-sectional view illustrating one embodiment of a method for manufacturing a semiconductor device.

Then, as illustrated in FIG. 48, the conductive films 171a, 171b, 171c, 171d, 173a, 175, 177a, 177b, and 179 each having a function of a wiring are formed over the insulating film 109 and the conductive films 161a, 161b, 161c, 161d, 163a, 163b, 165, 167a, 167b, and 169.

A conductive film is formed so as to cover the insulating film 109. After that, a mask is formed over the conductive film and then, the conductive film is selectively etched. In this manner, the conductive films 171a, 171b, 171c, 171d, 173a, 175, 177a, 177b, and 179 can be formed over the insulating film 109.

Through the above steps, a semiconductor device can be manufactured.

<Modification Example of Method for Manufacturing Semiconductor Device>

Here, an example of a method for manufacturing the transistors Tr1, Tr2, Tr3, and Tr4 having excellent electric characteristics will be described.

Figure 50:
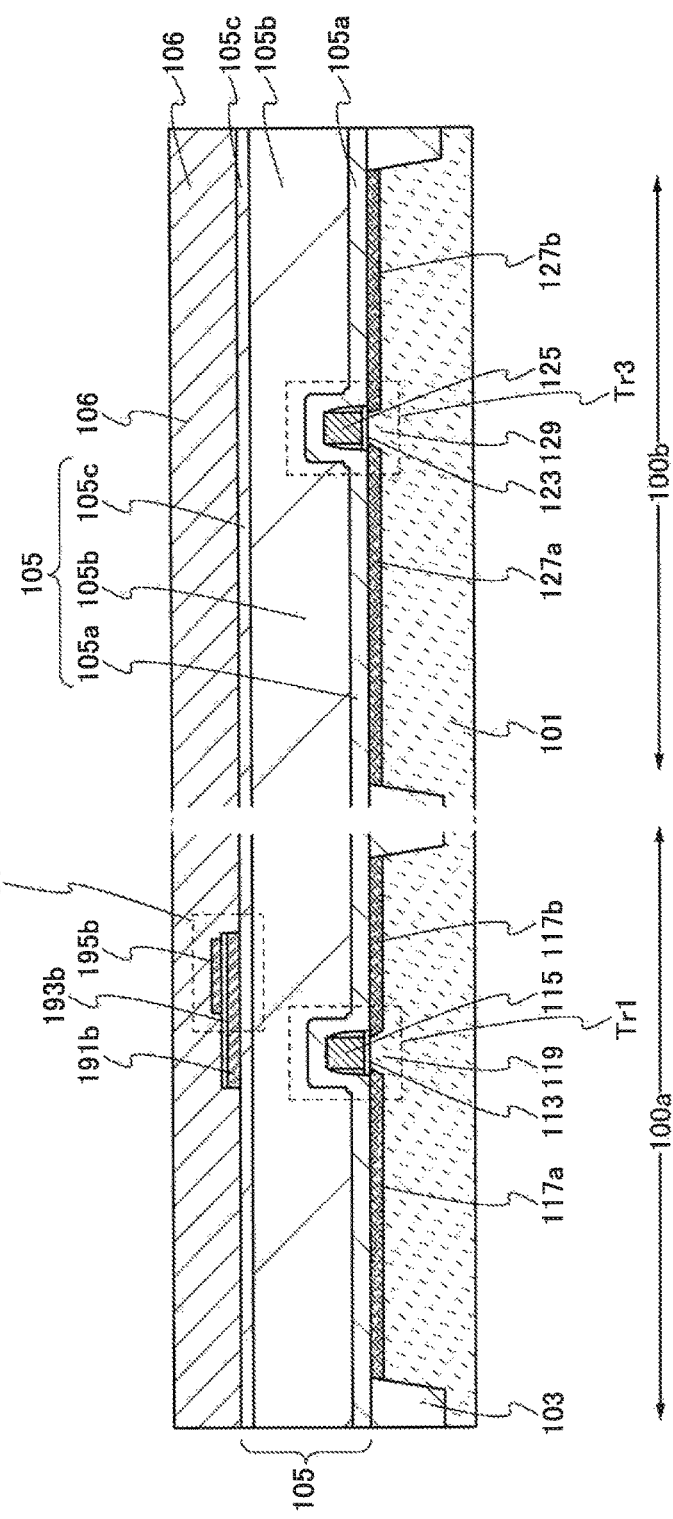
FIG. 50 is a cross-sectional view illustrating one embodiment of a method for manufacturing a semiconductor device.

In a manner similar to that described with reference to FIG. 38, the transistors Tr1 and Tr3 are formed over the substrate 101. Then, the insulating film 105a is formed over the impurity regions 117a, 117b, 127a, and 127b, the insulating films 113 and 123, and the conductive films 115 and 125 as illustrated in FIG. 50. The insulating film 105a is preferably formed using an insulating film that releases hydrogen by heating, typified by a silicon nitride film containing hydrogen, a silicon nitride oxide film containing hydrogen, or the like, so that the channel regions 119 and 129 can be hydrogenated by heat treatment in the manufacturing process of the semiconductor device. The insulating film that releases hydrogen by heating can be formed by a method for forming the insulating film 105 as appropriate.

Next, the insulating film 105b is formed over the insulating film 105a. The insulating film 105b is formed using any of the materials for the insulating film 105 as appropriate. Note that the insulating film 105b is preferably formed flat by a coating method. Alternatively, the insulating film 105b is preferably formed by performing planarization treatment such as a CMP method on an insulating film. This can increase coverage with an insulating film to be formed later.

Then, the insulating film 105c is formed over the insulating film 105b. The insulating film 105c is preferably formed using a film having barrier properties against hydrogen, water, and the like, and further preferably formed using a film having barrier properties against hydrogen, water, oxygen, and the like. Typical examples of the film having barrier properties against hydrogen, water, oxygen, and the like include a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film.

The insulating film 105c preferably has a sufficient thickness to be capable of preventing hydrogen diffusion, typified by a thickness greater than or equal to 20 nm and less than or equal to 250 nm.

High flatness of the insulating film 105b can increase the coverage with the insulating film 105c even with a small thickness. Such a case is preferable because the barrier properties of the insulating film 105c against hydrogen, water, and the like can be increased.

The insulating film 105c can be formed by the method for forming the insulating film 105 as appropriate. The insulating film 105c formed using an oxide film can be formed in the following manner: a conductive film is formed over the insulating film 105b and at least one of an oxygen radical, an oxygen atom, an oxygen atomic ion, and an oxygen molecular ion is added to the conductive film.

Next, the capacitor Cs is formed over the insulating film 105c. Then, the insulating film 106 is formed over the insulating film 105c and the capacitor Cs. The insulating film 106 is preferably formed using an insulating film that releases oxygen by heating, in which case oxygen contained in the insulating film 106 can be supplied to the semiconductor films of the transistors Tr2 and Tr4, which are to be formed later, by heat treatment in the manufacturing process of the semiconductor device. In addition, in the case where the semiconductor films are each formed using an oxide semiconductor film, oxygen vacancies contained in the oxide semiconductor film can be reduced.

In the oxide semiconductor film, oxygen vacancies sometimes serve as carrier traps, or serve as carrier generation sources when capturing hydrogen. Thus, in the case of using an oxide semiconductor film as each of the semiconductor films of the transistors Tr2 and Tr4, supplying oxygen contained in the insulating film 106 to the oxide semiconductor films reduces oxygen vacancies in the oxide semiconductor films, in which case the transistors Tr2 and Tr4 having excellent electric characteristics can be fabricated.

Through the above steps, the insulating film 105 including the insulating films 105a, 105b, and 105c, and the insulating film 106 are stacked.

Figure 51:
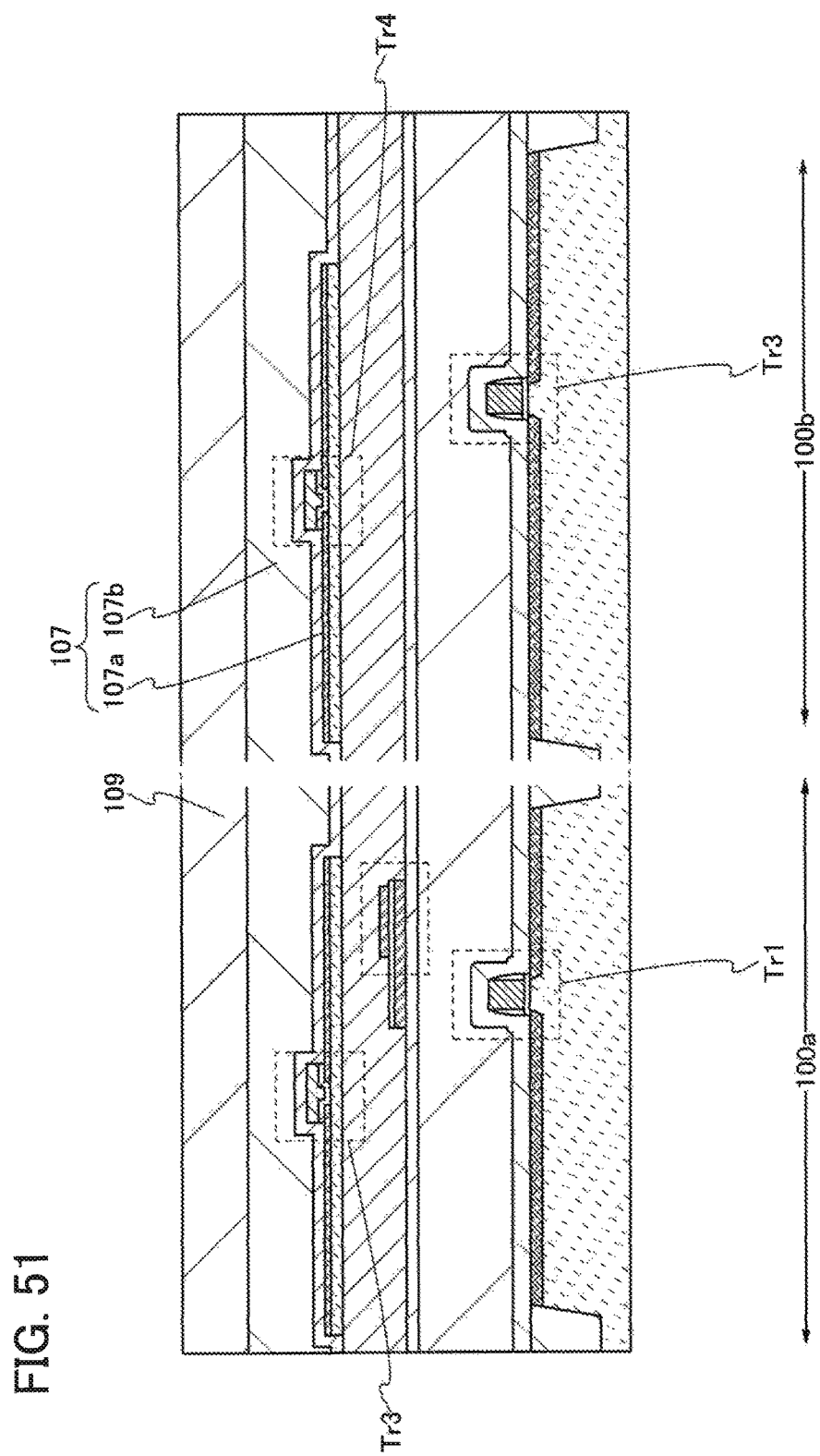
FIG. 51 is a cross-sectional view illustrating one embodiment of a method for manufacturing a semiconductor device.

After that, the transistors Tr2 and Tr4 are formed over the insulating film 106 as illustrated in FIG. 51. Subsequently, the insulating film 107 is formed over the transistors Tr2 and Tr4. In the insulating film 107, insulating films 107a and 107b are stacked in this order.

It is preferred that, like the insulating film 105c, one of the insulating films 107a and 107b be formed using a film having barrier properties against hydrogen, water, and the like, and further preferably formed using a film having barrier properties against hydrogen, water, oxygen, and the like. Here, the insulating film 107a is formed using a film having barrier properties against hydrogen, water, oxygen, and the like.

Next, the insulating film 109 is formed over the insulating film 107.

Note that by heat treatment in the formation steps of the insulating films 107 and 109, the transistors Tr2 and Tr4, and the capacitor Cs, hydrogen contained in the insulating film 105a is diffused into the channel regions of the transistors Tr1 and Tr3, so that defects in the channel regions can be repaired (dangling bonds in the channel regions can be terminated with hydrogen).

Hydrogen contained in the insulating film 105a might also be diffused into the insulating film 105b by heat treatment; however, since the insulating film 105c has a function of a barrier film against hydrogen, water, and the like, hydrogen diffusion into the semiconductor films of the transistors Tr2 and Tr4 can be prevented.

Hydrogen diffused to the oxide semiconductor film reacts with oxygen bonded to a metal atom to be water, and also causes oxygen vacancies in a lattice from which oxygen is released (or a portion from which oxygen is released). Due to entry of hydrogen into the oxygen vacancies, an electron serving as a carrier is generated. Furthermore, bonding of part of hydrogen to oxygen bonded to a metal atom causes generation of an electron serving as a carrier. Thus, a transistor including an oxide semiconductor into which hydrogen is diffused is likely to be normally on. In view of the above, prevention of diffusion of hydrogen, water, and the like into the semiconductor films of the transistors Tr2 and Tr4 makes it possible for the transistors Tr2 and Tr4 to have excellent electric characteristics.

The insulating film 106 is formed using an insulating film that releases oxygen by heat treatment; thus, oxygen contained in the insulating film 106 can be supplied to the semiconductor films of the transistors Tr2 and Tr4 by the heat treatment. This is another factor for the fabrication of the transistors Tr2 and Tr4 having excellent electric characteristics.

Since the transistors Tr2 and Tr4 and the insulating film 106 are sandwiched between the insulating films 105c and 107a having functions of barrier films against hydrogen, water, oxygen, and the like, oxygen contained in the insulating film 106 can be efficiently supplied to the semiconductor films of the transistors Tr2 and Tr4 while hydrogen, water, and the like can be prevented from entering the semiconductor films of the transistors Tr2 and Tr4 from the outside. This is another factor for the fabrication of the transistors Tr2 and Tr4 having excellent electric characteristics.

Owing to the insulating films 105c and 107a, the hydrogen concentration of the semiconductor films of the transistors Tr2 and Tr4 can be less than 1/10 and preferably less than 1/100 that of the channel regions of the transistors Tr1 and Tr3.

When the insulating film 105c is formed using a film having barrier properties against hydrogen, water, and oxygen, the insulating film 105c prevents diffusion of oxygen contained in the insulating film 106. In that case, oxygen contained in the insulating film 106 can be efficiently supplied to the semiconductor films of the transistors Tr2 and Tr4 by heat treatment.

Note that opening portions in the insulating films 105, 106, 107, and 109 and conductive films that fill the opening portions are not formed at this stage. Thus, hydrogen contained in the insulating film 105a can be prevented from being diffused to the semiconductor films of the transistors Tr2 and Tr4 by heat treatment via the opening portions and the conductive films that fill the opening portion. In addition, oxygen contained in the insulating film 106 can be efficiently supplied to the semiconductor films of the transistors Tr2 and Tr4.

Figure 53:
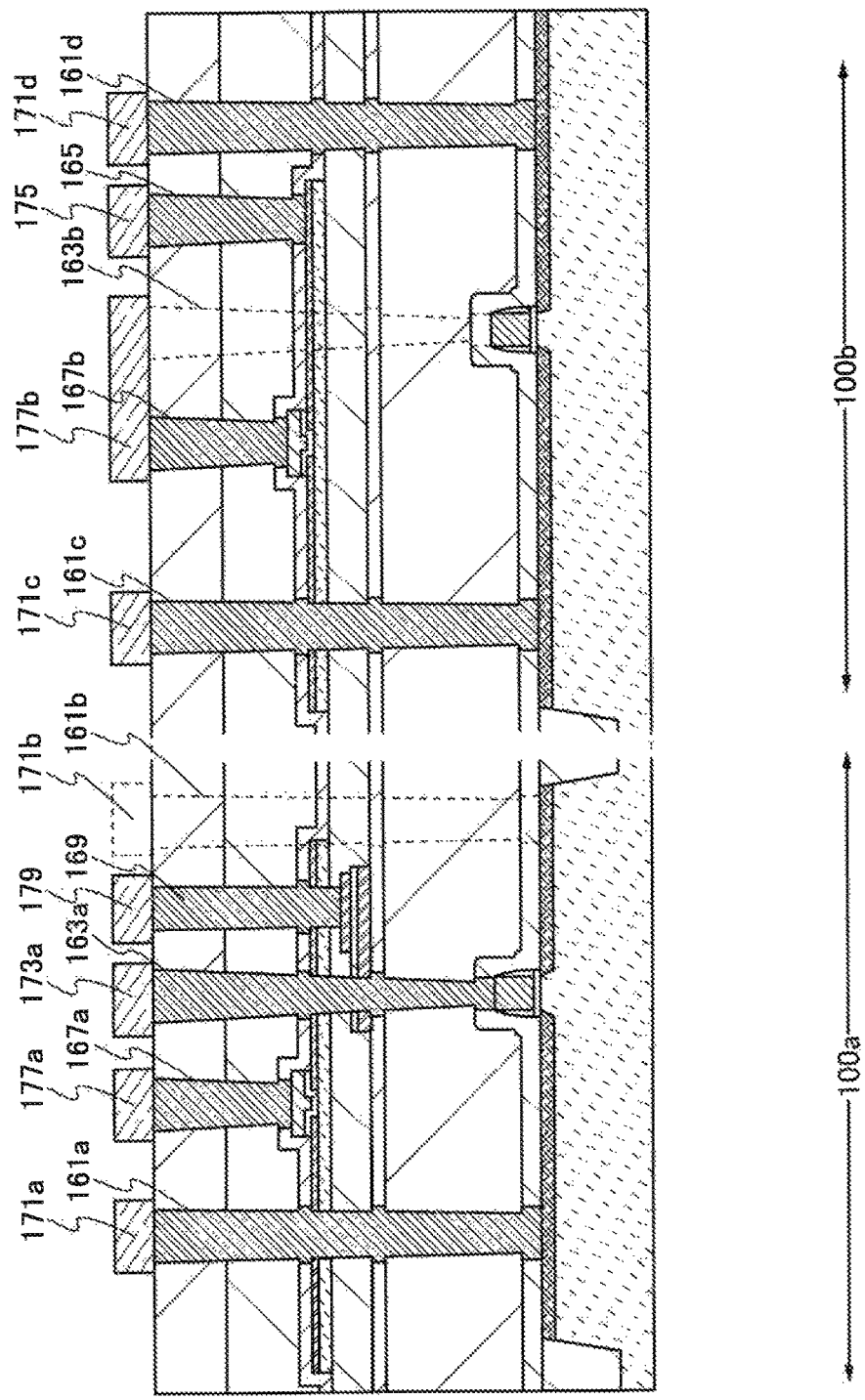
FIG. 53 is a cross-sectional view illustrating one embodiment of a method for manufacturing a semiconductor device.

Then, opening portions are formed in the insulating films 105, 106, 107, and 109, the semiconductor films 131 and 141, the conductive films 133a, 133b, 143a, 143b, and 191b, and the insulating film 193b by the steps illustrated in FIG. 41 to FIG. 46. Subsequently, by the steps illustrated in FIG. 47 and FIG. 48, the conductive films 161a, 161b, 161c, 161d, 163a, 163b, 165, 167a, 167b, and 169 each having a function of a plug and the conductive films 171a, 171b, 171c, 171d, 173a, 175, 177a, 177b, and 179 each having a function of a wiring are formed as illustrated in FIG. 53.

Figure 52:
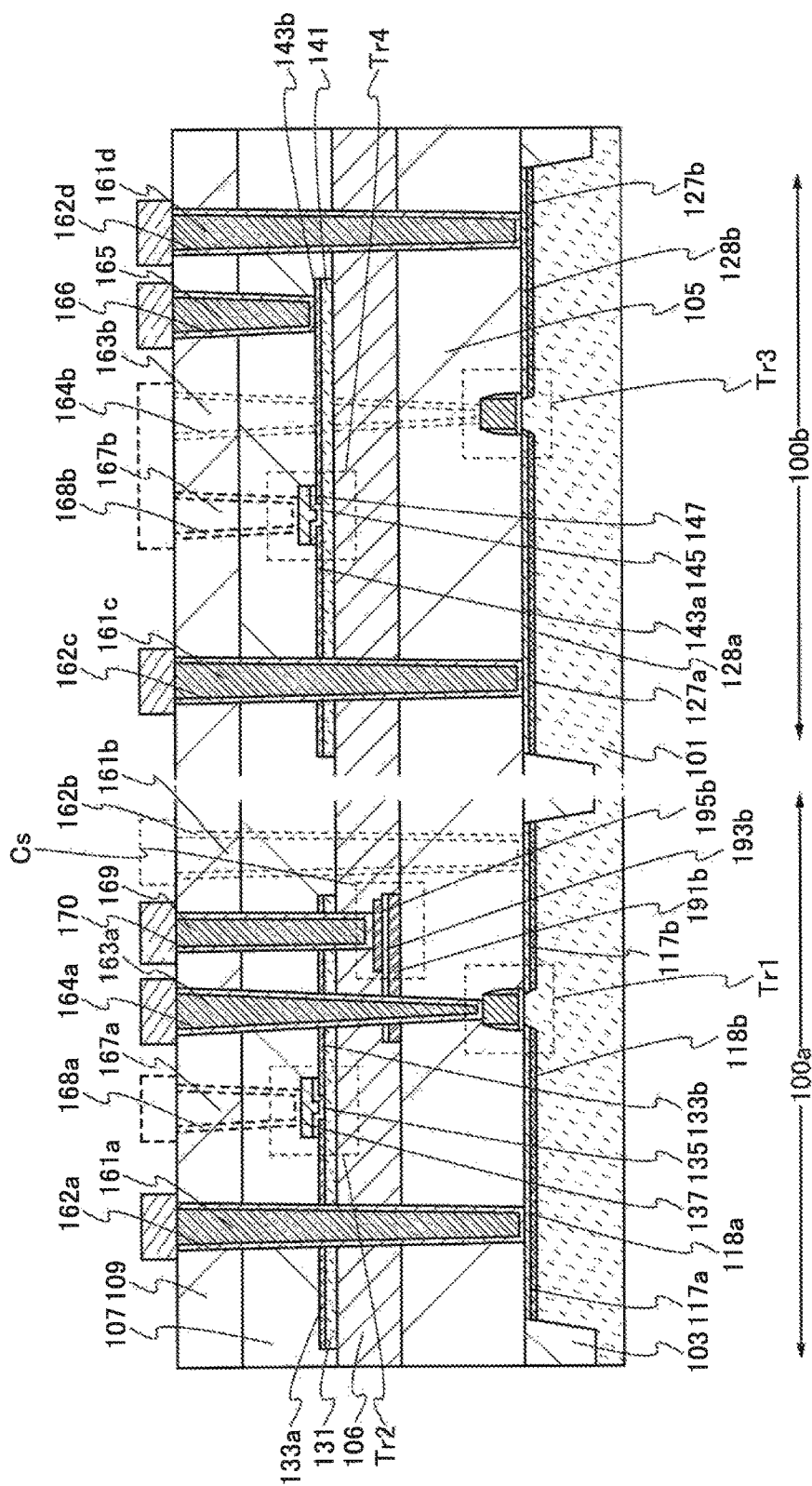
FIG. 52 is a cross-sectional view illustrating one embodiment of a semiconductor device.

As illustrated in FIG. 52, in the opening portions, the barrier films 162a, 162b, 162c, 162d, 164a, 164b, 166, 168a, 168b, and 170 may be provided between the conductive films 161a, 161b, 161c, 161d, 163a, 163b, 165, 167a, 167b, and 169 and the insulating films 105, 106, 107, and 109. Each of the barrier films 162a, 162b, 162c, 162d, 164a, 164b, 166, 168a, 168b, and 170 can be formed using a titanium film, a titanium nitride film, a tantalum nitride film, a molybdenum film, a molybdenum nitride film, or the like as appropriate. The barrier films 162a, 162b, 162c, 162d, 164a, 164b, 166, 168a, 168b, and 170 can prevent metal elements contained in the conductive films 161a, 161b, 161c, 161d, 163a, 163b, 165, 167a, 167b, and 169 from being diffused into the transistors Tr1, Tr2, Tr3, and Tr4 through the insulating films 105, 106, 107, and 109. In addition, the adhesion of the conductive films 161a, 161b, 161c, 161d, 163a, 163b, 165, 167a, 167b, and 169 can be increased.

Furthermore, as illustrated in FIG. 52, the silicide films 118a, 118b, 128a, and 128b may be provided over the impurity regions 117a, 117b, 127a, and 127b. Each of the silicide films can be formed using a nickel silicide film, a cobalt silicide film, a molybdenum silicide film, a tungsten silicide film, a titanium silicide film, or the like. The silicide films 118a, 118b, 128a, and 128b can reduce contact resistance; thus, a semiconductor device capable of high-speed operation can be manufactured.

In the case where the insulating films are formed using different materials, the opening portion may have a plurality of widths because of the different etching rates of the insulating films. For example, the width of the opening portion might be large in an insulating film that is easily etched, whereas the width might be small in an insulating film that is not easily etched. As a result, the conductive films 161a, 161b, 161c, 161d, 163a, 163b, 165, 167a, 167b, and 169 whose side surfaces have a plurality of projections are formed as illustrated in FIG. 53 in one step. Note that each of the conductive films 161a, 161b, 161c, 161d, 163a, 163b, 165, 167a, 167b, and 169 has one or more projections in a cross section in a thickness direction. Furthermore, the width of each of the conductive films 161a, 161b, 161c, 161d, 163a, 163b, 165, 167a, 167b, and 169 is not gradually reduced from the insulating film 109 toward the insulating film 107; each of the conductive films is formed to have regions with narrow widths and regions with wide widths randomly.

Each of the conductive films 161a, 161b, 161c, 161d, 163a, 163b, 165, 167a, 167b, and 169 has at least a region with a first width, a region with a second width, and a region with a third width. At least two of the first width, the second width, and the third width have different values.

For example, in a conductive film in which a region with the first width, a region with the second width, and a region with the third width are formed in this order, the first width and the third width are larger than the second width in some cases. In such a case, the region with the first width and the region with the third width are in opening portions formed in a silicon nitride film, a silicon nitride oxide film, an aluminum oxide film, or the like, whereas the region with the second width is in an opening portion formed in a silicon oxide film, a silicon oxynitride film, or the like.

In the conductive film in which the region with the first width, the region with the second width, and the region with the third width are formed in this order, the first width and the third width are smaller than the second width in some cases. In such a case, the region with the first width and the region with the third width are in opening portions formed in a silicon oxide film, a silicon oxynitride film, or the like whereas the region with the second width is in an opening portion formed in a silicon nitride film, a silicon nitride oxide film, an aluminum oxide film, or the like.

The conductive films 161a, 161b, 161c, 161d, 163a, 163b, 165, 167a, 167b, and 169 having the shapes illustrated in FIG. 53 have high adhesion with the insulating films 105, 106, 107, and 109. Thus, the conductive films 161a, 161b, 161c, 161d, 163a, 163b, 165, 167a, 167b, and 169 can be prevented from being separated by a mechanical load due to a polishing step in a step using a CMP method, which is one of formation steps of the conductive films. As a result, the yield of the semiconductor device can be improved.

In a manner described in this embodiment, an n-channel transistor can be stacked over a p-channel transistor without attaching a substrate over which the p-channel transistor is formed to a substrate over which the n-channel transistor is formed.

This embodiment can be combined with any of the other embodiments in this specification as appropriate.

(Embodiment 9)

An example in which the capacitor Cs is provided over the insulating film 107 is described in Embodiment 1. In contrast, in this embodiment, described is an example in which the transistor Tr2 and the capacitor Cs in contact with the transistor Tr2 are provided over the insulating film 105, and the insulating film 107 is provided thereover. Note that in this embodiment, the gate insulating film of the transistor Tr2 and the dielectric of the capacitor Cs that are formed over the same insulating film are insulating films formed in the same step. In this embodiment, portions common to those in Embodiment 1 will be described using the same reference numerals, and the descriptions overlapping with those in Embodiment 1 will be omitted.

Figure 55:
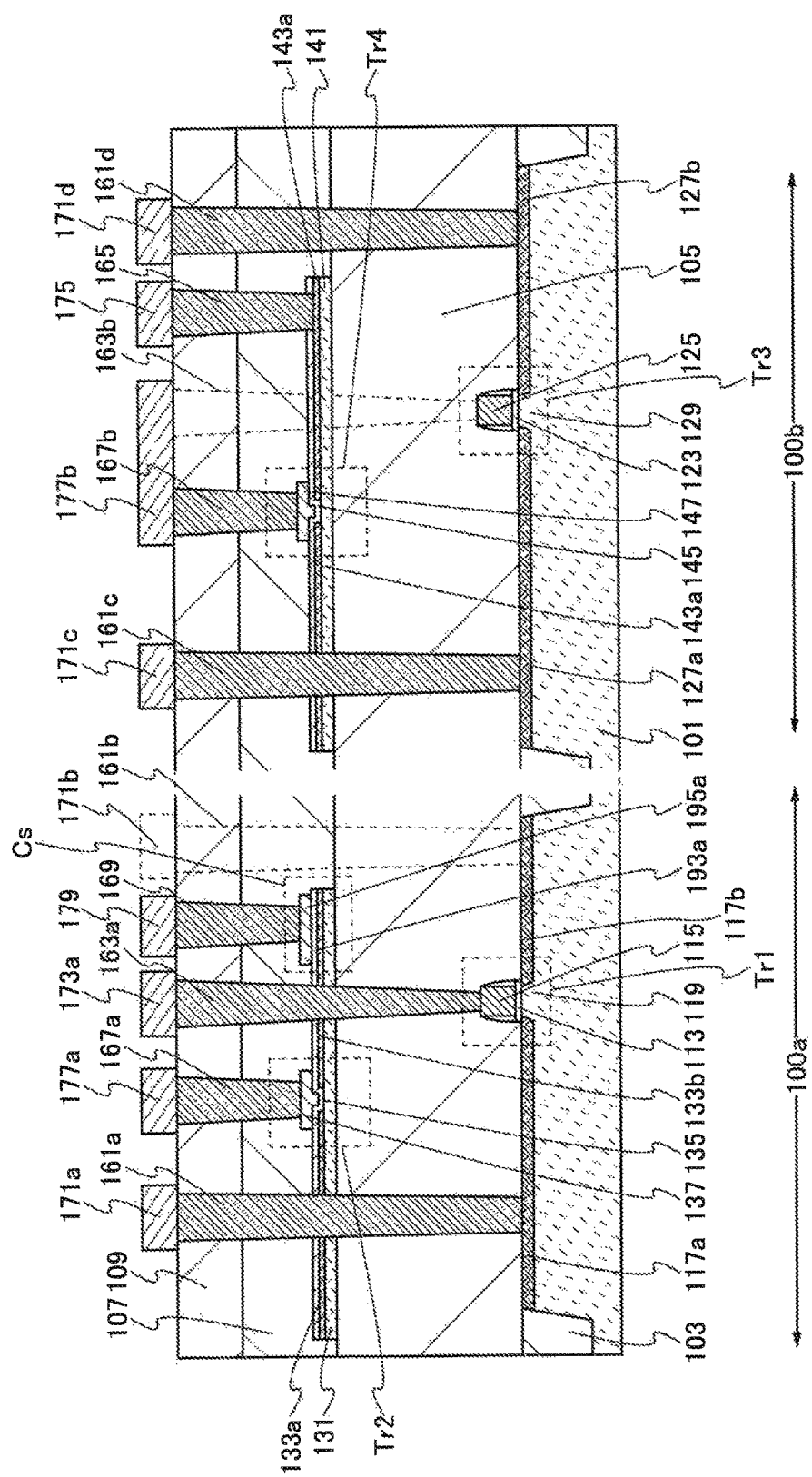
FIG. 55 is a cross-sectional view illustrating one embodiment of a semiconductor device.

FIG. 55 is a schematic cross-sectional view of the semiconductor device. FIG. 55 illustrates circuits, which are the memory cell 100a and the inverter circuit 100b here, included in the semiconductor device.

The memory cell 100a includes the transistor Tr1, the transistor Tr2, and the capacitor Cs. The insulating film 105 is formed over the transistor Tr1. The capacitor Cs is formed over the insulating film 105 and the transistor Tr2. The insulating film 107 is formed over the transistor Tr2 and the capacitor Cs. The insulating film 109 is formed over the insulating film 107.

The transistor Tr1 includes the channel region 119 formed in the substrate 101, the insulating film 113 formed over the channel region 119, the conductive film 115 formed over the insulating film 113, and the impurity regions 117a and 117b formed in the substrate 101 and outside the channel region 119. The insulating film 113 has a function of a gate insulating film. The conductive film 115 has a function of a gate electrode. The impurity regions 117a and 117b have functions of a source region and a drain region.

The transistor Tr2 includes the semiconductor film 131 formed over the insulating film 105, the conductive films 133a and 133b formed over the semiconductor film 131, the insulating film 135 formed over the semiconductor film 131 and the conductive films 133a and 133b, and the conductive film 137 formed over the insulating film 135. The conductive films 133a and 133b have functions of a source electrode and a drain electrode. The insulating film 135 has a function of a gate insulating film. The conductive film 137 has a function of a gate electrode.

The capacitor Cs includes the conductive film 133b formed over the semiconductor film 131, an insulating film 193a formed over the conductive film 133b, and a conductive film 195a formed over the insulating film 193a. The conductive films 133b and 195a each have a function of a capacitor electrode. The insulating film 193a has a function of a dielectric.

The memory cell 100a also includes the conductive films 161a, 161b, 163a, 167a, and 169. The conductive film 161a is connected to the impurity region 117a of the transistor Tr1 and the semiconductor film 131 and the conductive film 133a of the transistor Tr2. The conductive film 161b is connected to the impurity region 117b of the transistor Tr1. The conductive film 163a is connected to the conductive film 115 of the transistor Tr1, and the semiconductor film 131 and the conductive film 133b of the transistor Tr2. The conductive film 167a is connected to the conductive film 137 of the transistor Tr2. The conductive film 169 is connected to the conductive film 195a of the capacitor Cs. The conductive films 161a, 161b, 163a, 167a, and 169 each have a function of a plug. Note that since not existing on a plane illustrated in FIG. 55, the conductive film 161b is shown by a dashed line.

The conductive film 161a is formed in an opening portion of the insulating film 105, the semiconductor film 131, the insulating film 135, the conductive film 133a, the insulating film 107, and the insulating film 109. The conductive film 161b is formed in an opening portion of the insulating films 105, 107, and 109. The conductive film 163a is formed in an opening portion of the insulating film 105, the semiconductor film 131, the insulating film 135, the conductive film 133b, the insulating film 107, the conductive film 151, and the insulating film 109. The conductive film 167a is formed in an opening portion of the insulating films 107 and 109. The conductive film 169 is formed in an opening portion of insulating films 107 and 109.

The conductive films 171a, 171b, 173a, 177a, and 179 are formed over the insulating film 109. The conductive film 171a, the conductive film 171b, the conductive film 173a, the conductive film 177a, and the conductive film 179 are connected to the conductive film 161a, the conductive film 161b, the conductive film 163a, the conductive film 167a, and the conductive film 169, respectively. The conductive films 171a, 171b, 173a, 177a, and 179 each have a function of a wiring. Note that since not existing on a plane illustrated in FIG. 55, the conductive film 171b is shown by a dashed line.

In the memory cell 100a, some components of the transistor Tr1, the transistor Tr2, and the capacitor Cs are connected with the conductive films. The conductive films are formed through not only the insulating films but also the semiconductor films and the conductive films which are the components of the transistors. For this reason, the transistor Tr1, the transistor Tr2, and the capacitor Cs can partly or entirely overlap with each other. Accordingly, the semiconductor device can be highly integrated.

Next, the inverter circuit 100b will be described.

The inverter circuit 100b includes the transistors Tr3 and Tr4. The insulating film 105 is formed over the transistor Tr3. The transistor Tr4 is formed over the insulating film 105. The insulating film 107 is formed over the insulating film 105 and the transistor Tr4. The insulating film 109 is formed over the insulating film 107.

The transistor Tr3 includes the channel region 129 formed in the substrate 101, the insulating film 123 formed over the channel region 129, the conductive film 125 formed over the insulating film 123, and the impurity regions 127a and 127b formed in the substrate 101 and outside the channel region 129. The insulating film 123 has a function of a gate insulating film. The conductive film 125 has a function of a gate electrode. The impurity regions 127a and 127b have functions of a source region and a drain region.

The transistor Tr4 includes the semiconductor film 141 formed over the insulating film 105, the conductive films 143a and 143b formed over the semiconductor film 141, the insulating film 145 formed over the semiconductor film 141 and the conductive films 143a and 143b, and the conductive film 147 formed over the insulating film 145. The conductive films 143a and 143b have functions of a source electrode and a drain electrode. The insulating film 145 has a function of a gate insulating film. The conductive film 147 has a function of a gate electrode.

Figure 65:
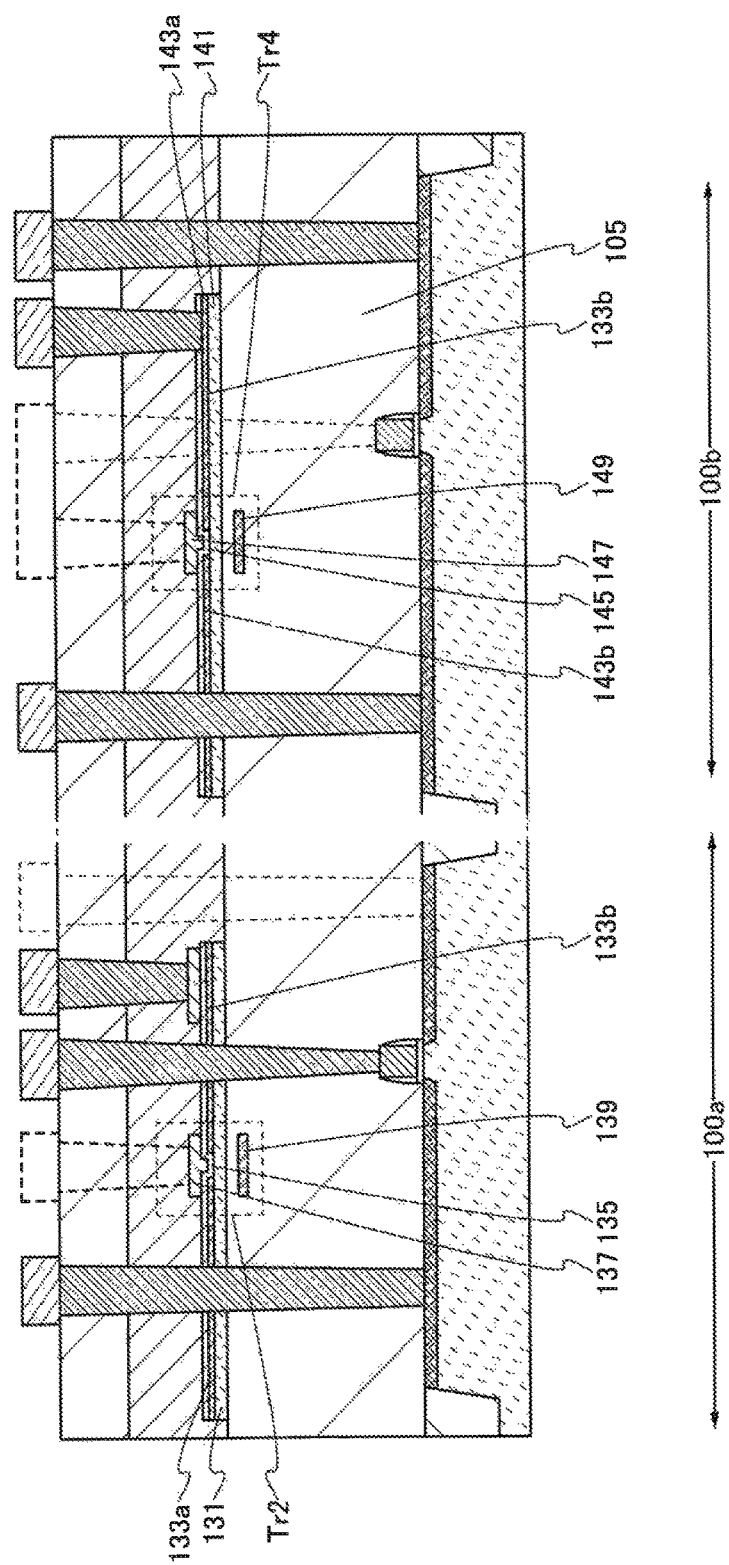
FIG. 65 is a cross-sectional view illustrating one embodiment of a semiconductor device.

Although the transistors Tr2 and Tr4 are described as single-gate transistors here, the transistors Tr2 and Tr4 can be dual-gate transistors as illustrated in FIG. 65. In that case, the transistor Tr2 includes the conductive film 139 having a function of a gate electrode in the insulating film 105 and in a position overlapping with the semiconductor film 131 and the conductive film 137. The transistor Tr4 includes the conductive film 149 having a function of a gate electrode in the insulating film 105 and in a position overlapping with the semiconductor film 141 and the conductive film 147.

By applying different voltages to the conductive films 137 and 139, the threshold voltage the transistor Tr3 can be controlled. Furthermore, by applying different voltages to the conductive films 147 and 149, the threshold voltage of the transistor Tr4 can be controlled.

The inverter circuit 100b also includes the conductive films 161c, 161d, 163b, 165, and 167b. The conductive film 161c is connected to the impurity region 127a of the transistor Tr3 and the semiconductor film 141 and the conductive film 143a of the transistor Tr4. The conductive film 161d is connected to the impurity region 127b of the transistor Tr3. The conductive film 163b is connected to the conductive film 125 of the transistor Tr3 and the semiconductor film 141 and the conductive film 143b of the transistor Tr4. The conductive film 165 is connected to the conductive film 143b of the transistor Tr4. The conductive film 167b is connected to the conductive film 147 of the transistor Tr4. The conductive films 161c, 161d, 163b, 165, and 167b each have a function of a plug. Note that since not existing on a plane illustrated in FIG. 55, the conductive film 163b is shown by a dashed line.

The conductive film 161c is formed in an opening portion of the insulating film 105, the semiconductor film 141, the insulating film 145, the conductive film 143a, the insulating film 107, and the insulating film 109. The conductive film 161d is formed in an opening portion of the insulating films 105, 107, and 109. The conductive film 163b is formed in an opening portion of the insulating film 105, the semiconductor film 141, the conductive film 143b, the insulating film 107, and the insulating film 109. The conductive film 165 is formed in an opening portion of the insulating films 145, 107, and 109. The conductive film 167b is formed in an opening portion of the insulating films 107 and 109.

The conductive films 171c, 171d, 175, and 177b are formed over the insulating film 109. The conductive film 171c is connected to the conductive film 161c. The conductive film 171d is connected to the conductive film 161d. The conductive film 175 is connected to the conductive film 165. The conductive film 177b is connected to the conductive films 163b and 167b. The conductive films 171c, 171d, 175, and 177b each have a function of a wiring.

In the inverter circuit 100b, some components of the transistors Tr3 and Tr4 are connected with the conductive films. The conductive films are formed through not only the insulating films but also the semiconductor films and the conductive films which are the components of the transistors. For this reason, the transistors Tr3 and Tr4 can partly or entirely overlap with each other. Accordingly, the semiconductor device can be highly integrated.

To manufacture the semiconductor device of this embodiment, after transistors are stacked, conductive films each having a function of a plug are selectively formed so that some components of the transistors are electrically connected to each other. In addition, wirings for connecting the plugs are formed. As a result, circuits each having a function can be formed. The plugs and the wirings can be formed as appropriate in accordance with a circuit design diagram to form an arbitrary circuit. Thus, masks designed for each semiconductor device are unnecessary, which increases the circuit design flexibility in the semiconductor device.

The transistors Tr1 and Tr3 have the same conductivity type and are p-channel transistors here. The transistors Tr2 and Tr4 have the same conductivity type and are n-channel transistors here. The transistor Tr2 is stacked over the transistor Tr1 and the transistor Tr4 is stacked over the transistor Tr3. In other words, the p-channel transistors and the n-channel transistors are formed in different tiers. Accordingly, in order that the electric characteristics of the transistor can be improved, the materials for the gate electrode and the gate insulating film can be appropriately selected depending on the conductivity type of the transistor. Moreover, since the transistors are stacked, the semiconductor device can be highly integrated.

The transistors Tr1 and Tr3 are formed using a semiconductor substrate and the channel regions 119 and 129 are formed in the semiconductor substrate. Alternatively, although not illustrated, the transistors Tr1 and Tr3 may each be a transistor in which a semiconductor film is provided over a substrate and a channel region is formed in the semiconductor film.

The impurity regions 117a, 117b, 127a, and 127b, the insulating films 113 and 123, and the conductive films 115 and 125 included in the transistors Tr1 and Tr3 can be formed using materials for an impurity region, an insulating film, and a conductive film included in any of known metal-oxide-semiconductor field-effect transistors (MOS-FETs), as appropriate.

The insulating film 105 can be formed using a silicon oxide film, a silicon oxynitride film, a silicon nitride film, a silicon nitride oxide film, an aluminum oxide film, an aluminum oxynitride film, a gallium oxide film, a gallium oxynitride film, a yttrium oxide film, a yttrium oxynitride film, a hafnium oxide film, or a hafnium oxynitride film. Alternatively, the insulating film 105 can be formed using a heat-resistant organic material such as polyimide, acrylic, a benzocyclobutene-based resin, polyamide, or epoxy.

Note that in the insulating film 105, it is preferred to provide an insulating film that releases hydrogen by heat, as a typical example, a silicon nitride film containing hydrogen, so as to be in contact with the transistors Tr2 and Tr4. By heat treatment in the manufacturing process of the semiconductor device, the channel regions 119 and 129 can be hydrogenated. As a result, defects (dangling bonds) in the channel regions can be repaired (terminated with hydrogen).

In the insulating film 105, an insulating film that releases oxygen by heat may be provided so as to be in contact with the semiconductor films 131 and 141 of the transistors Tr2 and Tr4. The insulating film that releases oxygen by heat can be formed by adding one or more of an oxygen radical, an oxygen atom, an oxygen atomic ion, and an oxygen molecular ion to an oxide film. Examples of a method for adding one or more of an oxygen radical, an oxygen atom, an oxygen atomic ion, and an oxygen molecular ion to the oxide film include an ion doping method, an ion implantation method, and plasma treatment.

For the semiconductor films 131 and 141 included in the transistors Tr2 and Tr4, silicon or a wide-gap semiconductor can be used. Examples of a wide-gap semiconductor include SiC, GaN, and an oxide semiconductor. The semiconductor films 131 and 141 of the transistors Tr2 and Tr4 are formed using a wide-gap semiconductor, whereby off-state leakage currents of the transistors Tr2 and Tr4 can be reduced.

The detailed structures of the transistors Tr2 and Tr4 are described in Embodiment 2.

The insulating film 107 can be formed using any of the materials for the insulating film 105 as appropriate.

Each of the conductive films 133b and 195a included in the capacitor Cs can be formed using any of known materials for a conductive film included in a capacitor as appropriate. The insulating film 193a is formed using the same material as the insulating film 135, and can be regarded as part of the insulating film 135, or part overlapping with the conductive film 195a.

The insulating film 109 can be formed using any of the materials for the insulating film 105 as appropriate.

Each of the conductive films 161a, 161b, 161c, 161d, 163a, 163b, 165, 167a, 167b, and 169 can be formed using a conductive material such as a metal material, an alloy material, or a metal oxide material. For example, each of the conductive films is formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. It is preferred that each of the conductive films 161a, 161b, 161c, 161d, 163a, 163b, 165, 167a, 167b, and 169 be formed using a high-melting-point material that has both heat resistance and conductivity, such as tungsten or molybdenum, and it is particularly preferred to use tungsten.

Figure 67:
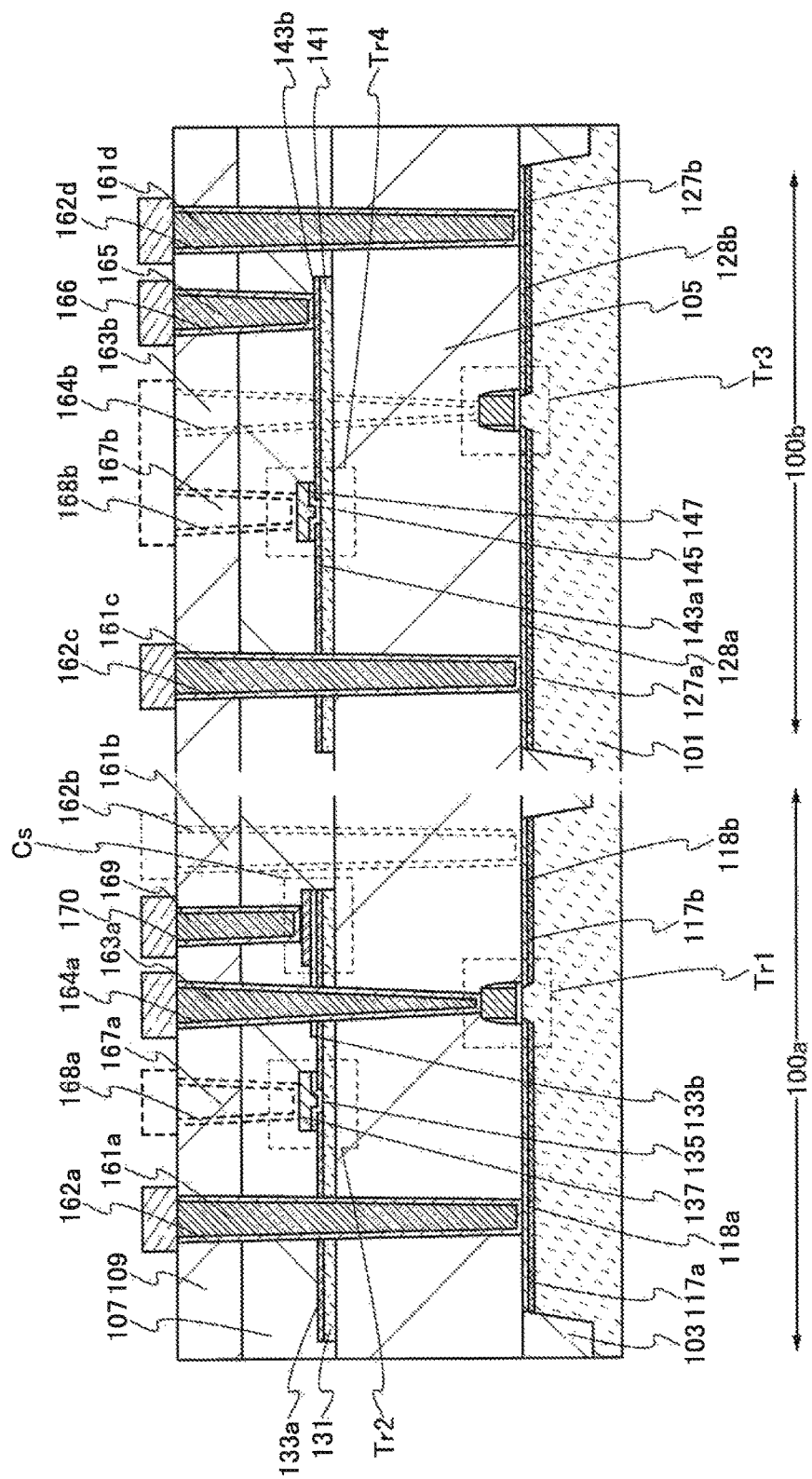
FIG. 67 is a cross-sectional view illustrating one embodiment of a semiconductor device.

As illustrated in FIG. 67, in the opening portions, the barrier films 162a, 162b, 162c, 162d, 164a, 164b, 166, 168a, 168b, and 170 may be provided between the conductive films 161a, 161b, 161c, 161d, 163a, 163b, 165, 167a, 167b, and 169 and the insulating films 105 and 107. Each of the barrier films 162a, 162b, 162c, 162d, 164a, 164b, 166, 168a, 168b, and 170 can be formed using a titanium film, a titanium nitride film, a tantalum nitride film, a molybdenum film, a molybdenum nitride film, or the like as appropriate. The barrier films 162a, 162b, 162c, 162d, 164a, 164b, 166, 168a, 168b, and 170 can prevent metal elements contained in the conductive films 161a, 161b, 161c, 161d, 163a, 163b, 165, 167a, 167b, and 169 from being diffused into the transistors Tr1, Tr2, Tr3, and Tr4 through the insulating films 105, 107, and 109. In addition, the adhesion of the conductive films 161a, 161b, 161c, 161d, 163a, 163b, 165, 167a, 167b, and 169 can be increased.

Furthermore, as illustrated in FIG. 67, the silicide films 118a, 118b, 128a, and 128b may be provided over the impurity regions 117a, 117b, 127a, and 127b. Each of the silicide films can be formed using a nickel silicide film, a cobalt silicide film, a molybdenum silicide film, a tungsten silicide film, a titanium silicide film, or the like. The silicide films 118a, 118b, 128a, and 128b can reduce contact resistance; thus, a semiconductor device capable of high-speed operation can be manufactured.

Note that although not illustrated, silicide films can be provided over the conductive films 137 and 147 to reduce contact resistance.

<Method for Manufacturing Semiconductor Device>

Next, the method for manufacturing the semiconductor device will be described with reference to FIG. 56 to FIG. 64 and FIG. 66. Though not existing on a plane illustrated in these figures, some components may be shown by solid lines for easy understanding. Note that components of the transistors Tr1, Tr2, Tr3, and Tr4, the insulating films over the transistors Tr1, Tr2, Tr3, and Tr4, and the conductive films connected to the transistors Tr1, Tr2, Tr3, and Tr4 can be formed by any of known methods as appropriate if not particularly described.

In a manner similar to that described in Embodiment 1, the p-channel transistor Tr1 having the channel region 119 in the substrate 101 and the p-channel transistor Tr3 having the channel region 129 in the substrate 101 are formed.

Next, the insulating film 105 is formed over the transistors Tr1 and Tr3.

Figure 56:
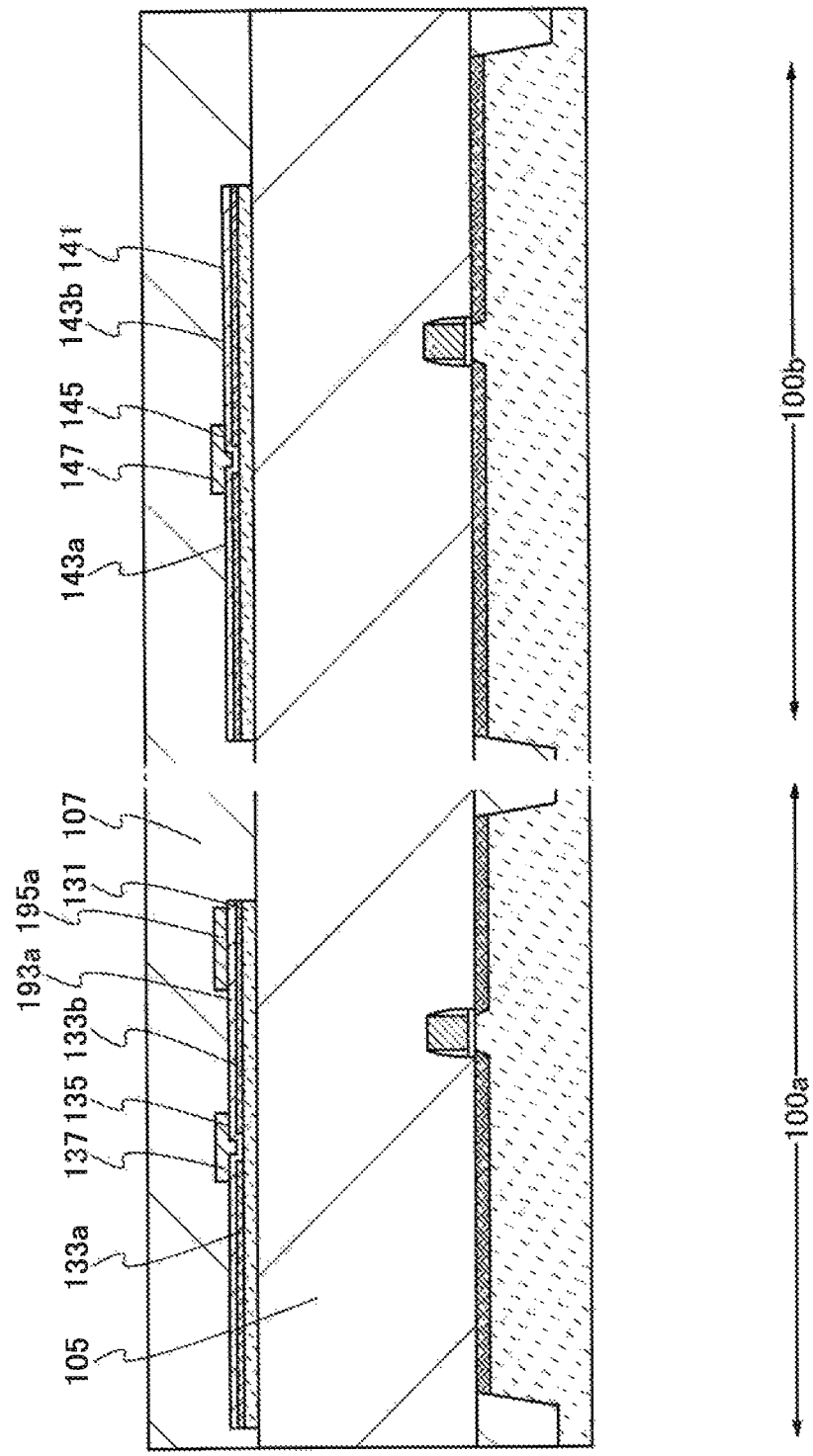
FIG. 56 is a cross-sectional view illustrating one embodiment of a method for manufacturing a semiconductor device.

As illustrated in FIG. 56, over the insulating film 105, the capacitor Cs and the transistor Tr2 including the semiconductor film 131, the conductive films 133a and 133b, the insulating film 135, and the conductive film 137 are formed. Furthermore, the transistor Tr4 including the semiconductor film 141, the conductive films 143a and 143b, the insulating film 145, and the conductive film 147 is formed.

The capacitor Cs and the transistor Tr2 are formed in the same steps; the capacitor Cs includes the conductive film 195a formed in the same step as the conductive film 137, the insulating film 193a which is part of the insulating film 135, and the conductive film 133b. Thus, the transistor Tr2 and the capacitor Cs can be formed without increasing the number of masks and steps.

Then, the insulating film 107 is formed over the transistors Tr2 and Tr4.

Methods for forming the transistors Tr2 and Tr4 are described in Embodiment 2.

The insulating film 107 can be formed by the method for forming the insulating film 105 as appropriate.

Figure 57:
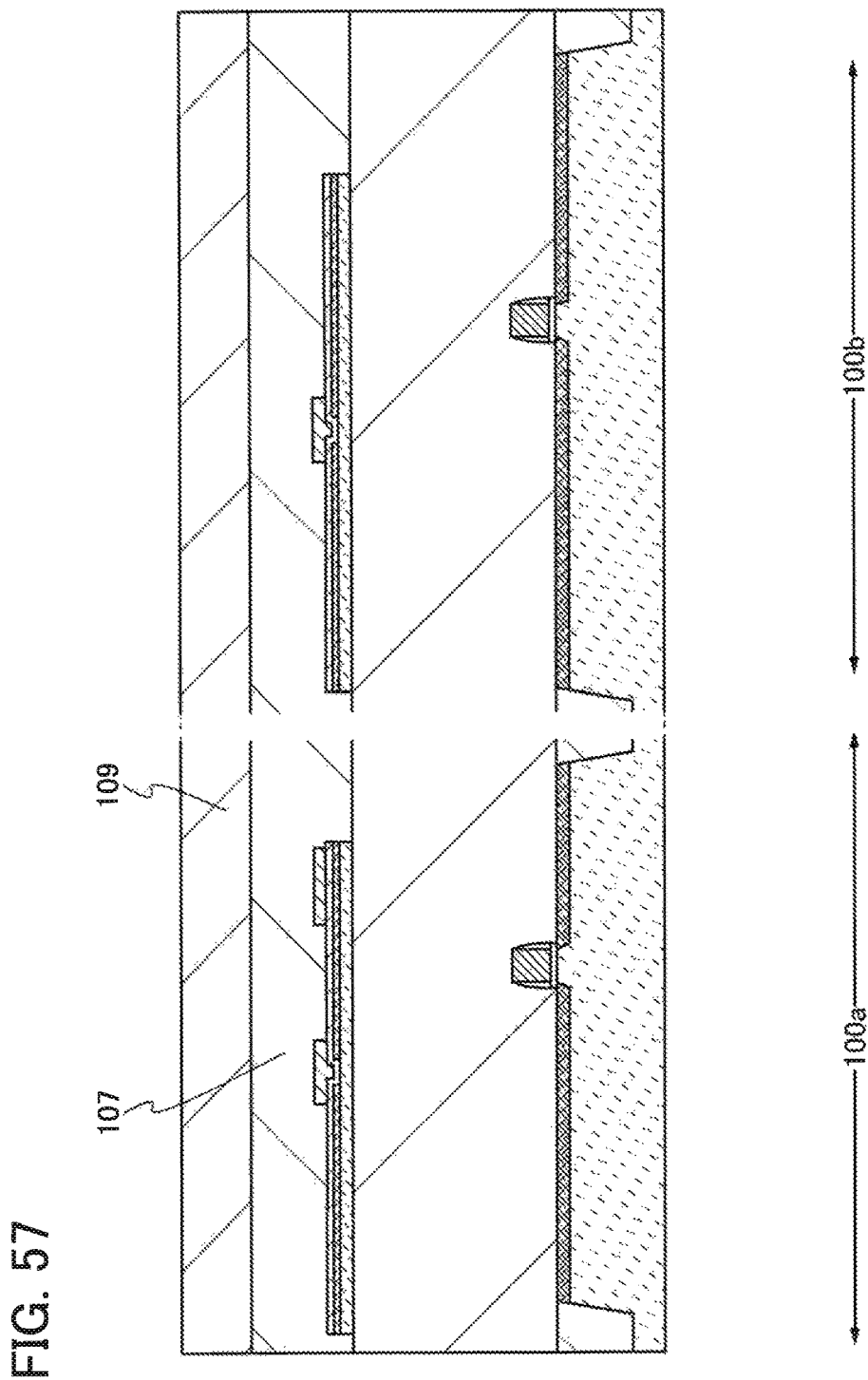
FIG. 57 is a cross-sectional view illustrating one embodiment of a method for manufacturing a semiconductor device.

Next, as illustrated in FIG. 57, the insulating film 109 is formed over the insulating film 107.

The insulating film 109 can be formed by the method for forming the insulating film 105 as appropriate.

Then, a mask is formed over the insulating film 109.

In this embodiment, opening portions, which are formed later, each have a high aspect ratio. For this reason, the mask is preferably a stack including the hard mask 150a_1 and the resist mask 150a_2.

The hard mask 150a_1 can have a single-layer structure or a stacked-layer structure of any of insulating films such as a silicon nitride film, a silicon oxide film, and a silicon nitride oxide film, and conductive films such as a tungsten film. The resist mask 150a_2 can be formed by a lithography process.

Figure 58:
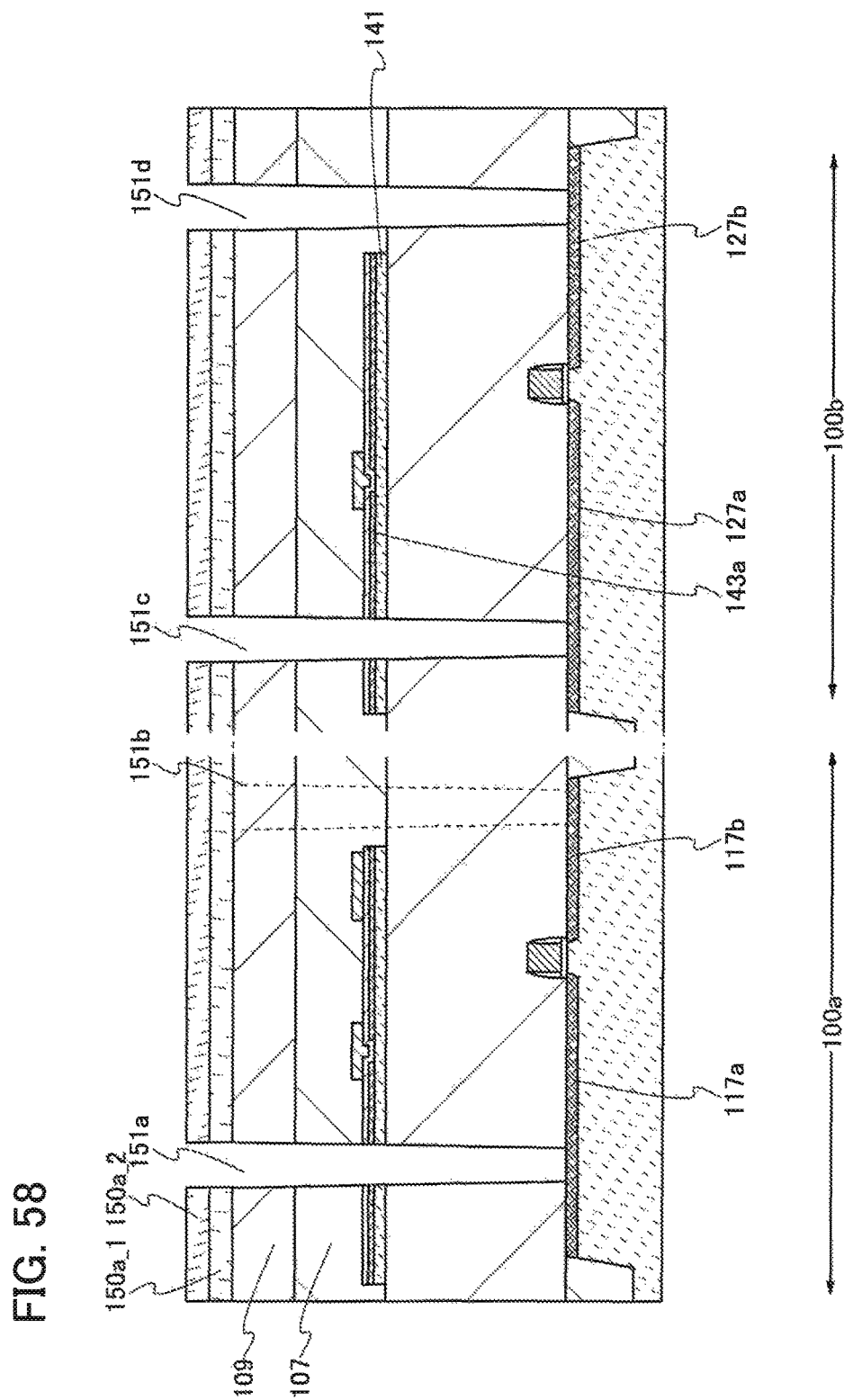
FIG. 58 is a cross-sectional view illustrating one embodiment of a method for manufacturing a semiconductor device.

Next, as illustrated in FIG. 58, the insulating films 105, 107, and 109, the semiconductor films 131 and 141, and the conductive films 133a and 143a are etched to form the opening portions 151a, 151b, 151c, and 151d that expose the impurity regions 117a, 117b, 127a, and 127b. At this time, the etching rate of the resist mask 150a_2 is preferably lower than the etching rates of the insulating films 105, 107, and 109, the semiconductor films 131 and 141, and the conductive films 133a and 143a. When the etching rate of the resist mask 150a_2 is low, the opening portions can be prevented from extending in the lateral direction.

Figure 69:
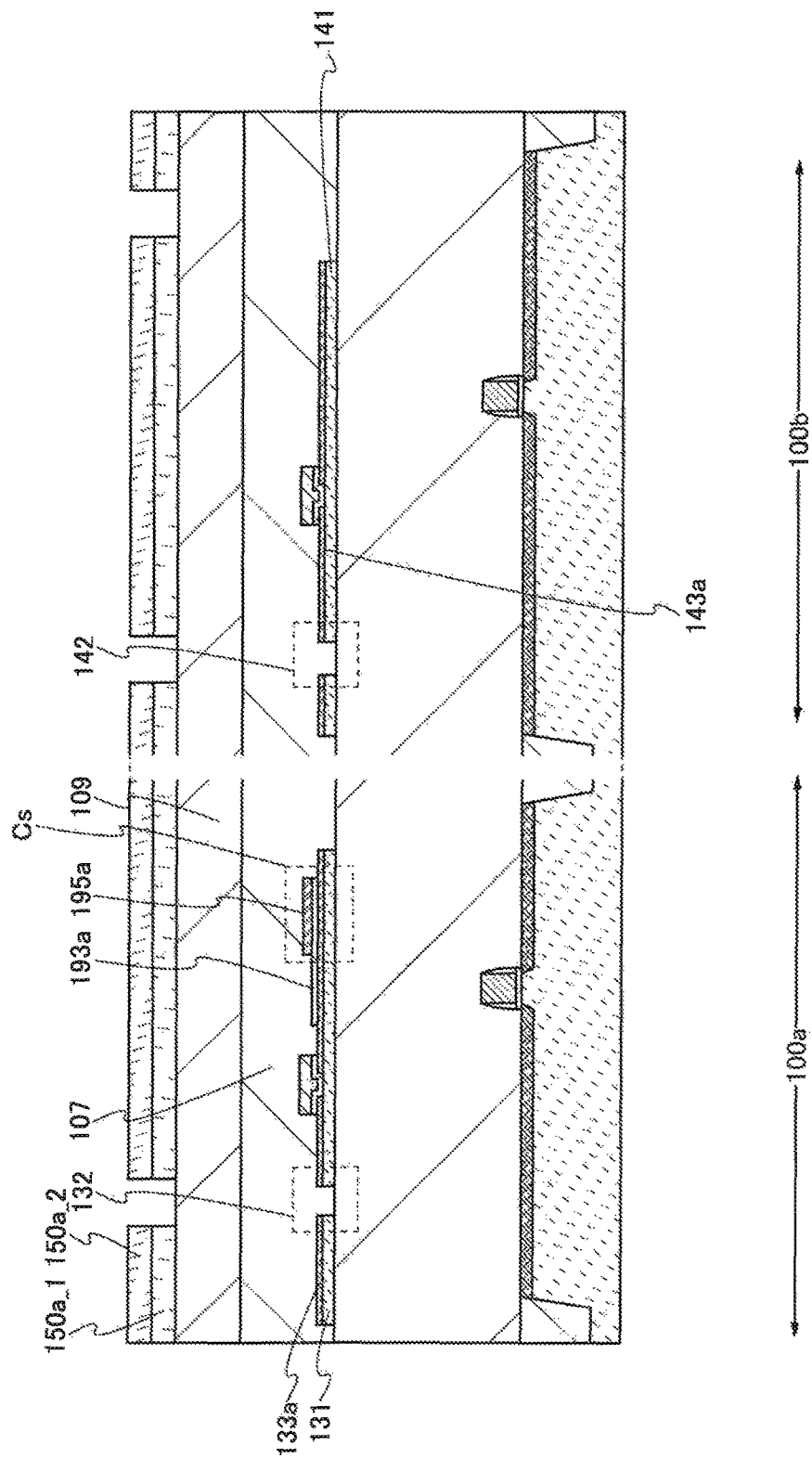
FIG. 69 is a cross-sectional view illustrating one embodiment of a method for manufacturing a semiconductor device.

Instead of the semiconductor films 131 and 141 and the conductive films 133a and 143a, the semiconductor films 131 and 141 and the conductive films 133a and 143a having the opening portions 132 and 142 can be formed in advance in regions where the opening portions 151a, 151b, 151c, and 151d are to be formed, as illustrated in FIG. 69. In such a case, the number of kinds of etching gases that are used for forming the opening portions 151a, 151b, 151c, and 151d can be reduced, and throughput can be improved.

After that, the hard mask 150a_1 and the resist mask 150a_2 are removed.

Figure 59:
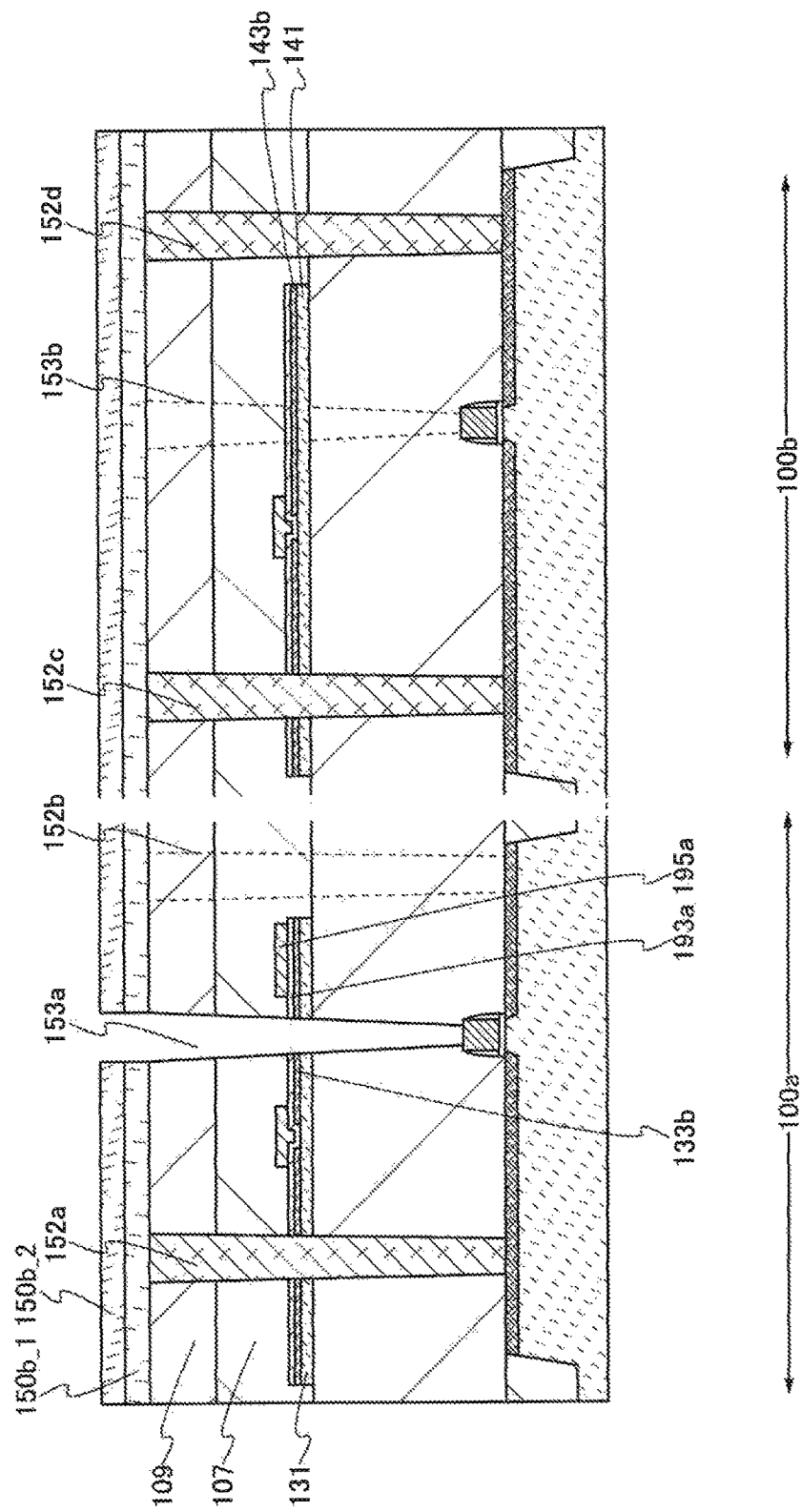
FIG. 59 is a cross-sectional view illustrating one embodiment of a method for manufacturing a semiconductor device.

Next, the masks 152a, 152b, 152c, and 152d are preferably formed in the opening portions 151a, 151b, 151c, and 151d as illustrated in FIG. 59. The masks 152a, 152b, 152c, and 152d can prevent a hard mask and a resist mask from being formed in the opening portions in a later step. The masks 152a, 152b, 152c, and 152d can be formed using an organic resin film such as a BARC film.

Then, a mask is formed over the insulating film 109. Here, the mask is preferably a stack including the hard mask 150b_1 and the resist mask 150n_2.

The hard mask 150b_1 can be formed in a manner similar to that of the hard mask 150a_1. The resist mask 150b_2 can be formed in a manner similar to that of the resist mask 150a_2.

Next, the insulating films 105, 107, 109, and 135, the semiconductor films 131 and 141, and the conductive films 133b, and 143b are etched to form the opening portions 153a and 153b that expose the conductive films 115 and 125. At this time, as in the formation step of the opening portions 151a, 151b, 151c, and 151d, the etching rate is preferably controlled so that the opening portions are prevented from extending in the lateral direction.

After that, the hard mask 150b_1 and the resist mask 150b_2 are removed.

Note that although the opening portions 151a, 151b, 151c, and 151d illustrated in FIG. 58 and the opening portions 153a and 153b illustrated in FIG. 59 are formed in different etching steps here, the opening portions 151a, 151b, 151c, 151d, 153a, and 153b can be formed in the same etching step.

Figure 60:
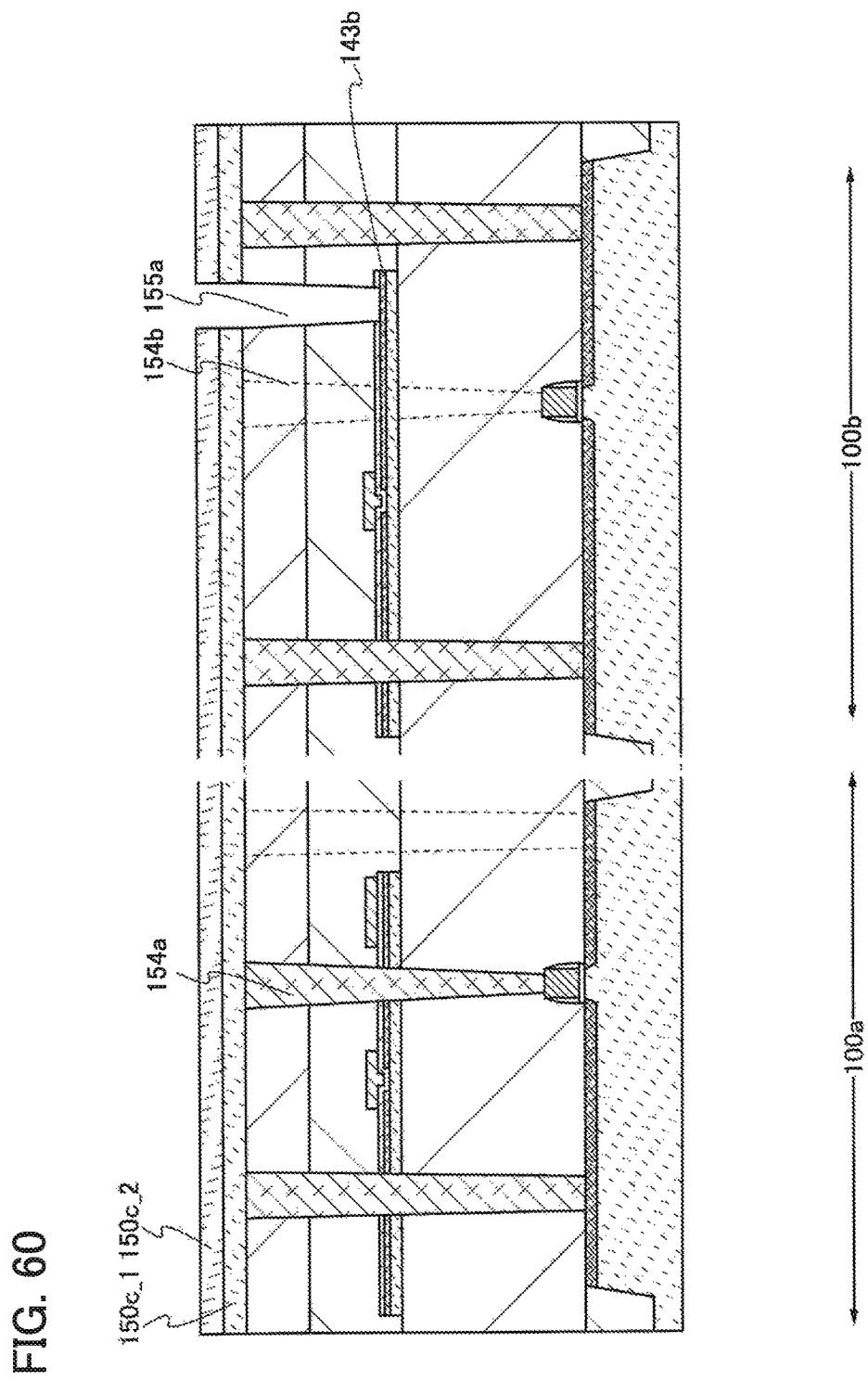
FIG. 60 is a cross-sectional view illustrating one embodiment of a method for manufacturing a semiconductor device.

Next, the masks 154a and 154b are preferably formed in the opening portions 153a and 153b as illustrated in FIG. 60.

Subsequently, a mask is formed over the insulating film 109. Here, the mask is preferably a stack including the hard mask 150c_1 and the resist mask 150c_2.

The hard mask 150c_1 can be formed in a manner similar to that of the hard mask 150a_1. The resist mask 150c_2 can be formed in a manner similar to that of the resist mask 150a_2.

Next, the insulating films 107 and 109 are etched to form the opening portion 155a that exposes the conductive film 143b. At this time, as in the formation step of the opening portions 151a, 151b, 151c, and 151d, the etching rate is preferably controlled so that the opening portions are prevented from extending in the lateral direction.

After that, the hard mask 150c_1 and the resist mask 150c_2 are removed.

Figure 61:
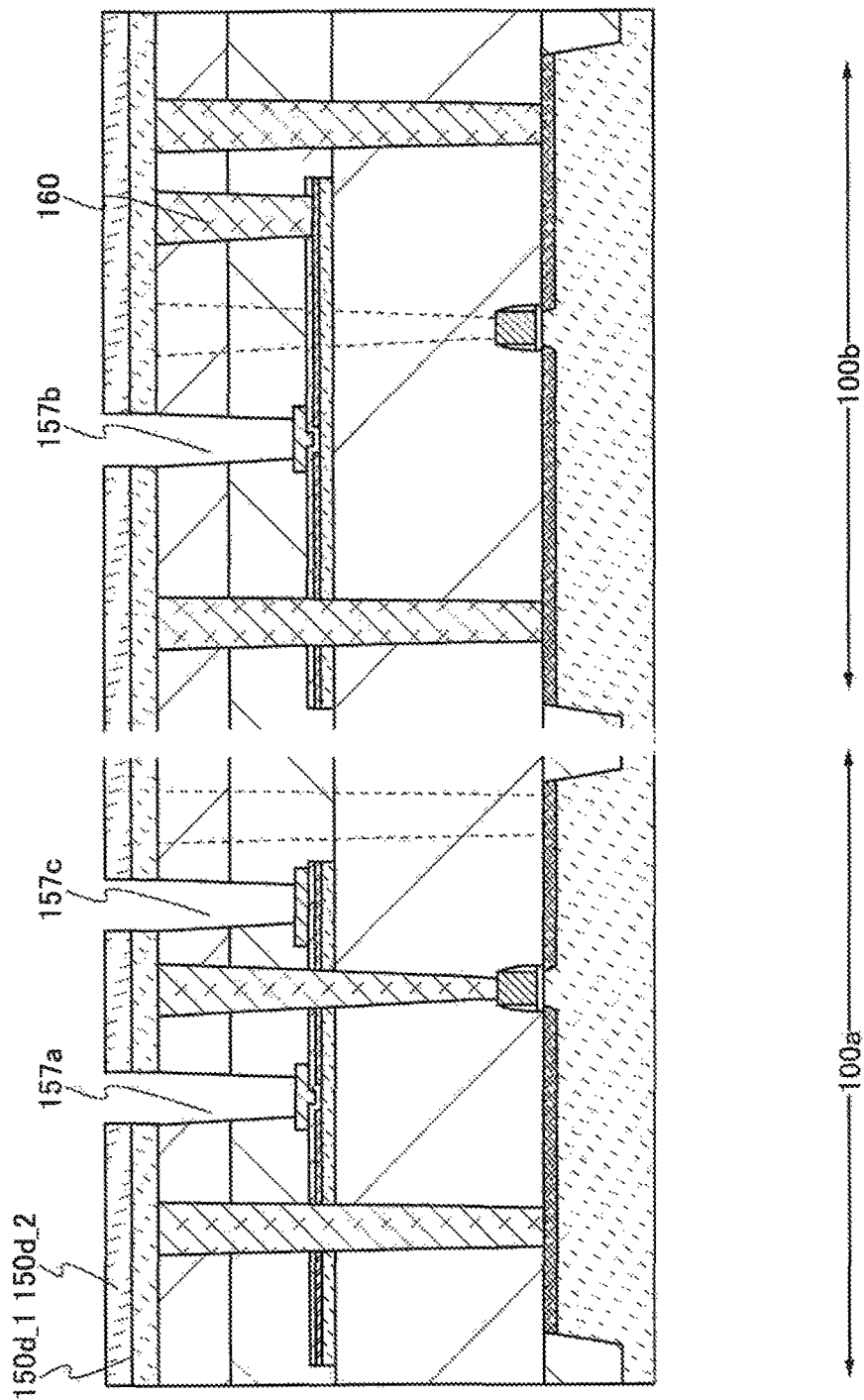
FIG. 61 is a cross-sectional view illustrating one embodiment of a method for manufacturing a semiconductor device.

Next, as illustrated in FIG. 61, the mask 160 is preferably formed in the opening portion 155a.

Subsequently, a mask is formed over the insulating film 109. Here, the mask is preferably a stack including the hard mask 150d_1 and the resist mask 150d_2.

The hard mask 150d_1 can be formed in a manner similar to that of the hard mask 150a_1. The resist mask 150d_2 can be formed in a manner similar to that of the resist mask 150a_2.

Next, the insulating films 107 and 109 are etched to form the opening portion 157a, the opening portion 157b, and an opening portion 157c that expose the conductive film 137, the conductive film 147, and the conductive film 195a, respectively. At this time, as in the formation step of the opening portions 151a, 151b, 151c, and 151d, the etching rate is preferably controlled so that the opening portions are prevented from extending in the lateral direction.

After that, the hard mask 150d_1 and the resist mask 150d_2 are removed.

Note that although the opening portion 155a illustrated in FIG. 60 and the opening portions 157a, 157b, and 157c illustrated in FIG. 61 are formed in different etching steps here, the opening portions 155a, 157a, 157b, and 157c can be formed in the same etching step.

Figure 62:
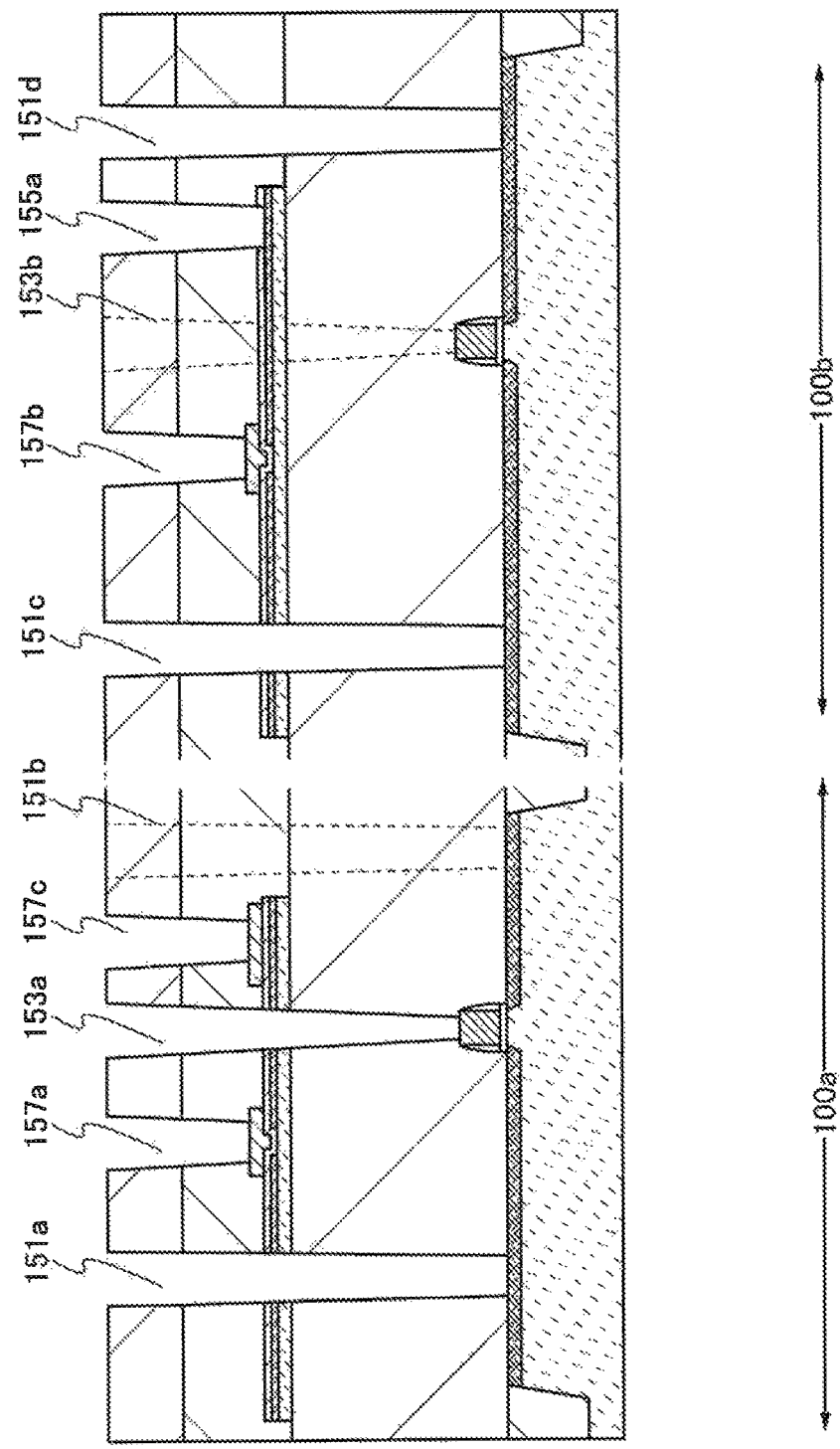
FIG. 62 is a cross-sectional view illustrating one embodiment of a method for manufacturing a semiconductor device.

Next, as illustrated in FIG. 62, the masks 152a, 152b, 152c, 152d, 154a, 154b, and 160 formed in the opening portions 151a, 151b, 151c, 151d, 153a, 153b, and 155a are removed.

Figure 63:
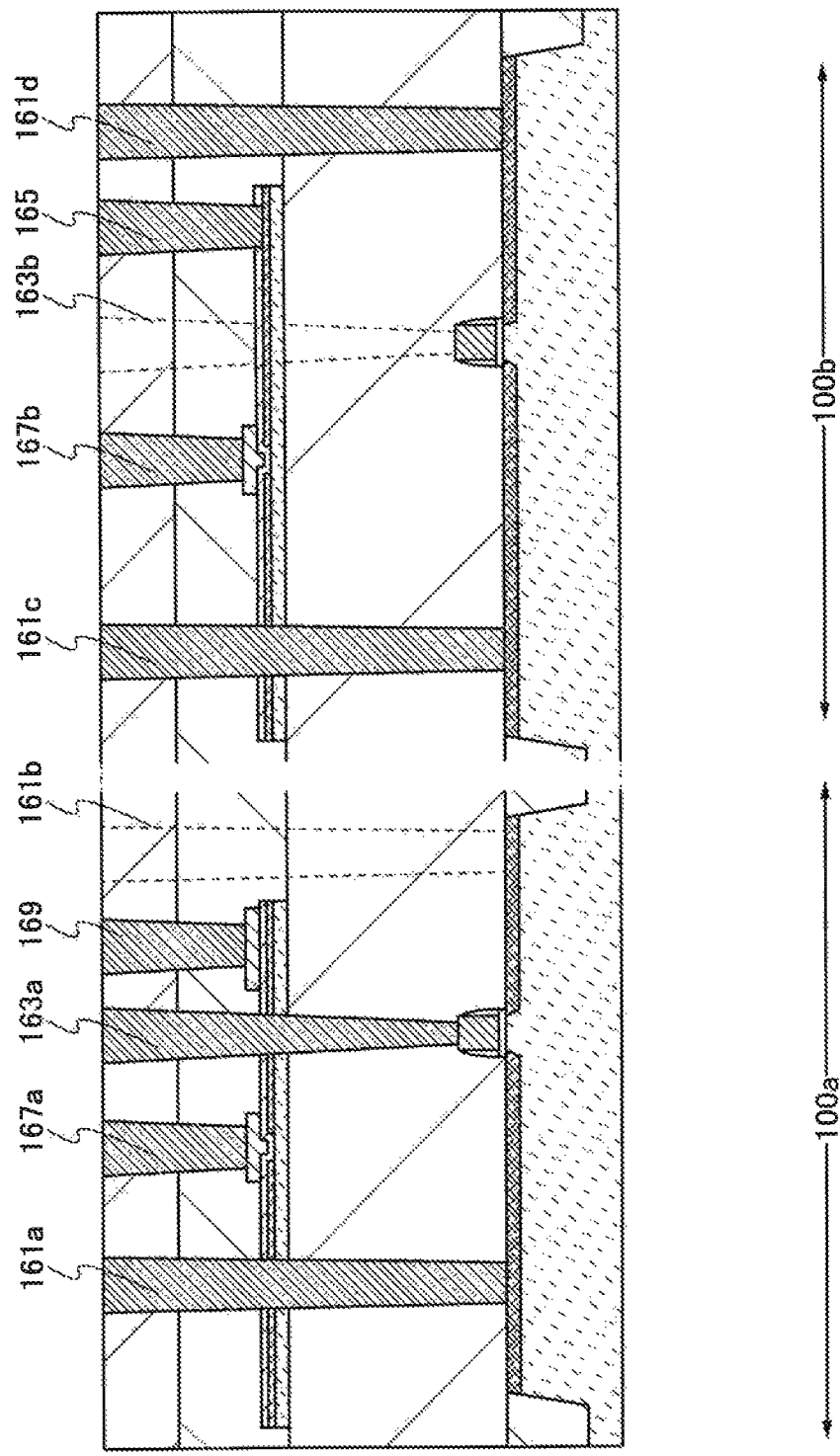
FIG. 63 is a cross-sectional view illustrating one embodiment of a method for manufacturing a semiconductor device.

Then, as illustrated in FIG. 63, the conductive films 161a, 161b, 161c, 161d, 163a, 163b, 165, 167a, 167b, and 169 each having a function of a plug are formed in the opening portions 151a, 151b, 151c, 151d, 153a, 153b, 155a, 157a, 157b, and 157c.

The conductive films 161a, 161b, 161c, 161d, 163a, 163b, 165, 167a, 167b, and 169 can be formed in the following manner: a conductive film is formed by a sputtering method, a CVD method, an evaporation method, or the like so as to fill the opening portions, and part of the conductive film over the insulating film 109 is removed by a CMP method or an etching method. The conductive films 161a, 161b, 161c, 161d, 163a, 163b, 165, 167a, 167b, and 169 may be formed by a damascene method.

Figure 64:
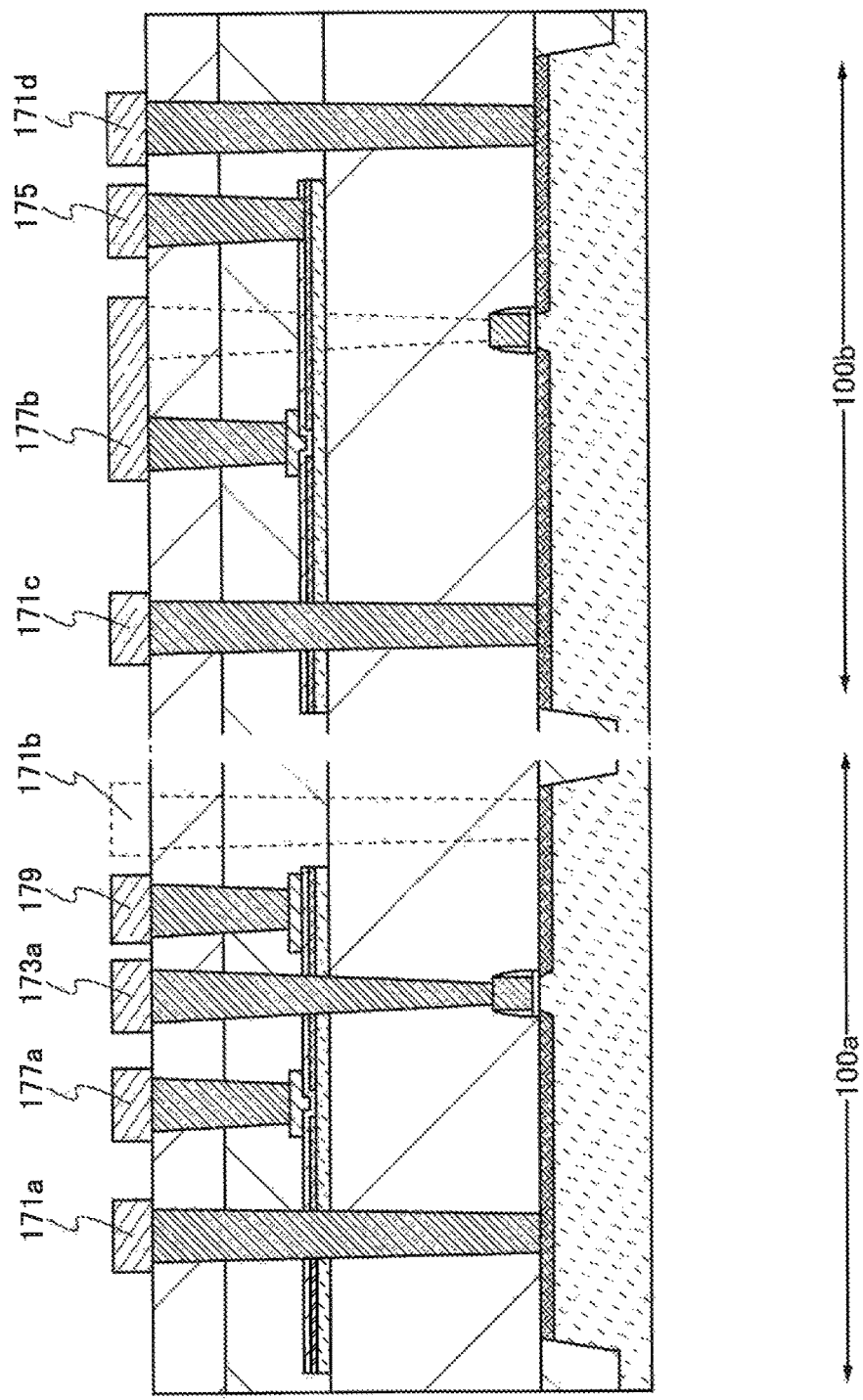
FIG. 64 is a cross-sectional view illustrating one embodiment of a method for manufacturing a semiconductor device.

Then, as illustrated in FIG. 64, the conductive films 171a, 171b, 171c, 171d, 173a, 175, 177a, 177b, and 179 each having a function of a wiring are formed over the insulating film 109 and the conductive films 161a, 161b, 161c, 161d, 163a, 163b, 165, 167a, 167b, and 169.

A conductive film is formed so as to cover the insulating film 109. After that, a mask is formed over the conductive film and then, the conductive film is selectively etched. In this manner, the conductive films 171a, 171b, 171c, 171d, 173a, 175, 177a, 177b, and 179 can be formed over the insulating film 109.

Through the above steps, a semiconductor device can be manufactured.

Note that here, an example where hard masks are used is described. However, one embodiment of the present invention is not limited thereto. Depending on cases or conditions, the semiconductor device can be manufactured using any of a variety of methods; for example, the semiconductor device may be manufactured without using a hard mask.

<Modification Example of Method for Manufacturing Semiconductor Device>

Here, an example of a method for manufacturing the transistors Tr1, Tr2, Tr3, and Tr4 having excellent electric characteristics will be described.

First, the transistors Tr1 and Tr3 are formed over the substrate 101. Then, the insulating film 105a is formed over the impurity regions 117a, 117b, 127a, and 127b, the insulating films 113 and 123, and the conductive films 115 and 125. The insulating film 105a is preferably formed using an insulating film that releases hydrogen by heating, typified by a silicon nitride film containing hydrogen, a silicon nitride oxide film containing hydrogen, or the like, so that the channel regions 119 and 129 can be hydrogenated by heat treatment in the manufacturing process of the semiconductor device. The insulating film that releases hydrogen by heating can be formed by a method for forming the insulating film 105 as appropriate.

Next, the insulating film 105b is formed over the insulating film 105a. The insulating film 105b is formed using any of the materials for the insulating film 105 as appropriate. Note that the insulating film 105b is preferably formed flat by a coating method. Alternatively, the insulating film 105b is preferably formed by performing planarization treatment such as a CMP method on an insulating film. This can increase coverage with an insulating film to be formed later.

Then, the insulating film 105c is formed over the insulating film 105b. The insulating film 105c is preferably formed using a film having barrier properties against hydrogen, water, and the like, and further preferably formed using a film having barrier properties against hydrogen, water, oxygen, and the like. Typical examples of the film having barrier properties against hydrogen, water, oxygen, and the like include a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film.

The insulating film 105c preferably has a sufficient thickness to be capable of preventing hydrogen diffusion, typified by a thickness greater than or equal to 20 nm and less than or equal to 250 nm.

High flatness of the insulating film 105b can increase the coverage with the insulating film 105c even with a small thickness. Such a case is preferable because the barrier properties of the insulating film 105c against hydrogen, water, and the like can be increased.

The insulating film 105c can be formed by the method for forming the insulating film 105 as appropriate. The insulating film 105c formed using an oxide film can be formed in the following manner: a conductive film is formed over the insulating film 105b and at least one of an oxygen radical, an oxygen atom, an oxygen atomic ion, and an oxygen molecular ion is added to the conductive film.

Next, the insulating film 105d is formed over the insulating film 105c. The insulating film 105d is preferably formed using an insulating film that releases oxygen by heating, in which case oxygen contained in the insulating film 105d can be supplied to the semiconductor films of the transistors Tr2 and Tr4, which are to be formed later, by heat treatment in the manufacturing process of the semiconductor device. In addition, in the case where the semiconductor films are each formed using an oxide semiconductor film, oxygen vacancies contained in the oxide semiconductor film can be reduced.

In the oxide semiconductor film, oxygen vacancies sometimes serve as carrier traps, or serve as carrier generation sources when capturing hydrogen. Thus, in the case of using an oxide semiconductor film as each of the semiconductor films of the transistors Tr2 and Tr4, supplying oxygen contained in the insulating film 105d to the oxide semiconductor films reduces oxygen vacancies in the oxide semiconductor films, in which case the transistors Tr2 and Tr4 having excellent electric characteristics can be fabricated.

Through the above steps, the insulating film 105 including the insulating films 105a, 105b, 105c, and 105d is formed.

Figure 66:
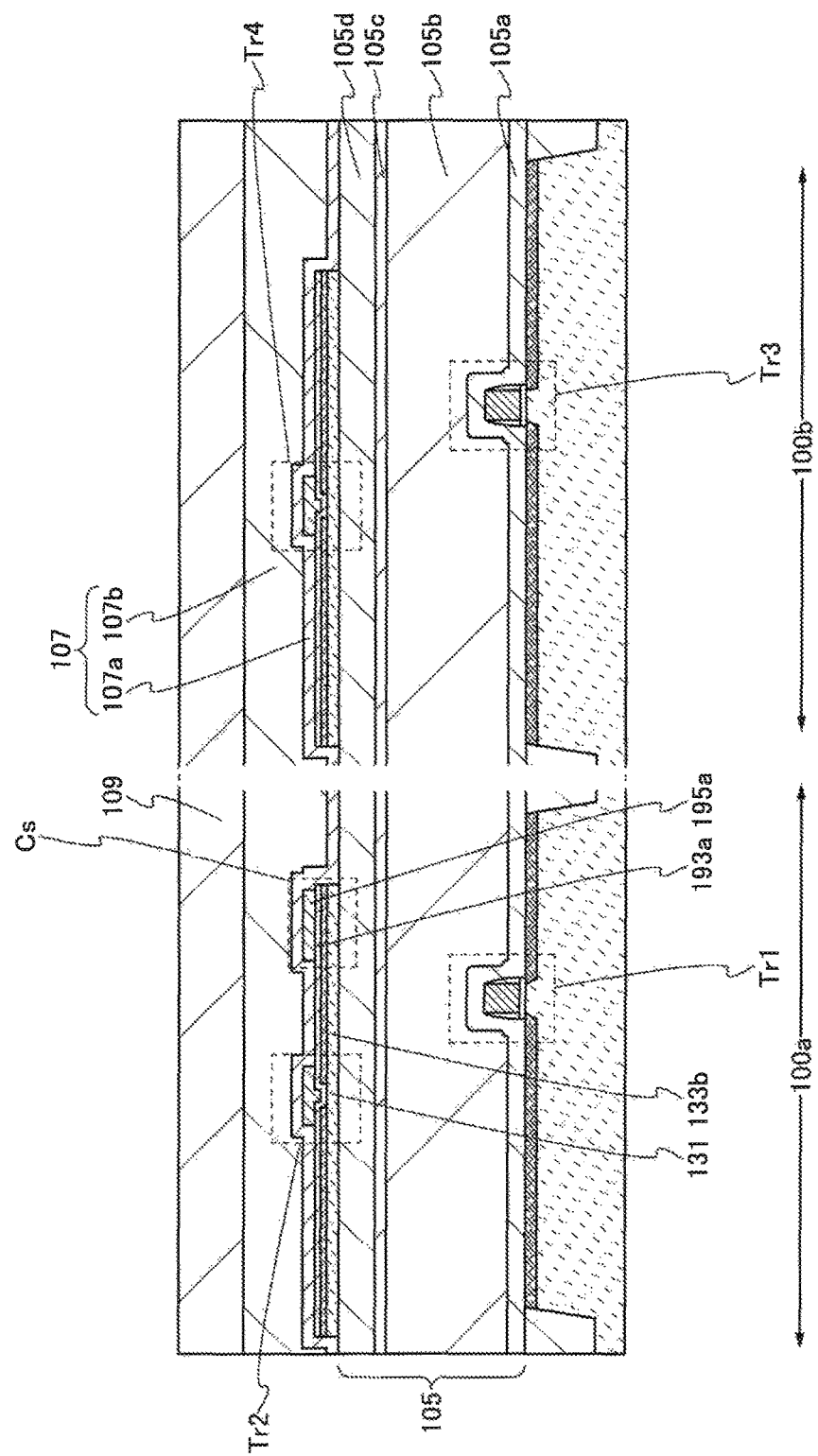
FIG. 66 is a cross-sectional view illustrating one embodiment of a method for manufacturing a semiconductor device.

After that, the transistors Tr2 and Tr4 and the capacitor Cs are formed over the insulating film 105 as illustrated in FIG. 66. Subsequently, the insulating film 107 is formed over the transistors Tr2 and Tr4 and the capacitor Cs. In the insulating film 107, insulating films 107a and 107b are stacked in this order.

It is preferred that, like the insulating film 105c, one of the insulating films 107a and 107b be formed using a film having barrier properties against hydrogen, water, and the like, and further preferably formed using a film having barrier properties against hydrogen, water, oxygen, and the like. Here, the insulating film 107a is formed using a film having barrier properties against hydrogen, water, oxygen, and the like.

Next, the insulating film 109 is formed over the insulating film 107.

Note that by heat treatment in the formation steps of the insulating films 107 and 109, the transistors Tr2 and Tr4, and the capacitor Cs, hydrogen contained in the insulating film 105a is diffused into the channel regions of the transistors Tr1 and Tr3, so that defects in the channel regions can be repaired (dangling bonds in the channel regions can be terminated with hydrogen).

Hydrogen contained in the insulating film 105a might also be diffused into the insulating film 105b by heat treatment; however, since the insulating film 105c has a function of a barrier film against hydrogen, water, and the like, hydrogen diffusion into the semiconductor films of the transistors Tr2 and Tr4 can be prevented.

Hydrogen diffused to the oxide semiconductor film reacts with oxygen bonded to a metal atom to be water, and also causes oxygen vacancies in a lattice from which oxygen is released (or a portion from which oxygen is released). Due to entry of hydrogen into the oxygen vacancies, an electron serving as a carrier is generated. Furthermore, bonding of part of hydrogen to oxygen bonded to a metal atom causes generation of an electron serving as a carrier. Thus, a transistor including an oxide semiconductor into which hydrogen is diffused is likely to be normally on. In view of the above, prevention of diffusion of hydrogen, water, and the like into the semiconductor films of the transistors Tr2 and Tr4 makes it possible for the transistors Tr2 and Tr4 to have excellent electric characteristics.

The insulating film 105d is formed using an insulating film that releases oxygen by heat treatment; thus, oxygen contained in the insulating film 105d can be supplied to the semiconductor films of the transistors Tr2 and Tr4 by the heat treatment. This is another factor for the fabrication of the transistors Tr2 and Tr4 having excellent electric characteristics.

Since the transistors Tr2 and Tr4 and the insulating film 105d are sandwiched between the insulating films 105c and 107a having functions of barrier films against hydrogen, water, oxygen, and the like, oxygen contained in the insulating film 105d can be efficiently supplied to the semiconductor films of the transistors Tr2 and Tr4 while hydrogen, water, and the like can be prevented from entering the semiconductor films of the transistors Tr2 and Tr4 from the outside. This is another factor for the fabrication of the transistors Tr2 and Tr4 having excellent electric characteristics.

Owing to the insulating films 105c and 107a, the hydrogen concentration of the semiconductor films of the transistors Tr2 and Tr4 can be less than 1/10 and preferably less than 1/100 that of the channel regions of the transistors Tr1 and Tr3.

When the insulating film 105c is formed using a film having barrier properties against hydrogen, water, and oxygen, the insulating film 105c prevents diffusion of oxygen contained in the insulating film 105d. In that case, oxygen contained in the insulating film 105d can be efficiently supplied to the semiconductor films of the transistors Tr2 and Tr4 by heat treatment.

Note that opening portions in the insulating films 105, 107, and 109 and conductive films that fill the opening portions are not formed at this stage. Thus, hydrogen contained in the insulating film 105a can be prevented from being diffused to the semiconductor films of the transistors Tr2 and Tr4 by heat treatment via the opening portions and the conductive films that fill the opening portion. In addition, oxygen contained in the insulating film 105d can be efficiently supplied to the semiconductor films of the transistors Tr2 and Tr4.

Figure 68:
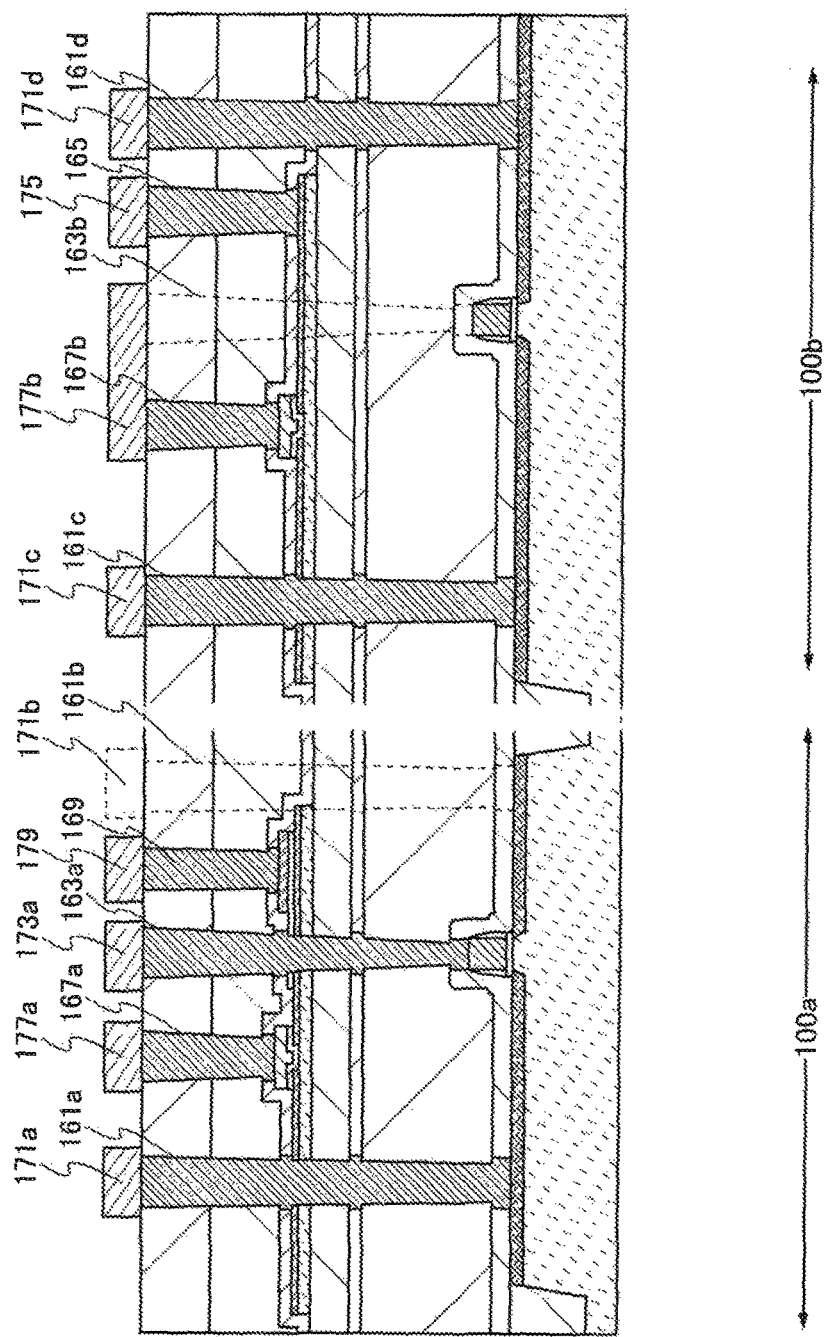
FIG. 68 is a cross-sectional view illustrating one embodiment of a method for manufacturing a semiconductor device.

Then, opening portions are formed in the insulating films 105, 107, and 109, the semiconductor films 131 and 141, the conductive films 133a, 133b, 143a, and 143b, and the insulating film 135 by the steps illustrated in FIG. 58 to FIG. 62. Subsequently, by the steps illustrated in FIG. 63 and FIG. 64, the conductive films 161a, 161b, 161c, 161d, 163a, 163b, 165, 167a, 167b, and 169 each having a function of a plug and the conductive films 171a, 171b, 171c, 171d, 173a, 175, 177a, 177b, and 179 each having a function of a wiring are formed as illustrated in FIG. 68.

In the case where the insulating films are formed using different materials, the opening portion may have a plurality of widths because of the different etching rates of the insulating films. For example, the width of the opening portion might be large in an insulating film that is easily etched, whereas the width might be small in an insulating film that is not easily etched. As a result, the conductive films 161a, 161b, 161c, 161d, 163a, 163b, 165, 167a, 167b, and 169 whose side surfaces have a plurality of projections are formed as illustrated in FIG. 68 in one step. Note that each of the conductive films 161a, 161b, 161c, 161d, 163a, 163b, 165, 167a, 167b, and 169 has one or more projections in a cross section in a thickness direction. Furthermore, the width of each of the conductive films 161a, 161b, 161c, 161d, 163a, 163b, 165, 167a, 167b, and 169 is not gradually reduced from the insulating film 109 toward the insulating film 107; each of the conductive films is formed to have regions with narrow widths and regions with wide widths randomly.

Each of the conductive films 161a, 161b, 161c, 161d, 163a, 163b, 165, 167a, 167b, and 169 has at least a region with a first width, a region with a second width, and a region with a third width. At least two of the first width, the second width, and the third width have different values.

For example, in a conductive film in which a region with the first width, a region with the second width, and a region with the third width are formed in this order, the first width and the third width are larger than the second width in some cases. In such a case, the region with the first width and the region with the third width are in opening portions formed in a silicon nitride film, a silicon nitride oxide film, an aluminum oxide film, or the like, whereas the region with the second width is in an opening portion formed in a silicon oxide film, a silicon oxynitride film, or the like.

In the conductive film in which the region with the first width, the region with the second width, and the region with the third width are formed in this order, the first width and the third width are smaller than the second width in some cases. In such a case, the region with the first width and the region with the third width are in opening portions formed in a silicon oxide film, a silicon oxynitride film, or the like whereas the region with the second width is in an opening portion formed in a silicon nitride film, a silicon nitride oxide film, an aluminum oxide film, or the like.

The conductive films 161a, 161b, 161c, 161d, 163a, 163b, 165, 167a, 167b, and 169 having the shapes illustrated in FIG. 68 have high adhesion with the insulating films 105, 107, and 109. Thus, the conductive films 161a, 161b, 161c, 161d, 163a, 163b, 165, 167a, 167b, and 169 can be prevented from being separated by a mechanical load due to a polishing step in a step using a CMP method, which is one of formation steps of the conductive films. As a result, the yield of the semiconductor device can be improved.

In a manner described in this embodiment, an n-channel transistor can be stacked over a p-channel transistor without attaching a substrate over which the p-channel transistor is formed to a substrate over which the n-channel transistor is formed.

This embodiment can be combined with any of the other embodiments in this specification as appropriate.

This application is based on Japanese Patent Application serial no. 2014-113576 filed with Japan Patent Office on May 30, 2014, Japanese Patent Application serial no. 2014-113585 filed with Japan Patent Office on May 30, 2014, and Japanese Patent Application serial no. 2014-113587 filed with Japan Patent Office on May 30, 2014, the entire contents of which are hereby incorporated by reference.

What is claimed is:
1. A semiconductor device comprising:
a first transistor;
a second transistor over the first transistor, the second transistor comprising a semiconductor film comprising a first opening portion;
an insulating film over the second transistor, the insulating film comprises a second opening portion that overlaps with the second transistor; and
a conductive film in the first opening portion and the second opening portion, the conductive film electrically connected to the first transistor, and
wherein a side surface of the conductive film comprises a plurality of projections.

2. A semiconductor device comprising:
a first insulating film comprising a first opening portion;
a second insulating film over the first insulating film, the second insulating film comprising a second opening portion;
a third insulating film over the second insulating film, the third insulating film comprising a third opening portion;
a transistor over the third insulating film, the transistor comprising a semiconductor film comprising a fourth opening portion; and
a first conductive film in the first opening portion, the second opening portion, the third opening portion, and the fourth opening portion,
wherein the first conductive film comprises a first width in the first opening portion, a second width in the second opening portion, and a third width in the third opening portion,
wherein the first opening portion, the second opening portion, the third opening portion, and the fourth opening portion are connected to each other,
wherein at least two of the first width, the second width, and the third width are different from each other, and
wherein the first conductive film is in contact with a top surface of the first insulating film.

3. The semiconductor device according to claim 2, wherein the second width is larger than each of the first width and the third width.

4. The semiconductor device according to claim 3, wherein the first insulating film and the third insulating film each comprise a region including a silicon oxide film or a silicon oxynitride film, and
wherein the second insulating film comprises a region including a silicon nitride film, a silicon nitride oxide film, or an aluminum oxide film.

5. The semiconductor device according to claim 2,
wherein a top surface of the first conductive film is in contact with a second conductive film, and
wherein a bottom surface of the first conductive film is in contact with a third conductive film or a semiconductor region.

6. An electronic device comprising:
the semiconductor device according to claim 2; and
at least one of a display device, a microphone, a speaker, an operation key, a position input device, a lens, and a connection portion.

7. A semiconductor device comprising:
a first transistor;
a second transistor over the first transistor, the second transistor comprising a semiconductor film comprising a first opening portion;
a first insulating film over the second transistor, the first insulating film comprising a second opening portion;
a second insulating film over the first insulating film, the second insulating film comprising a third opening portion; and
a conductive film in the first opening portion, the second opening portion, and the third opening portion,
wherein the first opening portion, the second opening portion, and the third opening portion overlap with one another,
wherein a width of the second opening portion at a bottom end of the second opening portion is larger than a width of the first opening portion at a top end of the first opening portion,
wherein a width of the second opening portion at a top end of the second opening portion is larger than a width of the third opening portion at a bottom end of the third opening portion,
wherein the conductive film is in contact with a top surface of the first transistor and a side surface of the second transistor, and
wherein the first insulating film and the second insulating film comprise different insulating materials.

8. The semiconductor device according to claim 7, wherein a top surface of the first insulating film is in contact with a bottom surface of the second insulating film.

9. The semiconductor device according to claim 7,
wherein the semiconductor film comprises polycrystalline silicon, and
wherein the semiconductor film comprises a channel formation region.

10. The semiconductor device according to claim 7,
wherein the semiconductor film comprises oxide semiconductor, and
wherein the semiconductor film comprises a channel formation region.

11. A semiconductor device comprising:
a transistor comprising a semiconductor film, the semiconductor film comprising a third opening portion;
a first conductive film;
a first insulating film over and in contact with the first conductive film, the first insulating film comprising a first opening portion and a fourth opening portion;
a second insulating film over and in contact with the first insulating film, the second insulating film comprising a second opening portion;
a second conductive film in the first opening portion and the second opening portion; and
a third conductive film in the third opening portion and the fourth opening portion,
wherein the first opening portion and the second opening portion overlap with each other,
wherein the third opening portion and the fourth opening portion overlap with each other,
wherein the second conductive film is in contact with a top surface of the first conductive film, a side surface of the first insulating film, and a bottom surface of the second insulating film, and
wherein the first insulating film and the second insulating film comprise different insulating materials.

* * * * *